US011880136B2

(12) United States Patent
Hatakeyama

(10) Patent No.: US 11,880,136 B2
(45) Date of Patent: Jan. 23, 2024

(54) RESIST COMPOSITION AND PATTERNING PROCESS

(71) Applicant: Shin-Etsu Chemical Co., Ltd., Tokyo (JP)

(72) Inventor: Jun Hatakeyama, Joetsu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 93 days.

(21) Appl. No.: 17/368,989

(22) Filed: Jul. 7, 2021

(65) Prior Publication Data

US 2022/0026805 A1 Jan. 27, 2022

(30) Foreign Application Priority Data

Jul. 17, 2020 (JP) ................................ 2020-123159

(51) Int. Cl.

| | |
|---|---|
| ***G03F 7/039*** | (2006.01) |
| ***G03F 7/38*** | (2006.01) |
| ***C08F 220/04*** | (2006.01) |
| ***C08F 220/38*** | (2006.01) |
| ***G03F 7/32*** | (2006.01) |
| ***G03F 7/038*** | (2006.01) |
| ***G03F 7/004*** | (2006.01) |
| ***G03F 7/20*** | (2006.01) |

(52) U.S. Cl.

CPC .......... *G03F 7/0397* (2013.01); *C08F 220/04* (2013.01); *C08F 220/382* (2020.02); *G03F 7/0045* (2013.01); *G03F 7/0382* (2013.01); *G03F 7/2006* (2013.01); *G03F 7/32* (2013.01); *G03F 7/38* (2013.01)

(58) Field of Classification Search

CPC .... G03F 7/0397; G03F 7/0382; G03F 7/0045; G03F 7/0392; G03F 7/38; C08F 220/04; C08F 220/382

See application file for complete search history.

(56) References Cited

U.S. PATENT DOCUMENTS

| | | | | |
|---|---|---|---|---|
| 7,598,016 B2 | 10/2009 | Kobayashi et al. | | |
| 9,152,050 B2 | 10/2015 | Hatakeyama | | |
| 9,250,523 B2 | 2/2016 | Hatakeyama et al. | | |
| 2008/0241736 A1* | 10/2008 | Kobayashi ............ | G03F 7/0397 430/322 | |
| 2009/0011365 A1 | 1/2009 | Kobayashi et al. | | |
| 2016/0124313 A1* | 5/2016 | Hatakeyama ........... | G03F 7/405 430/325 | |

FOREIGN PATENT DOCUMENTS

| | | |
|---|---|---|
| JP | 2007-297590 A | 11/2007 |
| JP | 2008-239918 A | 10/2008 |
| JP | 2009-31767 A | 2/2009 |
| JP | 2014-67012 A | 4/2014 |
| JP | 2014-67014 A | 4/2014 |

* cited by examiner

*Primary Examiner* — John S Chu

(74) *Attorney, Agent, or Firm* — WHDA, LLP

(57) ABSTRACT

A resist composition comprising an ammonium salt and fluorine-containing polymer offers a high sensitivity and is unsusceptible to nano-bridging, pattern collapse or residue formation, independent of whether it is of positive or negative tone. The ammonium salt and fluorine-containing polymer comprises repeat units AU having an ammonium salt structure containing a carboxylic acid anion, sulfonamide anion, phenoxide anion or enolate anion of β-diketone, the anion containing fluorine, but not iodine and bromine, and repeat units FU-1 having a trifluoromethylalcohol group and/or repeat units FU-2 having a fluorinated hydrocarbyl group.

13 Claims, No Drawings

RESIST COMPOSITION AND PATTERNING PROCESS

CROSS-REFERENCE TO RELATED APPLICATION

This non-provisional application claims priority under 35 U.S.C. § 119(a) on Patent Application No. 2020-123159 filed in Japan on Jul. 17, 2020, the entire contents of which are hereby incorporated by reference.

TECHNICAL FIELD

This invention relates to a resist composition and a pattern forming process.

BACKGROUND ART

To meet the demand for higher integration density and operating speed of LSIs, the effort to reduce the pattern rule is in rapid progress. In particular, the enlargement of the logic memory market to comply with the wide-spread use of smart phones drives forward the miniaturization technology. As the advanced miniaturization technology, manufacturing of microelectronic devices at the 10-nm node by double patterning of the ArF immersion lithography has been implemented in a mass scale. Manufacturing of 7-nm node devices as the next generation by the double patterning technology is approaching to the verge of high-volume application. The candidate for 5-nm node devices as the next generation but one is EUV lithography.

The EUV lithography has the problem that defects in a mask blank consisting of total 80 layers of Mo and Si are transferred, and the problem that a high strength pellicle which causes only a little lowering of light intensity and is devoid of the risk of failure during exposure is not available, allowing particles to deposit from the exposure tool onto a mask. It is urgently required to reduce defects. Since the EUV lithography enables to form patterns to a feature size of less than half of the size achieved by the standard ArF immersion lithography, the probability of defect occurrence is increased. A higher level of defect control is thus necessary.

In conjunction with resist materials for the ArF immersion lithography, Patent Document 1 proposes a fluorinated polymer additive which segregates on the surface of a resist film to improve water repellency. This additive containing a 1,1,1,3,3,3-hexafluoro-2-propanol (HFA) group is effective for improving the solubility in alkaline developer at the resist film surface and reducing bridge defects on the resist surface.

Patent Documents 2 and 3 disclose that a polymer comprising repeat units having a HFA group and robust repeat units having an aromatic group is added for reducing outgassing from the resist film during EUV exposure. The modification of resist film surface can lead to a possibility of reducing pattern defects or suppressing outgassing.

In conjunction with resist compositions comprising a fluorine-containing polymer which segregates on the surface of a resist film to improve water repellency, Patent Documents 4 and 5 propose to introduce an amino group or an ammonium salt of fluorosulfonic acid into the fluorine-containing polymer. This is effective for suppressing acid diffusion on the resist film surface and improving the rectangularity of a resist pattern as developed. Since EUV absorption is not so high, the sensitizing effect is limitative.

CITATION LIST

Patent Document 1: JP-A 2007-297590

Patent Document 2: JP-A 2014-067014 (U.S. Pat. No. 9,152,050)

Patent Document 3: JP-A 2014-067012 (U.S. Pat. No. 9,250,523)

Patent Document 4: JP-A 2009-031767 (US 20090011365)

Patent Document 5: JP-A 2008-239918 (U.S. Pat. No. 7,598,016)

DISCLOSURE OF INVENTION

For the acid-catalyzed chemically amplified resist, it is desired to develop a resist composition capable of minimizing nano-bridging and collapse of line patterns, eliminating any residues in the space region, and improving a sensitivity.

An object of the invention is to provide a resist composition which exhibits a high sensitivity and is unsusceptible to nano-bridging, pattern collapse or residue formation, independent of whether it is of positive tone or negative tone; and a pattern forming process using the same.

The inventor has found that when a polymer comprising repeat units having an ammonium salt structure containing a carboxylic acid anion containing fluorine, but not iodine and bromine, a sulfonamide anion containing fluorine, but not iodine and bromine, a phenoxide anion containing fluorine, but not iodine and bromine, or an enolate anion of β-diketone containing fluorine, but not iodine and bromine and repeat units having a trifluoromethylalcohol group which may be substituted with an acid labile group and/or repeat units having a fluorinated hydrocarbyl group (referred to as "ammonium salt and fluorine-containing polymer" or "additive polymer", hereinafter) is added to a base polymer, there is obtained a resist composition which is effective for preventing nano-bridging and pattern collapse, providing a wide process margin, forming a line pattern with improved LWR or a hole pattern with improved CDU, and leaving no residues in the space region.

In one aspect, the invention provides a resist composition comprising an ammonium salt and fluorine-containing polymer comprising repeat units AU having an ammonium salt structure containing a carboxylic acid anion containing fluorine, but not iodine and bromine, a sulfonamide anion containing fluorine, but not iodine and bromine, a phenoxide anion containing fluorine, but not iodine and bromine, or an enolate anion of pi-diketone containing fluorine, but not iodine and bromine, and repeat units of at least one type selected from repeat units FU-1 having a trifluoromethylalcohol group which may be substituted with an acid labile group and repeat units FU-2 having a fluorinated hydrocarbyl group, and a base polymer.

Preferably, the repeat unit AU has the formula (AU), the repeat unit FU-1 has the formula (FU-1), and the repeat unit FU-2 has the formula (FU-2).

(AU)

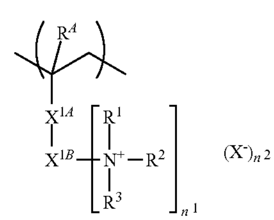

-continued (FU-1)

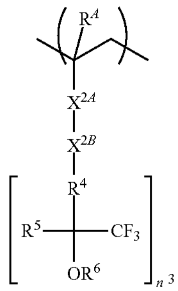

(FU-2)

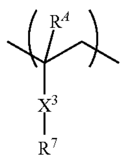

Herein $n^1$ is 1 or 2, $n^2$ is a positive number in the range: $0<n^2/n^1\leq$; 1, and $n^3$ is 1 or 2. $R^A$ is each independently hydrogen or methyl. $X^{1A}$ is a single bond, phenylene group, ester bond or amide bond. $X^{1B}$ is a single bond or a $C_1$-$C_{20}$ $(n^1+1)$-valent hydrocarbon group which may contain an ether bond, carbonyl moiety, ester bond, amide bond, sultone ring, lactam ring, carbonate bond, halogen, hydroxy moiety or carboxy moiety. $X^{2A}$ is a single bond, phenylene, —O—, —C(═O)—O— or —C(═O)—NH—. $X^{2B}$ is a $C_1$-$C_{12}$ $(n^3+1)$-valent saturated hydrocarbon group or $(n^3+1)$-valent aromatic hydrocarbon group, which may contain fluorine, hydroxy moiety, ester bond or ether bond. $X^3$ is a single bond, phenylene, —O—, —C(═O)—O—$X^{31}$—$X^{32}$— or —C(═O)—NH—$X^{31}$—$X^{32}$—, wherein $X^{31}$ is a single bond or $C_1$-$C_4$ alkanediyl group, and $X^{32}$ is a single bond, ester bond, ether bond or sulfonamide bond. $R^1$, $R^2$ and $R^3$ are each independently hydrogen, a $C_1$-$C_{12}$ alkyl group, $C_2$-$C_{12}$ alkenyl group, $C_6$-$C_{12}$ aryl group or $C_7$-$C_{12}$ aralkyl group, a pair of $R^1$ and $R^2$ or $R^1$ and $X^{1B}$ may bond together to form a ring with the nitrogen atom to which they are attached, the ring may contain oxygen, sulfur, nitrogen or a double bond. $R^4$ is a single bond, ester bond, or a $C_1$-$C_{12}$ saturated hydrocarbylene group in which some or all of the hydrogen atoms may be substituted by fluorine and some carbon may be replaced by an ester bond or ether bond.

$R^5$ is hydrogen, fluorine, methyl, trifluoromethyl or difluoromethyl, a pair of $R^5$ and $R^6$ may bond together to form a ring with the carbon atom to which they are attached, the ring may contain an ether bond, fluorine or trifluoromethyl. $R^6$ is hydrogen or an acid labile group. $R^7$ is a $C_1$-$C_{20}$ hydrocarbyl group which is substituted with at least one fluorine, and in which some carbon may be replaced by an ester bond or ether bond. $X^-$ is a carboxylic acid anion containing fluorine, but not iodine and bromine, a sulfonamide anion containing fluorine, but not iodine and bromine, a phenoxide anion containing fluorine, but not iodine and bromine, or an enolate anion of β-diketone containing fluorine, but not iodine and bromine.

In a preferred embodiment, 0.001 to 20 parts by weight of the ammonium salt and fluorine-containing polymer is present per 100 parts by weight of the base polymer.

The resist composition may further comprise an acid generator capable of generating a sulfonic acid, imide acid or methide acid, an organic solvent, and/or a surfactant.

In one preferred embodiment, the base polymer comprises repeat units having the formula (a1) or repeat units having the formula (a2).

(a1)

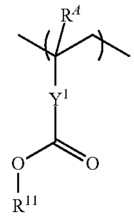

(a2)

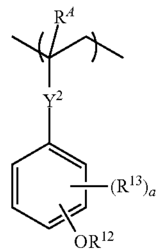

Herein $R^A$ is each independently hydrogen or methyl, $R^{11}$ and $R^{12}$ each are an acid labile group, $R^{13}$ is fluorine, trifluoromethyl, a $C_1$-$C_5$ saturated hydrocarbyl group or $C_1$-$C_5$ saturated hydrocarbyloxy group, $Y^1$ is a single bond, phenylene group, naphthylene group, or $C_1$-$C_{12}$ divalent linking group containing at least one moiety selected from ester bond and lactone ring, $Y^2$ is a single bond or ester bond, and a is an integer of 0 to 4.

In one embodiment, the resist composition is a chemically amplified positive resist composition.

In another embodiment, the base polymer is free of an acid labile group. Typically, the resist composition is a chemically amplified negative resist composition.

In one preferred embodiment, the base polymer comprises repeat units of at least one type selected from repeat units having the formulae (f1) to (3).

(f1)

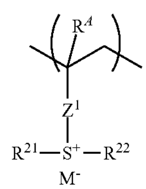

(f2)

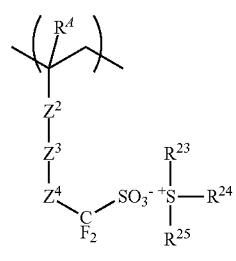

(f3)

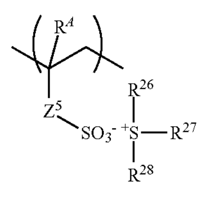

Herein $R^A$ is each independently hydrogen or methyl. $Z^1$ is a single bond, a $C_1$-$C_6$ aliphatic hydrocarbylene group, phenylene group, naphthylene group, or $C_7$-$C_{18}$ group obtained by combining the foregoing, or —O—$Z^{11}$—, —C(═O)—O—$Z^{11}$— or —C(═O)—NH—$Z^{11}$—, wherein $Z^1$ is a $C_1$-$C_6$ aliphatic hydrocarbylene group, phenylene group, naphthylene group, or $C_7$-$C_{18}$ group obtained by combining the foregoing, which may contain a carbonyl moiety, ester bond, ether bond or hydroxy moiety. $Z^2$ is a single bond or ester bond. $Z^3$ is a single bond, —$Z^{31}$—C(═O)—O—, —$Z^{31}$—O— or —$Z^{31}$—O—C(═O)—, wherein $Z^{31}$ is a $C_1$-$C_{12}$ hydrocarbylene group, phenylene group, or $C_7$-$C_{18}$ group obtained by combining the foregoing, which may contain a carbonyl moiety, ester bond, ether bond, iodine or bromine. $Z^4$ is a methylene, 2,2,2-trifluoro-1,1-ethanediyl or carbonyl group. $Z^5$ is a single bond, methylene, ethylene, phenylene, fluorinated phenylene, trifluoromethyl-substituted phenylene group, —O—$Z^{51}$—, —C(═O)—O—$Z^{51}$—, or —C(═O)—NH—$Z^{51}$—, wherein $Z^5$ is a $C_1$-$C_6$ aliphatic hydrocarbylene group, phenylene group, fluorinated phenylene group, or trifluoromethyl-substituted phenylene group, which may contain a carbonyl moiety, ester bond, ether bond or hydroxy moiety. $R^{21}$ to $R^{28}$ are each independently halogen or a $C_1$-$C_{20}$ hydrocarbyl group which may contain a heteroatom, a pair of $R^{23}$ and $R^{24}$ or $R^{26}$ and $R^{27}$ may bond together to form a ring with the sulfur atom to which they are attached. $M^-$ is a non-nucleophilic counter ion.

In another aspect, the invention provides a process for forming a pattern comprising the steps of applying the resist composition defined above onto a substrate to form a resist film thereon, exposing the resist film to high-energy radiation, and developing the exposed resist film in a developer.

Typically, the high-energy radiation is ArF excimer laser radiation of wavelength 193 nm, KrF excimer laser radiation of wavelength 248 nm, EB, or EUV of wavelength 3 to 15 nm.

Advantageous Effects of Invention

The ammonium salt and fluorine-containing polymer (or additive polymer) is a quencher of polymer type which is fully soluble in an alkaline developer. When a resist composition comprising the additive polymer and a base polymer is applied to form a resist film, the additive polymer efficiently segregates on the film surface because not only repeat units of fluorine-containing ammonium salt structure, but also fluorine-containing repeat units are incorporated therein. Thus, fluorine atoms are present at a high density in proximity to the resist film surface. The additive polymer is effective for increasing the absorption of exposure light due to fluorine atoms whereby a sensitizing effect is exerted. The additive polymer is also effective for controlling acid diffusion in proximity to the resist film surface and preventing evaporation of acid from the resist film surface whereby the resist pattern as developed is enhanced in rectangularity and the LWR of line patterns or CDU of hole patterns on top-down observation is improved. Further, the solubility of the resist film surface in alkaline developer is increased whereby bridge defects or pattern collapse after pattern formation is minimized.

DESCRIPTION OF EMBODIMENTS

As used herein, the singular forms "a," "an" and "the" include plural referents unless the context clearly dictates otherwise. The notation ($C_n$-$C_m$) means a group containing from n to m carbon atoms per group. As used herein, the term "fluorinated", "iodized" or "brominated" compound means a fluorine, iodine or bromine-substituted compound. Also, the terms "group" and "moiety" are interchangeable.

The abbreviations and acronyms have the following meaning.

EB: electron beam
EUV: extreme ultraviolet
Mw: weight average molecular weight
Mn: number average molecular weight
Mw/Mn: molecular weight distribution or dispersity
GPC: gel permeation chromatography
PEB: post-exposure bake
PAG: photoacid generator
LWR: line width roughness
CDU: critical dimension uniformity Resist Composition One embodiment of the invention is a resist composition comprising an ammonium salt and fluorine-containing polymer and a base polymer.

Ammonium Salt and Fluorine-Containing Polymer

The ammonium salt and fluorine-containing polymer is defined as comprising repeat units AU having an ammonium salt structure containing a carboxylic acid anion containing fluorine, but not iodine and bromine, a sulfonamide anion containing fluorine, but not iodine and bromine, a phenoxide anion containing fluorine, but not iodine and bromine, or an enolate anion of β-diketone containing fluorine, but not iodine and bromine, and repeat units of at least one type selected from repeat units FU-1 having a trifluoromethylalcohol group which may be substituted with an acid labile group and repeat units FU-2 having a fluorinated hydrocarbyl group.

The repeat unit AU is preferably a unit having the ammonium salt structure as a pendant and more preferably has the following formula (AU).

(AU)

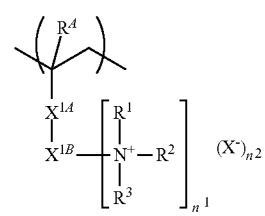

In formula (AU), $n^1$ is 1 or 2, and $n^2$ is a positive number in the range: $0<n^2/n^1$ 1.

$R^A$ is each independently hydrogen or methyl.

$X^{1A}$ is a single bond, phenylene group, ester bond or amide bond. $X^{1B}$ is a single bond or a $C_1$-$C_{20}$ ($n^1$+1)-valent hydrocarbon group which may contain an ether bond, carbonyl moiety, ester bond, amide bond, sultone ring, lactam ring, carbonate bond, halogen, hydroxy moiety or carboxy moiety.

The $C_1$-$C_{20}$ ($n^1$+1)-valent hydrocarbon group represented by $X^{1B}$ is a group obtained by removing ($n^1$+1) number of hydrogen atoms from a $C_1$-$C_{20}$ aliphatic hydrocarbon or $C_6$-$C_{20}$ aromatic hydrocarbon and may be straight, branched or cyclic. Examples thereof include groups obtained by removing ($n^1$+1) number of hydrogen atoms from $C_1$-$C_{20}$ saturated hydrocarbons such as methane, ethane, propane, butane, pentane, hexane, heptane, octane, nonane, decane, undecane, dodecane, cyclopropane, cyclobutane, cyclopentane, cyclohexane, methylcyclopentane, ethylcyclopentane, methylcyclohexane, ethylcyclohexane, 1-propylcyclohexane, isopropylcyclohexane, norbornane, adamantane, methylnorbornane, ethylnorbornane, methyladamantane, ethyladamantane, and tetrahydrodicyclopentadiene; groups obtained by removing ($n^1$+1) number of hydrogen atoms from aromatic hydrocarbons such as benzene, toluene, xylene, ethylbenzene, 1-propylbenzene, isopropylbenzene, and naphthalene; and combinations thereof.

In formula (AU), $R^1$, $R^2$ and $R^3$ are each independently hydrogen, a $C_1$-$C_{12}$ alkyl group, $C_2$-$C_{12}$ alkenyl group, $C_6$-$C_{12}$ aryl group or $C_7$-$C_{12}$ aralkyl group. A pair of $R^1$ and $R^2$, or $R^1$ and $X^{1B}$ may bond together to form a ring with the nitrogen atom to which they are attached, the ring may contain oxygen, sulfur, nitrogen or a double bond. The ring is preferably of 3 to 12 carbon atoms.

Of the groups represented by $R^1$, $R^2$ and $R^3$, the $C_1$-$C_{12}$ alkyl group may be straight, branched or cyclic, and examples thereof include methyl, ethyl, n-propyl, isopropyl, n-butyl, isobutyl, sec-butyl, tert-butyl, n-pentyl, n-hexyl, n-heptyl, n-octyl, n-nonyl, n-decyl, and n-dodecyl. Examples of the $C_2$-$C_{12}$ alkenyl group include vinyl, 1-propenyl, 2-propenyl, butenyl, and hexenyl. Examples of the $C_6$-$C_{12}$ aryl group include phenyl, tolyl, xylyl, 1-naphthyl, and 2-naphthyl. Typical of the $C_7$-$C_{12}$ aralkyl group is benzyl.

Examples of the cation in the monomer from which repeat units AU are derived are shown below, but not limited thereto. Herein $R^A$ is as defined above.

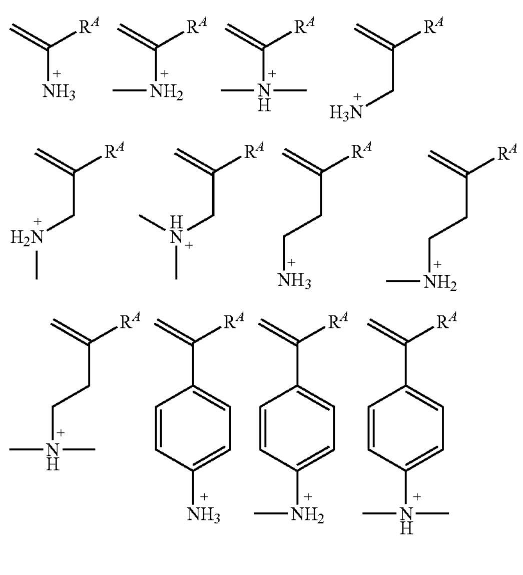

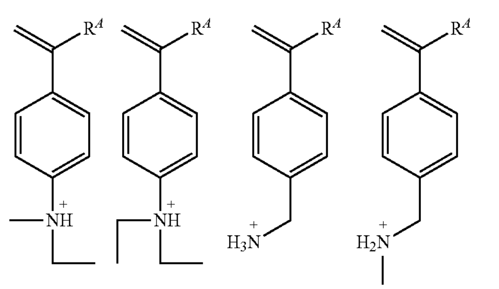

-continued

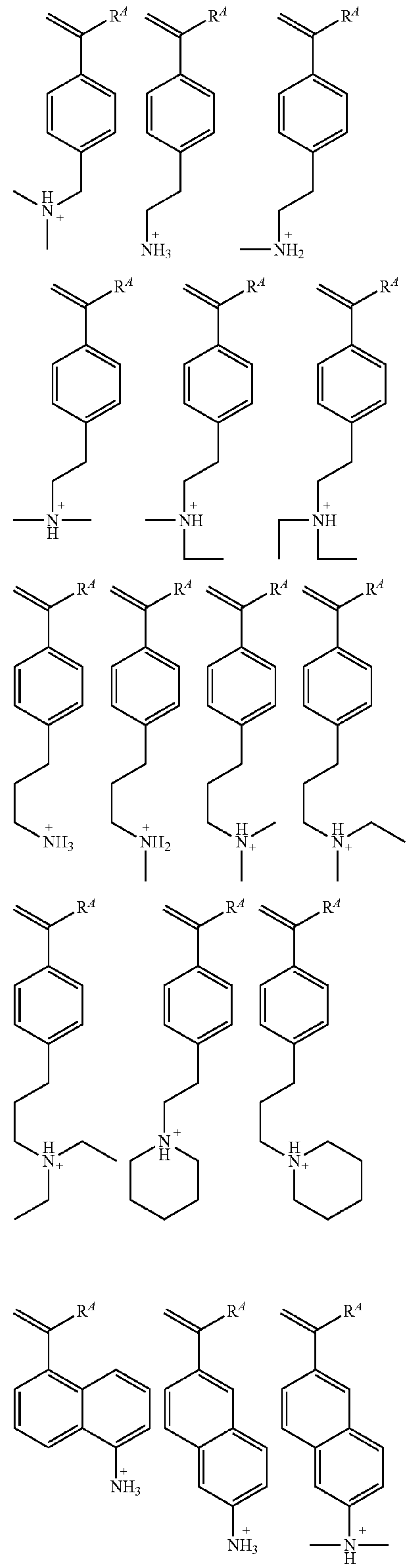

-continued
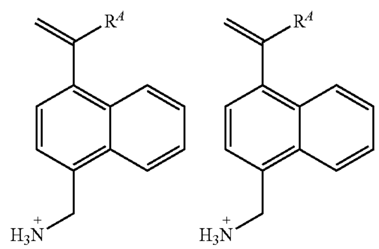
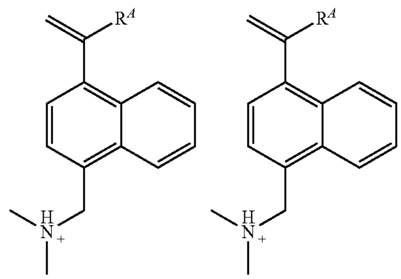
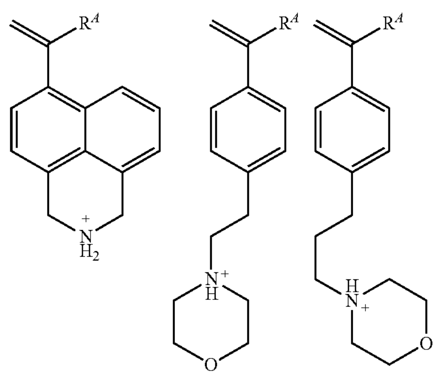
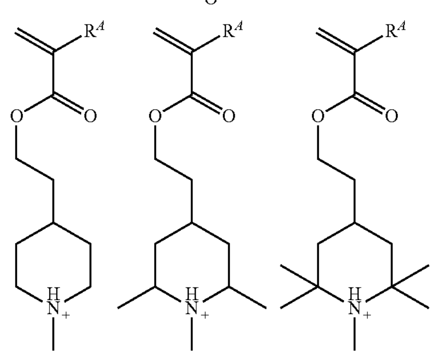
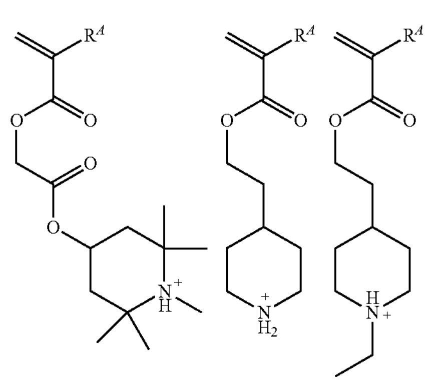
-continued
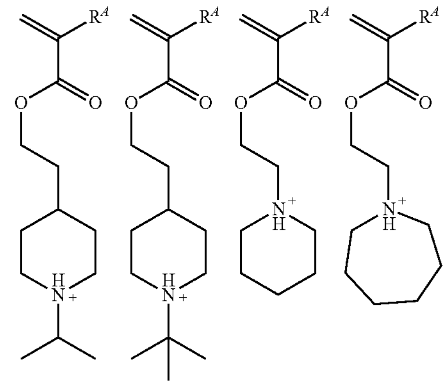
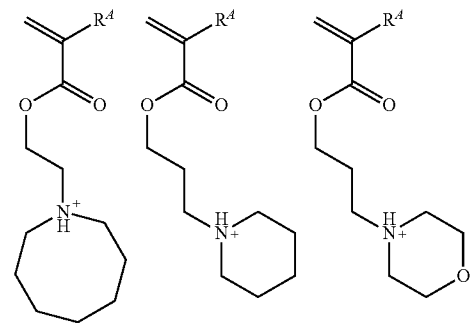
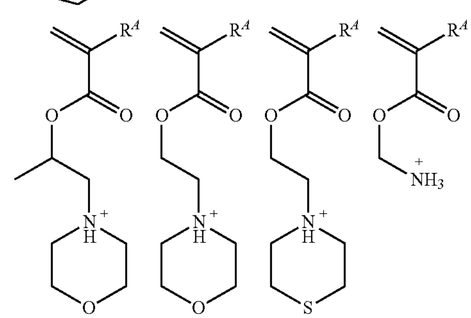
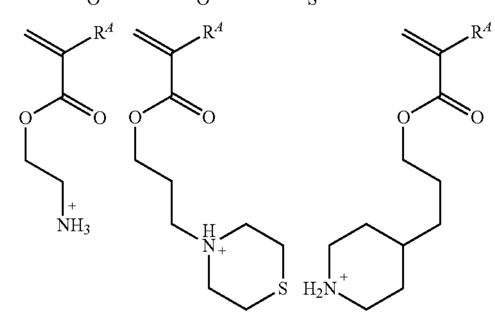
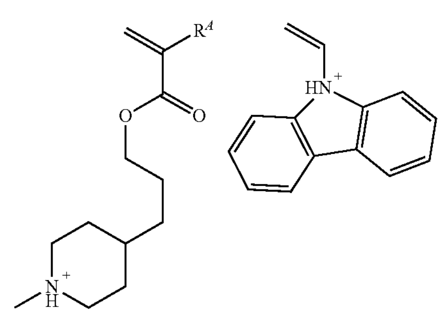

-continued
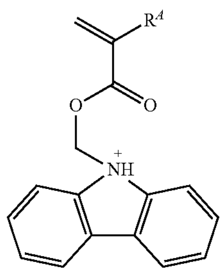
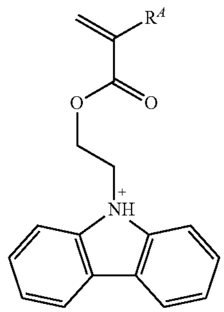
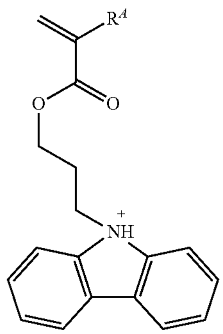
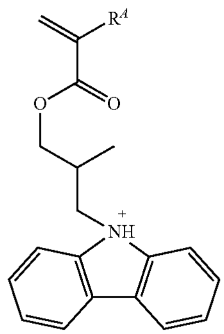
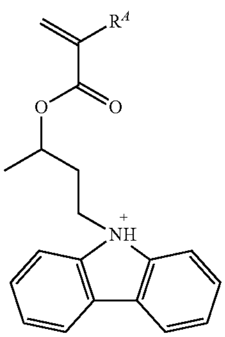
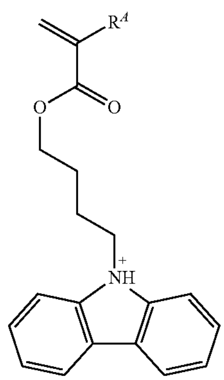
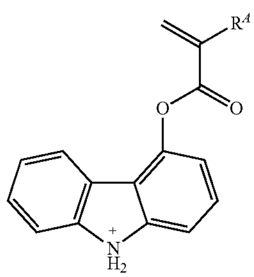
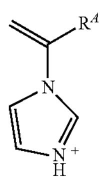
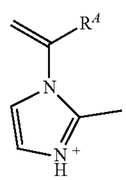
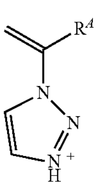
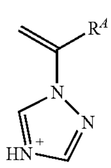
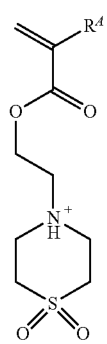
-continued
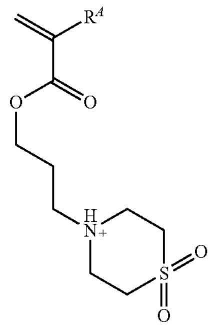
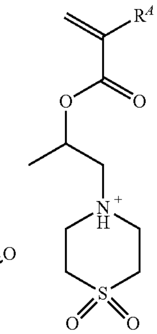
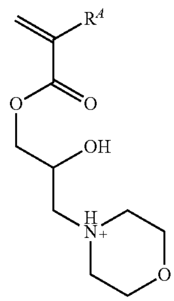
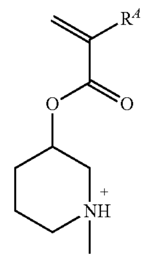
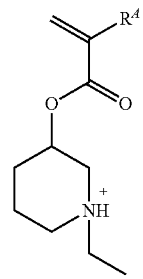
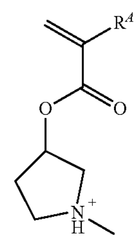
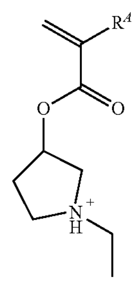
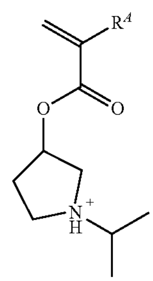
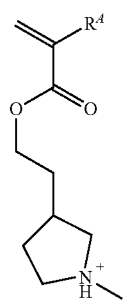
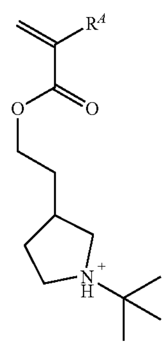
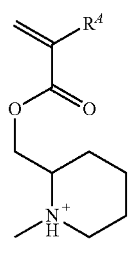
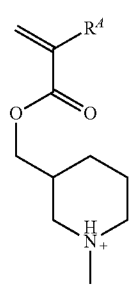
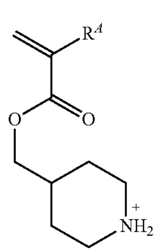
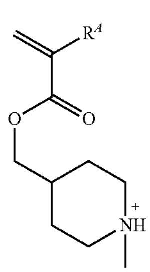

-continued
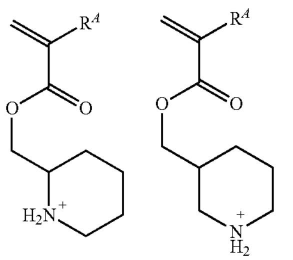
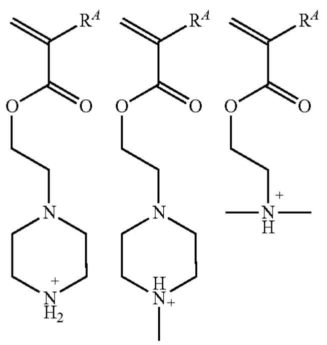
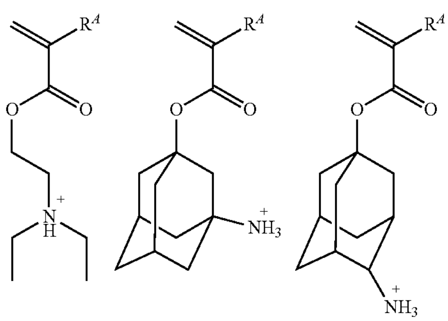
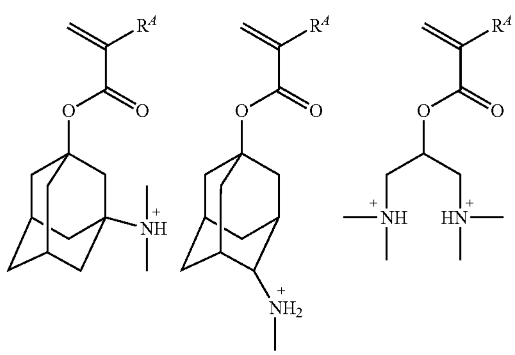
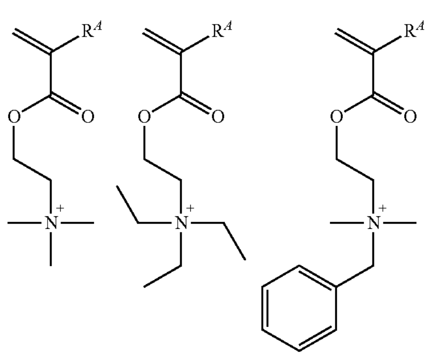
-continued
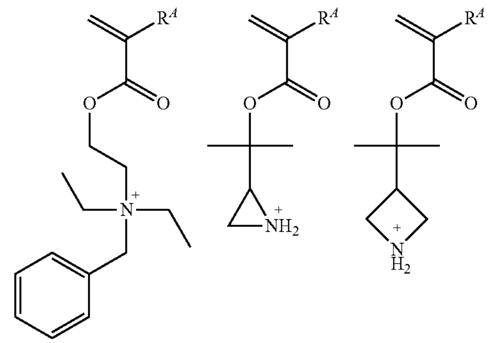
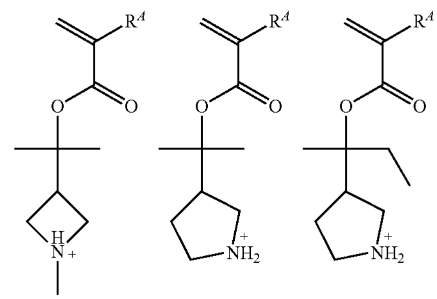
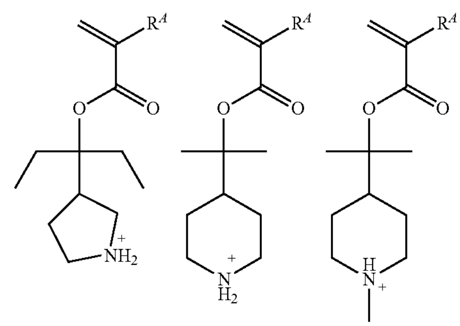
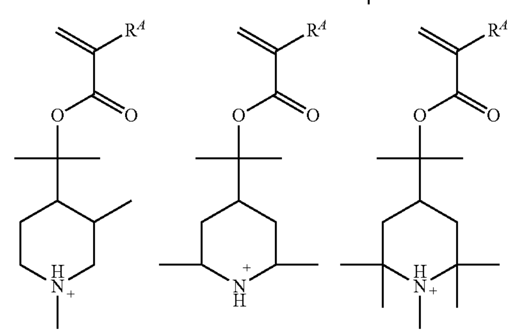
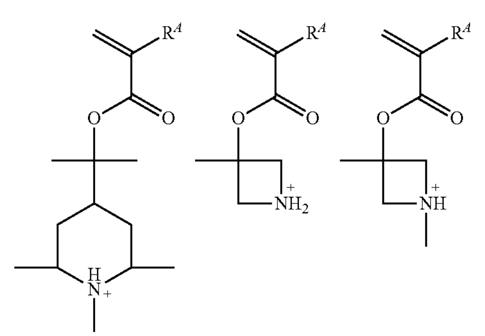

-continued
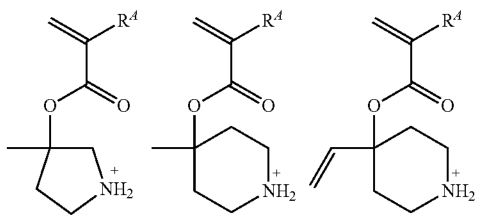
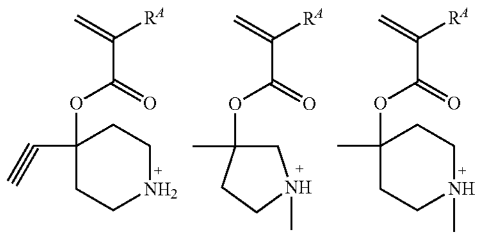
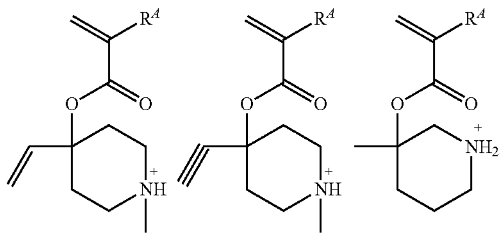
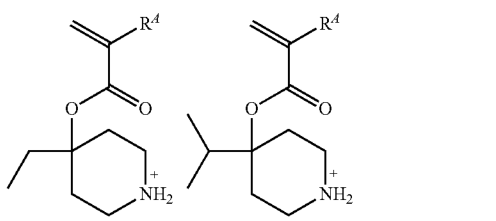
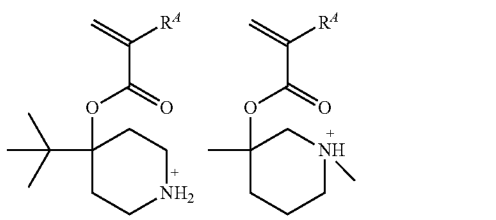
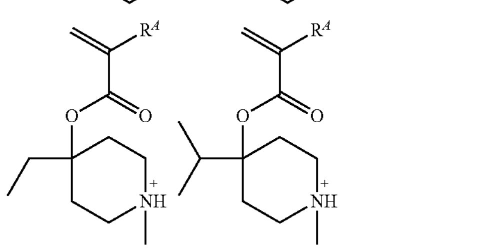
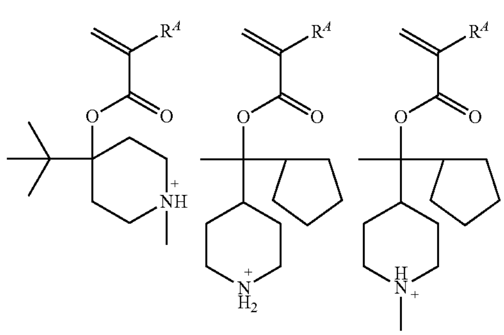
-continued
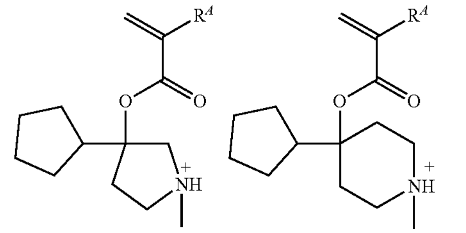
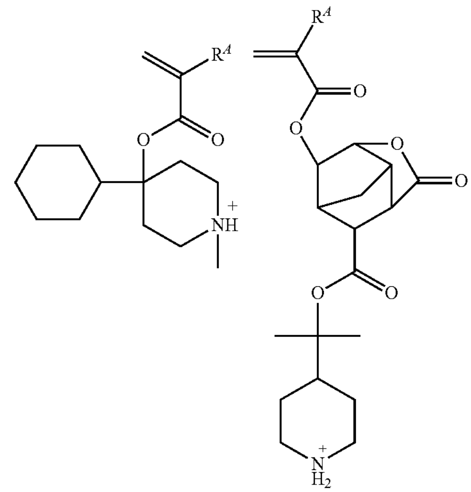
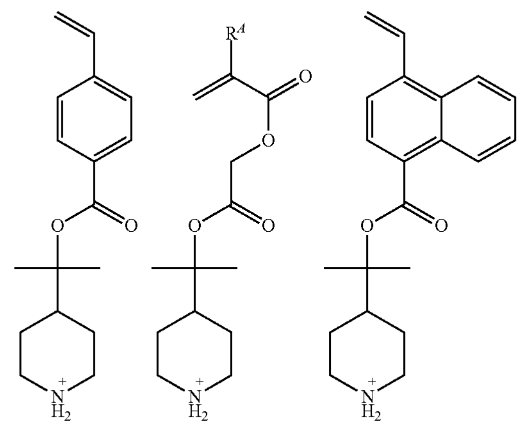
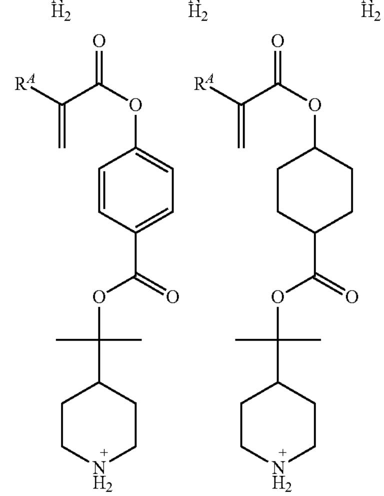
In formula (AU), $X^-$ is a carboxylic acid anion containing fluorine, but not iodine and bromine, a sulfonamide anion containing fluorine, but not iodine and bromine, a phenoxide anion containing fluorine, but not iodine and bromine, or an enolate anion of β-diketone containing fluorine, but not iodine and bromine.

The carboxylic acid anion preferably has the following formula (an-1). The sulfonamide anion preferably has the following formula (an-2). The phenoxide anion preferably has the following formula (an-3). The enolate anion of β-diketone preferably has the following formula (an-4).

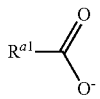

(an-1)

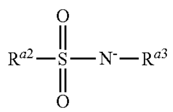

(an-2)

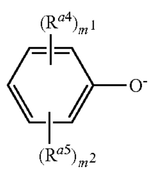

(an-3)

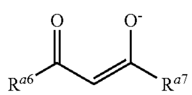

(an-4)

In formula (an-1), $R^{a1}$ is fluorine, a $C_1$-$C_{30}$ fluorinated hydrocarbyl group or $C_2$-$C_{30}$ fluorinated heteroaryl group. The fluorinated hydrocarbyl and fluorinated heteroaryl groups may contain a hydroxy moiety, amino moiety, nitro moiety, ether bond, ester bond or thiol moiety.

The fluorinated hydrocarbyl group represented by $R^{a1}$ is a hydrocarbyl group in which some or all of the hydrogen atoms are substituted by fluorine atoms while it may be saturated or unsaturated and straight, branched or cyclic. Examples of the hydrocarbyl group are as will be exemplified later for the hydrocarbyl group $R^{111}$ in formula (1A'). The fluorinated heteroaryl group represented by $R^{a1}$ is a heteroaryl group in which some or all of the hydrogen atoms are substituted by fluorine atoms. Exemplary heteroaryl groups include pyridyl and methylpyridyl.

In formula (an-2), $R^{a2}$ is fluorine or a $C_1$-$C_{10}$ fluorinated hydrocarbyl group which may contain a hydroxy moiety, ether bond, ester bond, amide bond or thiol moiety. The fluorinated hydrocarbyl group represented by $R^{a2}$ is a hydrocarbyl group in which some or all of the hydrogen atoms are substituted by fluorine atoms while it may be saturated or unsaturated and straight, branched or cyclic. Examples of the hydrocarbyl group are as will be exemplified later for the hydrocarbyl group $R^{111}$ in formula (1A'), but of 1 to 10 carbon atoms.

In formula (an-2), $R^{a3}$ is hydrogen or a $C_1$-$C_{10}$ hydrocarbyl group which may contain a hydroxy moiety, ether bond or ester bond. The hydrocarbyl group represented by $R^{a3}$ may be saturated or unsaturated and straight, branched or cyclic. Examples thereof include $C_1$-$C_{10}$ alkyl groups, $C_3$-$C_{10}$ cyclic saturated hydrocarbyl groups, $C_2$-$C_{10}$ alkenyl groups, $C_2$-$C_{10}$ alkynyl groups, $C_2$-$C_{10}$ cyclic unsaturated hydrocarbyl groups, $C_6$-$C_{10}$ aryl groups, $C_6$-$C_{10}$ aralkyl groups, and combinations thereof.

In formula (an-3), $m^1$ is an integer of 1 to 5, and $m^2$ is an integer of 0 to 3, meeting $1 \le m^1+m^2 \le 5$.

$R^{a4}$ is fluorine, trifluoromethyl or 1,1,1,3,3,3-hexafluoro-2-propanol.

$R^{a5}$ is a hydroxy group, optionally halogenated $C_1$-$C_6$ saturated hydrocarbyl group, optionally halogenated $C_1$-$C_6$ saturated hydrocarbyloxy group, optionally halogenated $C_2$-$C_7$ saturated hydrocarbylcarbonyl group, optionally halogenated $C_2$-$C_7$ saturated hydrocarbylcarbonyloxy group, optionally halogenated $C_2$-$C_7$ saturated hydrocarbyloxycarbonyl group, optionally halogenated $C_1$-$C_4$ saturated hydrocarbylsulfonyloxy group, chlorine, bromine, amino group, nitro group, cyano group, —N($R^{a5A}$)—C(═O)—$R^{a5B}$, or —N($R^{a5A}$)—C(═O)—O—$R^{a5B}$. $R^{a5A}$ is hydrogen or a $C_1$-$C_6$ saturated hydrocarbyl group. $R^{5B}$ is a $C_1$-$C_6$ saturated hydrocarbyl group or $C_2$-$C_8$ unsaturated aliphatic hydrocarbyl group.

The $C_1$-$C_6$ saturated hydrocarbyl group represented by $R^5$, $R^{a5A}$ and $R^{a5B}$ may be straight, branched or cyclic and examples thereof include $C_1$-$C_6$ alkyl groups such as methyl, ethyl, n-propyl, isopropyl, n-butyl, isobutyl, sec-butyl, tert-butyl, n-pentyl, and n-hexyl, and $C_3$-$C_6$ cycloalkyl groups such as cyclopropyl, cyclobutyl, cyclopentyl and cyclohexyl. Examples of the saturated hydrocarbyl moiety in the $C_1$-$C_6$ saturated hydrocarbyloxy group, $C_2$-$C_7$ saturated hydrocarbylcarbonyl group, $C_2$-$C_7$ saturated hydrocarbylcarbonyloxy group and $C_2$-$C_7$ saturated hydrocarbyloxycarbonyl group are as exemplified above for the saturated hydrocarbyl group. Examples of the saturated hydrocarbyl moiety in the $C_1$-$C_4$ saturated hydrocarbylsulfonyloxy group are as exemplified above for the saturated hydrocarbyl group, but of 1 to 4 carbon atoms.

The $C_2$-$C_8$ unsaturated aliphatic hydrocarbyl group represented by $R^{a5B}$ may be straight, branched or cyclic and examples thereof include $C_2$-$C_8$ alkenyl groups such as vinyl, 1-propenyl, 2-propenyl, butenyl and hexenyl, and $C_3$-$C_8$ cyclic unsaturated aliphatic hydrocarbyl groups such as cyclohexenyl.

In formula (an-4), $R^{a6}$ is a $C_1$-$C_{10}$ fluorinated hydrocarbyl group, $C_1$-$C_{10}$ hydrocarbyl group or $C_2$-$C_{10}$ heteroaryl group. $R^{a7}$ is a $C_1$-$C_{10}$ fluorinated hydrocarbyl group.

The fluorinated hydrocarbyl group represented by $R^6$ and $R^{a7}$ is a hydrocarbyl group in which some or all of the hydrogen atoms are substituted by fluorine atoms while it may be saturated or unsaturated and straight, branched or cyclic. Examples of the hydrocarbyl group are as will be exemplified later for the hydrocarbyl group $R^{111}$ in formula (1A'), but of 1 to 10 carbon atoms. Of the hydrocarbyl groups, $C_1$-$C_{10}$ saturated hydrocarbyl groups and $C_6$-$C_{10}$ aryl groups are preferred.

The $C_1$-$C_{10}$ hydrocarbyl group represented by $R^6$ may be saturated or unsaturated and straight, branched or cyclic. Examples of the hydrocarbyl group are as will be exemplified later for the hydrocarbyl group $R^{111}$ in formula (1A'), but of 1 to 10 carbon atoms. Of the hydrocarbyl groups, $C_1$-$C_{10}$ saturated hydrocarbyl groups and $C_6$-$C_{10}$ aryl groups are preferred.

Exemplary of the $C_2$-$C_{10}$ heteroaryl group represented by $R^{a6}$ are thienyl and furyl.

Examples of the carboxylic acid anion containing fluorine, but not iodine and bromine are shown below, but not limited thereto.

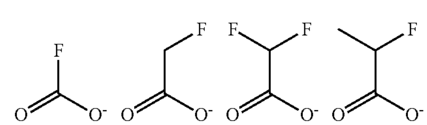

-continued
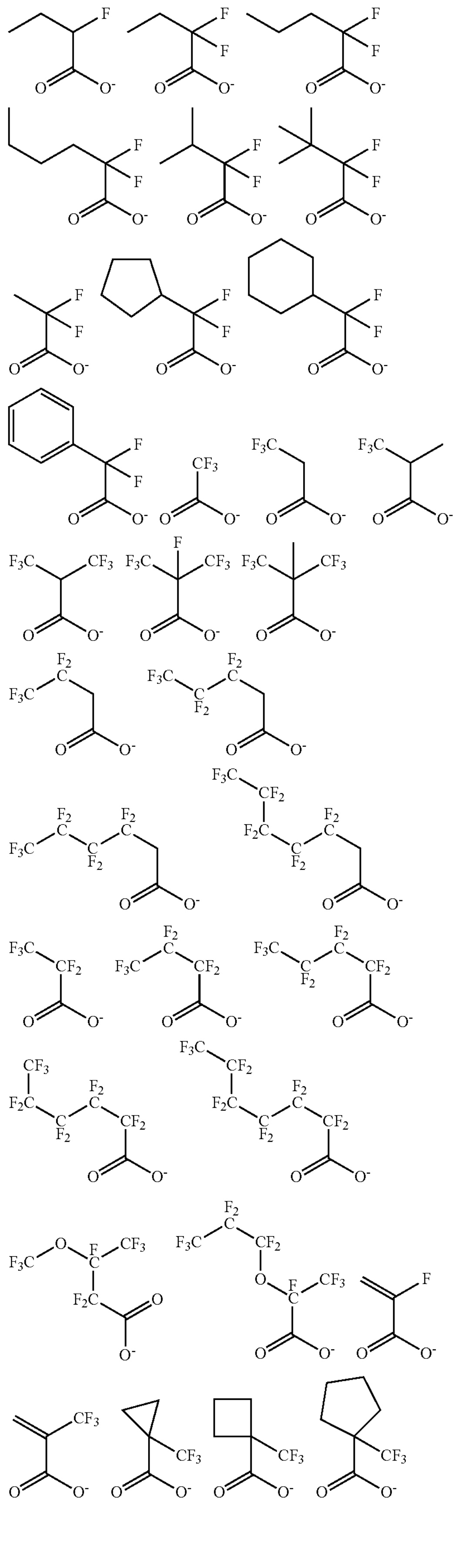
-continued
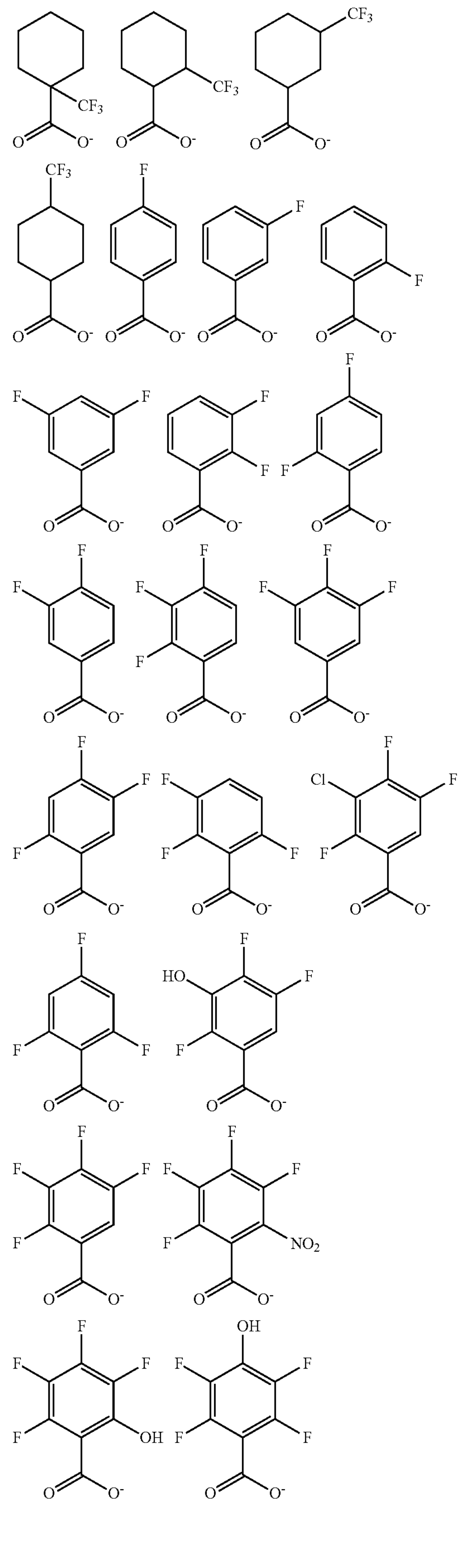

-continued
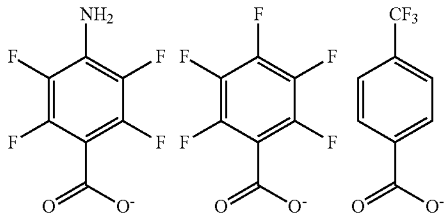
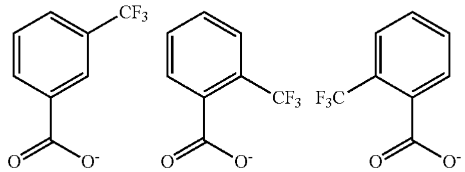
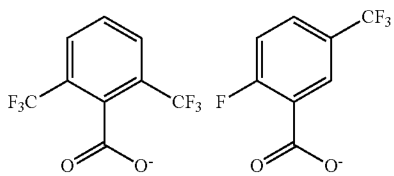
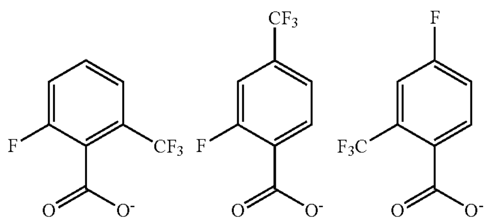
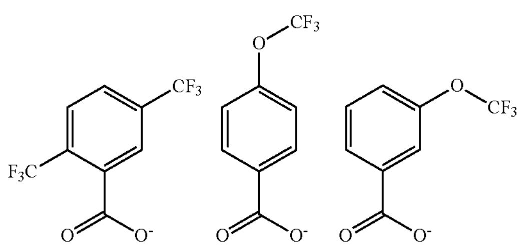
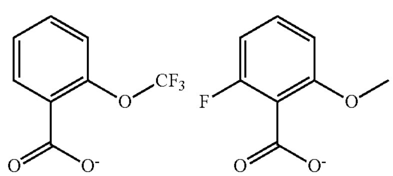
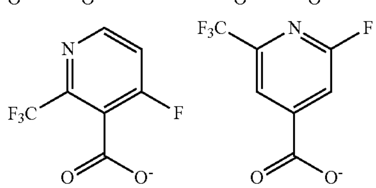
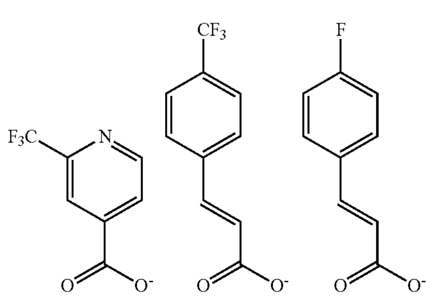
-continued
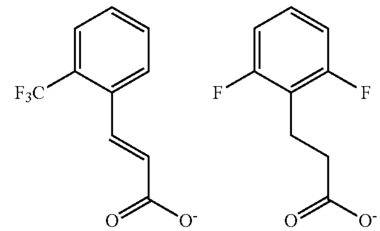
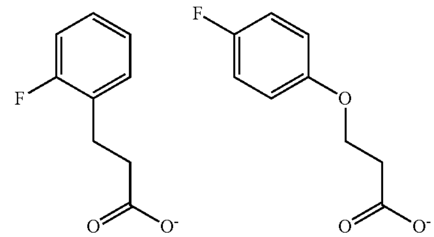
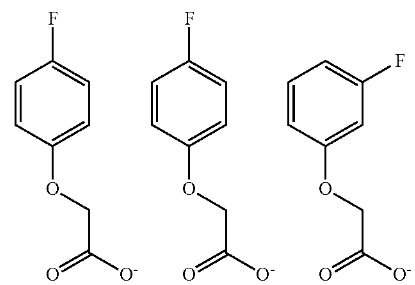
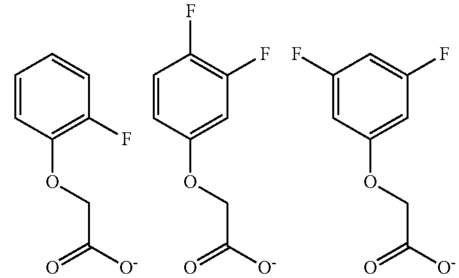
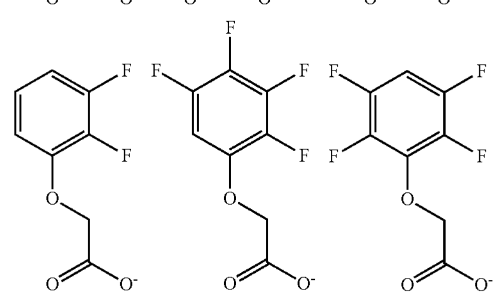
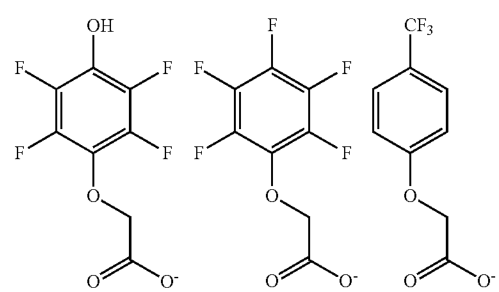

-continued
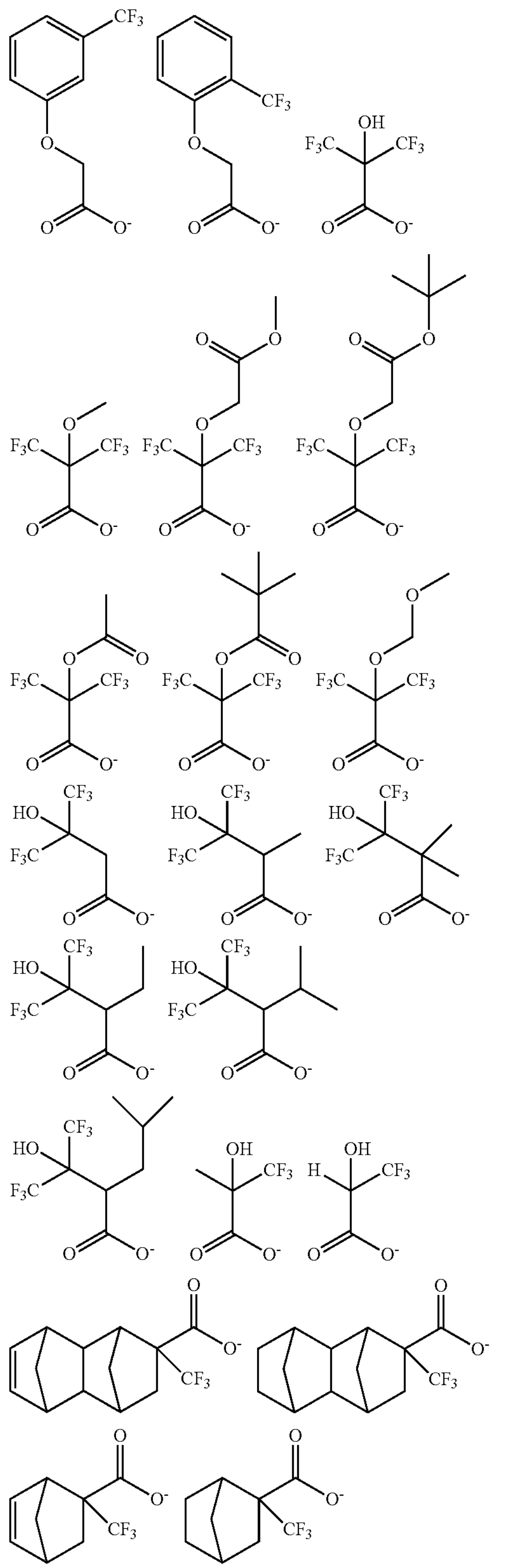
Examples of the sulfonamide anion containing fluorine, but not iodine and bromine are shown below, but not limited thereto.
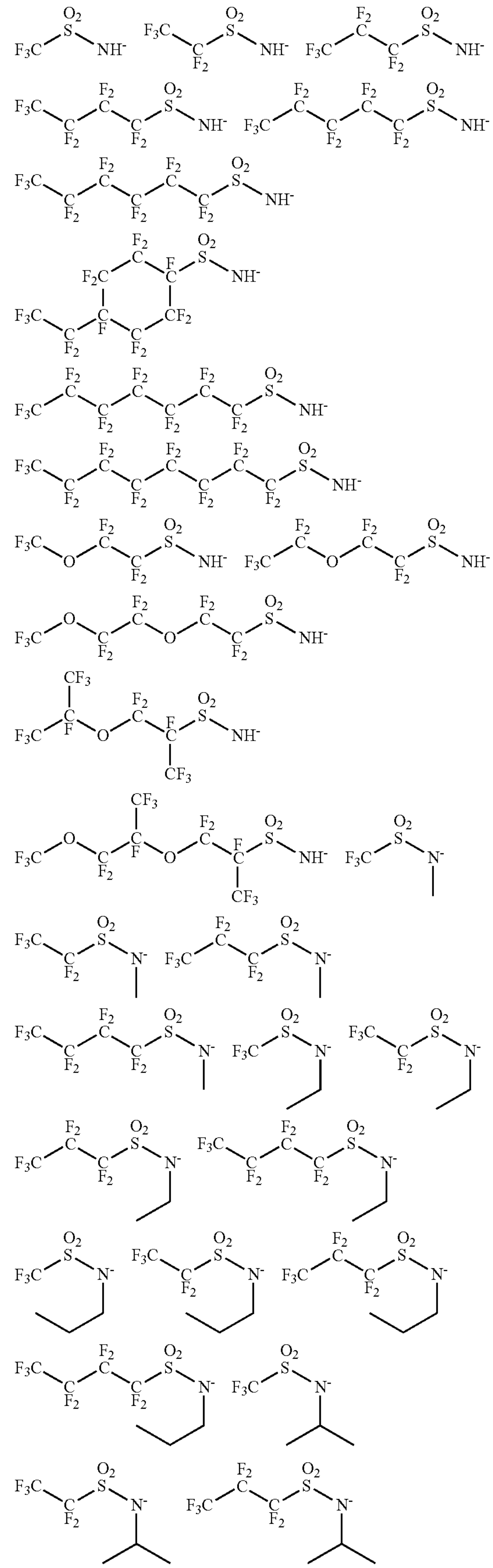

-continued
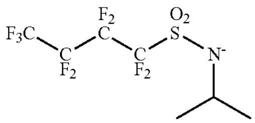
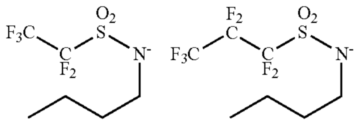
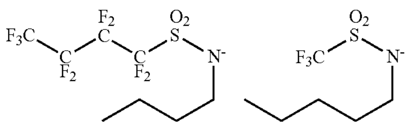
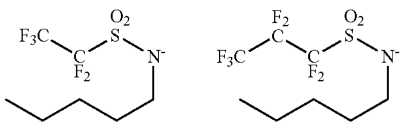
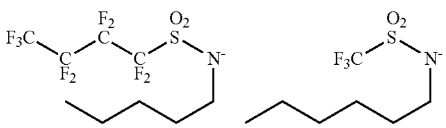
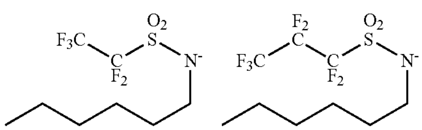
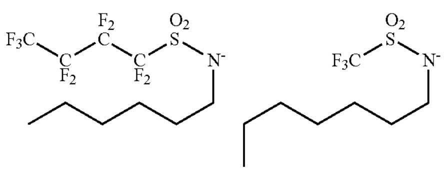
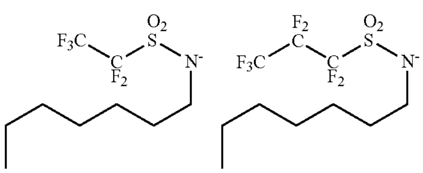
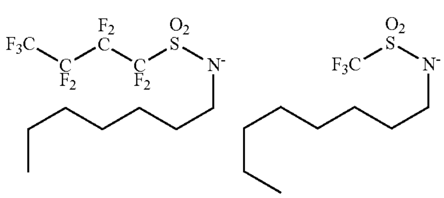
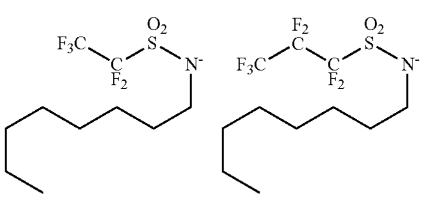
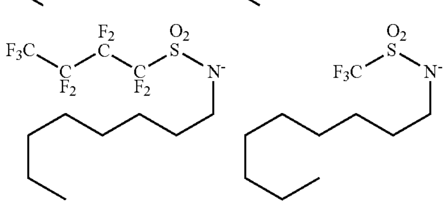
-continued
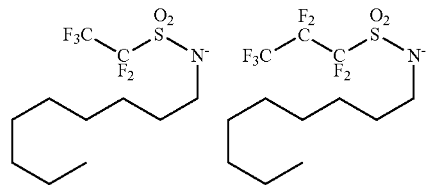
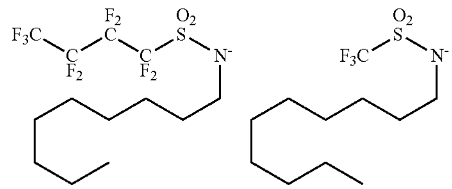
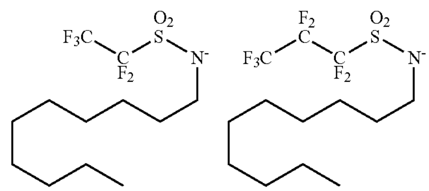
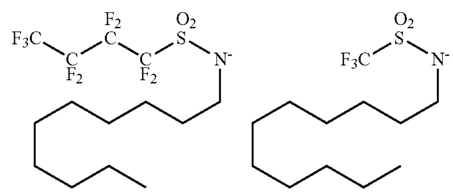
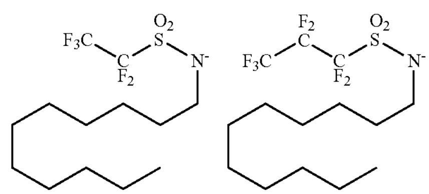
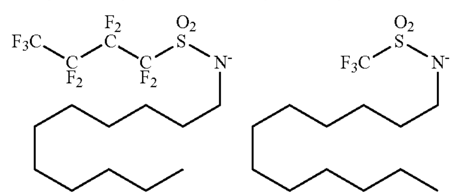
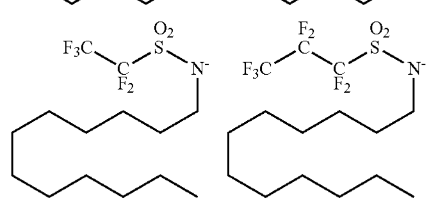
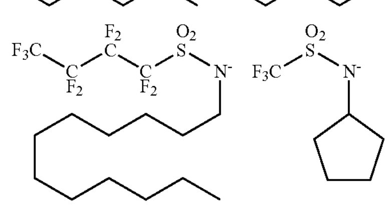
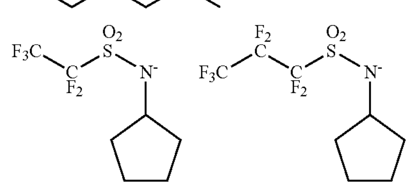

-continued
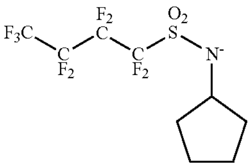
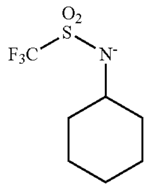
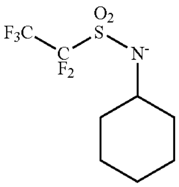
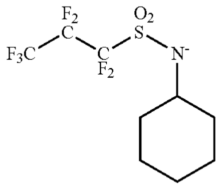
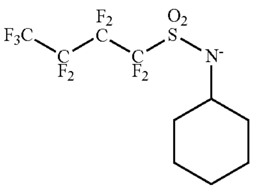
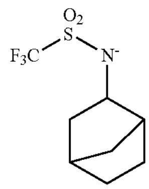
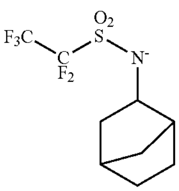
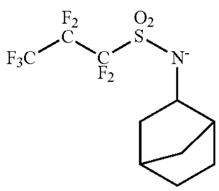
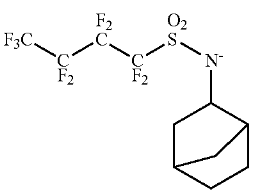
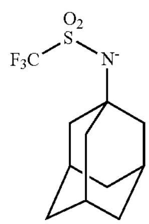
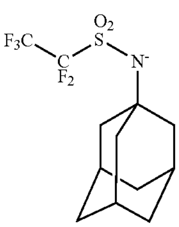
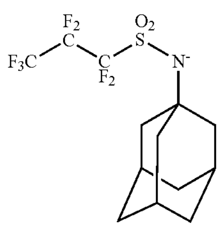
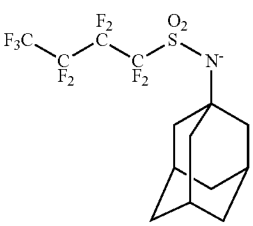
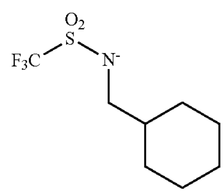
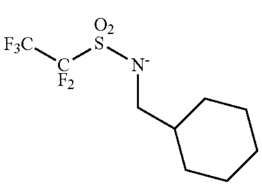
-continued
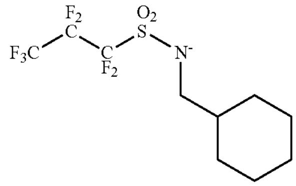
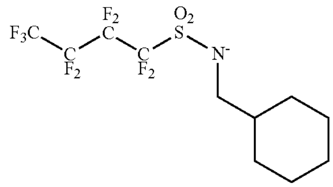
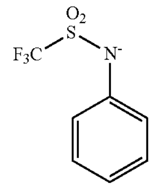
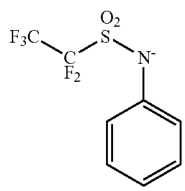
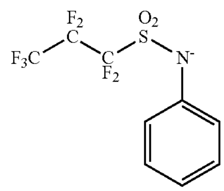
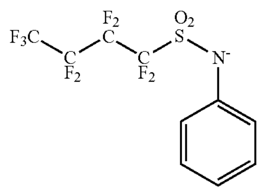
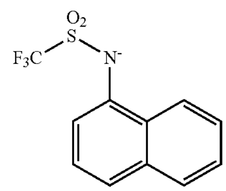
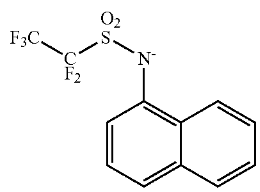
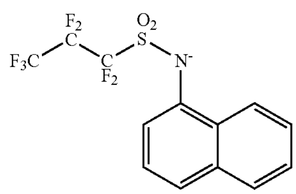
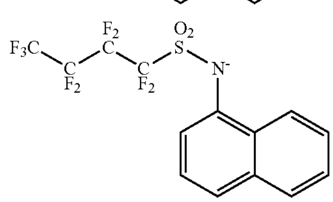
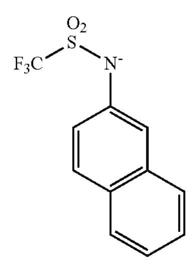
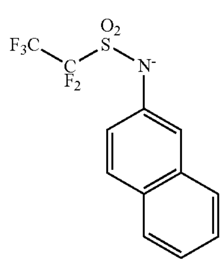
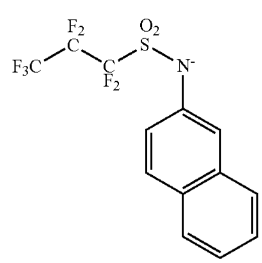

-continued
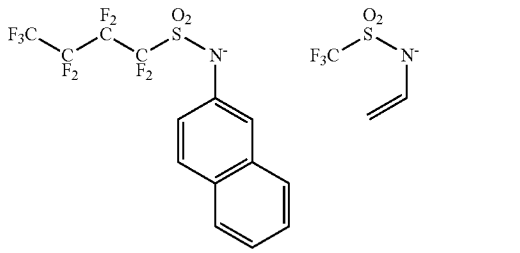
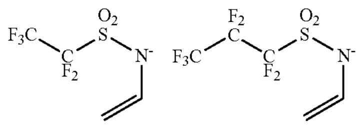
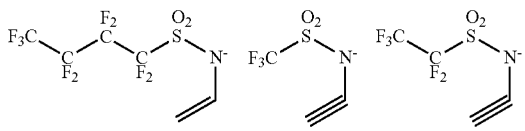
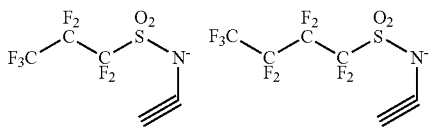
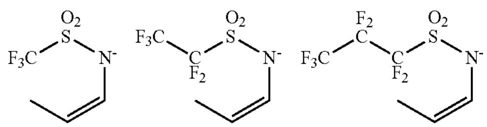
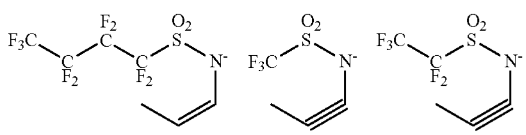
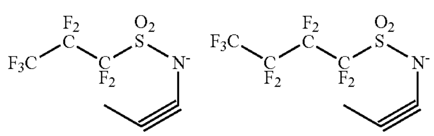
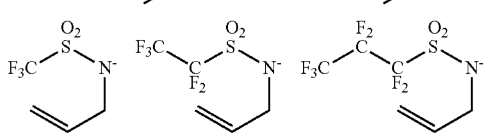
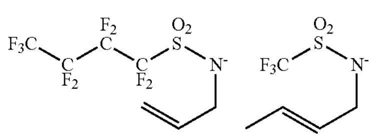
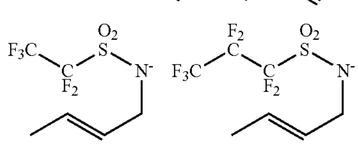
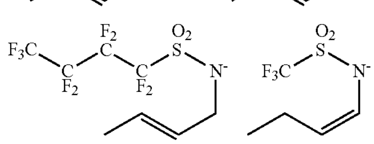
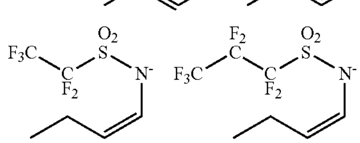
-continued
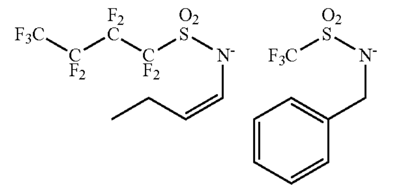
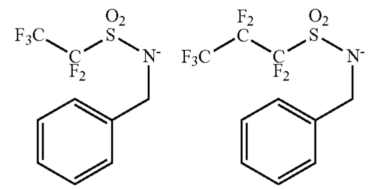
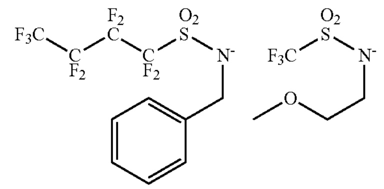
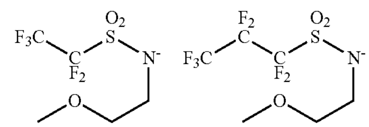
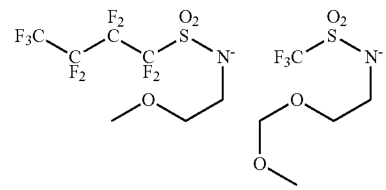
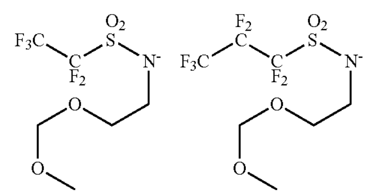
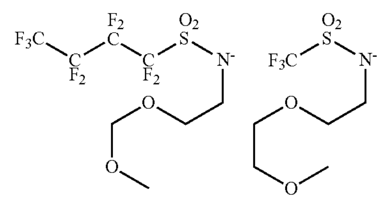
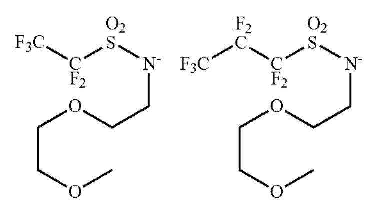
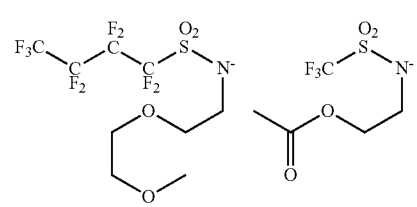

-continued
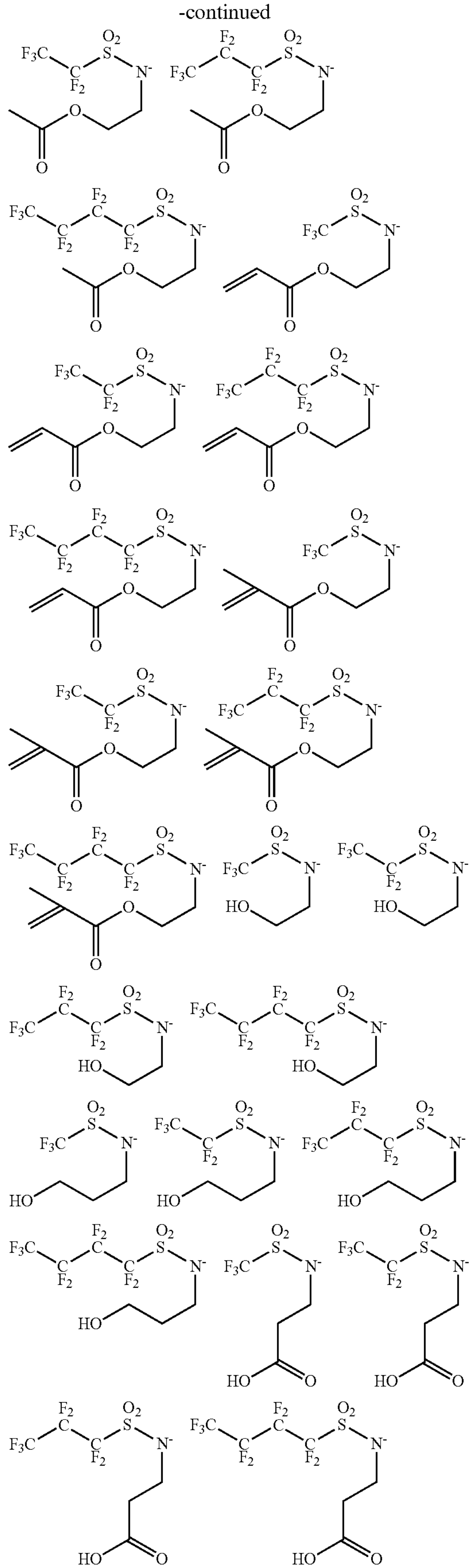
-continued
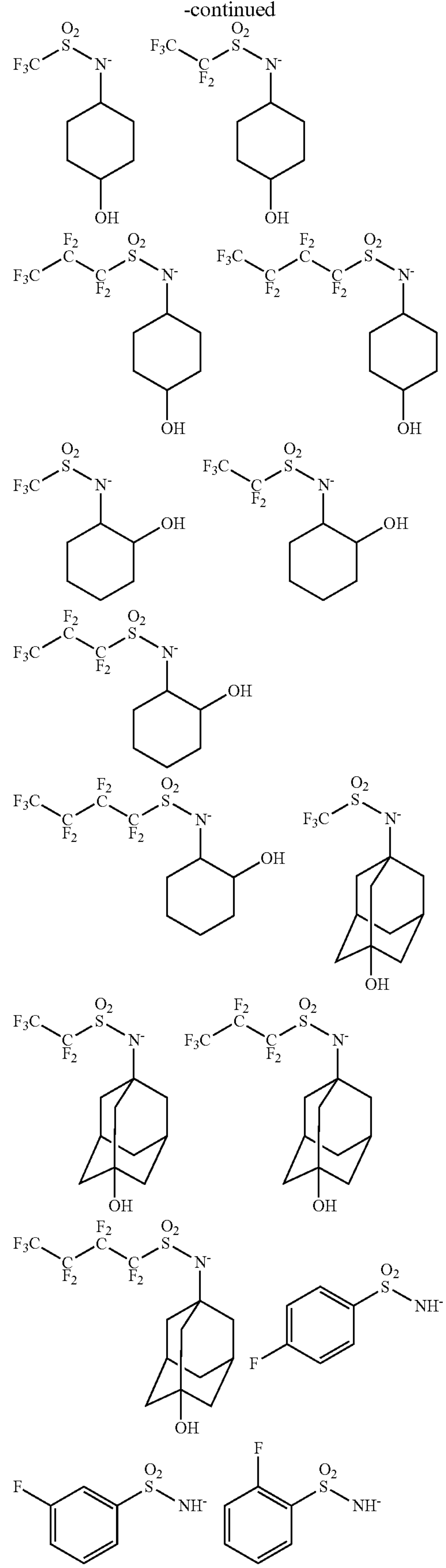

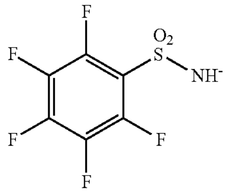
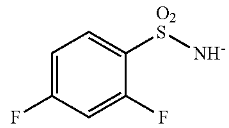
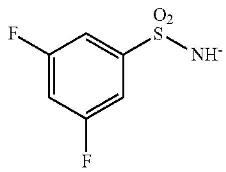
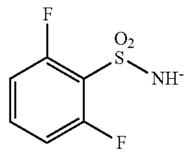
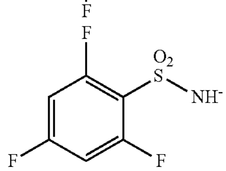
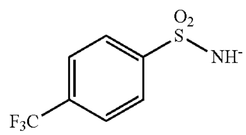
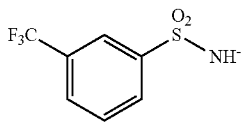
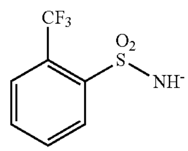
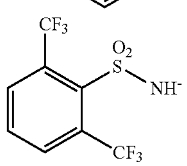
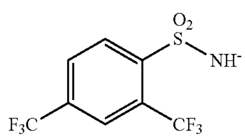
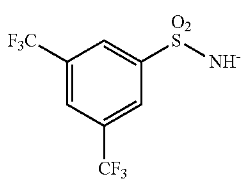
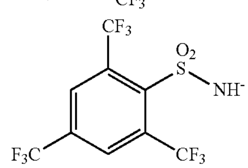
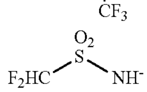
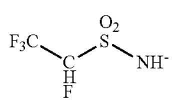
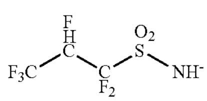
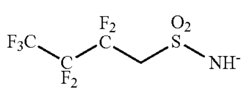
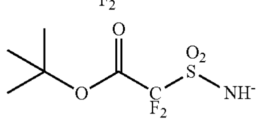
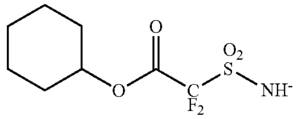
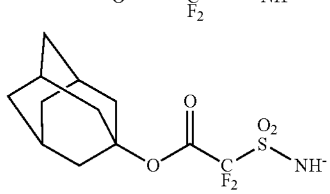
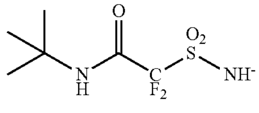
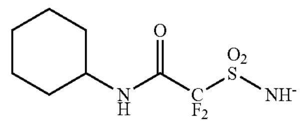
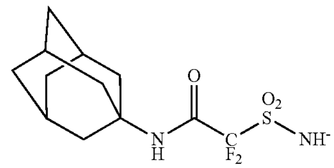
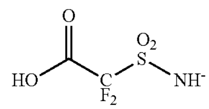
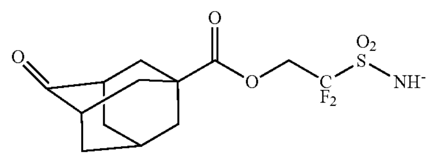
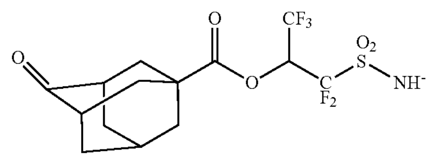
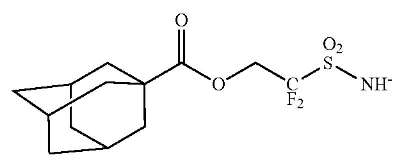
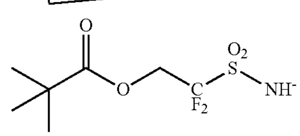
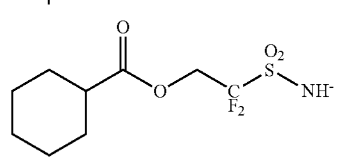
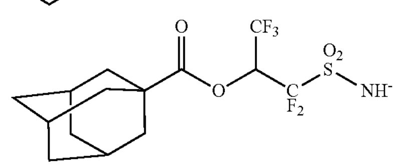
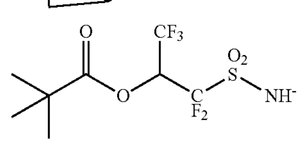
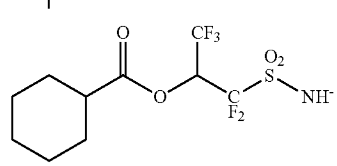
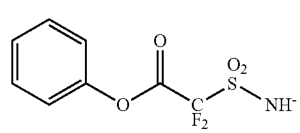

-continued
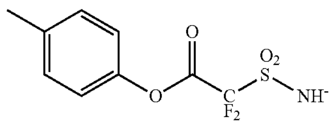
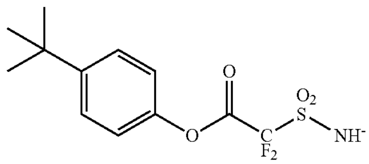
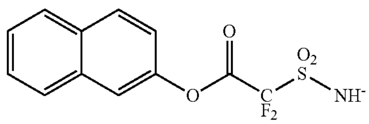
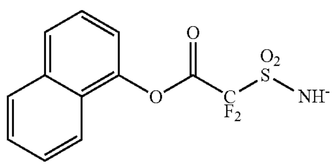
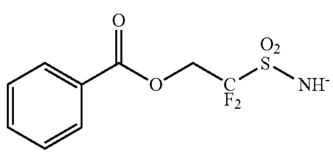
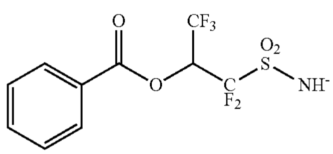
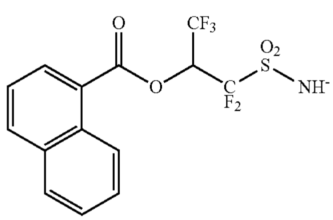
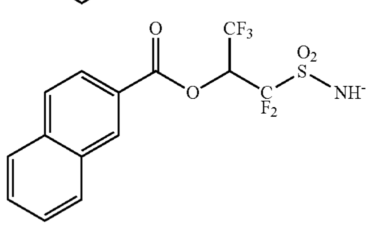
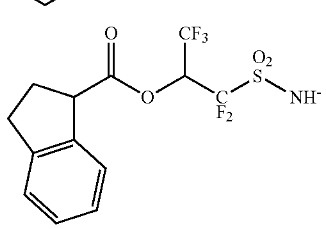
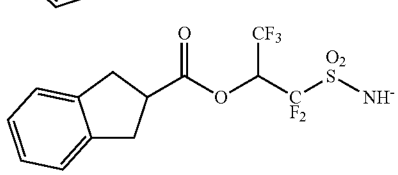
-continued
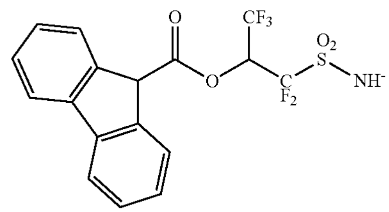
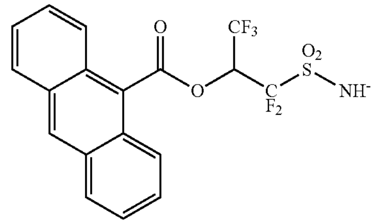
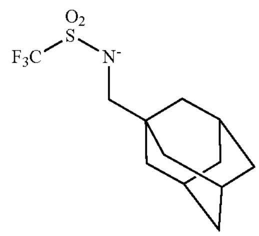
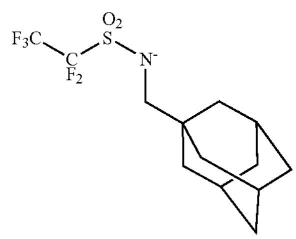
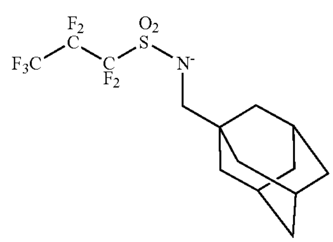
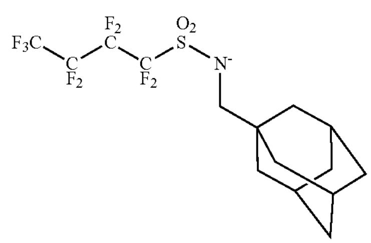
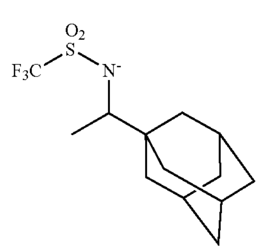

-continued
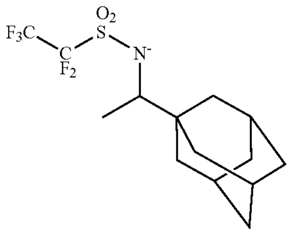
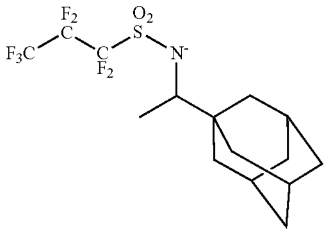
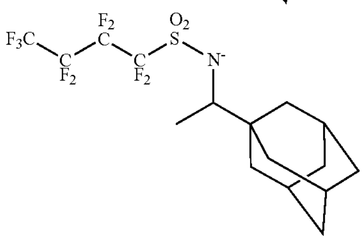
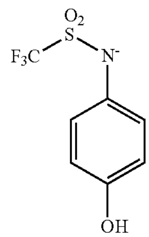
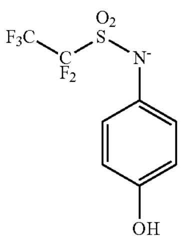
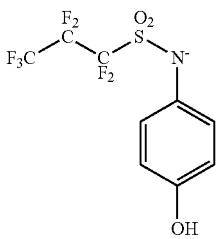
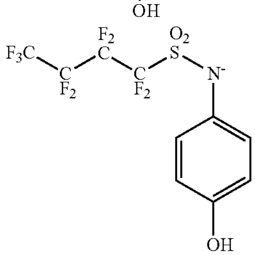
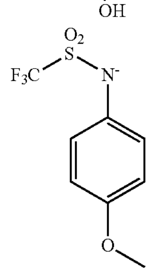
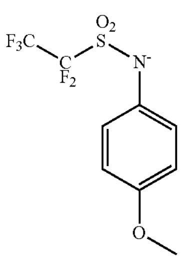
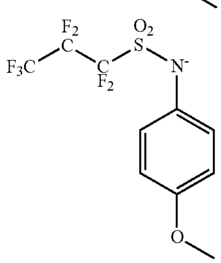
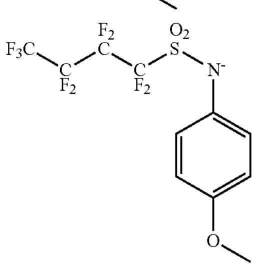
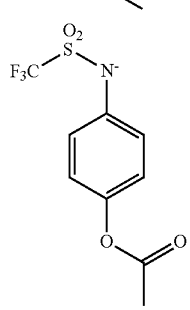
-continued
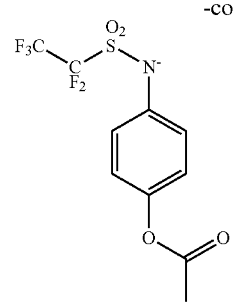
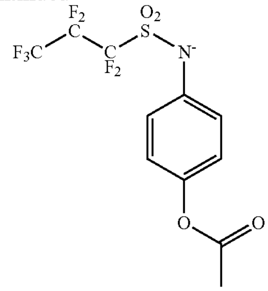
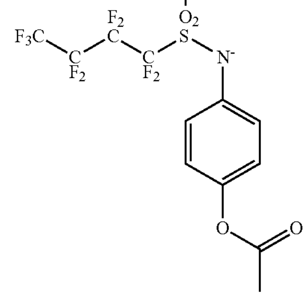
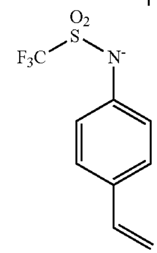
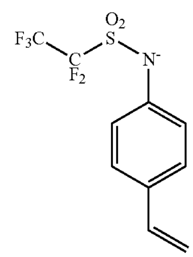
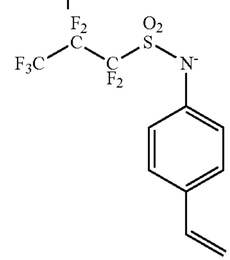
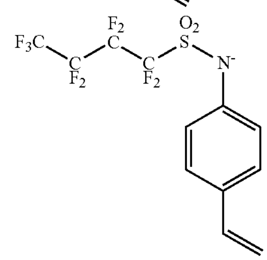
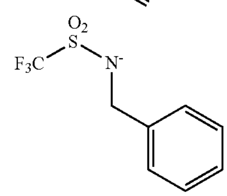
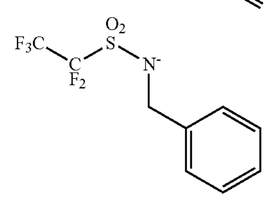
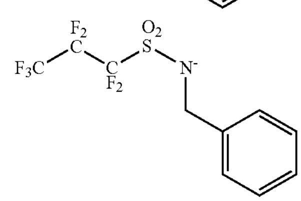
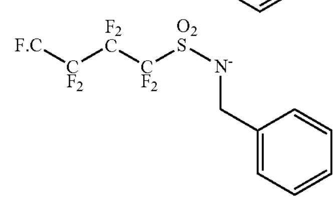
Examples of the phenoxide anion containing fluorine, but not iodine and bromine are shown below, but not limited thereto.

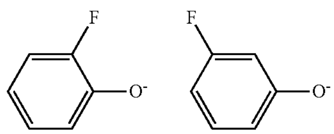
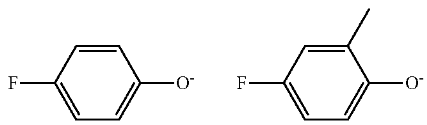
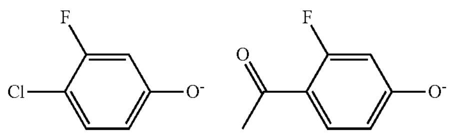
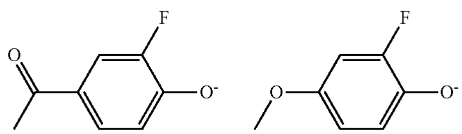
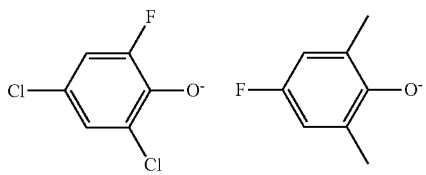
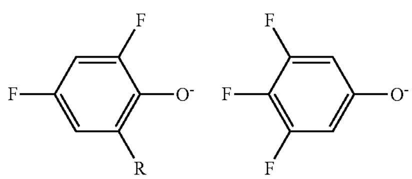
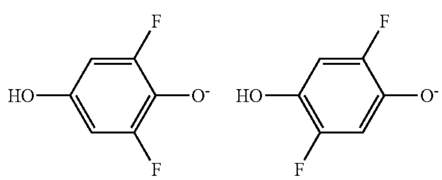
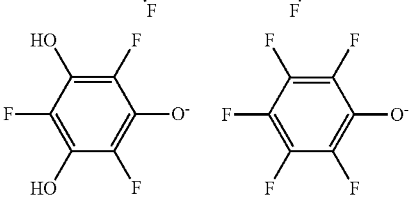
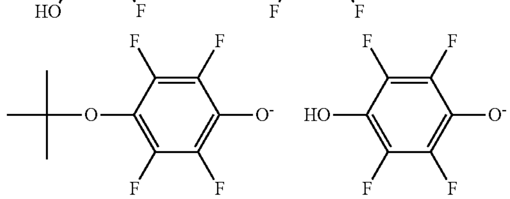
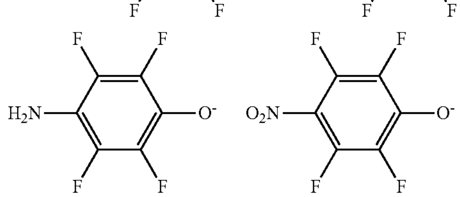
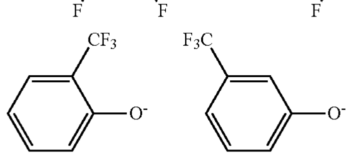
-continued
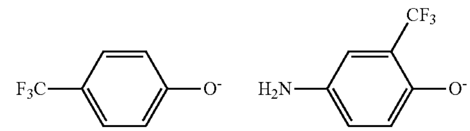
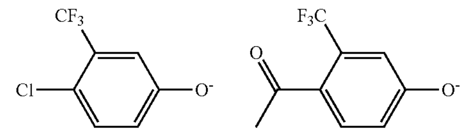
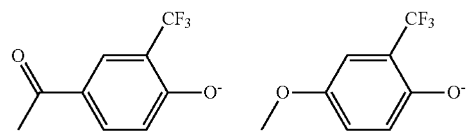
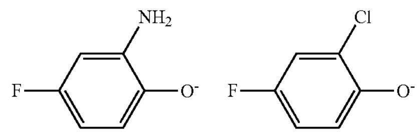
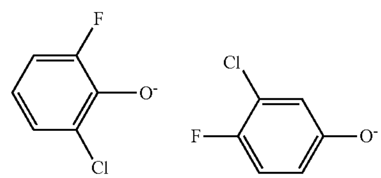
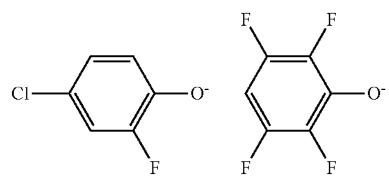
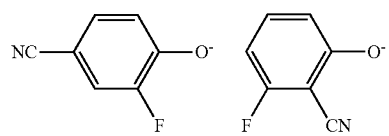
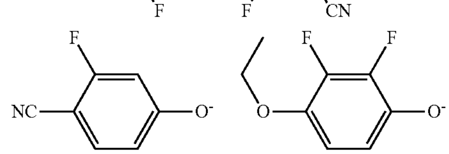
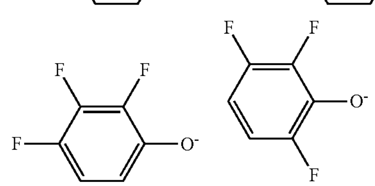
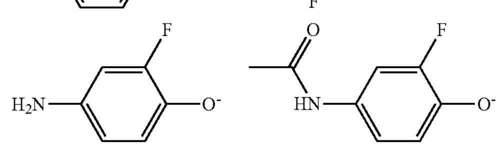
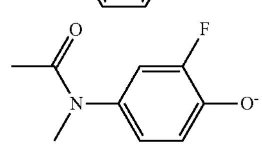
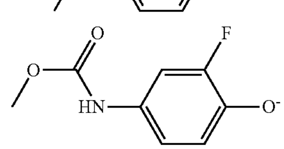

-continued

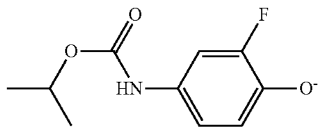

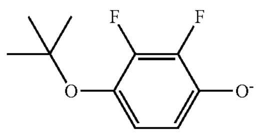

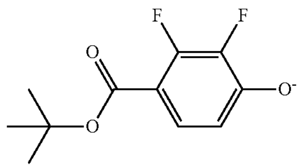

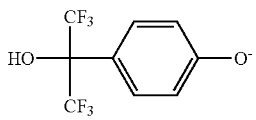

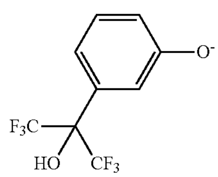

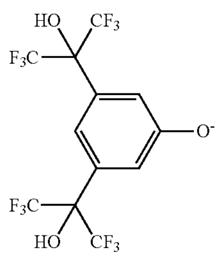

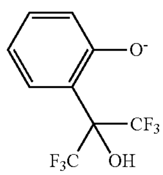

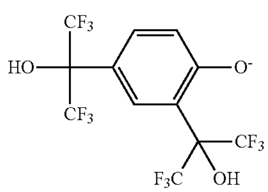

Examples of the enolate anion of β-diketone containing fluorine, but not iodine and bromine are shown below, but not limited thereto.

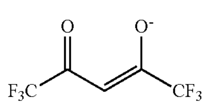

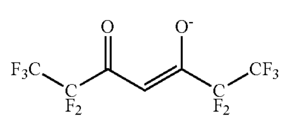

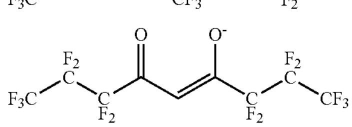

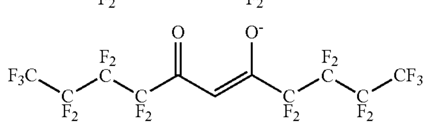

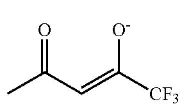

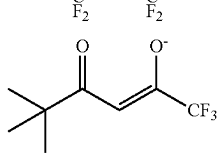

-continued

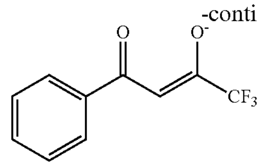

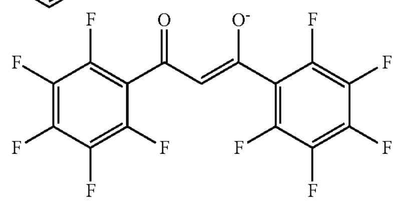

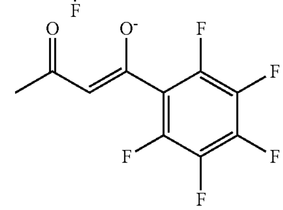

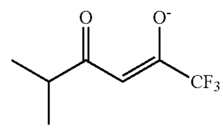

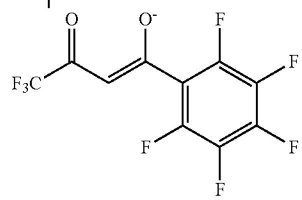

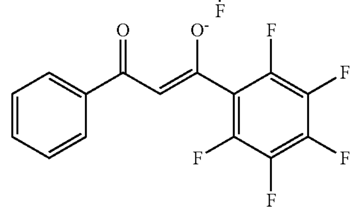

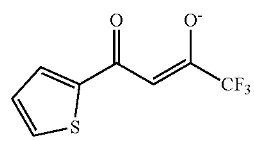

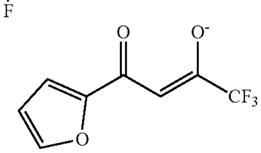

The monomer from which repeat units AU are derived is a polymerizable ammonium salt type monomer. This ammonium salt type monomer may be obtained via neutralization reaction of a monomer which is an amine compound of the structure that one hydrogen atom bonded to the nitrogen atom in the cation of the repeat unit AU is removed with a carboxylic acid containing fluorine, but not iodine and bromine, a sulfonamide containing fluorine, but not iodine and bromine, a phenol compound containing fluorine, but not iodine and bromine, or a β-diketone containing fluorine, but not iodine and bromine.

The repeat unit AU is formed via polymerization reaction of the ammonium salt type monomer. The repeat unit AU may also be formed by performing polymerization reaction of the monomer in the form of the amine compound, adding the carboxylic acid containing fluorine, but not iodine and bromine, the sulfonamide containing fluorine, but not iodine and bromine, the phenol compound containing fluorine, but not iodine and bromine, or the β-diketone containing fluorine, but not iodine and bromine to the resulting reaction solution or a solution containing the purified polymer, and performing neutralization reaction.

Although the neutralization reaction is ideally performed under the conditions that the amino group on the amine compound and the carboxylic acid containing fluorine, but not iodine and bromine, the sulfonamide containing fluorine, but not iodine and bromine, the phenol compound containing fluorine, but not iodine and bromine, or the β-diketone containing fluorine, but not iodine and bromine are in a stoichiometric ratio (molar ratio) of 1:1, it is acceptable that the carboxylic acid, sulfonamide, phenol compound or β-diketone is in excess or short relative to the amino group.

The repeat units FU-1 and FU-2 preferably have the following formulae (FU-1) and (FU-2), respectively.

(FU-1)

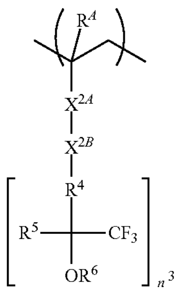

(FU-2)

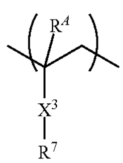

In formula (FU-1), $n^3$ is 1 or 2.

In formulae (FU-1) and (FU-2), $R^A$ is each independently hydrogen or methyl.

In formula (FU-1), $X^{2A}$ is a single bond, phenylene, —O—, —C(═O)—O— or —C(═O)—NH—. $X^{2B}$ is a $C_1$-$C_{12}$ ($n^3$+1)-valent saturated hydrocarbon group or ($n^3$+1)-valent aromatic hydrocarbon group, which may contain fluorine, hydroxy moiety, ester bond or ether bond.

The $C_1$-$C_{12}$ ($n^3$+1)-valent saturated hydrocarbon group represented by $X^{2B}$ may be straight, branched or cyclic and examples thereof include groups obtained by removing ($n^3$+1) number of hydrogen atoms from saturated hydrocarbons such as methane, ethane, propane, butane, pentane, hexane, heptane, octane, nonane, decane, undecane, dodecane, cyclopropane, cyclobutane, cyclopentane, cyclohexane, methylcyclopentane, ethylcyclopentane, methylcyclohexane, ethylcyclohexane, 1-propylcyclohexane, isopropylcyclohexane, norbornane, adamantane, methylnorbornane, ethylnorbornane, methyladamantane, ethyladamantane, and tetrahydrodicyclopentadiene. Examples of the ($n^3$+1)-valent aromatic hydrocarbon group represented by $X^{2B}$ include groups obtained by removing ($n^3$+1) number of hydrogen atoms from aromatic hydrocarbons such as benzene, toluene, xylene, ethylbenzene, 1-propylbenzene, isopropylbenzene, and naphthalene.

In formula (FU-2), $X^3$ is a single bond, phenylene, —O—, —C(═O)—O—$X^{31}$—$X^{32}$— or —C(═O)—NH—$X^{31}$—$X^{32}$—. $X^{31}$ is a single bond or $C_1$-$C_4$ alkanediyl group. $X^{32}$ is a single bond, ester bond, ether bond or sulfonamide bond. Examples of the $C_1$-$C_4$ alkanediyl group include methanediyl, ethane-1,1-diyl, ethane-1,2-diyl, propane-1,1-diyl, propane-1,2-diyl, propane-1,3-diyl, propane-2,2-diyl, butane-1,1-diyl, butane-1,2-diyl, butane-1,3-diyl, butane-2,3-diyl, butane-1,4-diyl, and 1,1-dimethylethane-1,2-diyl.

In formula (FU-1), $R^4$ is a single bond, ester bond, or a $C_1$-$C_{12}$ saturated hydrocarbylene group. In the saturated hydrocarbylene group, some or all of the hydrogen atoms may be substituted by fluorine. In the saturated hydrocarbylene group, some carbon may be replaced by an ester bond or ether bond. The saturated hydrocarbylene group may be straight, branched or cyclic.

In formula (FU-1), $R^5$ is hydrogen, fluorine, methyl, trifluoromethyl or difluoromethyl. A pair of $R^4$ and $R^5$ may bond together to form a ring with the carbon atom to which they are attached, and the ring may contain an ether bond, fluorine or trifluoromethyl.

In formula (FU-1), $R^6$ is hydrogen or an acid labile group, examples of which will be described later.

In formula (FU-2), $R^7$ is a $C_1$-$C_{20}$ hydrocarbyl group which is substituted with at least one fluorine, and in which some carbon may be replaced by an ester bond or ether bond. The hydrocarbyl group may be saturated or unsaturated and straight, branched or cyclic, and examples thereof are as will be exemplified later for groups $R^{101}$ to $R^{105}$ in formulae (1-1) and (1-2). Of these, $C_1$-$C_{20}$ saturated hydrocarbyl groups and $C_6$-$C_{20}$ aryl groups are preferred.

Examples of the monomer from which repeat units (FU-1) are derived are shown below, but not limited thereto. Herein $R^A$ and $R^6$ are as defined above.

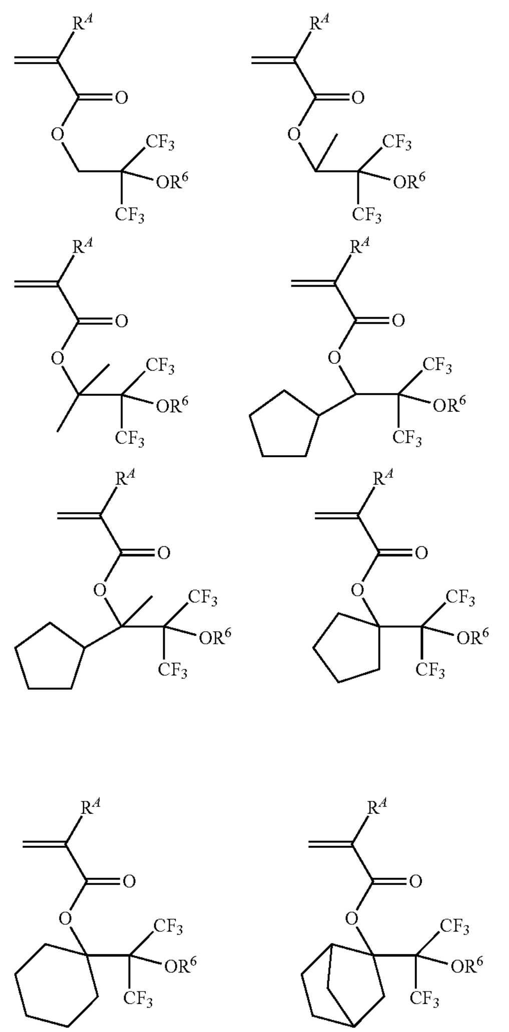

-continued
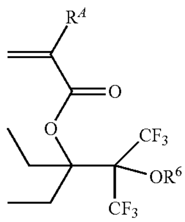
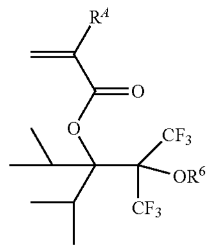
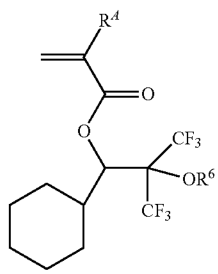
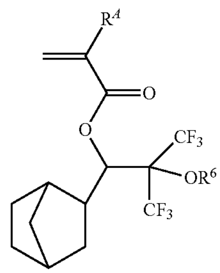
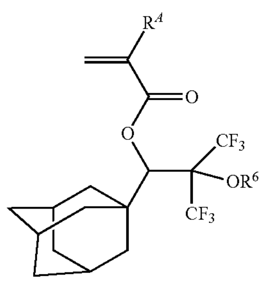
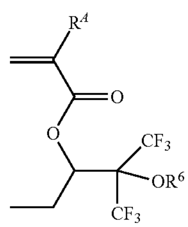
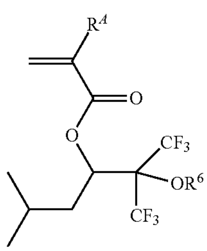
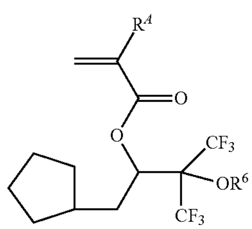
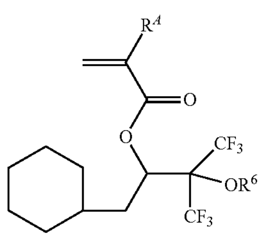
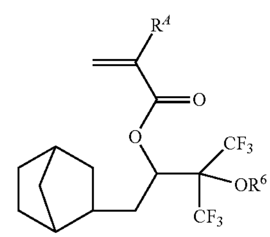
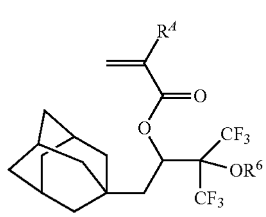
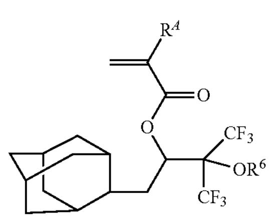
-continued
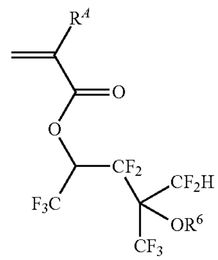
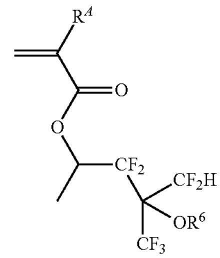
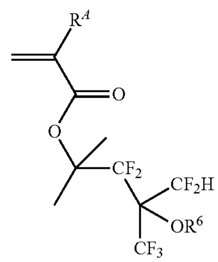
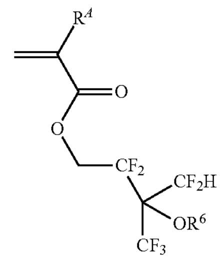
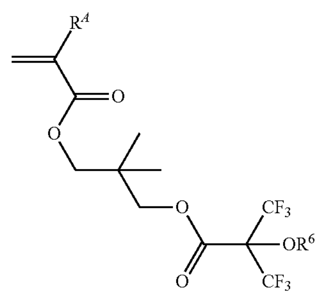
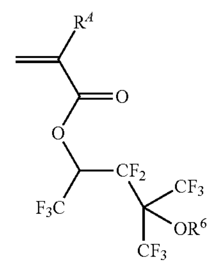
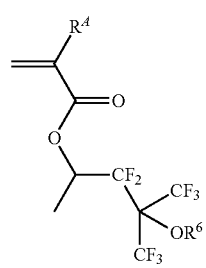
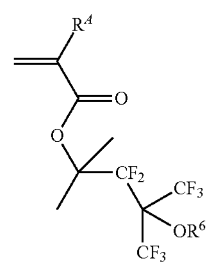
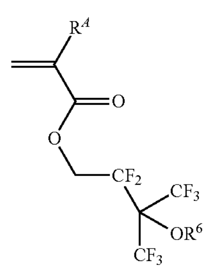
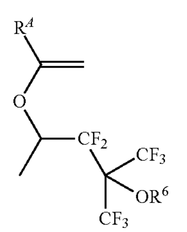
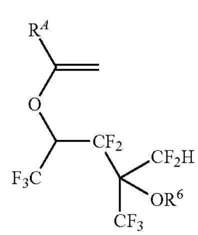
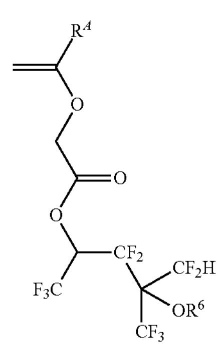

-continued
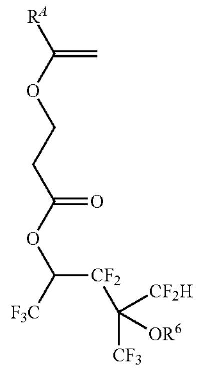
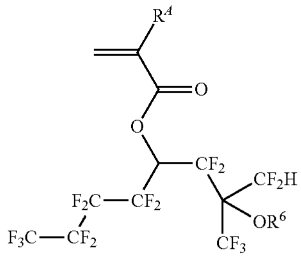
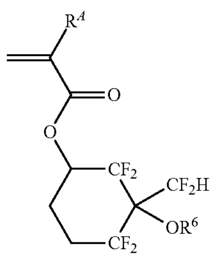
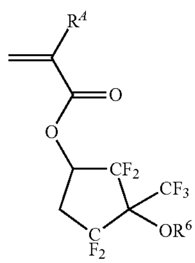
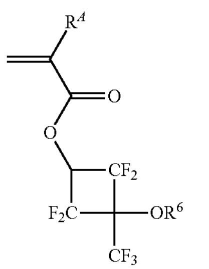
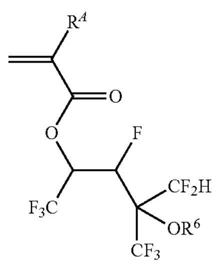
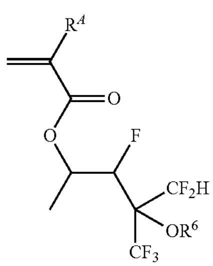
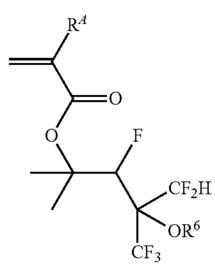
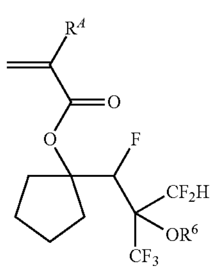
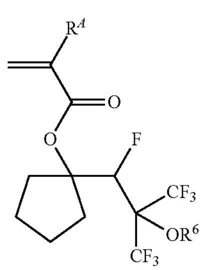
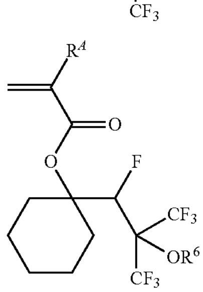
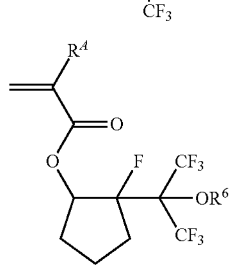
-continued
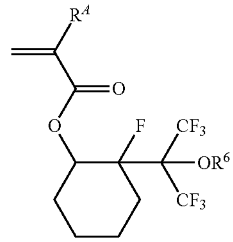
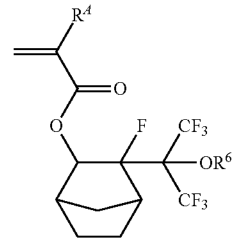
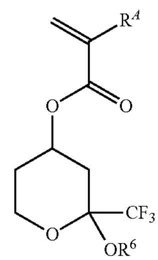
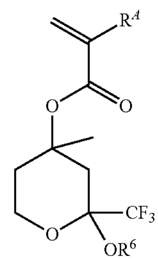
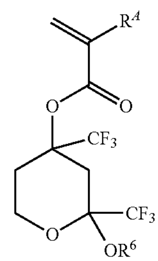
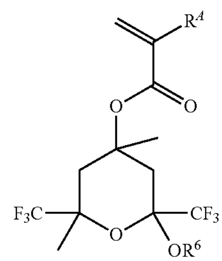
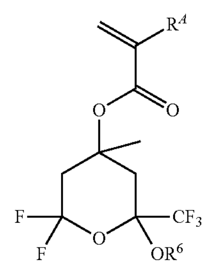
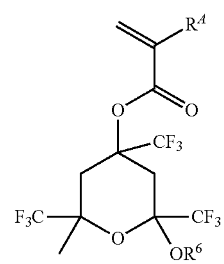
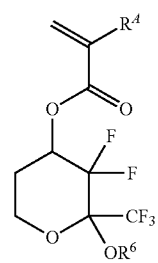
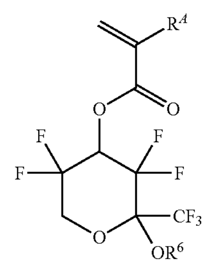
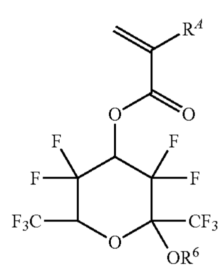
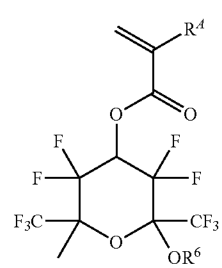

-continued
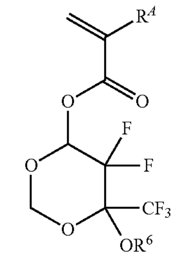
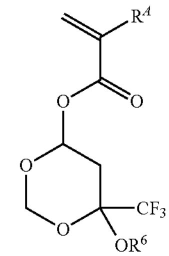
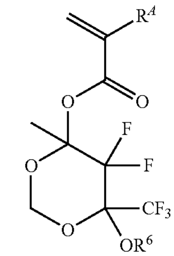
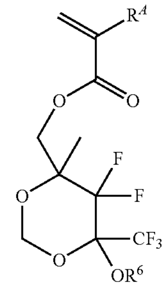
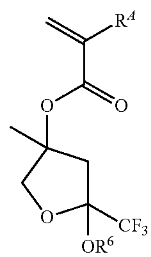
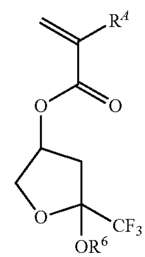
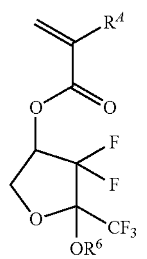
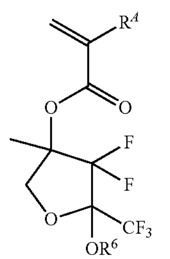
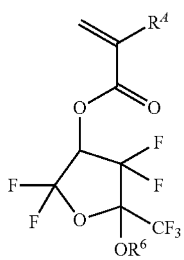
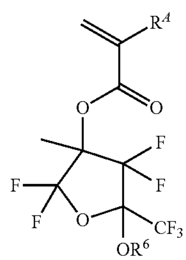
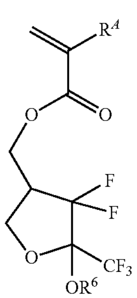
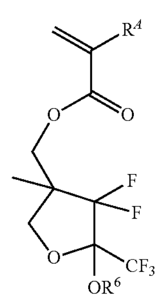
-continued
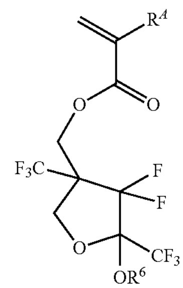
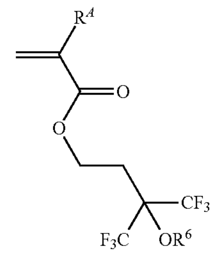
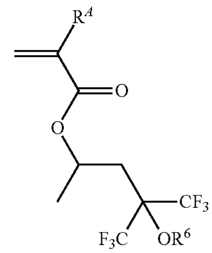
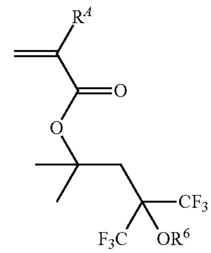
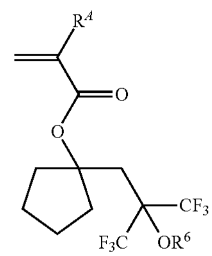
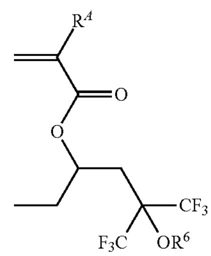
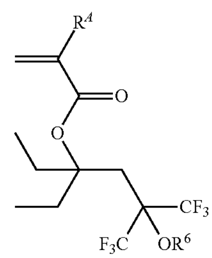
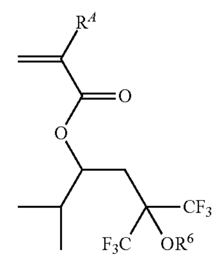
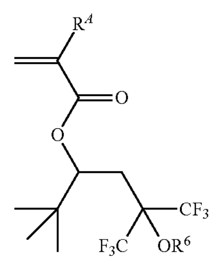
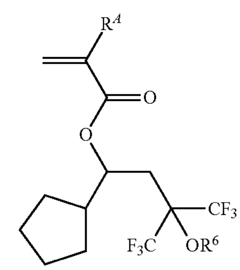
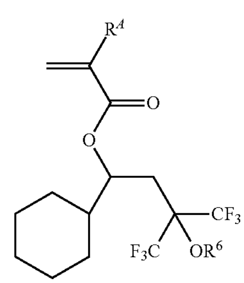
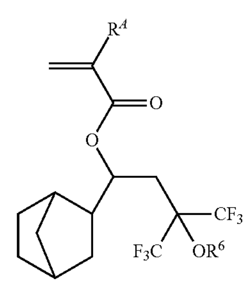

-continued
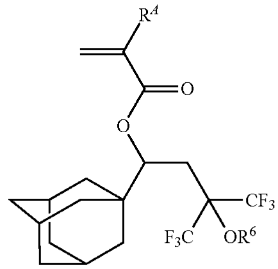
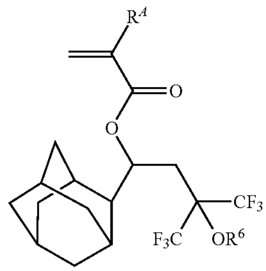
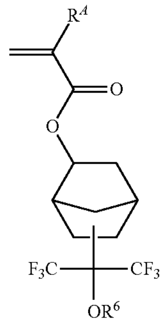
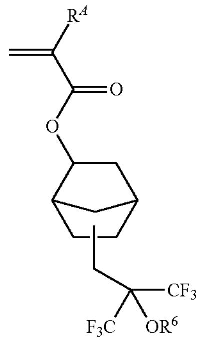
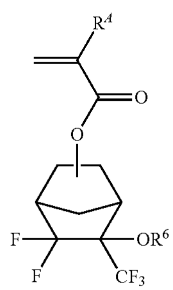
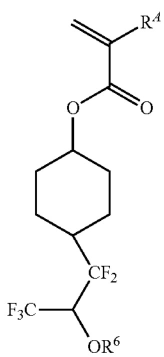
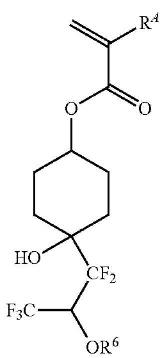
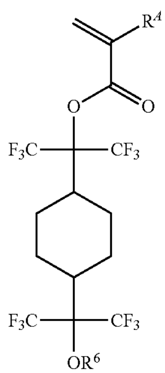
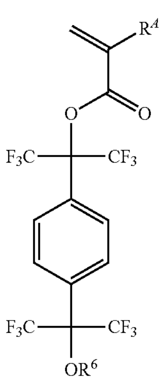
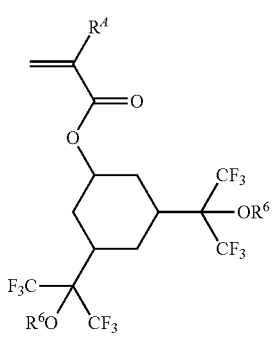
-continued
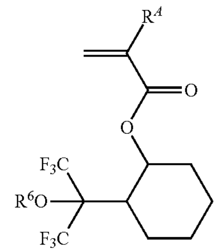
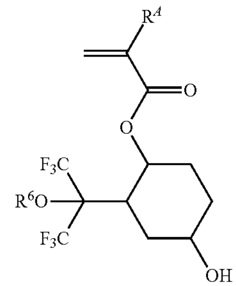
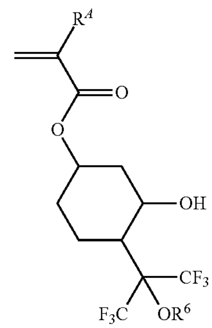
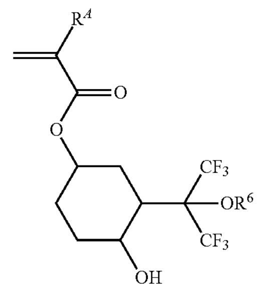
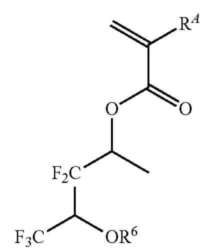
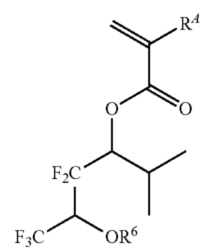
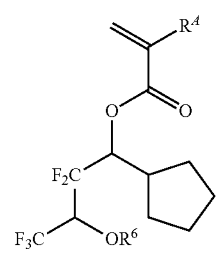
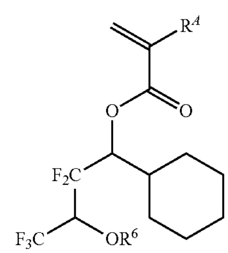
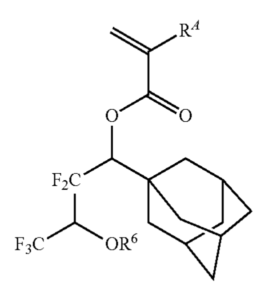
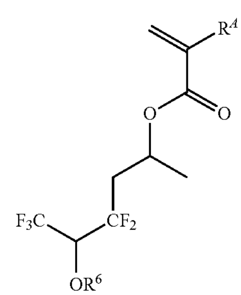
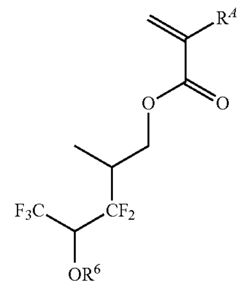
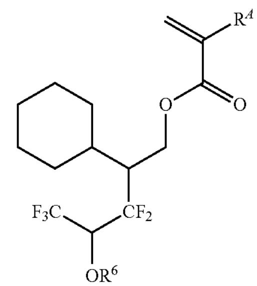

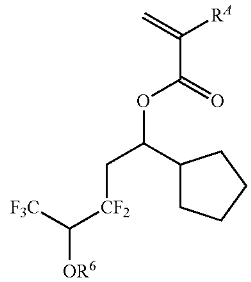
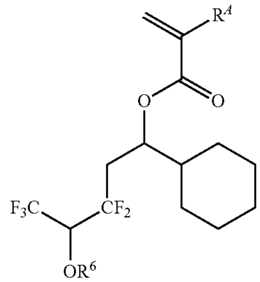
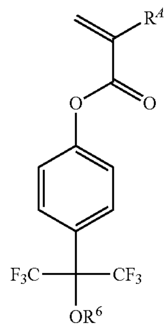
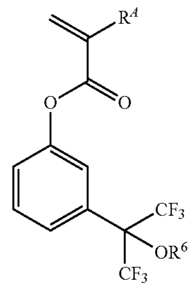
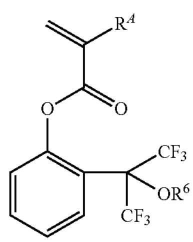
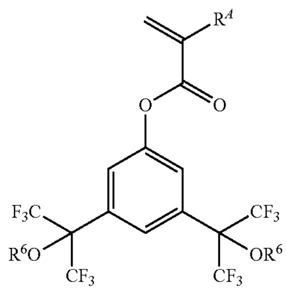
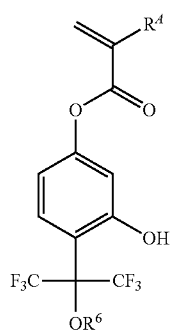
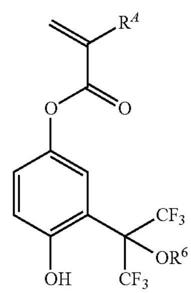
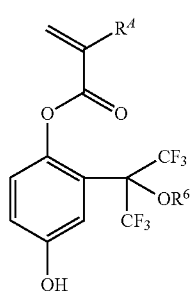
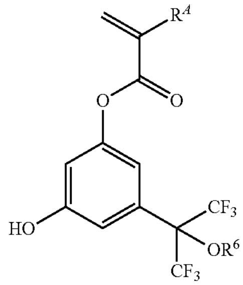
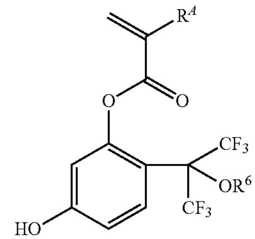
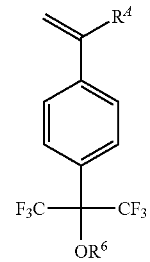
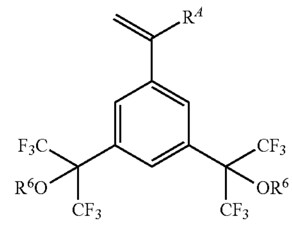
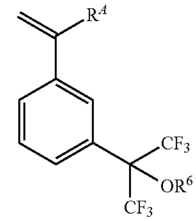
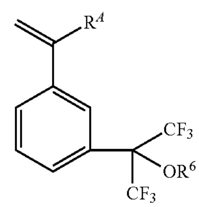
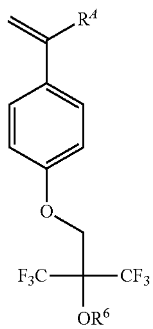
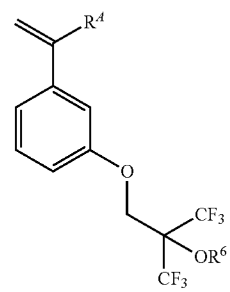
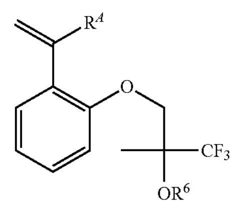
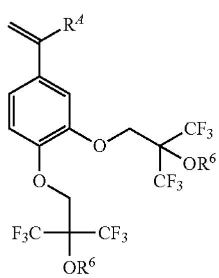
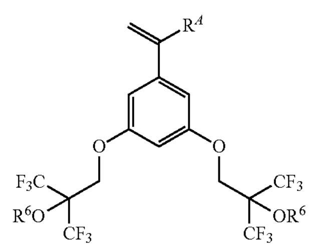
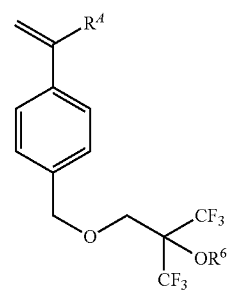
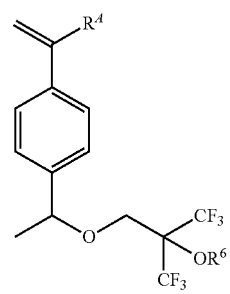

-continued
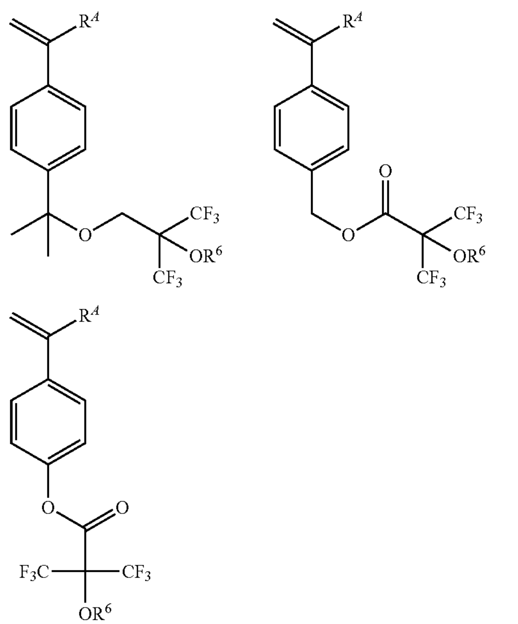
Examples of the monomer from which repeat units (FU-2) are derived are shown below, but not limited thereto. Herein $R^A$ is as defined above.
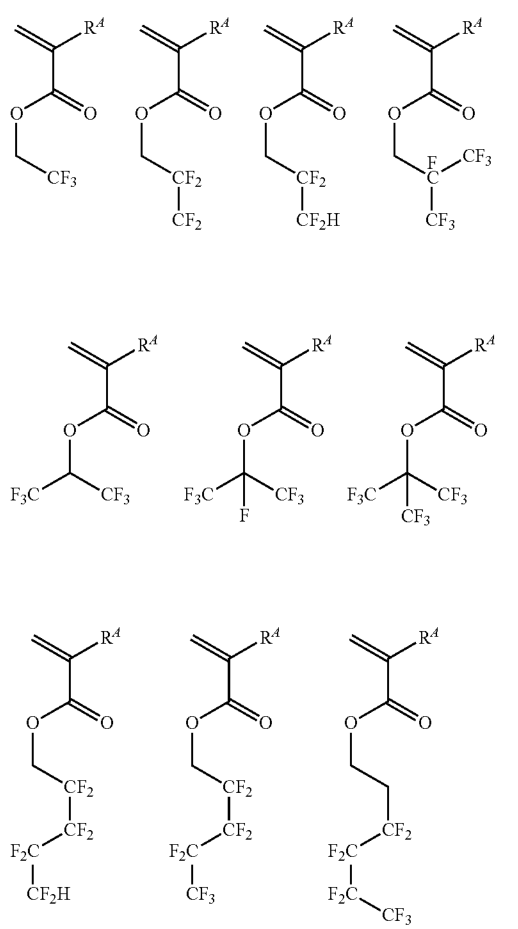
-continued
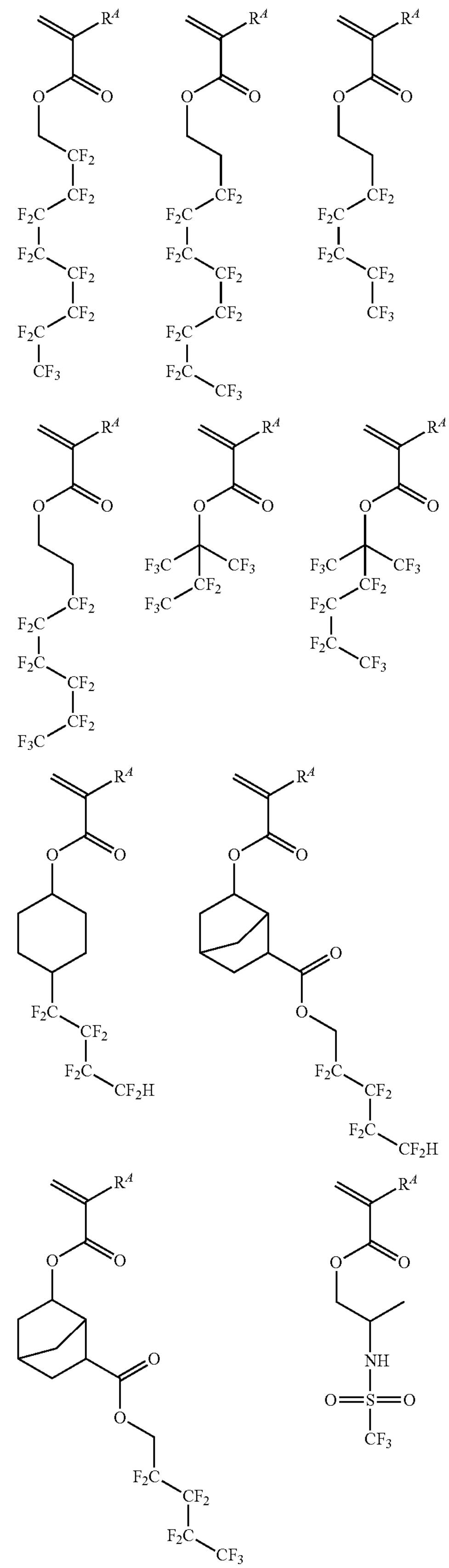

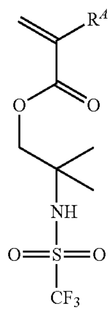
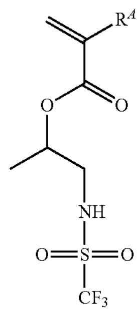
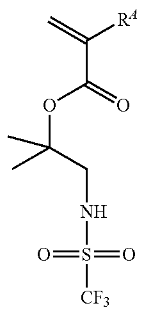
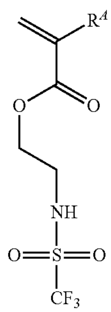
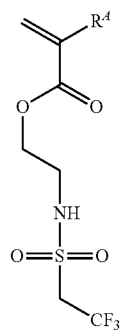
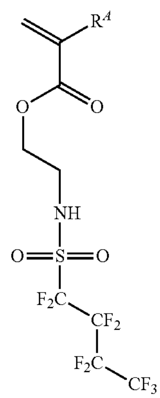
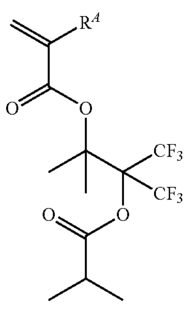
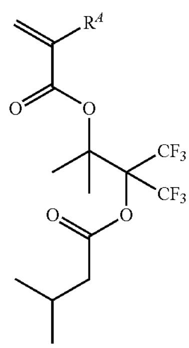
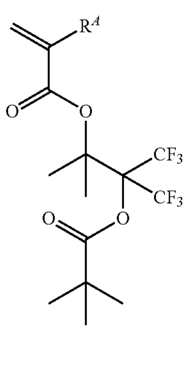
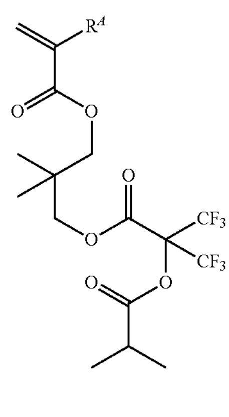
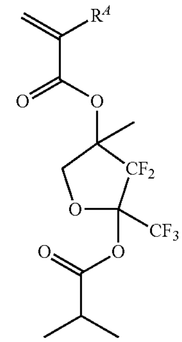
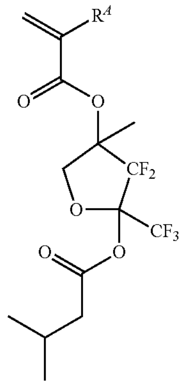
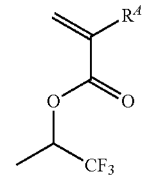
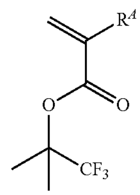
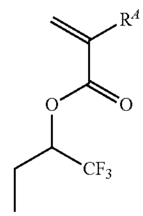
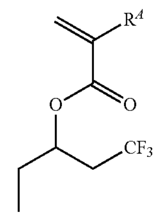
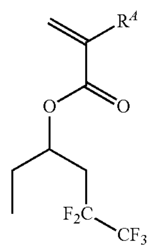
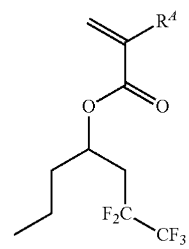
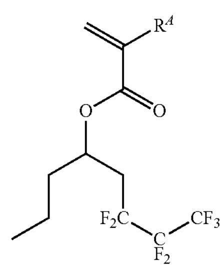
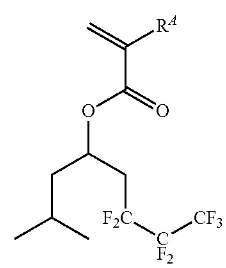
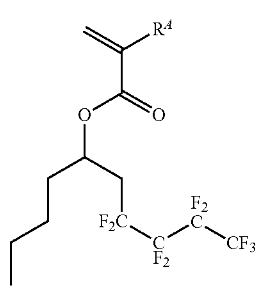
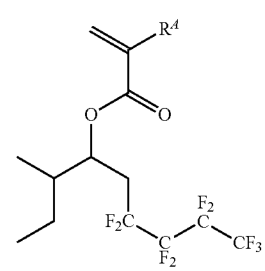
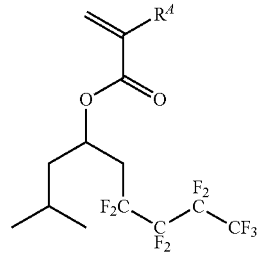
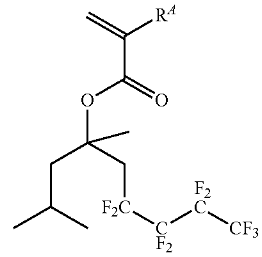

-continued
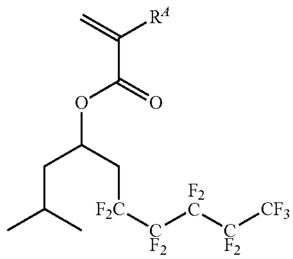
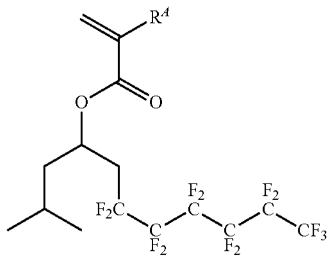
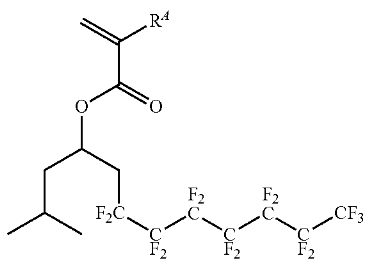
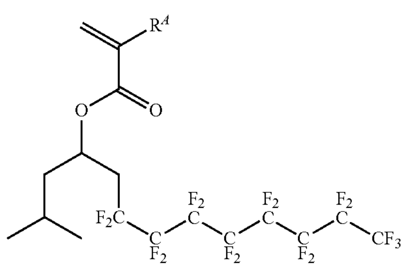
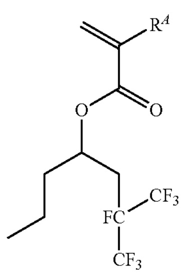
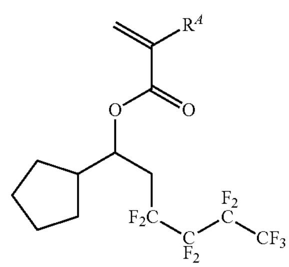
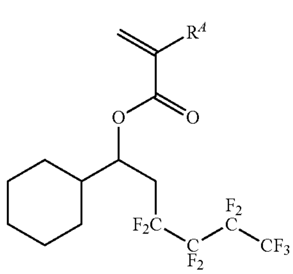
-continued
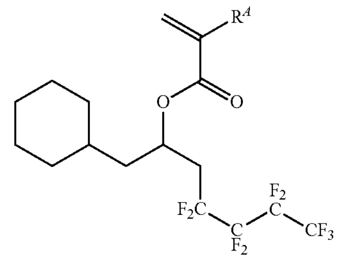
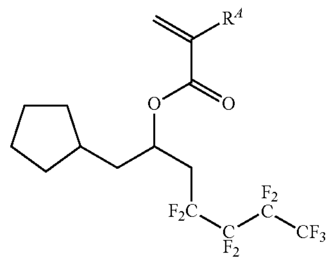
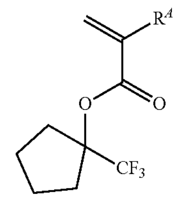
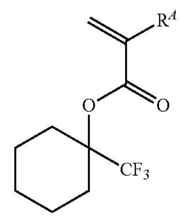
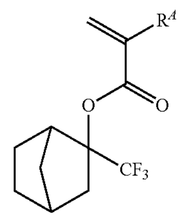
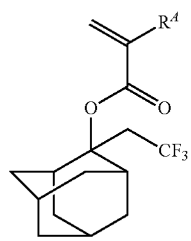
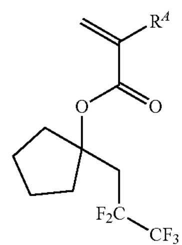
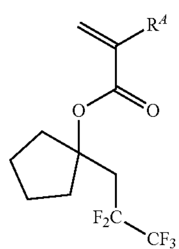
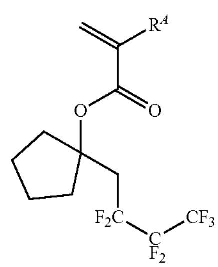
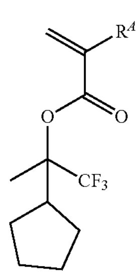
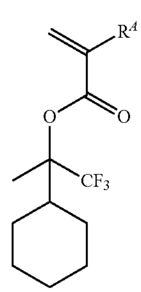

-continued
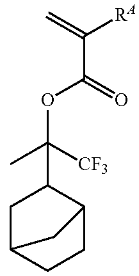
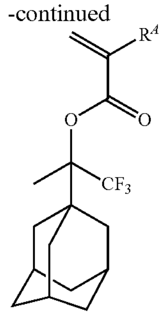
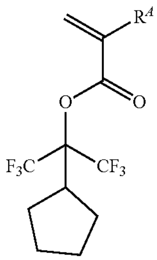
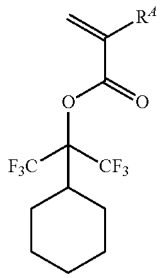
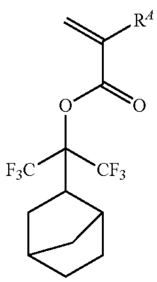
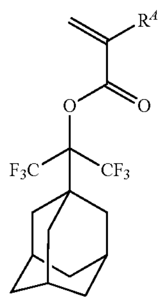
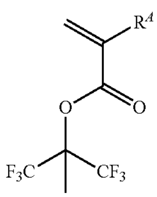
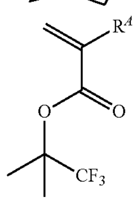
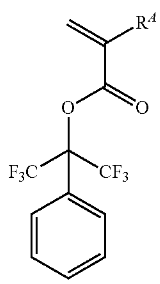
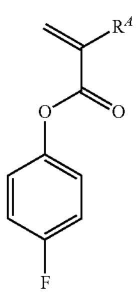
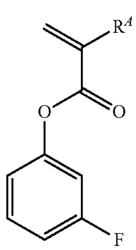
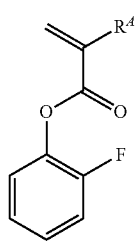
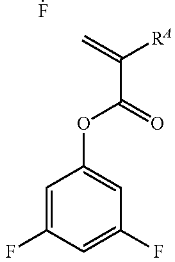
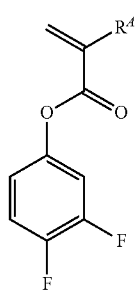
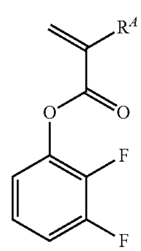
-continued
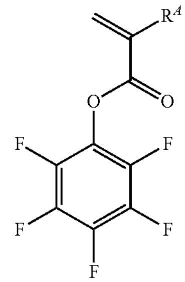
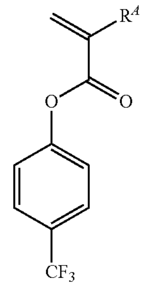
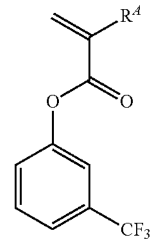
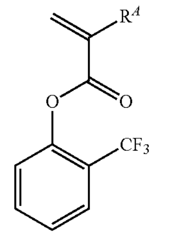
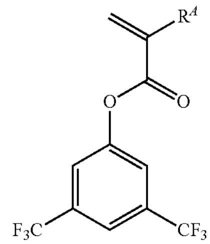
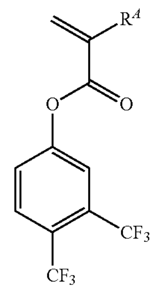
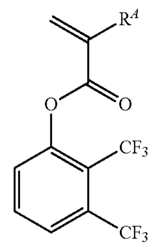
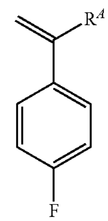
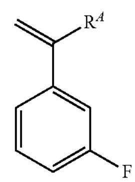
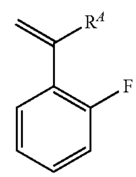
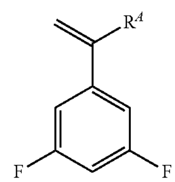
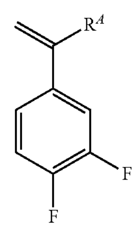
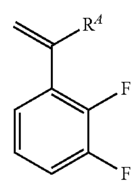
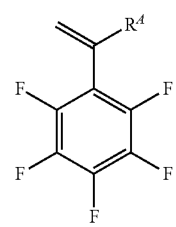
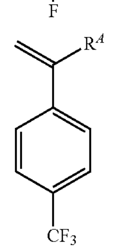
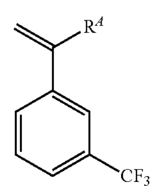
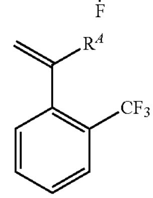
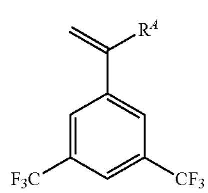
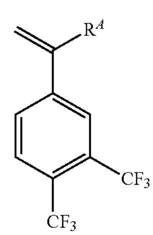
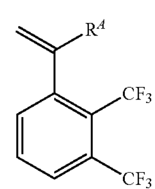

-continued
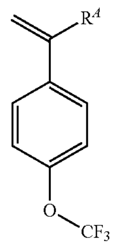
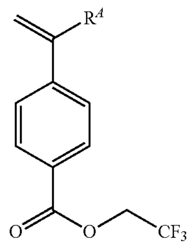
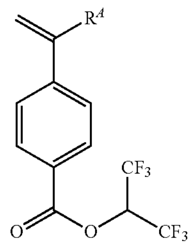
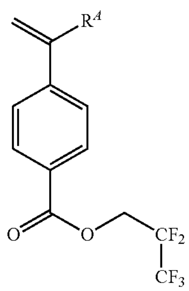
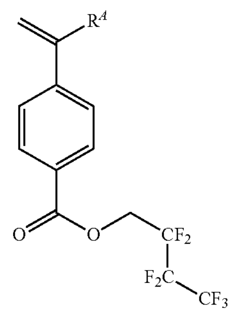
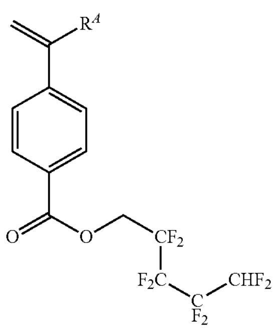
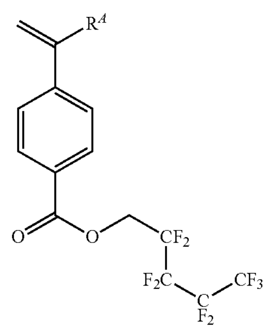
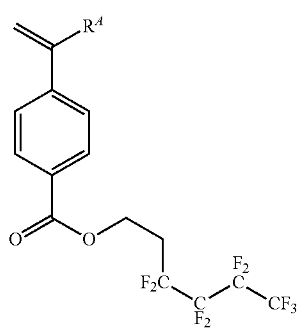
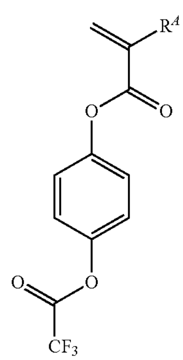
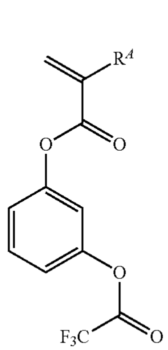
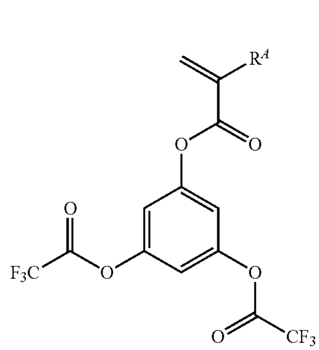
-continued
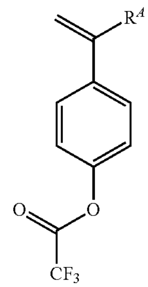
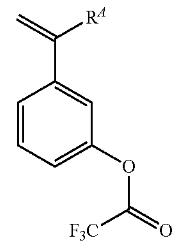
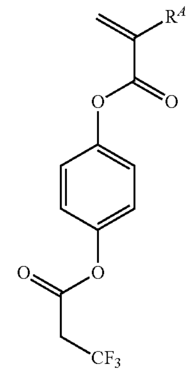
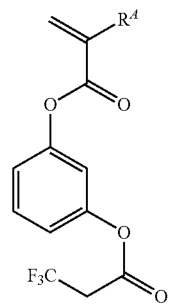
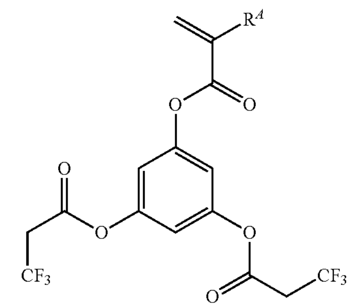
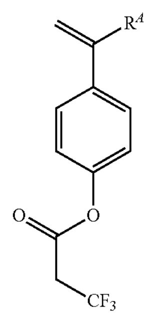
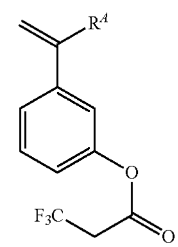
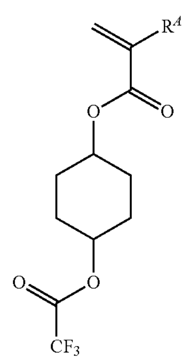
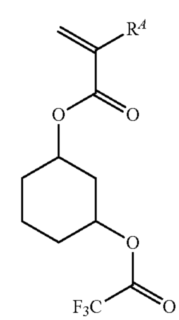
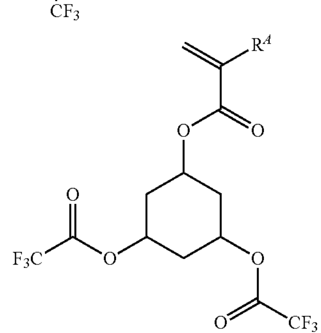
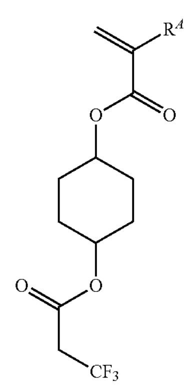

-continued

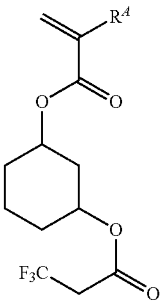

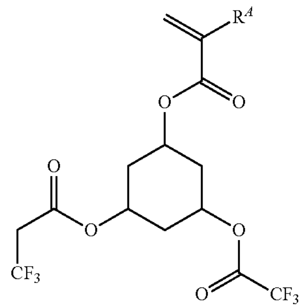

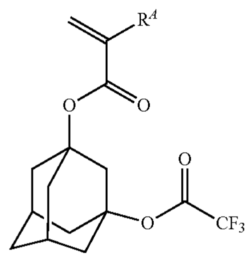

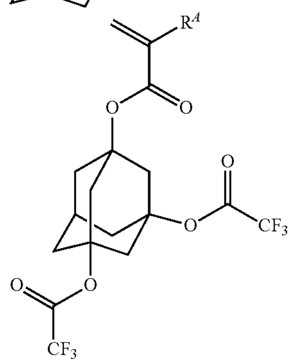

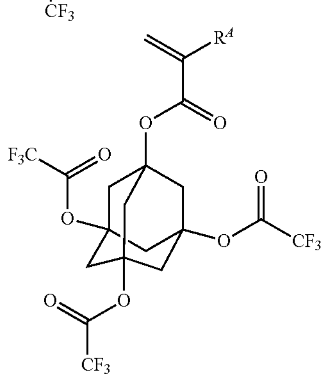

After a resist film is formed, the ammonium salt and fluorine-containing polymer is likely to segregate on the surface of the resist film because repeat units of at least one type selected from repeat units FU-1 and FU-2 are incorporated therein.

Besides the repeat units AU, FU-1 and FU-2, the ammonium salt and fluorine-containing polymer may further comprise repeat units having an acid generator function. Typical of these repeat units are units having formulae (f1) to (f3) as will be described later.

The fraction of repeat units AU, FU-1 and FU-2 is preferably $0<AU<1.0$, $0\leq(FU\text{-}1)<1.0$, $0\leq(FU\text{-}2)<1.0$, and $0<(FU\text{-}1)+(FU\text{-}2)<1.0$; more preferably $0.001\leq AU\leq 0.7$, $0\leq(FU\text{-}1)\leq 0.95$, $0\leq(FU\text{-}2)\leq 0.95$, and $0.1\leq(FU\text{-}1)+(FU\text{-}2)\leq 0.99$; even more preferably $0.01\leq AU\leq 0.5$, $0\leq(FU\text{-}1)\leq 0.8$, $0\leq(FU\text{-}2)\leq 0.8$, and $0.2\leq(FU\text{-}1)+(FU\text{-}2)\leq 0.98$. Although the ammonium salt and fluorine-containing polymer may further comprise other repeat units as long as the benefits of the invention are not compromised, it is preferred that the polymer do not include other units (i.e., AU+(FU-1)+(FU-2)=1).

The ammonium salt and fluorine-containing polymer preferably has a weight average molecular weight (Mw) of 1,000 to 1,000,000, more preferably 2,000 to 100,000. Also, the polymer preferably has a molecular weight distribution (Mw/Mn) of 1.0 to 3.0. Notably, Mw and Mn are as measured by gel permeation chromatography (GPC) using tetrahydrofuran (THF) solvent versus polystyrene standards.

The ammonium salt and fluorine-containing polymer segregates on the surface of a resist film whereby the solubility of the resist film surface in an alkaline developer is improved for thereby preventing bridging defects and collapse of patterns.

In the resist composition, the ammonium salt and fluorine-containing polymer is preferably present in an amount of 0.001 to 20 parts by weight, more preferably 0.01 to 10 parts by weight per 100 parts by weight of the base polymer, as viewed from sensitivity and acid diffusion controlling effect.

Base Polymer

Where the resist composition is of positive tone, the base polymer comprises repeat units containing an acid labile group, preferably repeat units having the formula (a1) or repeat units having the formula (a2). These units are simply referred to as repeat units (a1) and (a2).

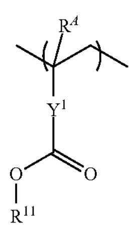

(a1)

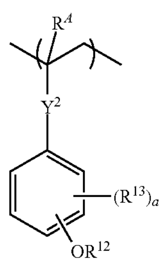

(a2)

In formulae (a1) and (a2), $R^A$ is each independently hydrogen or methyl. $R^{11}$ and $R^{12}$ are each independently an acid labile group. $R^{11}$ and $R^{12}$ may be the same or different when the base polymer contains both repeat units (a1) and (a2). $R^{13}$ is fluorine, trifluoromethyl, a $C_1$-$C_8$ saturated hydrocarbyl group or $C_1$-$C_8$ saturated hydrocarbyloxy group. $Y^1$ is a single bond, phenylene or naphthylene group, or $C_1$-$C_{12}$ divalent linking group containing an ester bond and/or lactone ring. $Y^2$ is a single bond or ester bond. The subscript "a" is an integer of 0 to 4.

Examples of the monomer from which the repeat units (a1) are derived are shown below, but not limited thereto. $R^A$ and $R^{11}$ are as defined above.

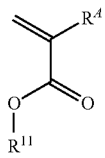
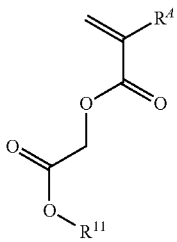
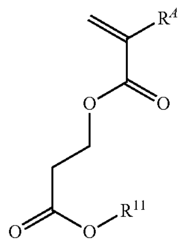
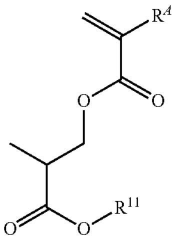
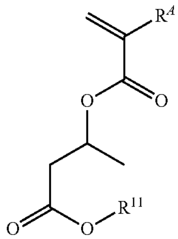
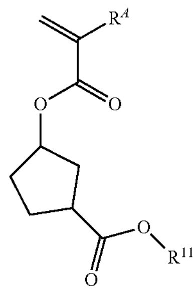
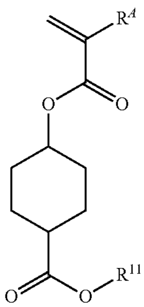
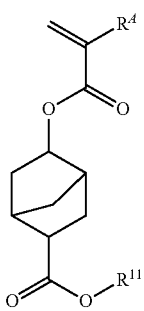
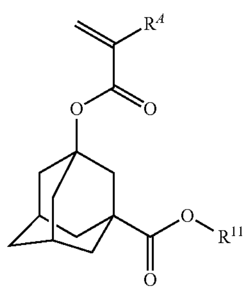
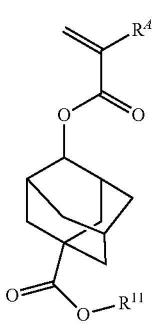
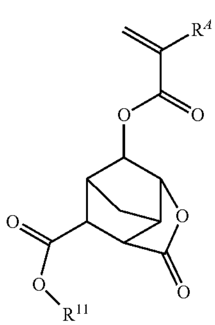
-continued
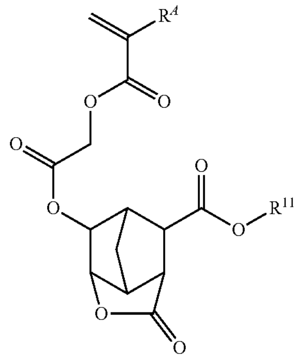
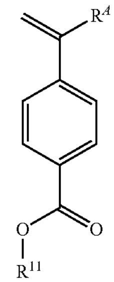
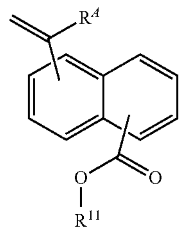
Examples of the monomer from which the repeat units (a2) are derived are shown below, but not limited thereto. $R^A$ and $R^{12}$ are as defined above.
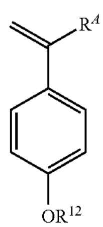
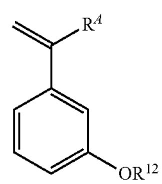
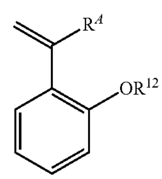
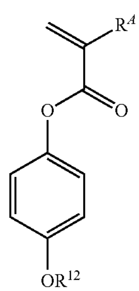
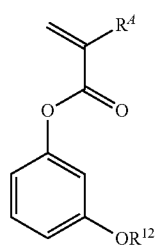
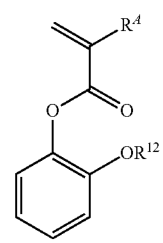
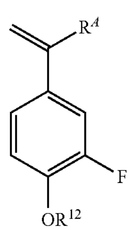
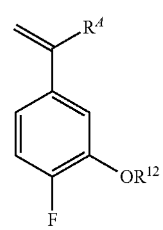
The acid labile groups represented by $R^6$ in formula (FU-1), $R^{11}$ in formula (a1), and $R^{12}$ in formula (a2) may be selected from a variety of such groups, for example, those groups described in JP-A 2013-080033 (U.S. Pat. No. 8,574,817) and JP-A 2013-083821 (U.S. Pat. No. 8,846,303).

Typical of the acid labile group are groups of the following formulae (AL-1) to (AL-3).

(AL-1)

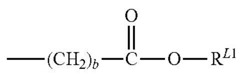

(AL-2)

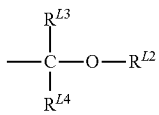

(AL-3)

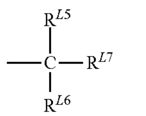

In formulae (AL-1) and (AL-2), $R^{L1}$ and $R^{L2}$ are each independently a $C_1$-$C_{40}$ hydrocarbyl group which may contain a heteroatom such as oxygen, sulfur, nitrogen or fluorine. The hydrocarbyl group may be saturated or unsaturated and straight, branched or cyclic. Inter alia, $C_1$-$C_{40}$ saturated hydrocarbyl groups are preferred, and $C_1$-$C_{20}$ saturated hydrocarbyl groups are more preferred.

In formula (AL-1), b is an integer of 0 to 10, preferably 1 to 5.

In formula (AL-2), $R^{L3}$ and $R^{L4}$ are each independently hydrogen or a $C_1$-$C_{20}$ hydrocarbyl group which may contain a heteroatom such as oxygen, sulfur, nitrogen or fluorine. The hydrocarbyl group may be saturated or unsaturated and straight, branched or cyclic. Inter alia, $C_1$-$C_{20}$ saturated hydrocarbyl groups are preferred. Any two of $R^{L2}$, $R^{L3}$ and $R^{L4}$ may bond together to form a $C_3$-$C_{20}$ ring with the carbon atom or carbon and oxygen atoms to which they are attached, the ring being preferably of 4 to 16 carbon atoms and especially alicyclic.

In formula (AL-3), $R^{L5}$, $R^{L6}$ and $R^{L7}$ are each independently a $C_1$-$C_{20}$ hydrocarbyl group which may contain a heteroatom such as oxygen, sulfur, nitrogen or fluorine. The hydrocarbyl group may be saturated or unsaturated and straight, branched or cyclic. Inter alia, $C_1$-$C_{20}$ saturated hydrocarbyl groups are preferred. Any two of $R^{L5}$, $R^{L6}$ and $R^{L7}$ may bond together to form a $C_3$-$C_{20}$ ring with the carbon atom to which they are attached, the ring being preferably of 4 to 16 carbon atoms and especially alicyclic.

The base polymer may further comprise repeat units (b) having a phenolic hydroxy group as an adhesive group. Examples of suitable monomers from which repeat units (b) are derived are given below, but not limited thereto. Herein $R^A$ is as defined above.

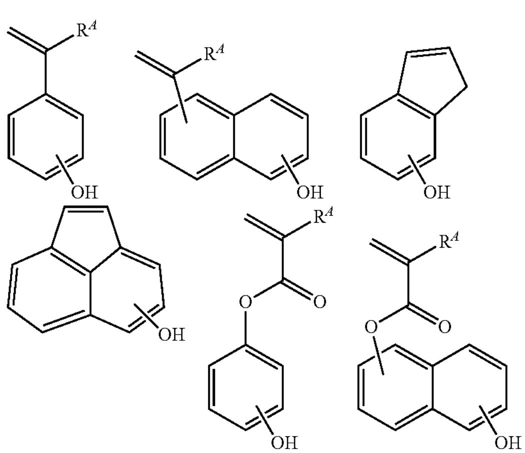

-continued

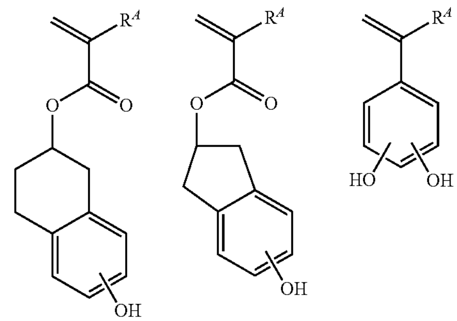

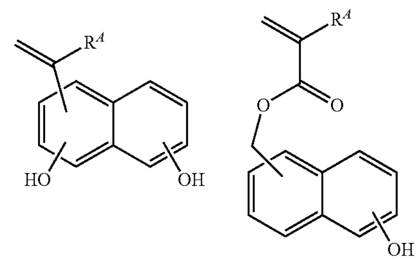

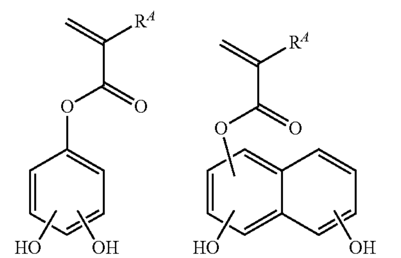

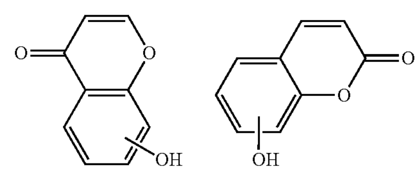

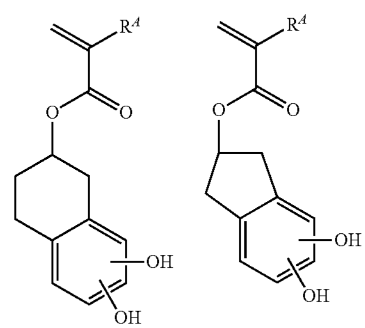

Further, repeat units (c) having another adhesive group selected from hydroxy (other than the foregoing phenolic hydroxy), lactone ring, sultone ring, ether bond, ester bond, sulfonate bond, carbonyl, sulfonyl, cyano, and carboxy groups may also be incorporated in the base polymer. Examples of suitable monomers from which repeat units (c) are derived are given below, but not limited thereto. Herein $R^A$ is as defined above.

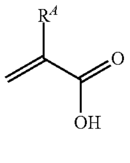
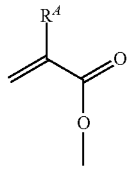
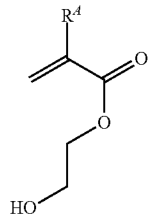
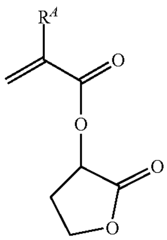
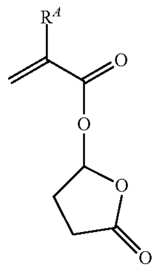
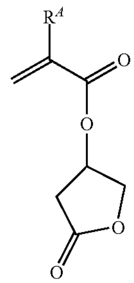
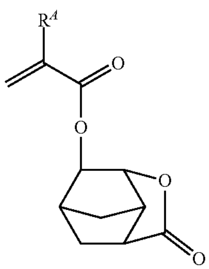
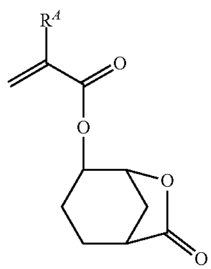
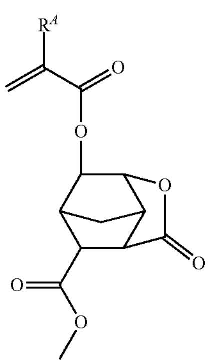
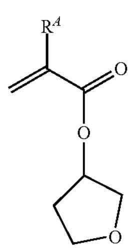
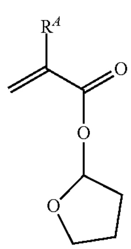
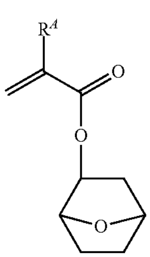
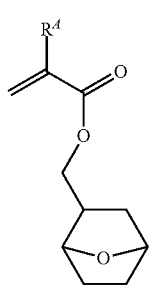
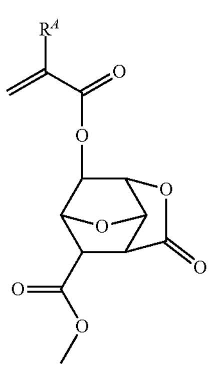
-continued
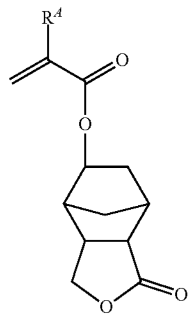
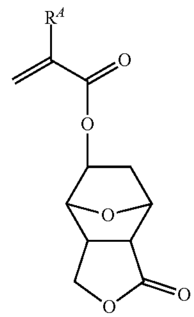
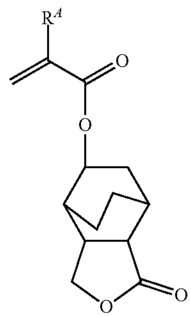
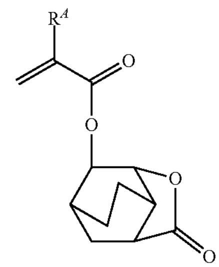
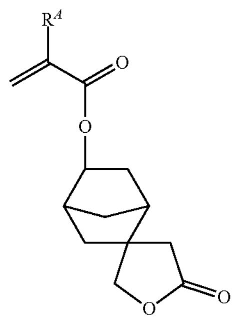
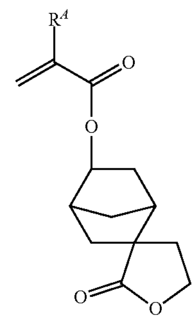
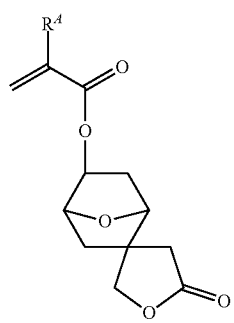
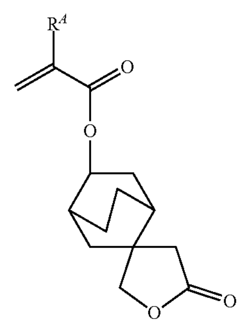
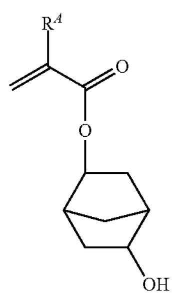
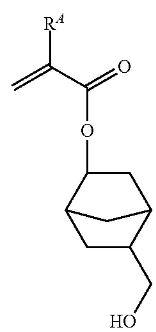
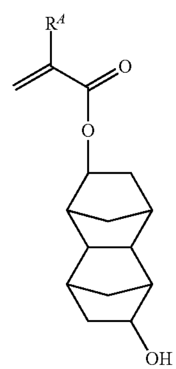

-continued
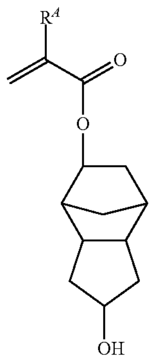
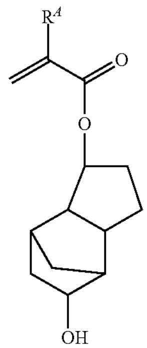
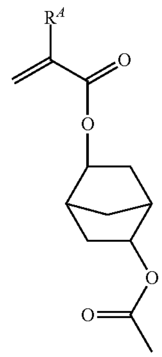
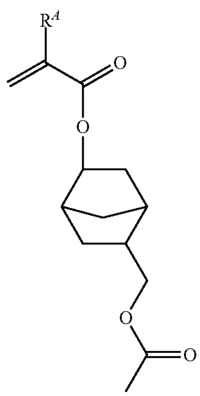
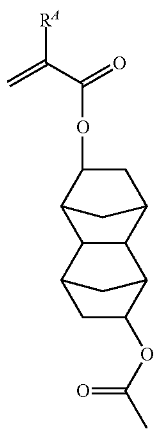
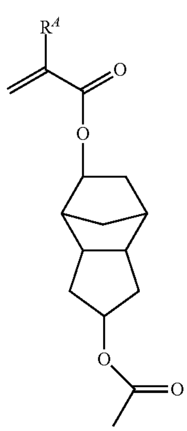
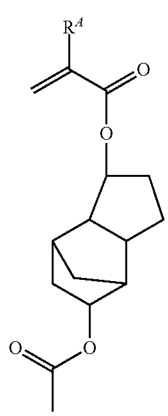
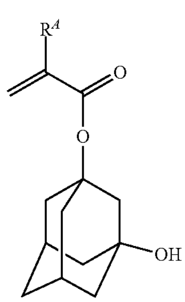
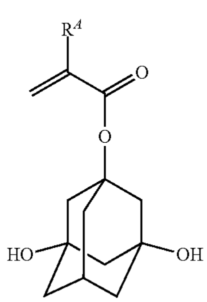
-continued
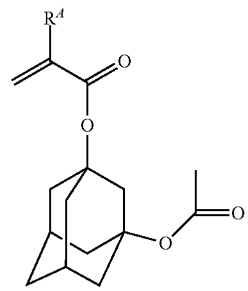
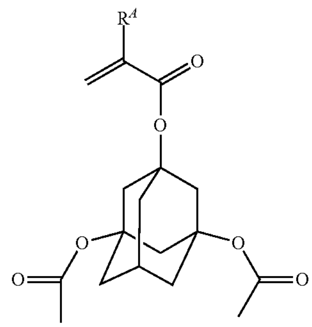
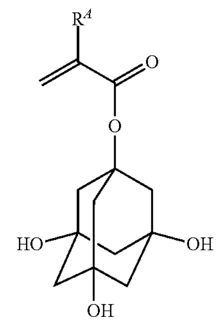
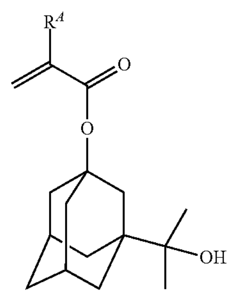
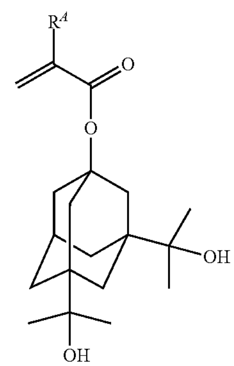
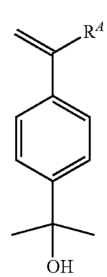
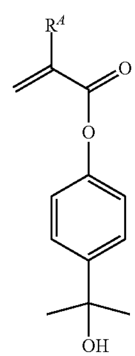
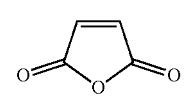
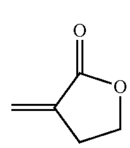
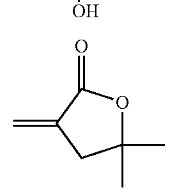
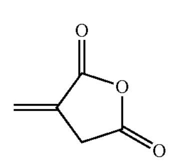
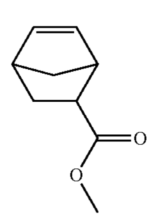
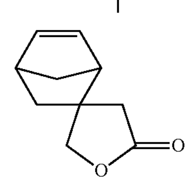
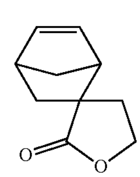

-continued
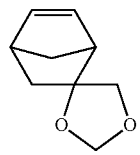
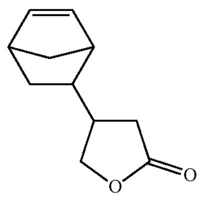
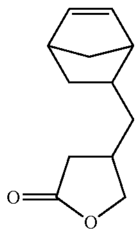
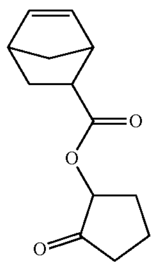
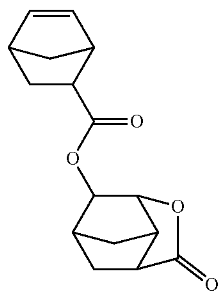
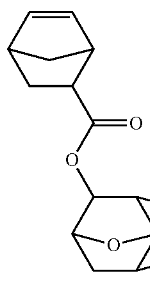
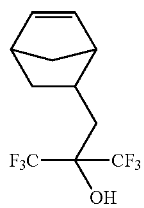
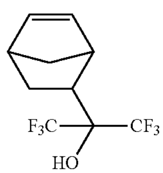
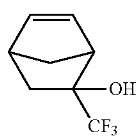
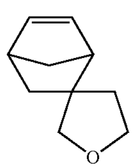
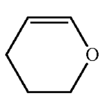
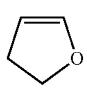
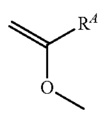
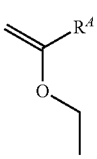
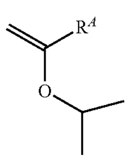
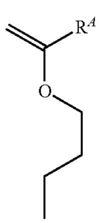
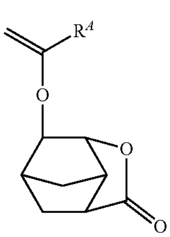
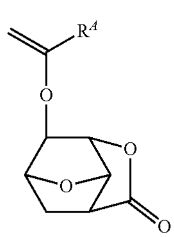
-continued
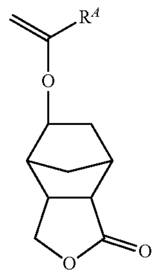
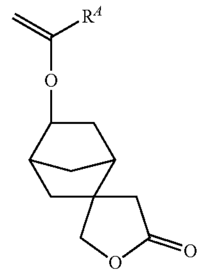
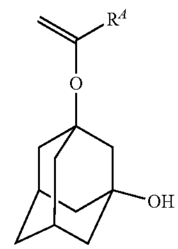
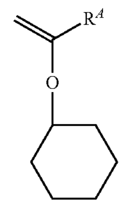
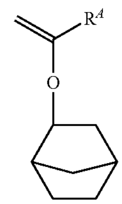
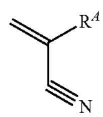
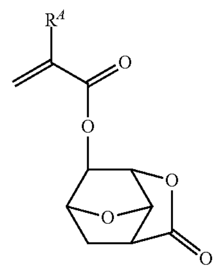
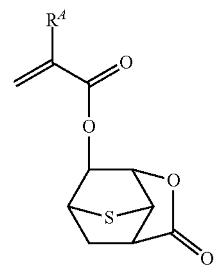
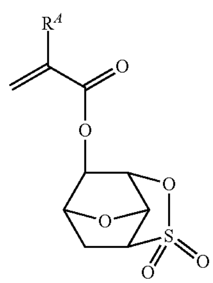
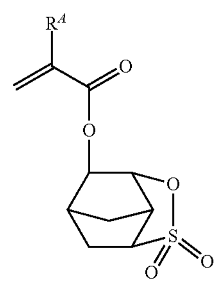
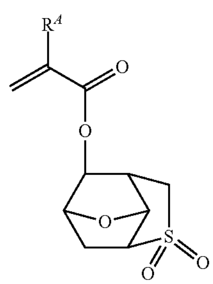
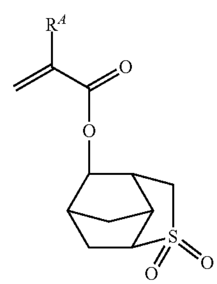
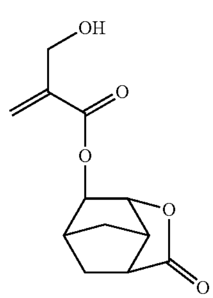
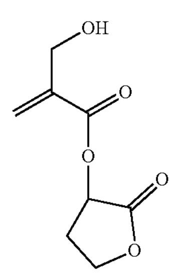

-continued
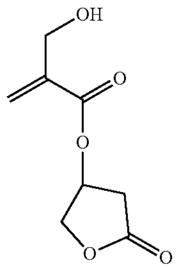
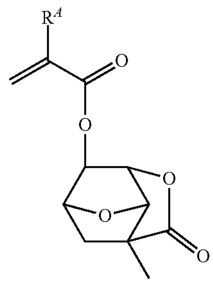
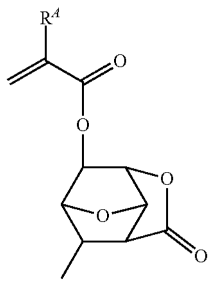
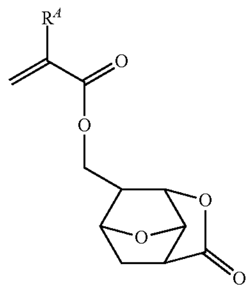
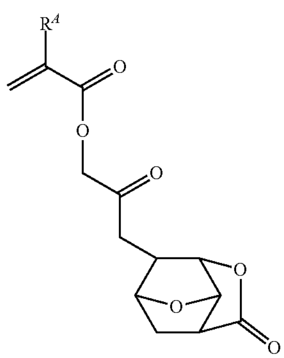
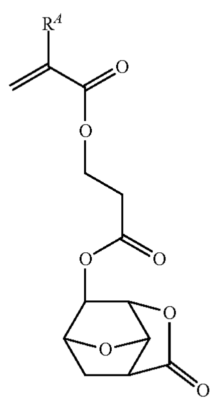
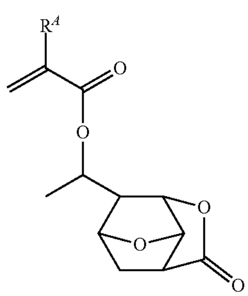
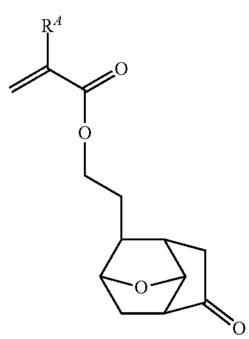
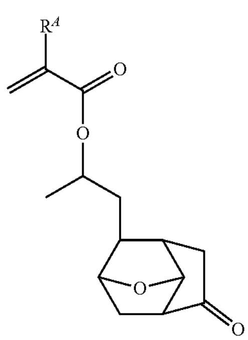
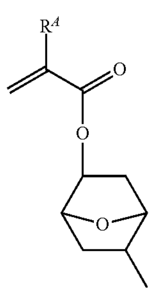
-continued
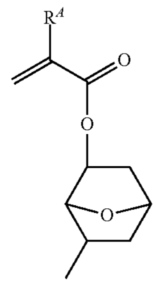
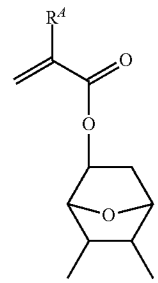
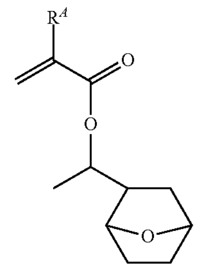
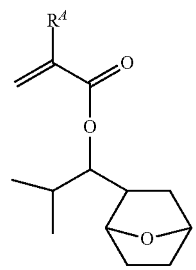
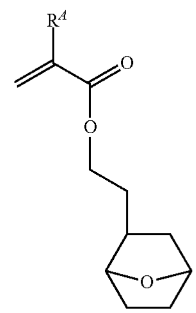
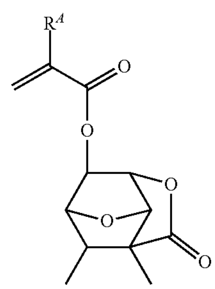
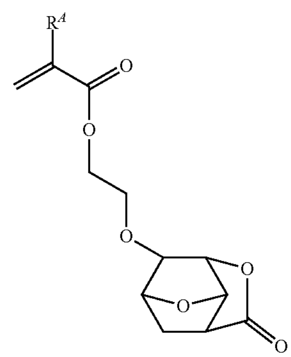
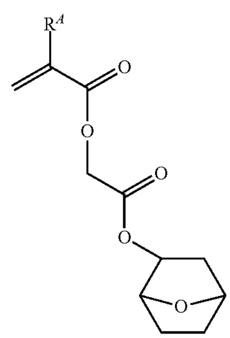
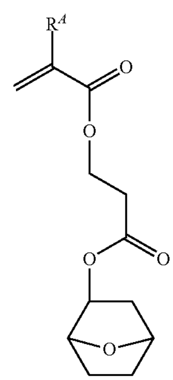
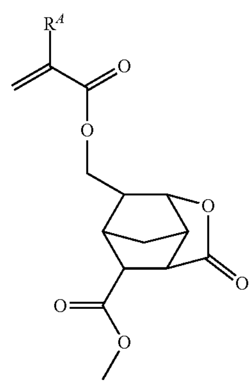

-continued
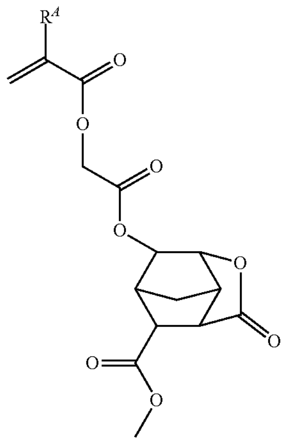
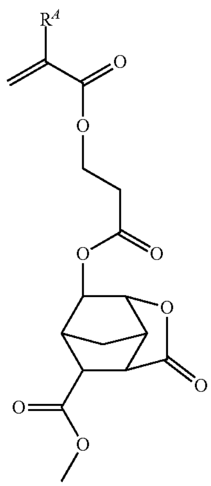
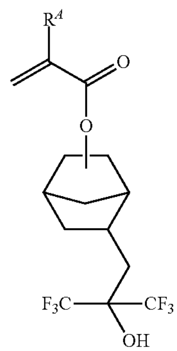
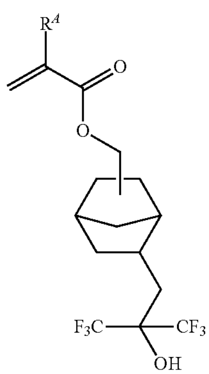
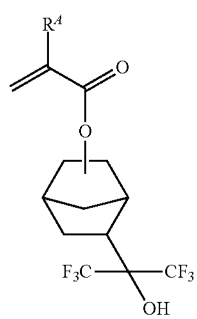
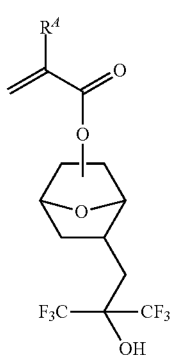
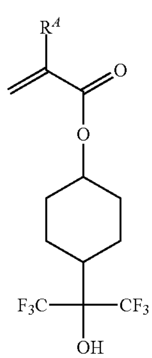
-continued
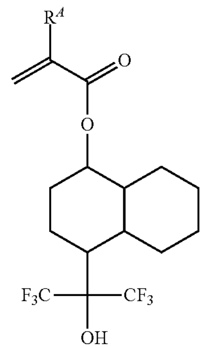
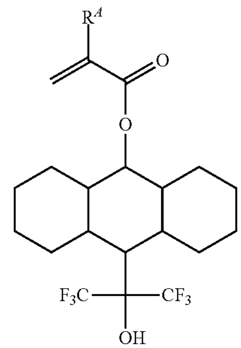
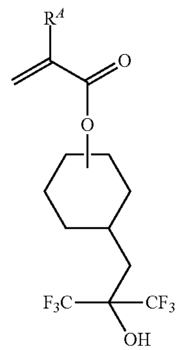
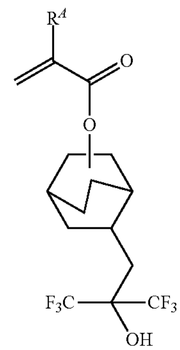
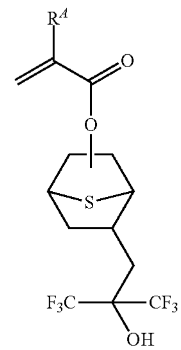
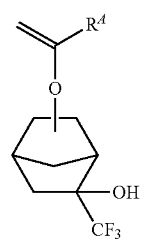
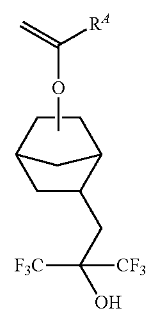
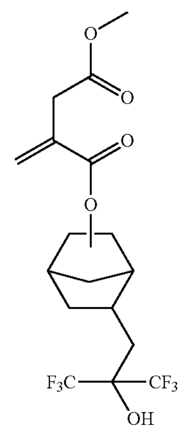
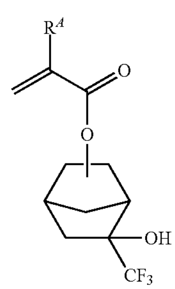
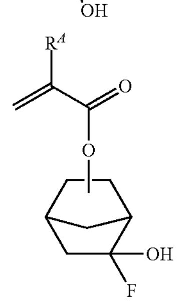
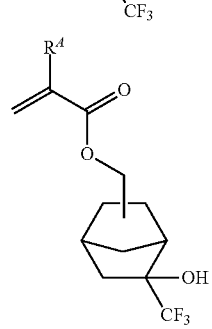
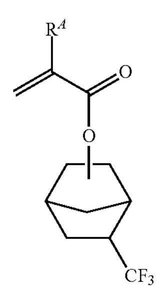

-continued
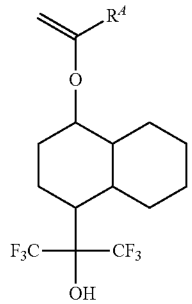
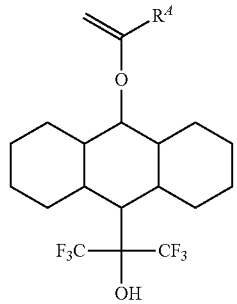
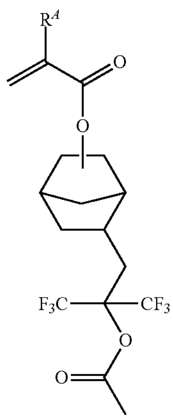
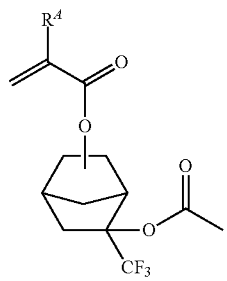
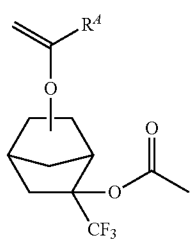
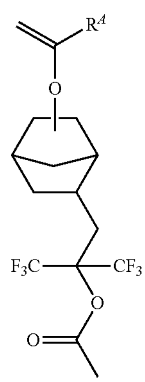
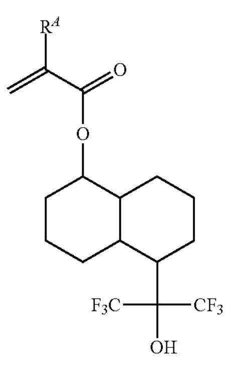
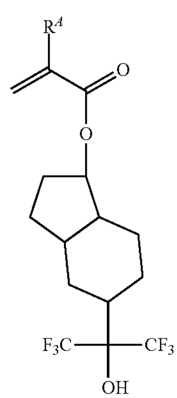
-continued
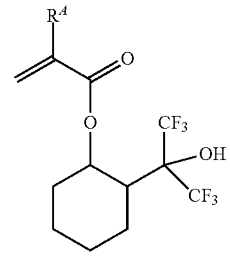
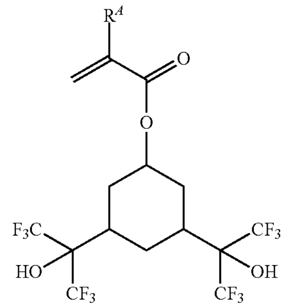
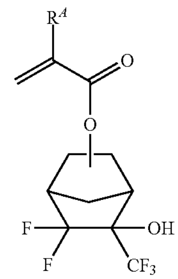
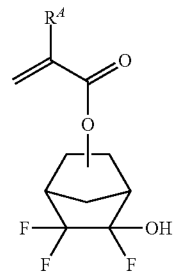
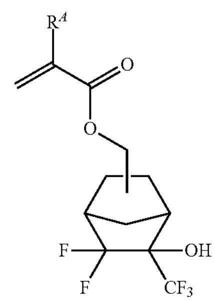
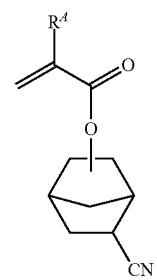
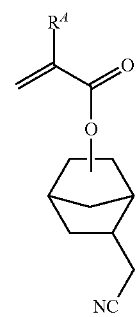
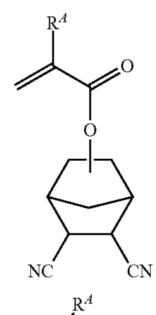
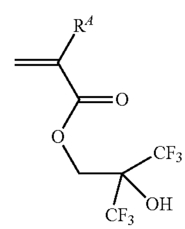
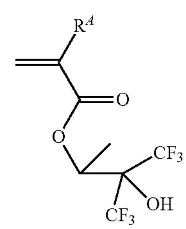
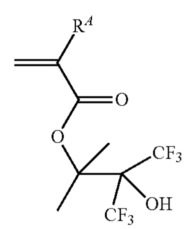
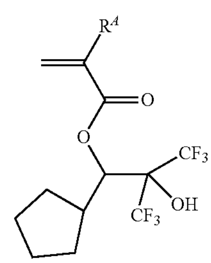
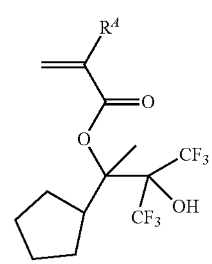
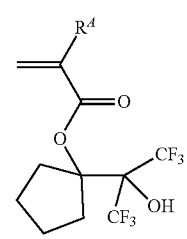

-continued
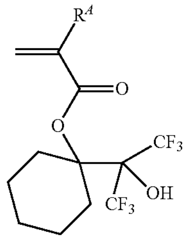
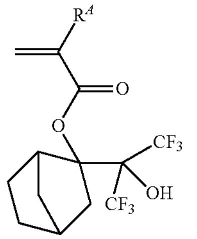
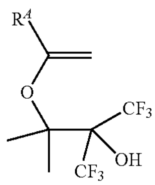
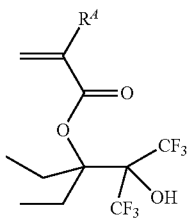
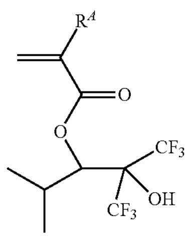
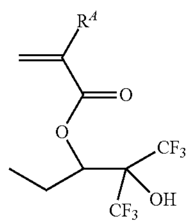
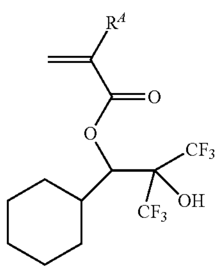
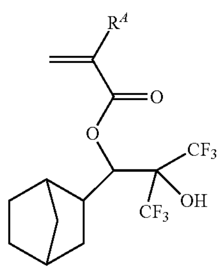
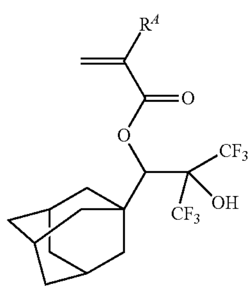
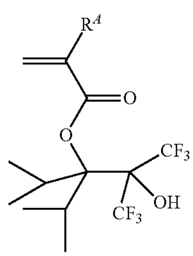
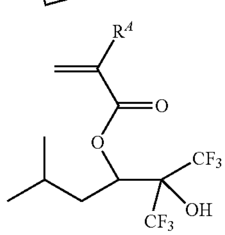
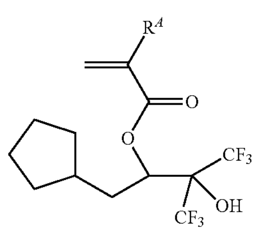
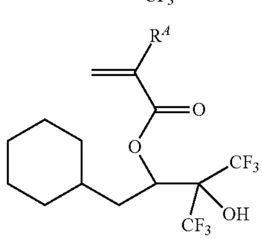
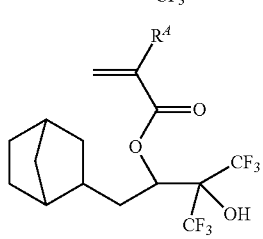
-continued
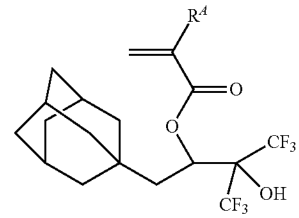
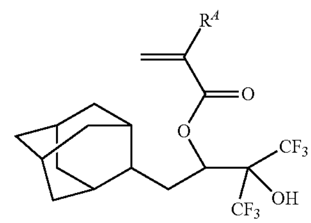
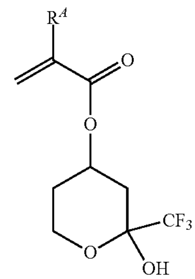
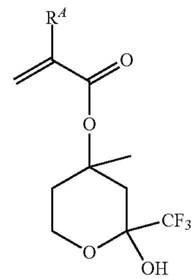
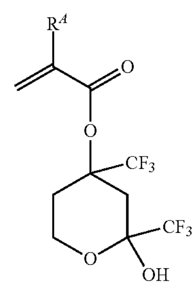
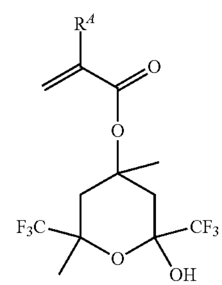
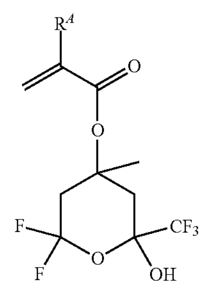
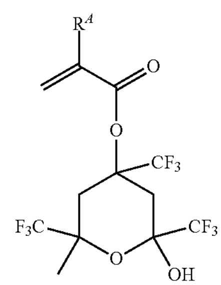
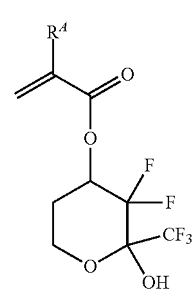
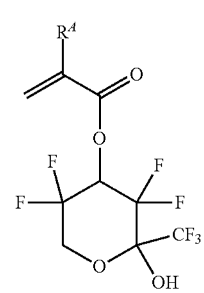

-continued
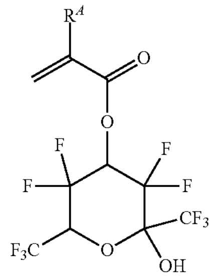
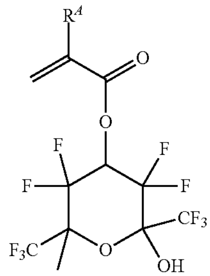
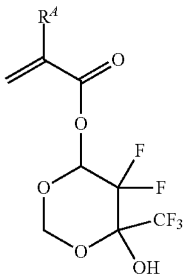
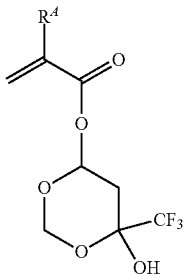
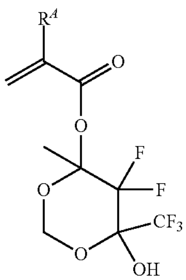
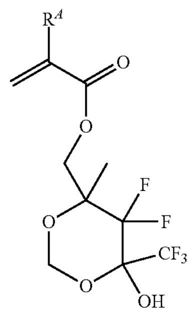
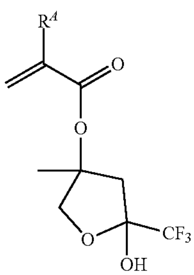
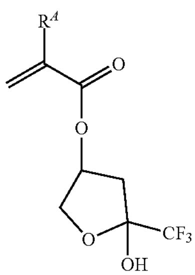
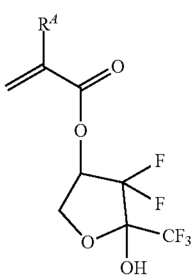
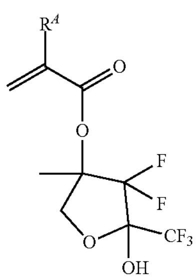
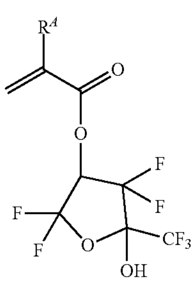
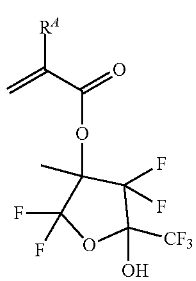
-continued
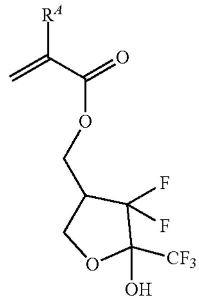
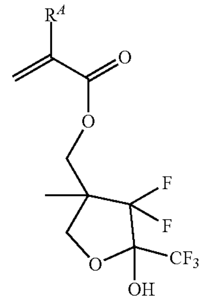
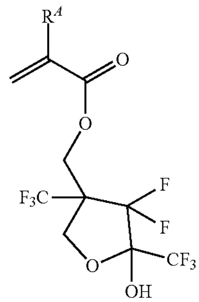
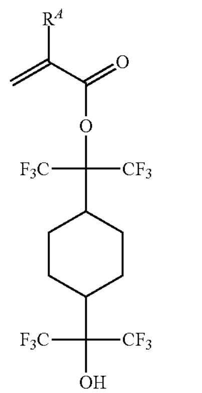
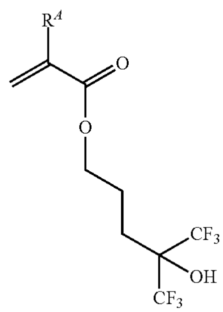
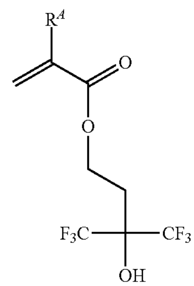
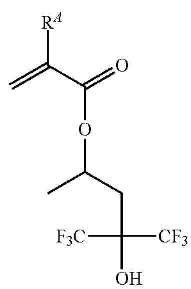
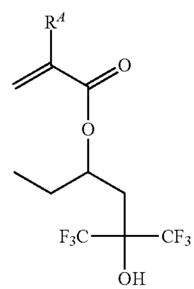
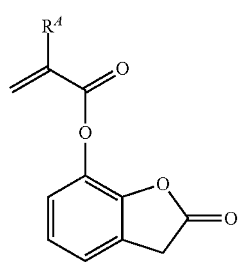
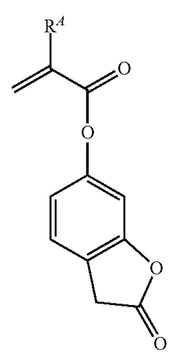

-continued
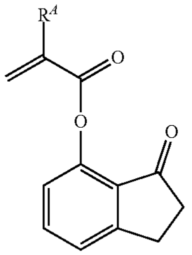
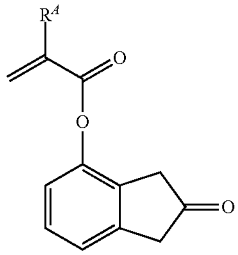
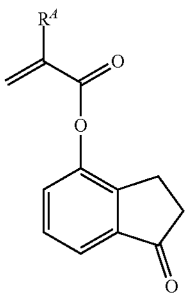
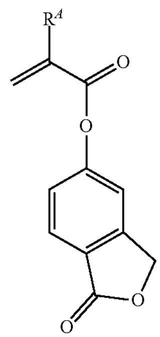
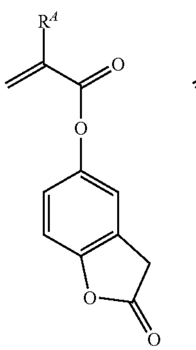
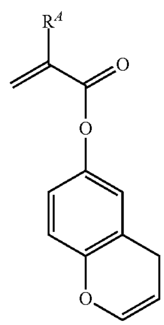
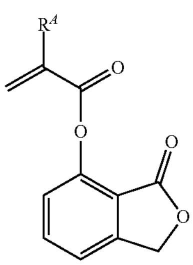
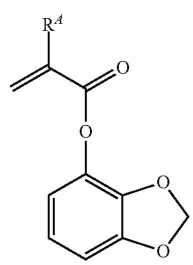
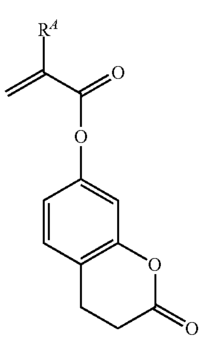
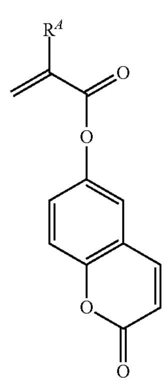
-continued
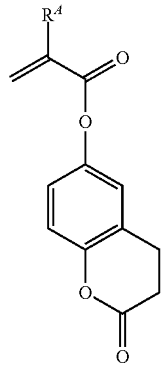
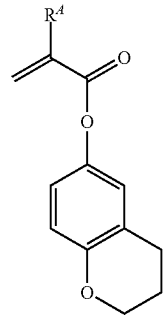
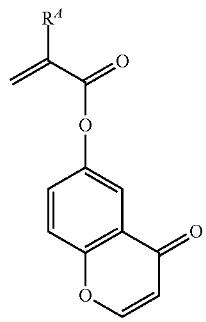
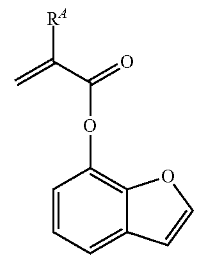
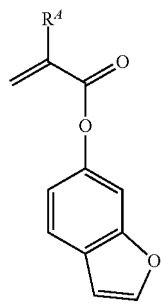
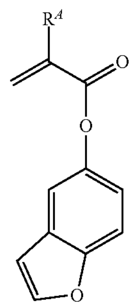
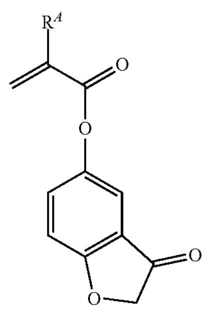
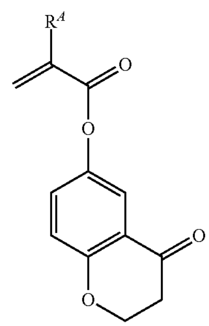
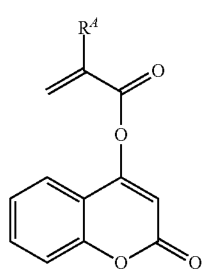
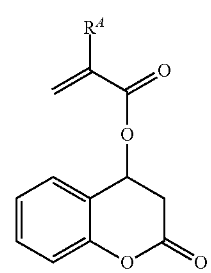

-continued
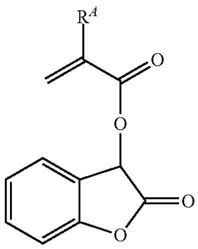
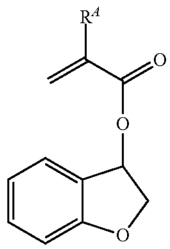
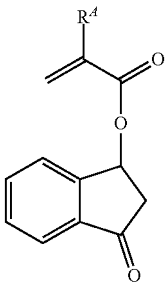
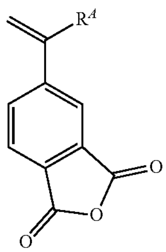
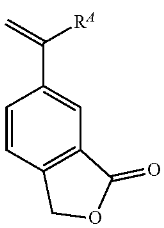
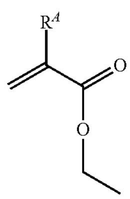
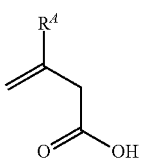
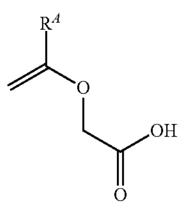
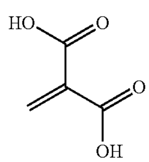
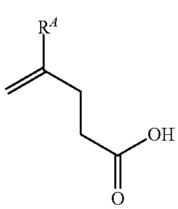
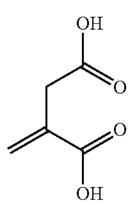
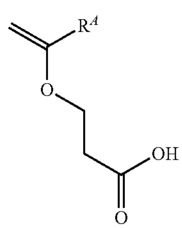
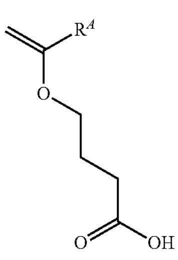
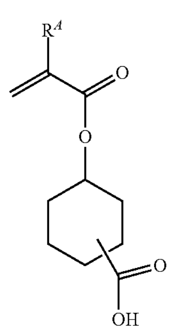
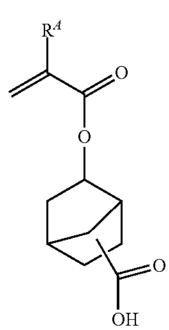
-continued
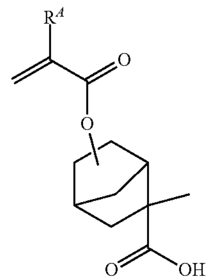
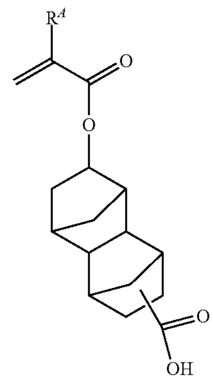
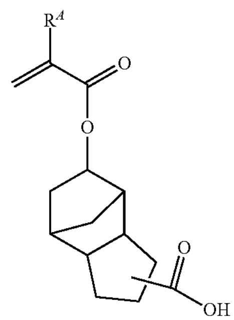
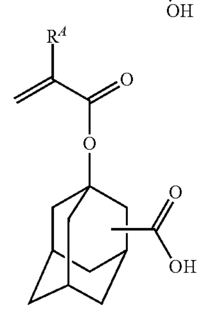
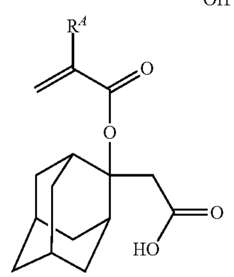
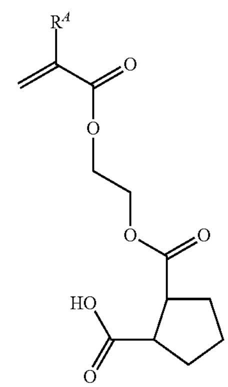
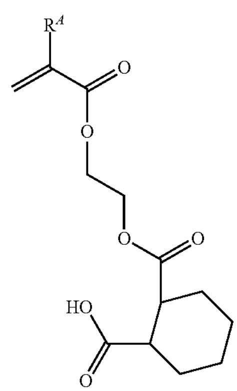
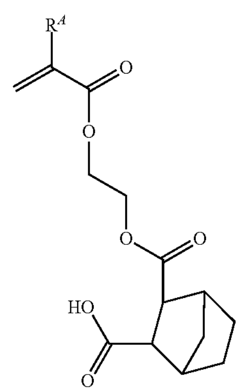
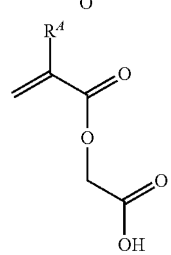
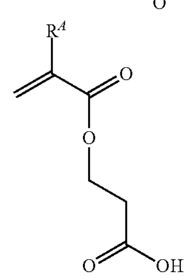

-continued
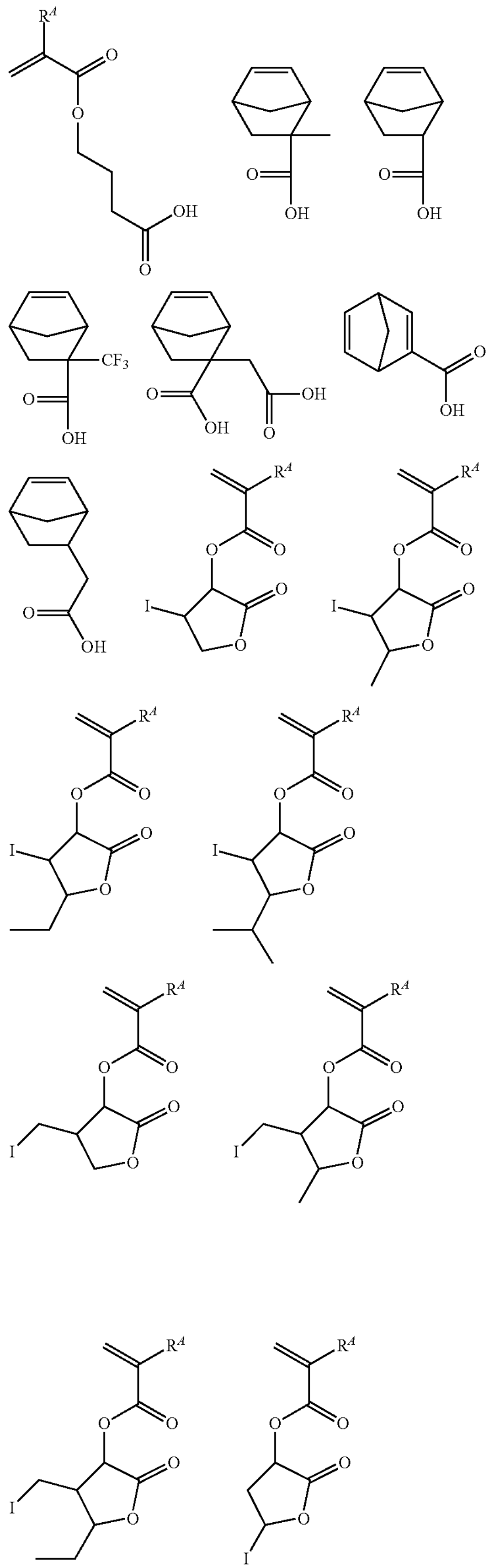
-continued
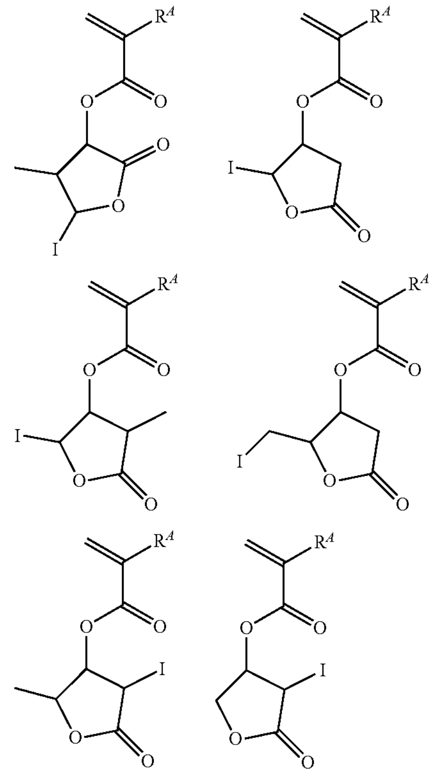
In another preferred embodiment, the base polymer may further comprise repeat units (d) derived from monomers of indene, benzofuran, benzothiophene, acenaphthylene, chromone, coumarin, and norbornadiene, or derivatives thereof. Suitable monomers are exemplified below.
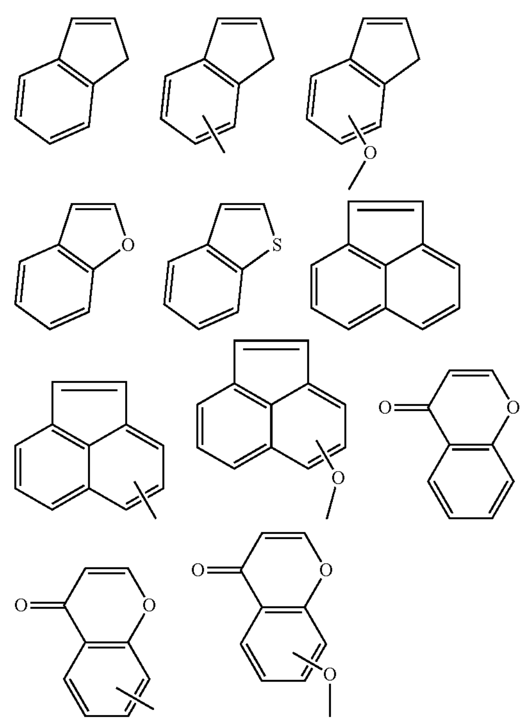

-continued

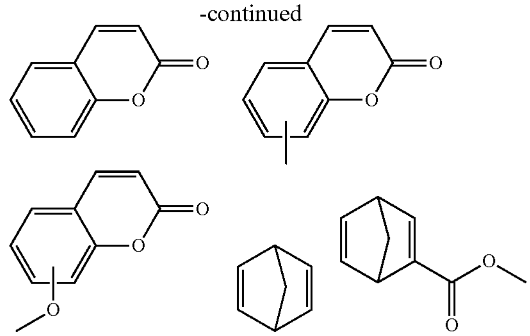

The base polymer may further comprise repeat units (e) derived from styrene, vinylnaphthalene, vinylanthracene, vinylpyrene, methyleneindene, vinylpyridine, and vinylcarbazole.

The base polymer may further comprise repeat units (f) derived from an onium salt having a polymerizable unsaturated bond. Preferred repeat units (f) include repeat units having formula (f1), repeat units having formula (f2) and repeat units having formula (f3). These units are simply referred to as repeat units (f1), (f2) and (f3), which may be used alone or in combination of two or more types.

(f1)

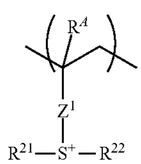

(f2)

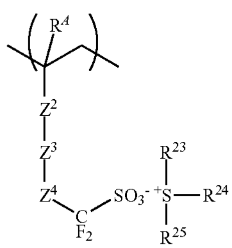

(f3)

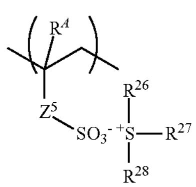

In formulae (f1) to (f3), $R^A$ is each independently hydrogen or methyl. $Z^1$ is a single bond, a $C_1$-$C_6$ aliphatic hydrocarbylene group, phenylene group, naphthylene group, or $C_7$-$C_{18}$ group obtained by combining the foregoing, or —O—$Z^{11}$—, —C(═O)—O—$Z^{11}$— or —C(═O)—NH—$Z^{11}$—. $Z^{11}$ is a $C_1$-$C_6$ aliphatic hydrocarbylene group, phenylene group, naphthylene group, or $C_7$-$C_{18}$ group obtained by combining the foregoing, which may contain a carbonyl moiety, ester bond, ether bond or hydroxy moiety. $Z^2$ is a single bond or ester bond. $Z^3$ is a single bond, —$Z^{31}$—C(═O)—O—, —$Z^{31}$—O— or —$Z^{31}$—O—C(═O)—. $Z^{31}$ is a $C_1$-$C_{12}$ hydrocarbylene group, phenylene group or $C_7$-$C_{18}$ group obtained by combining the foregoing, which may contain a carbonyl moiety, ester bond, ether bond, iodine or bromine. $Z^4$ is a methylene, 2,2,2-trifluoro-1,1-ethanediyl or carbonyl group. $Z^5$ is a single bond, methylene, ethylene, phenylene, fluorinated phenylene, trifluoromethyl-substituted phenylene group, —O—$Z^5$—, —C(═O)—O—$Z^5$—, or —C(═O)—NH—$Z^{51}$—. $Z^{51}$ is a $C_1$-$C_6$ aliphatic hydrocarbylene group, phenylene group, fluorinated phenylene group, or trifluoromethyl-substituted phenylene group, which may contain a carbonyl moiety, ester bond, ether bond or hydroxy moiety.

In formulae (f1) to (3), $R^{21}$ to $R^{28}$ are each independently halogen or a $C_1$-$C_{20}$ hydrocarbyl group which may contain a heteroatom. The hydrocarbyl group may be saturated or unsaturated and straight, branched or cyclic. Examples thereof are as will be exemplified later for the groups $R^{10'}$ to $R^{105}$ in formulae (1-1) and (1-2). A pair of $R^{23}$ and $R^{24}$ or $R^{26}$ and $R^{27}$ may bond together to form a ring with the sulfur atom to which they are attached. Examples of the ring are as will be exemplified later for the ring that $R^{101}$ and $R^{102}$ in formula (1-1), taken together, form with the sulfur atom to which they are attached.

In formula (f1), $M^-$ is a non-nucleophilic counter ion. Examples of the non-nucleophilic counter ion include halide ions such as chloride and bromide ions; fluoroalkylsulfonate ions such as triflate, 1,1,1-trifluoroethanesulfonate, and nonafluorobutanesulfonate; arylsulfonate ions such as tosylate, benzenesulfonate, 4-fluorobenzenesulfonate, and 1,2,3,4,5-pentafluorobenzenesulfonate; alkylsulfonate ions such as mesylate and butanesulfonate; imide ions such as bis(trifluoromethylsulfonyl)imide, bis(perfluoroethylsulfonyl)imide and bis(perfluorobutylsulfonyl)imide; methide ions such as tris(trifluoromethylsulfonyl)methide and tris(perfluoroethylsulfonyl)methide.

Also included are sulfonate ions having fluorine substituted at α-position as represented by the formula (f1-1) and sulfonate ions having fluorine substituted at α-position and trifluoromethyl substituted at β-position as represented by the formula (f1-2).

(f1-1)

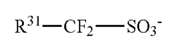

(f1-2)

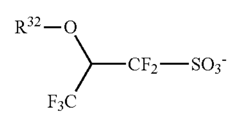

In formula (f1-1), $R^{31}$ is hydrogen or a $C_1$-$C_{20}$ hydrocarbyl group which may contain an ether bond, ester bond, carbonyl moiety, lactone ring, or fluorine atom. The hydrocarbyl group may be saturated or unsaturated and straight, branched or cyclic. Examples thereof are as will be exemplified for the hydrocarbyl group $R^{111}$ in formula (1A').

In formula (f1-2), $R^{32}$ is hydrogen or a $C_1$-$C_{30}$ hydrocarbyl or $C_2$-$C_{30}$ to hydrocarbylcarbonyl group, which may contain an ether bond, ester bond, carbonyl moiety or lactone ring. The hydrocarbyl group and the hydrocarbyl moiety in the hydrocarbylcarbonyl group may be saturated or unsaturated and straight, branched or cyclic. Examples thereof are as will be exemplified for the hydrocarbyl group $R^{111}$ in formula (1A').

Examples of the cation in the monomer from which repeat unit (f1) is derived are shown below, but not limited thereto. $R^A$ is as defined above.

-continued
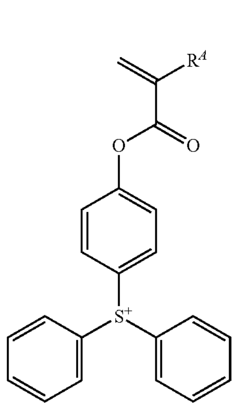
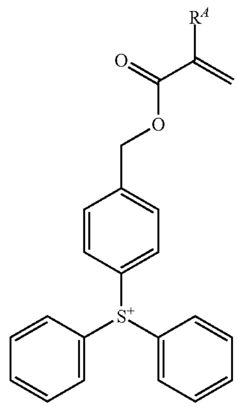
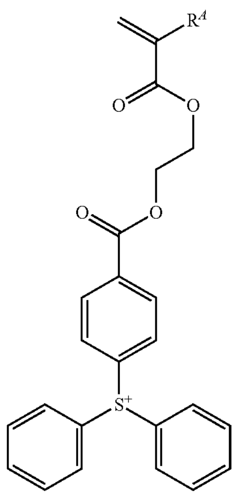
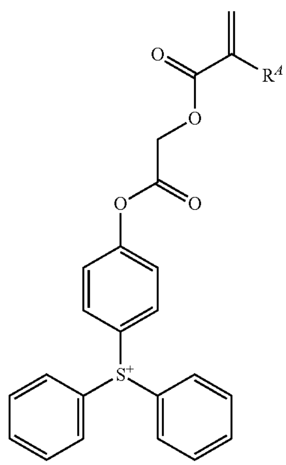
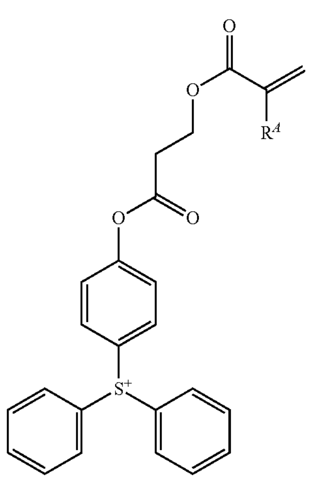
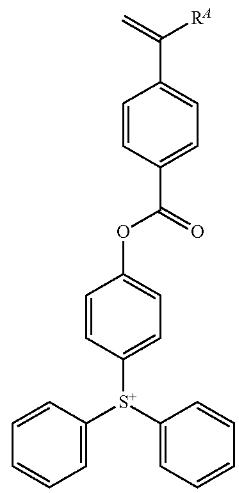
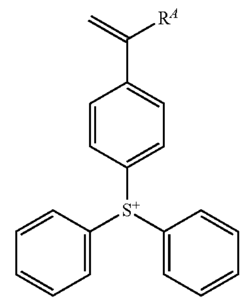
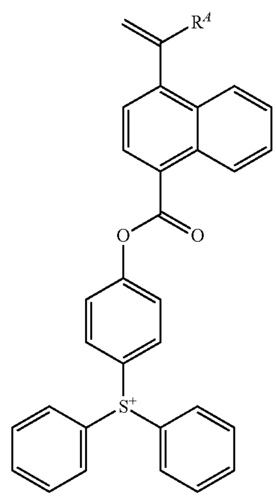
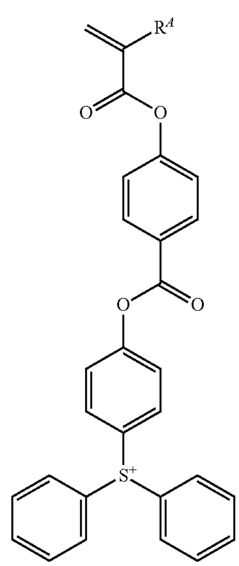
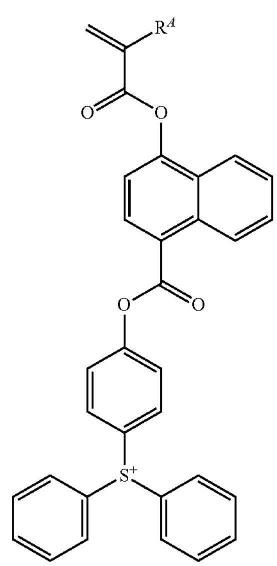

-continued
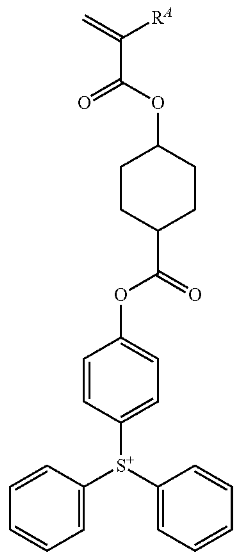
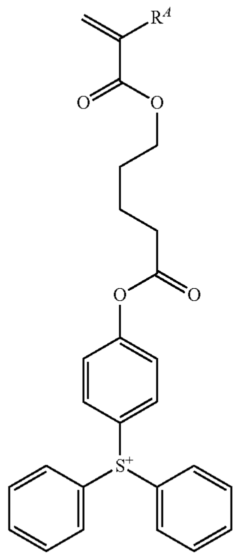
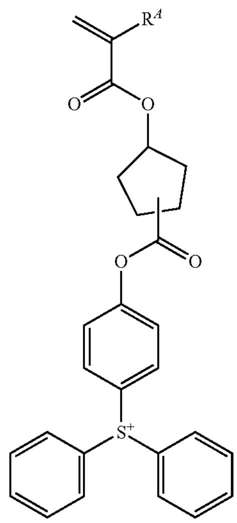
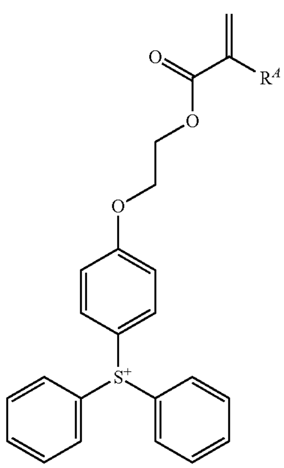
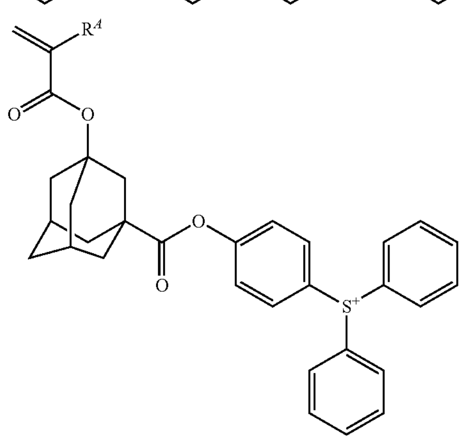
Examples of the cation in the monomer from which repeat unit (f2) or (f3) is derived are as will be exemplified for the cation in the sulfonium salt having formula (1-1).
Examples of the anion in the monomer from which repeat unit (f2) is derived are shown below, but not limited thereto. $R^A$ is as defined above.
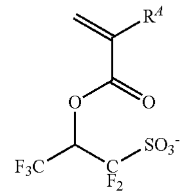
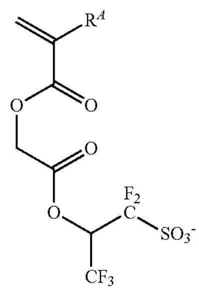
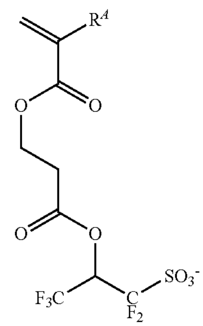
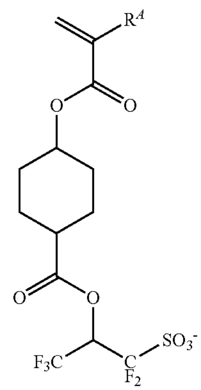
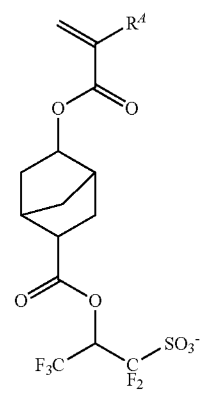
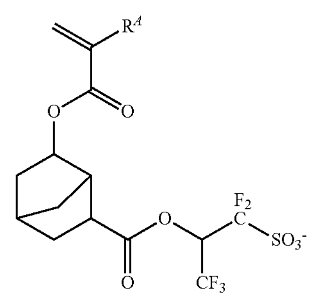
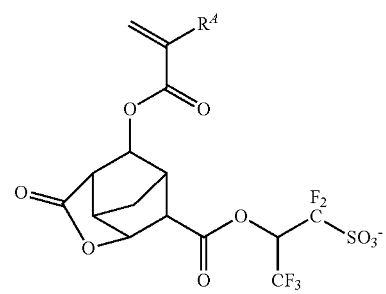
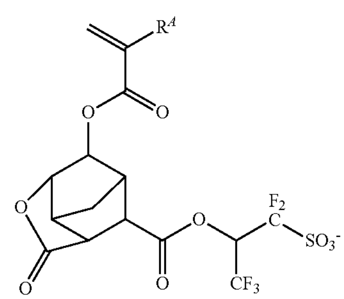

-continued
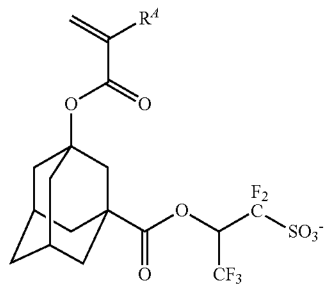
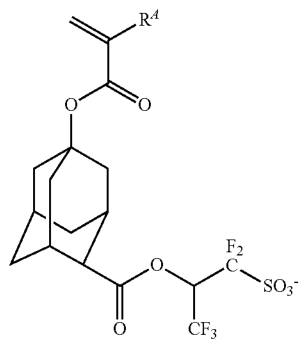
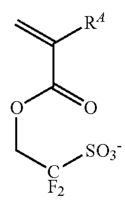
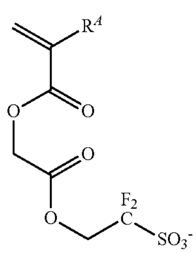
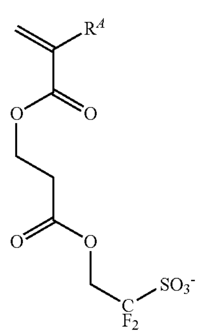
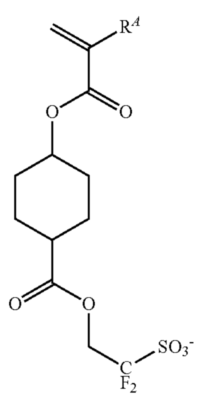
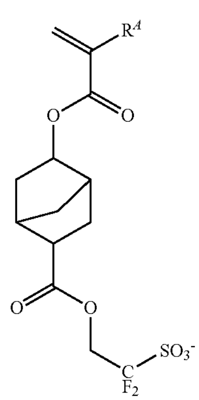
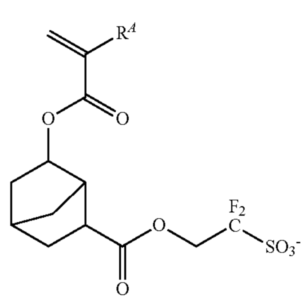
-continued
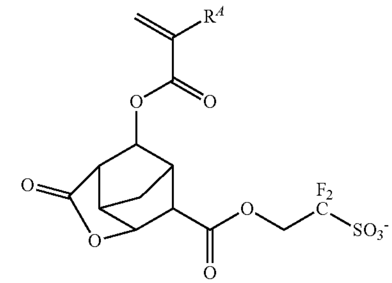
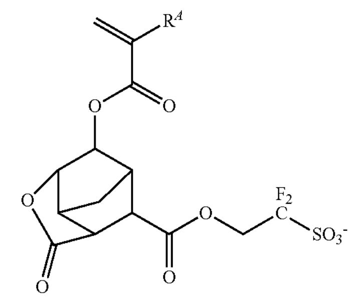
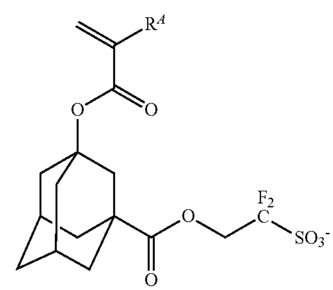
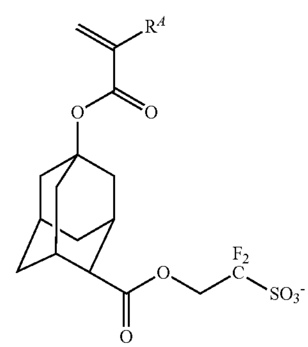
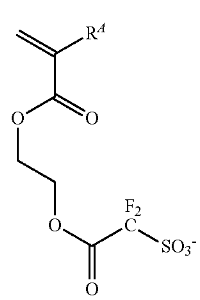
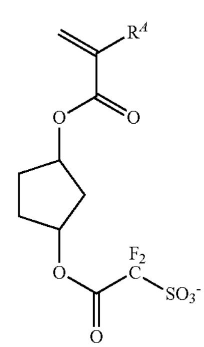

-continued
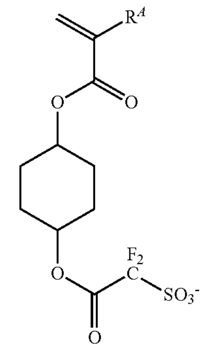
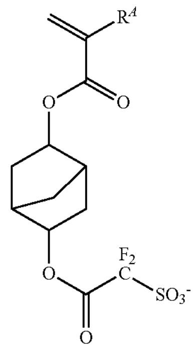
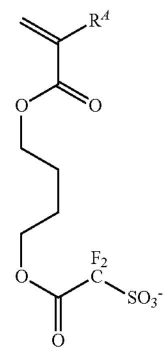
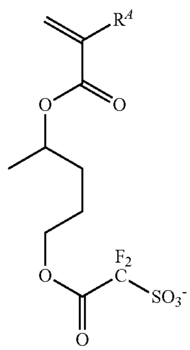
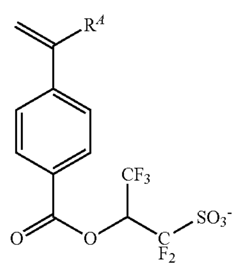
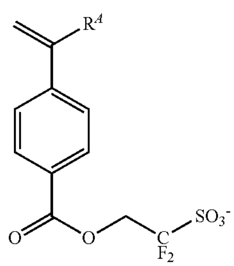
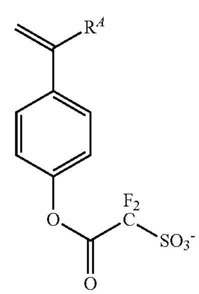
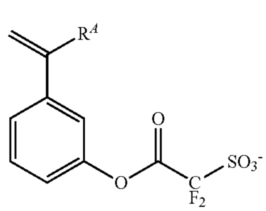
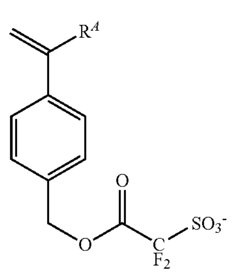
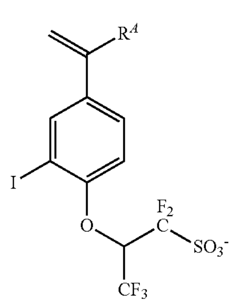
-continued
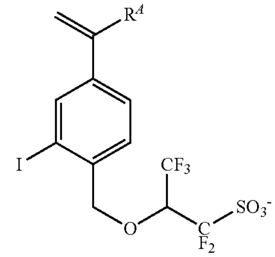
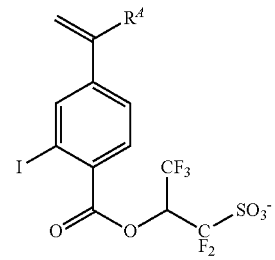
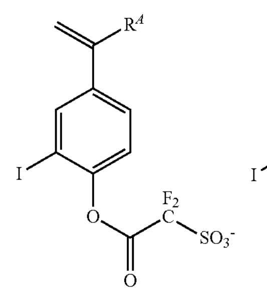
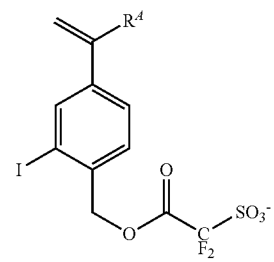
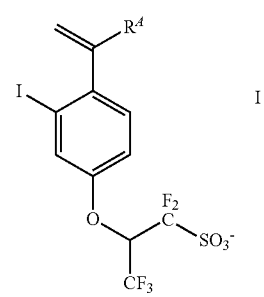
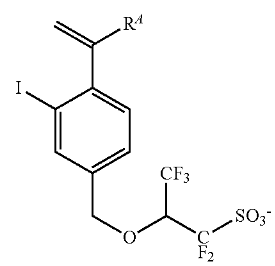
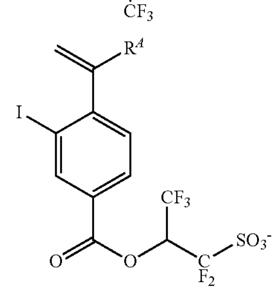
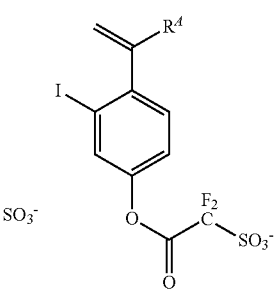
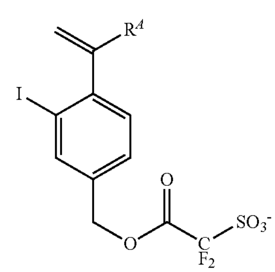
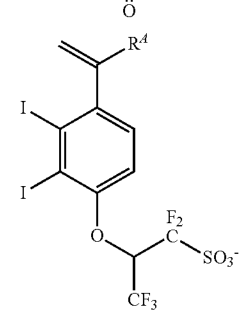

-continued
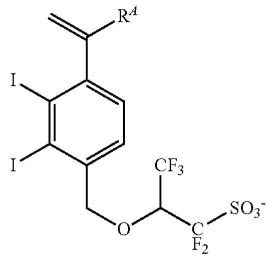
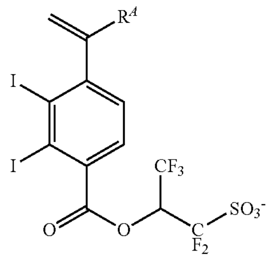
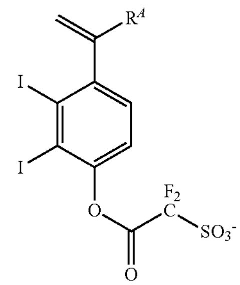
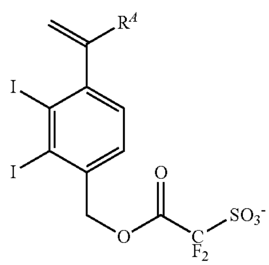
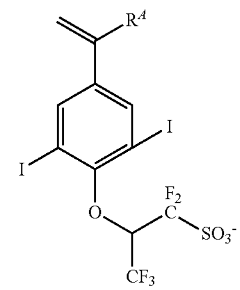
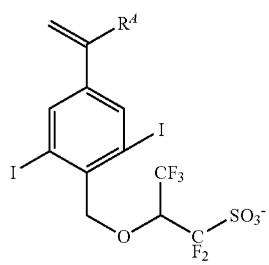
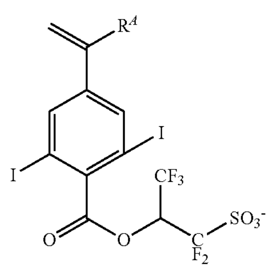
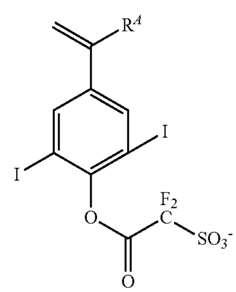
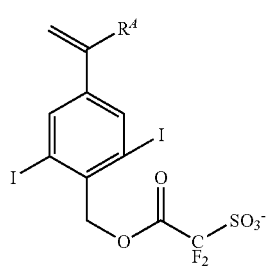
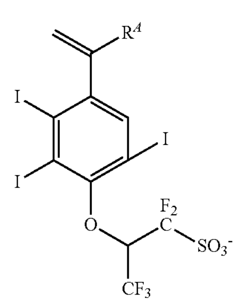
-continued
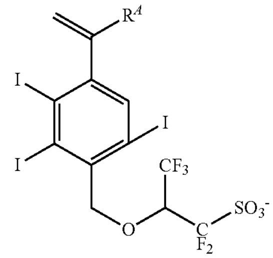
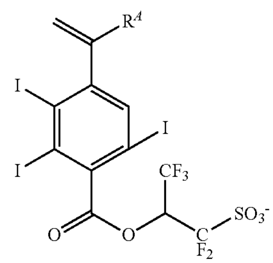
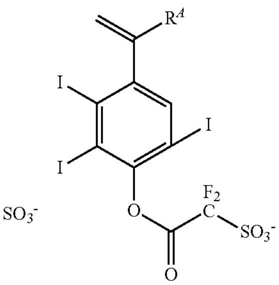
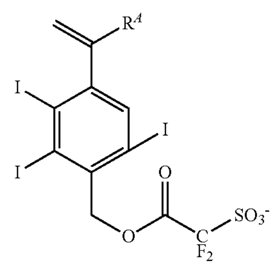
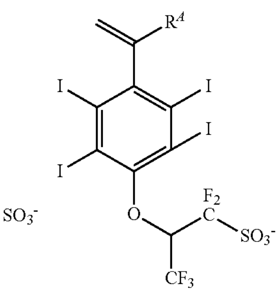
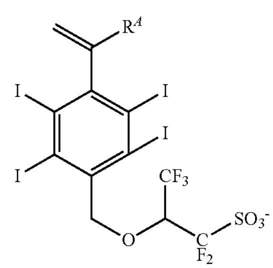
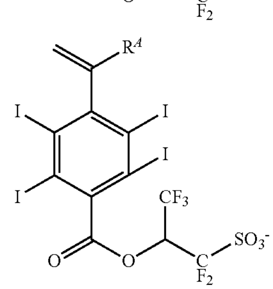
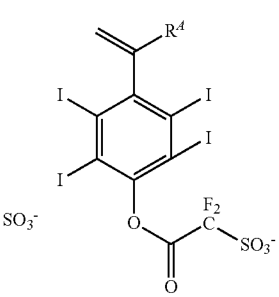
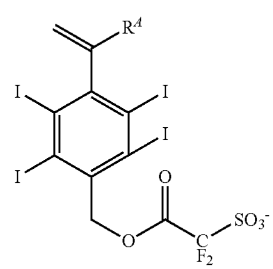

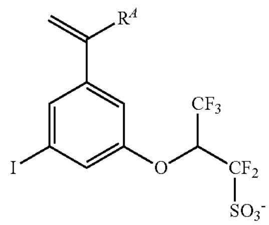
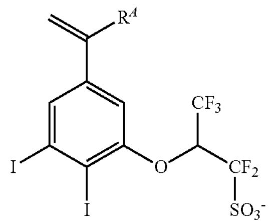
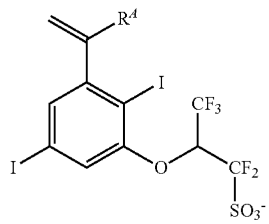
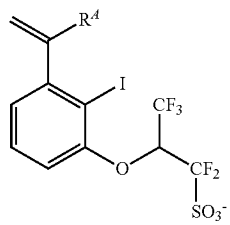
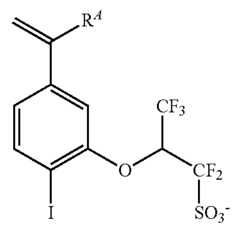
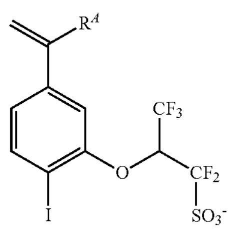
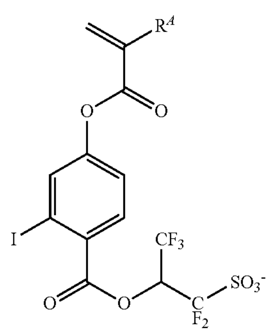
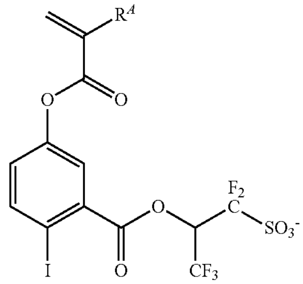
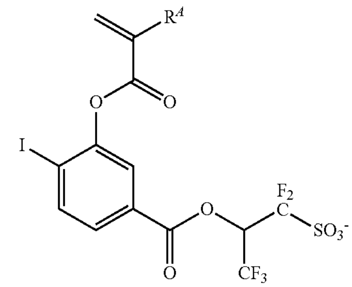
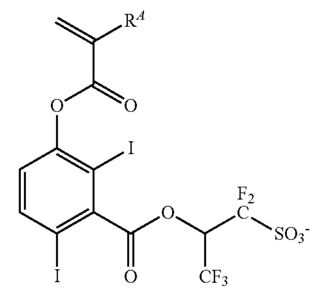
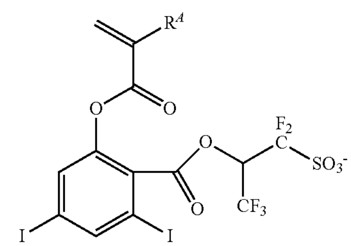
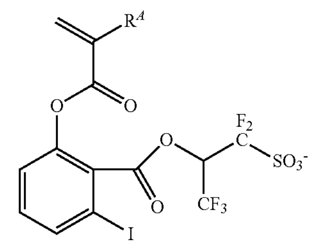
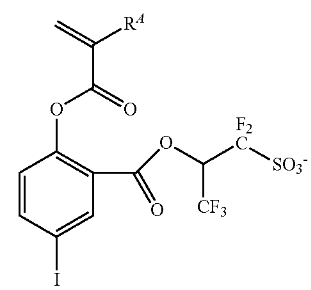
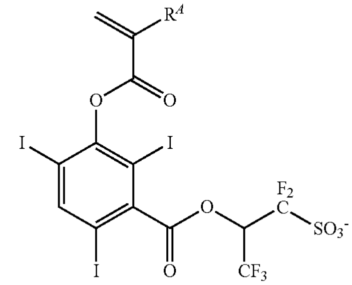

-continued
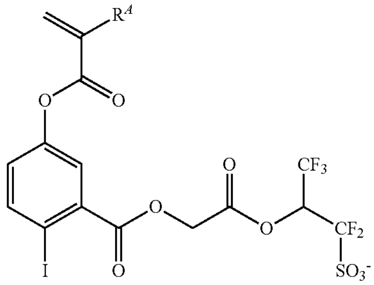
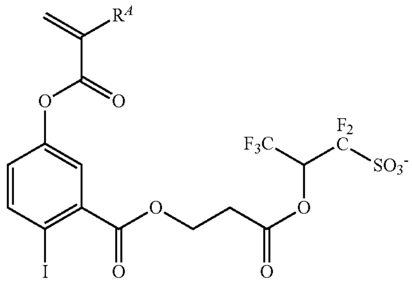
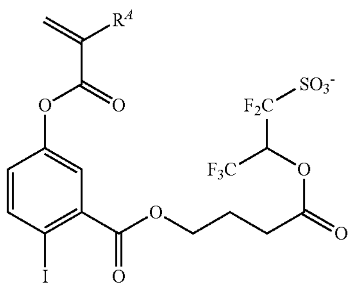
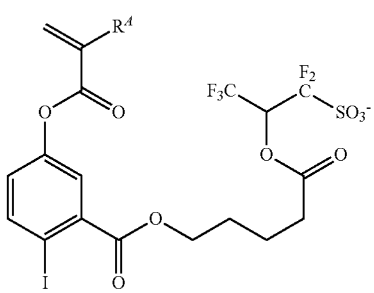
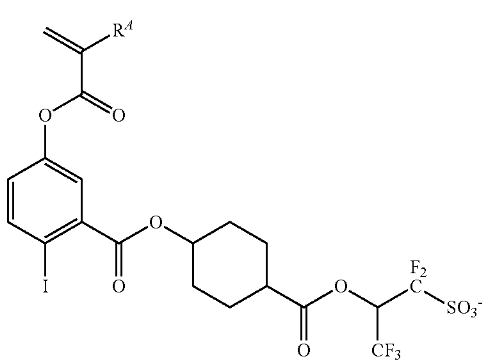
-continued
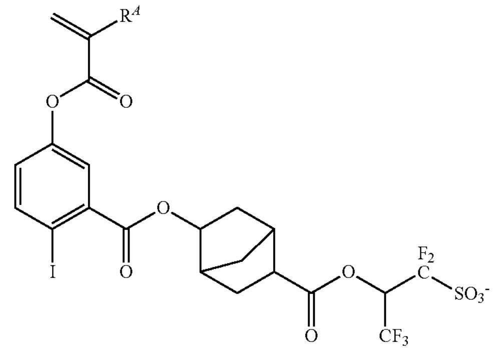
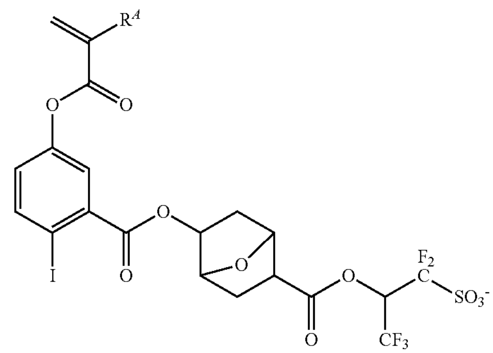
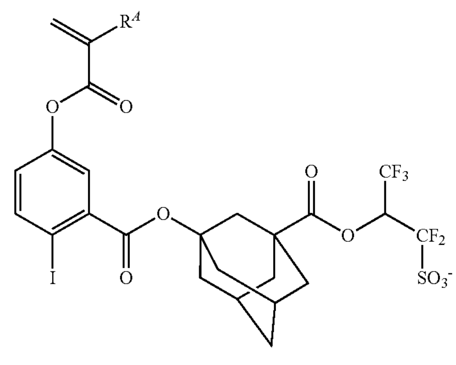
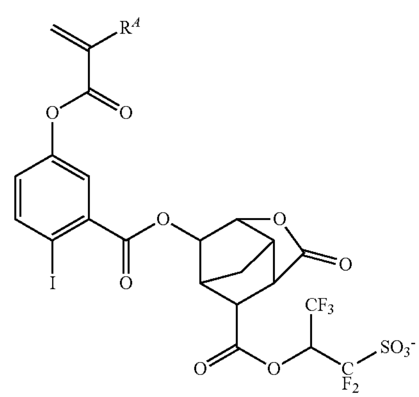

-continued
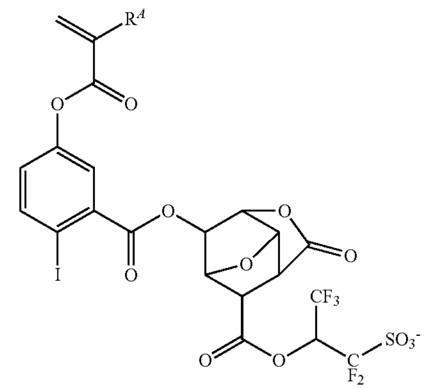
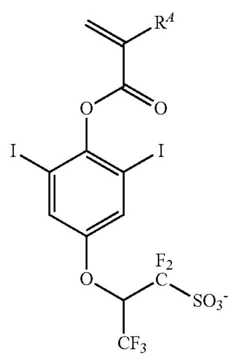
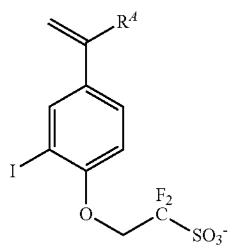
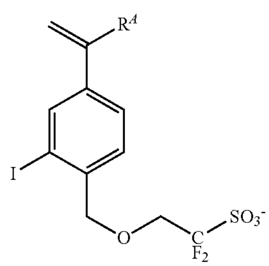
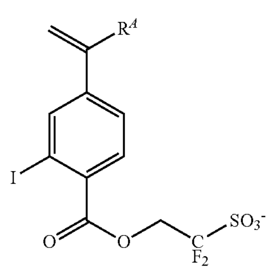
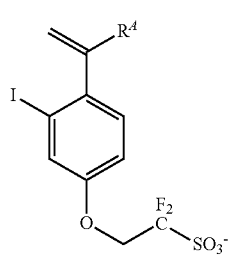
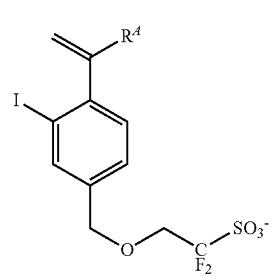
-continued
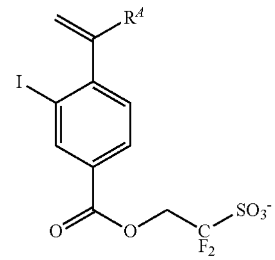
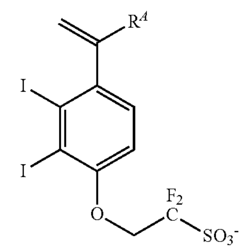
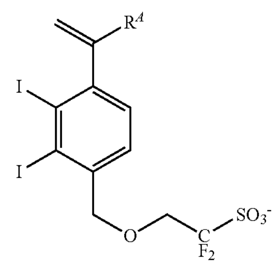
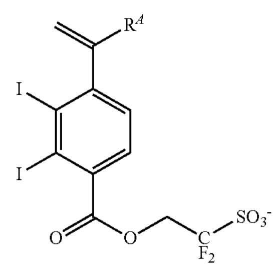
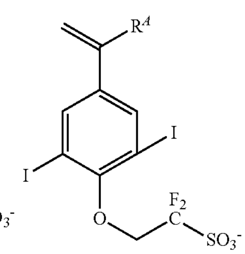
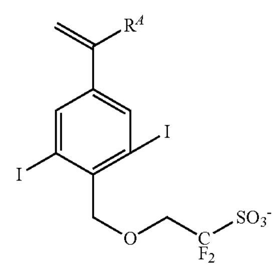
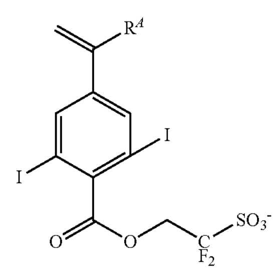
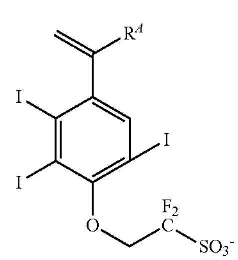
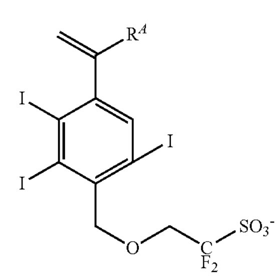

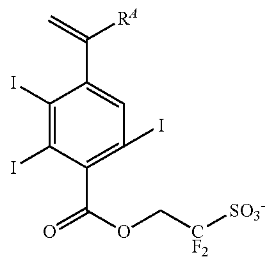
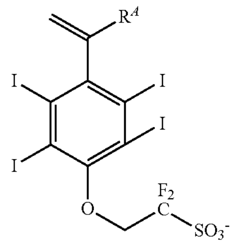
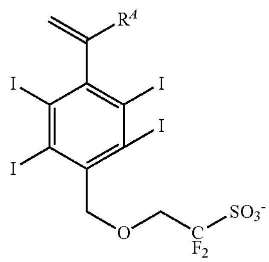
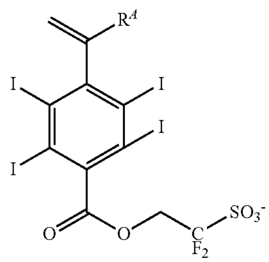
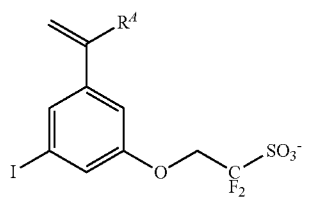
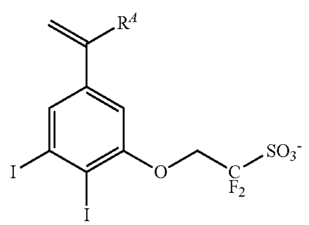
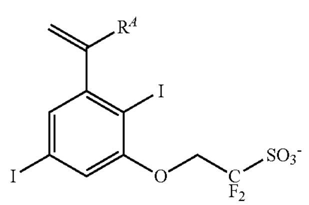
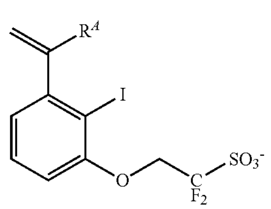
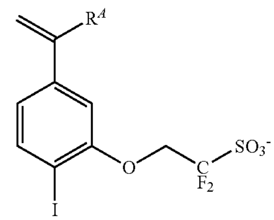
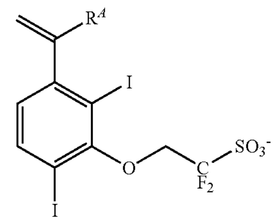
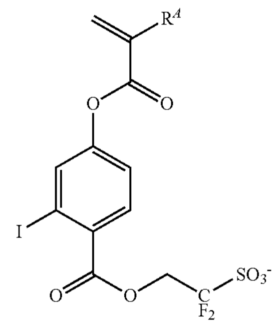
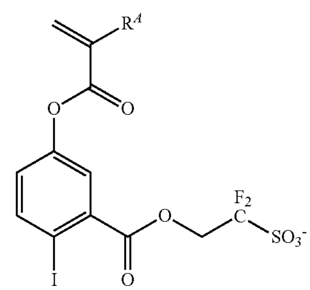
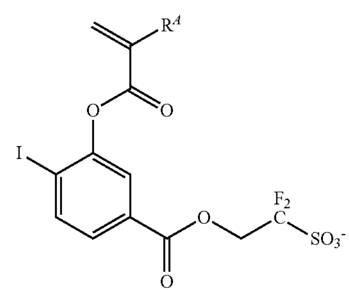
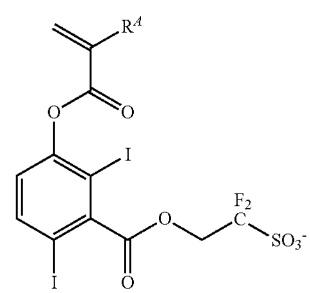

-continued
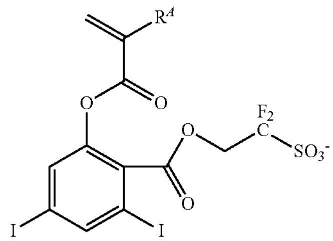
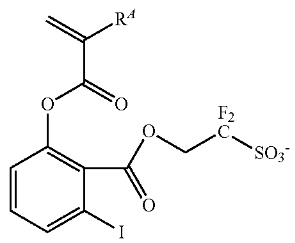
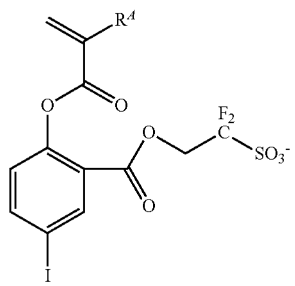
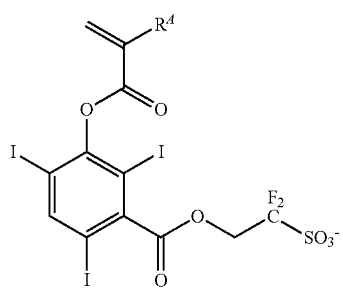
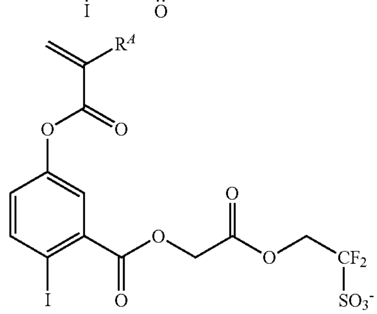
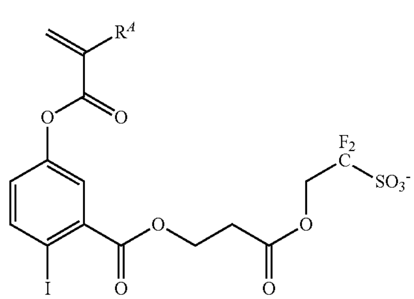
-continued
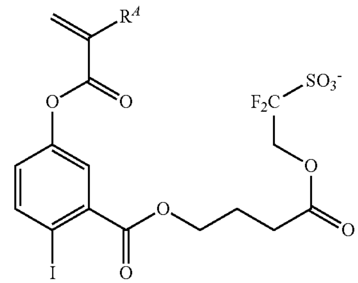
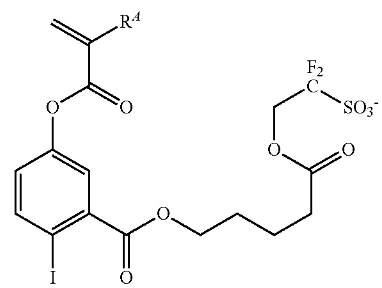
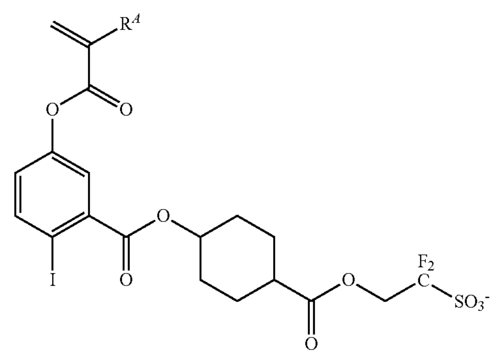
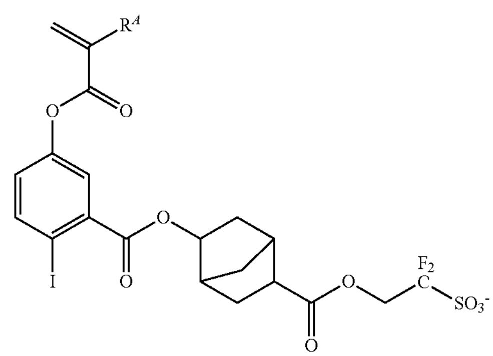
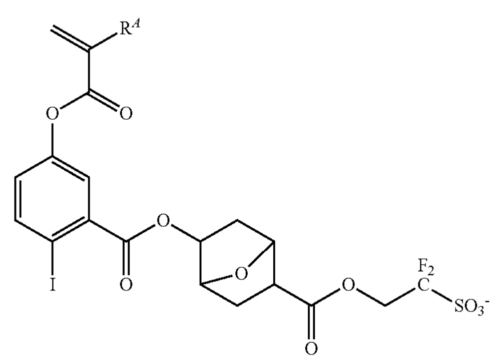

-continued

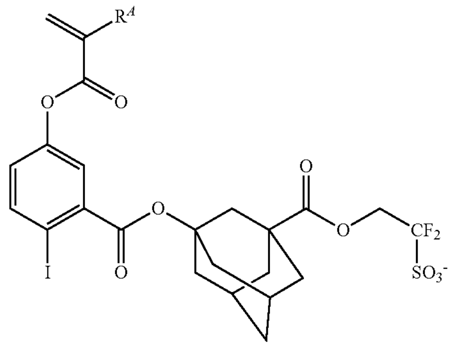

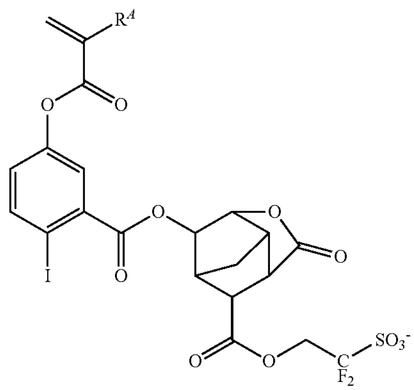

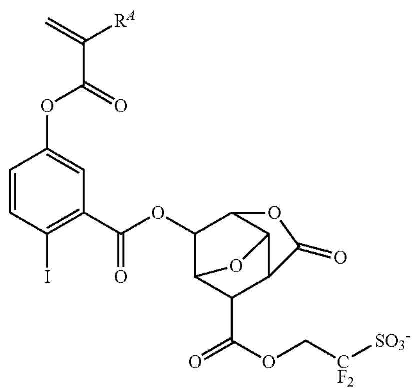

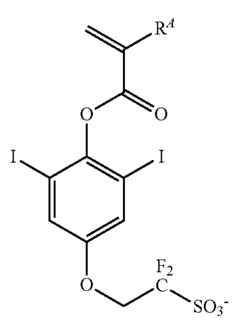

Examples of the anion in the monomer from which repeat unit (f3) is derived are shown below, but not limited thereto. $R^A$ is as defined above.

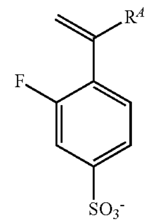
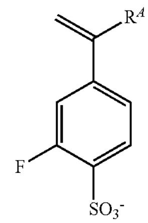
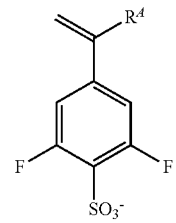

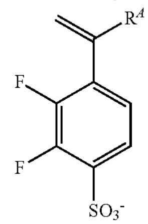
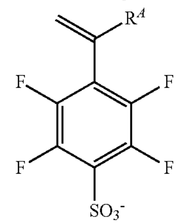
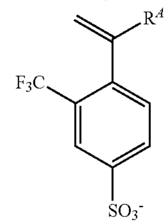

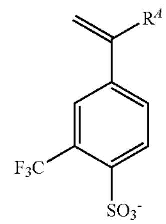
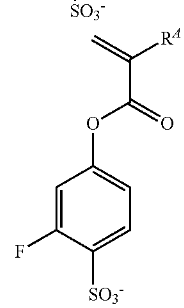

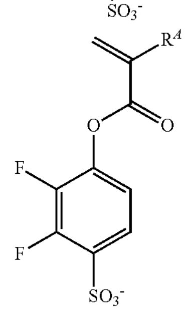
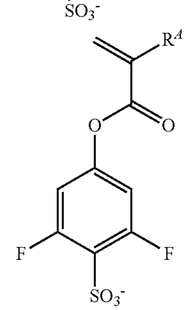

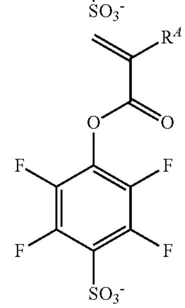
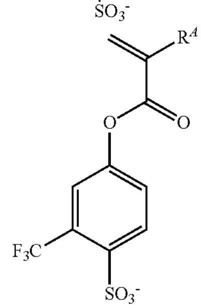

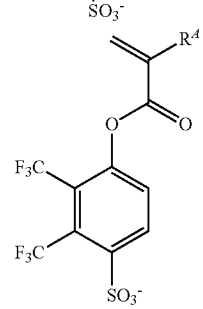
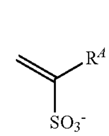
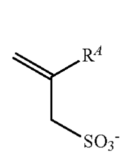

The attachment of an acid generator to the polymer main chain is effective in restraining acid diffusion, thereby preventing a reduction of resolution due to blur by acid diffusion. Also LWR or CDU is improved since the acid generator is uniformly distributed. Where a base polymer containing repeat units (f), i.e., polymer-bound acid generator is used, the addition of an acid generator of addition type may be omitted.

The base polymer for formulating the positive resist composition comprises repeat units (a1) or (a2) having an acid labile group as essential component and additional repeat units (b), (c), (d), (e), and (f) as optional components. A fraction of units (a1), (a2), (b), (c), (d), (e), and (f) is: preferably $0 \le a1 < 1.0$, $0 \le a2 < 1.0$, $0 < a1+a2 < 1.0$, $0 \le b \le 0.9$, $0 \le c \le 0.9$, $0 \le d \le 0.8$, $0 \le e \le 0.8$, and $0 \le f \le 0.5$; more preferably $0 \le a1 \le 0.9$, $0 \le a2 \le 0.9$, $0.1 \le a1+a2 \le 0.9$, $0 \le b \le 0.8$, $0 \le c \le 0.8$, $0 \le d < 0.7$, $0 \le e \le 0.7$, and $0 \le f \le 0.4$; and even more preferably $0 \le a1 \le 0.8$, $0 \le a2 \le 0.8$, $0.1 \le a1+a2 \le 0.8$, $0 \le b \le 0.75$, $0 \le c \le 0.75$, $0 \le d \le 0.6$, $0 \le e \le 0.6$, and $0 \le f \le 0.3$. Notably, $f=f1+f2+f3$, meaning that unit (f) is at least one of units (f1) to (f3), and $a1+a2+b+c+d+e+f=1.0$.

For the base polymer for formulating the negative resist composition, an acid labile group is not necessarily essential. The base polymer comprises repeat units (b), and optionally repeat units (c), (d), (e), and/or (f). A fraction of these units is: preferably $0 < b \le 1.0$, $0 \le c \le 0.9$, $0 \le d \le 0.8$, $0 \le e \le 0.8$, and $0 \le f \le 0.5$; more preferably $0.2 \le b \le 1.0$, $0 \le c \le 0.8$, $0 \le d \le 0.7$, $0 \le e \le 0.7$, and $0 \le f \le 0.4$; and even more preferably $0.3 \le b \le 1.0$, $0 \le c \le 0.75$, $0 \le d \le 0.6$, $0 \le e \le 0.6$, and $0 \le f \le 0.3$. Notably, $f=f1+f2+f3$, meaning that unit (f) is at least one of units (f1) to (f3), and $b+c+d+e+f=1.0$.

The base polymer may be synthesized by any desired methods, for example, by dissolving one or more monomers selected from the monomers corresponding to the foregoing repeat units in an organic solvent, adding a radical polymerization initiator thereto, and heating for polymerization. Examples of the organic solvent which can be used for polymerization include toluene, benzene, tetrahydrofuran (THF), diethyl ether, and dioxane. Examples of the polymerization initiator used herein include 2,2'-azobisisobutyronitrile (AIBN), 2,2'-azobis(2,4-dimethylvaleronitrile), dimethyl 2,2-azobis(2-methylpropionate), benzoyl peroxide, and lauroyl peroxide. Preferably, the polymerization temperature is 50 to 80° C. and the reaction time is 2 to 100 hours, more preferably 5 to 20 hours.

Where a monomer having a hydroxy group is copolymerized, the hydroxy group may be replaced by an acetal group susceptible to deprotection with acid, typically ethoxyethoxy, prior to polymerization, and the polymerization be followed by deprotection with weak acid and water. Alternatively, the hydroxy group may be replaced by an acetyl, formyl, pivaloyl or similar group prior to polymerization, and the polymerization be followed by alkaline hydrolysis.

When hydroxystyrene or hydroxyvinylnaphthalene is copolymerized, an alternative method is possible. Specifically, acetoxystyrene or acetoxyvinyluaphthalene is used instead of hydroxystyrene or hydroxyvinylnaphthalene, and after polymerization, the acetoxy group is deprotected by alkaline hydrolysis, for thereby converting the polymer product to hydroxystyrene or hydroxyvinylnaphthalene. For alkaline hydrolysis, a base such as aqueous ammonia or triethylamine may be used. Preferably the reaction temperature is −20° C. to 100° C., more preferably 0° C. to 60° C., and the reaction time is 0.2 to 100 hours, more preferably 0.5 to 20 hours.

The base polymer should preferably have a Mw in the range of 1,000 to 500,000, and more preferably 2,000 to 30,000, as measured by GPC versus polystyrene standards using THF solvent. A Mw in the range ensures that the resist film has heat resistance and solubility in alkaline developer.

If a base polymer has a wide Mw/Mn, which indicates the presence of lower and higher molecular weight polymer fractions, there is a possibility that foreign matter is left on the pattern or the pattern profile is degraded. The influences of Mw and Mw/Mn become stronger as the pattern rule becomes finer. Therefore, the base polymer should preferably have a narrow dispersity (Mw/Mn) of 1.0 to 2.0, especially 1.0 to 1.5, in order to provide a resist composition suitable for micropatteming to a small feature size.

The base polymer may be a blend of two or more polymers which differ in compositional ratio, Mw or Mw/Mn.

Acid Generator

The resist composition may comprise an acid generator capable of generating a strong acid (referred to as acid generator of addition type, hereinafter). As used herein, the term "strong acid" refers to a compound having a sufficient acidity to induce deprotection reaction of an acid labile group on the base polymer in the case of a chemically amplified positive resist composition, or a compound having a sufficient acidity to induce acid-catalyzed polarity switch reaction or crosslinking reaction in the case of a chemically amplified negative resist composition. The inclusion of such an acid generator ensures that the inventive resist composition functions as a chemically amplified positive or negative resist composition.

The acid generator is typically a compound (PAG) capable of generating an acid upon exposure to actinic ray or radiation. Although the PAG used herein may be any compound capable of generating an acid upon exposure to high-energy radiation, those compounds capable of generating sulfonic acid, imide acid (imidic acid) or methide acid are preferred. Suitable PAGs include sulfonium salts, iodonium salts, sulfonyldiazometlane, N-sulfonyloxyimide, and oxime-O-sulfonate acid generators. Exemplary PAGs are described in JP-A 2008-111103, paragraphs [0122]-[0142] (U.S. Pat. No. 7,537,880).

As the PAG used herein, sulfonium salts having the formula (1-1) and iodonium salts having the formula (1-2) are also preferred.

$$R^{102}-\overset{\overset{\displaystyle R^{101}}{|}}{S^{+}}-R^{103}\ Xa^{-} \qquad (1\text{-}1)$$

$$R^{104}-I^{+}-R^{105}\ Xa^{-} \qquad (1\text{-}2)$$

In formulae (1-1) and (1-2), $R^{101}$ to $R^{105}$ are each independently halogen or a $C_1$-$C_{20}$ hydrocarbyl group which may contain a heteroatom. Suitable halogen atoms include fluorine, chlorine, bromine and iodine. The $C_1$-$C_{20}$ hydrocarbyl group may be saturated or unsaturated and straight, branched or cyclic. Examples thereof include $C_1$-$C_{20}$ alkyl groups such as methyl, ethyl, n-propyl, isopropyl, n-butyl, isobutyl, sec-butyl, tert-butyl, n-pentyl, n-hexyl, n-octyl, n-nonyl, n-decyl, undecyl, dodecyl, tridecyl, tetradecyl, pentadecyl, heptadecyl, octadecyl, nonadecyl and icosyl; $C_3$-$C_{20}$ saturated cyclic hydrocarbyl groups such as cyclopropyl, cyclopentyl, cyclohexyl, cyclopropylmethyl, 4-methylcyclohexyl, cyclohexyhnethyl, norbornyl, and adamantyl; $C_2$-$C_{20}$ alkenyl groups such as vinyl, propenyl, butenyl, and hexenyl; $C_2$-$C_{20}$ alkynyl groups such as ethynyl, propynyl and butynyl; $C_3$-$C_{20}$ unsaturated alicyclic hydrocarbyl groups such as cyclohexenyl and norbornenyl; $C_6$-$C_{20}$ aryl groups such as phenyl, methylphenyl, ethylphenyl, n-propylphenyl, isopropylphenyl, n-butylphenyl, isobutylphenyl, sec-butylphenyl, tert-butylphenyl, naphthyl, methylnaphthyl, ethyluaphthyl, n-propylnaphthyl, isopropylnaphthyl, n-butylnaphthyl, isobutylnaphthyl, sec-butylnaphthyl, and tert-butylnaphthyl; $C_7$-$C_{20}$ aralkyl groups such as benzyl and phenethyl; and combinations thereof.

In the foregoing groups, some or all of the hydrogen atoms may be substituted by a moiety containing a heteroatom such as oxygen, sulfur, nitrogen or halogen, or some carbon may be replaced by a moiety containing a heteroatom such as oxygen, sulfur or nitrogen, so that the group may contain a hydroxy moiety, cyano moiety, nitro moiety, carbonyl moiety, ether bond, ester bond, sulfonic ester bond, carbonate bond, lactone ring, sultone ring, carboxyic anhydride or haloalkyl moiety.

Also, $R^{101}$ and $R^{102}$ may bond together to form a ring with the sulfur atom to which they are attached. Preferred examples of the ring are shown by the following structure.

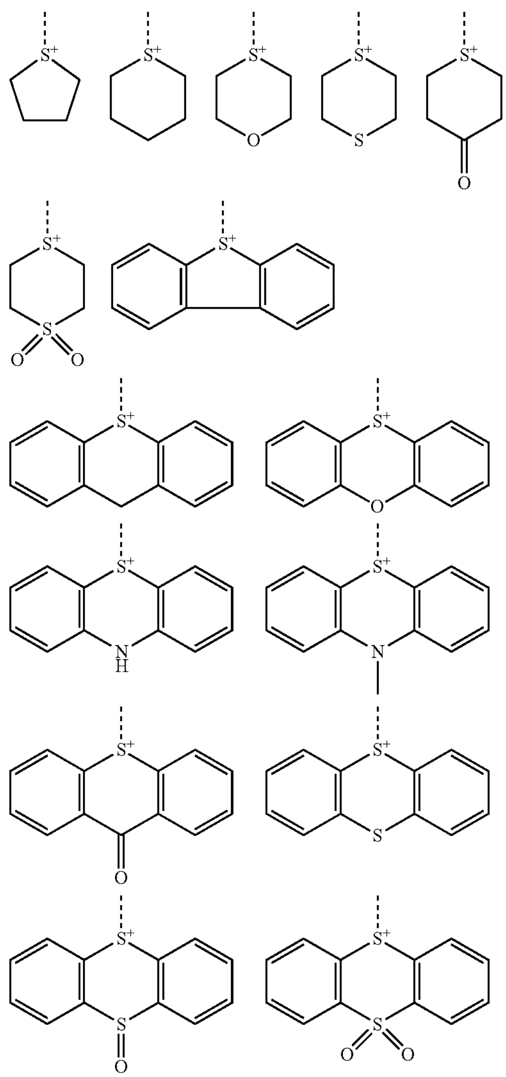

Herein the broken line designates a point of attachment to $R^{103}$.

Examples of the cation in the sulfonium salt having formula (1-1) are shown below, but not limited thereto.

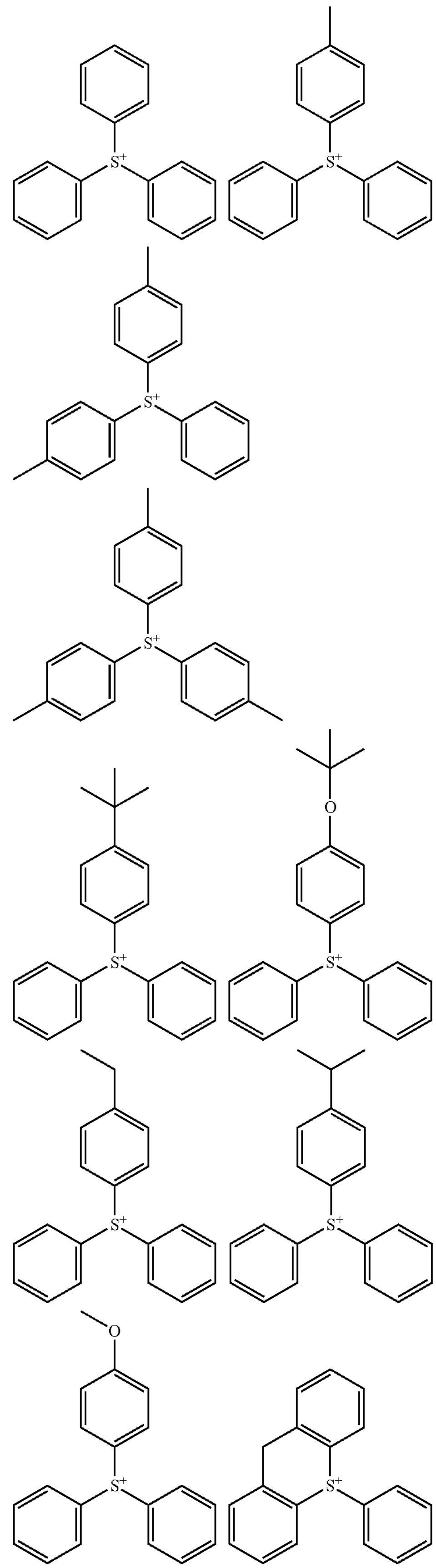

-continued
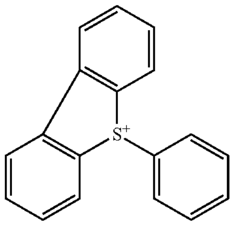
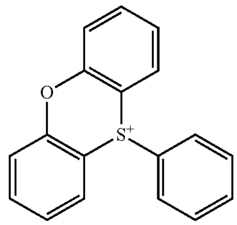
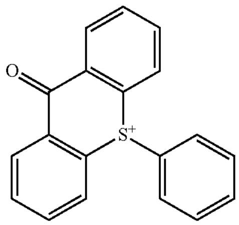
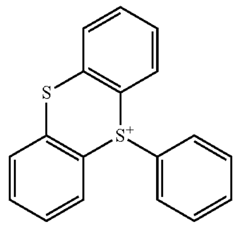
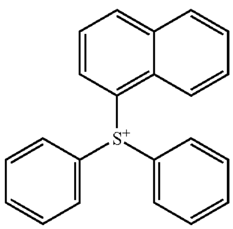
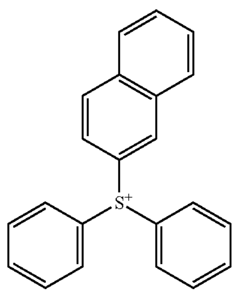
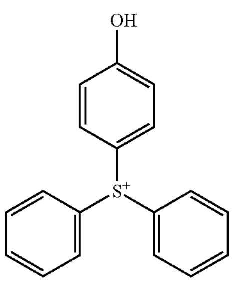
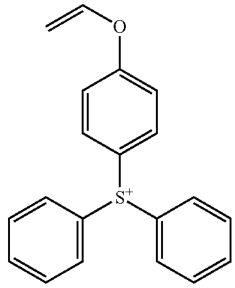
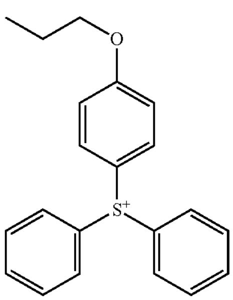
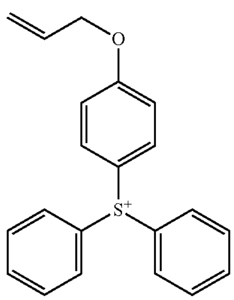
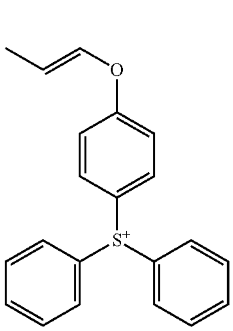
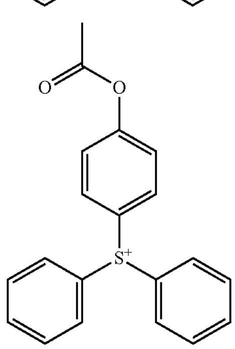
-continued
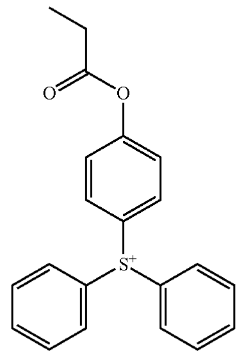
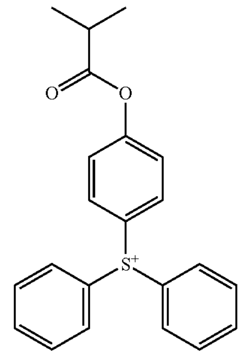
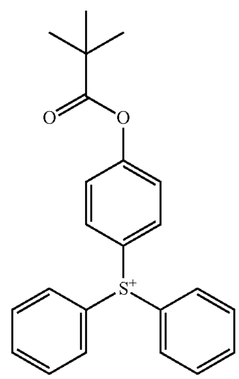
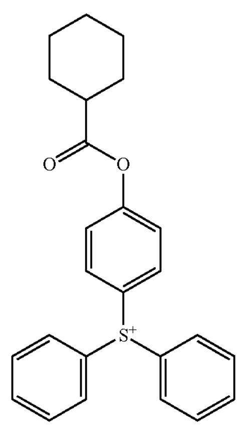
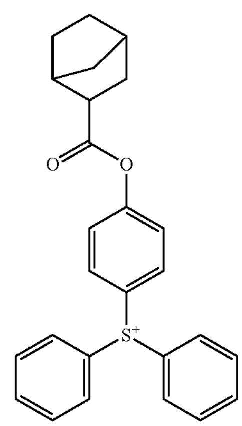
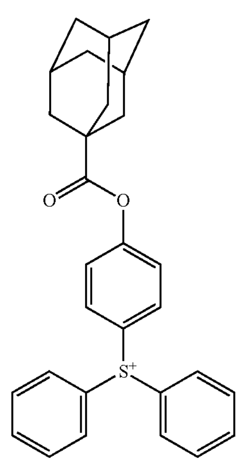
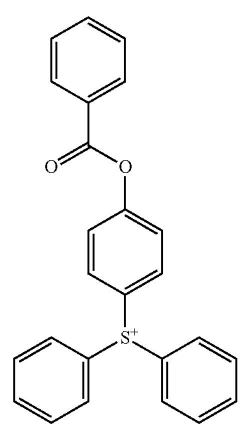

-continued
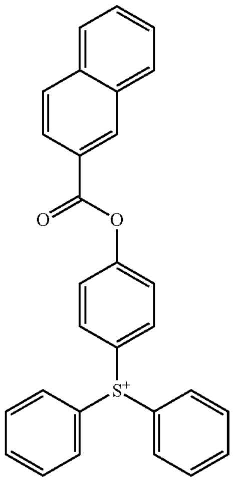
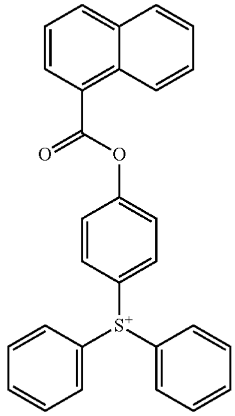
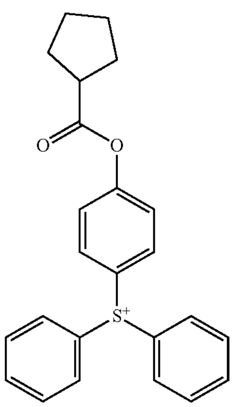
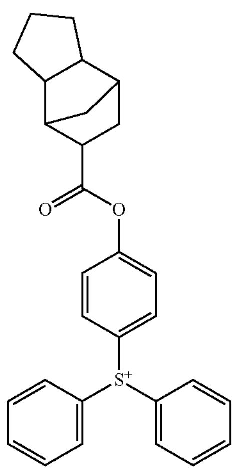
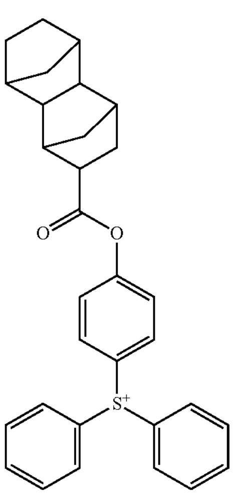
-continued
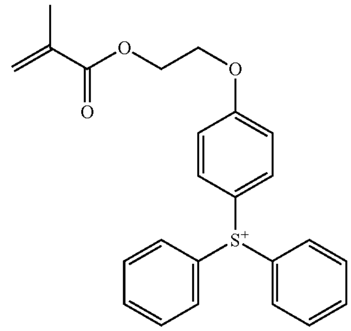
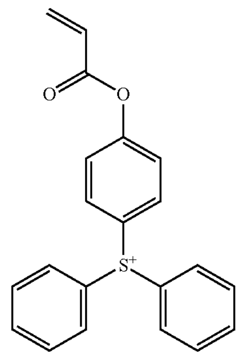
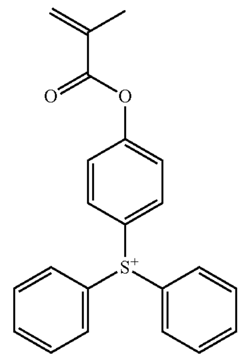
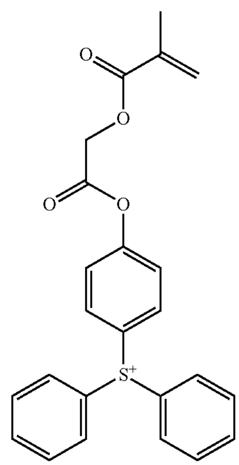
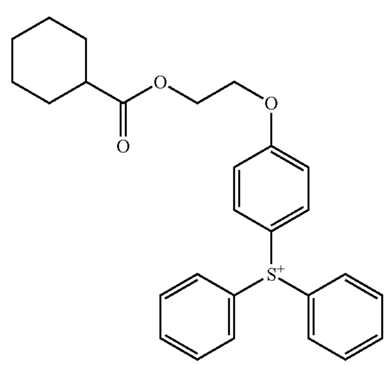

-continued
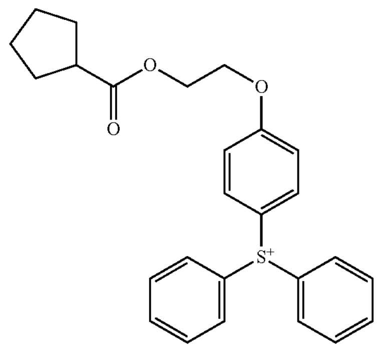
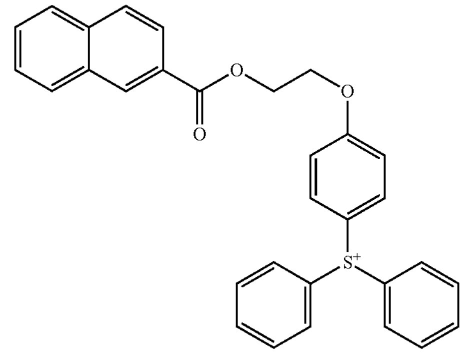
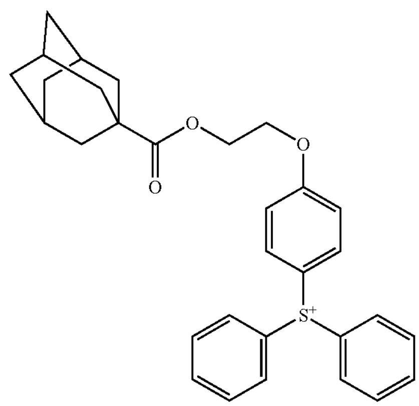
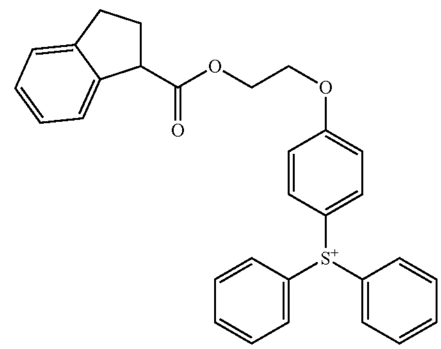
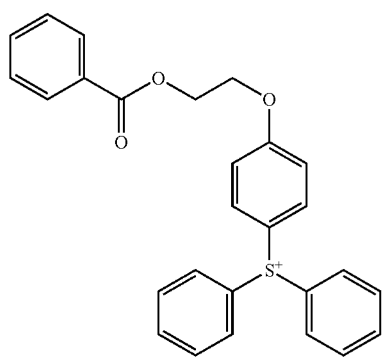
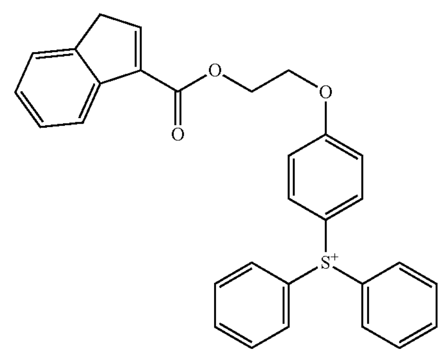
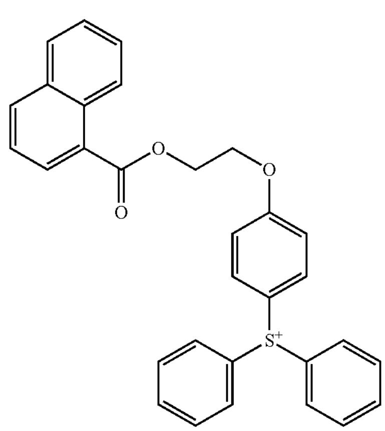
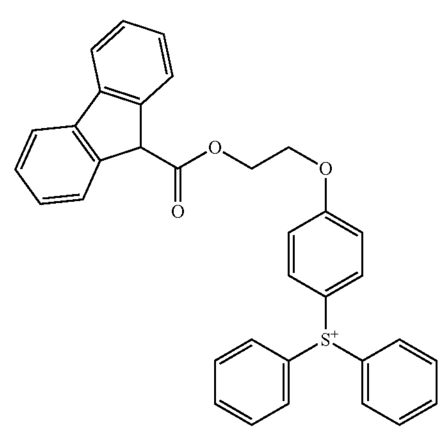

-continued
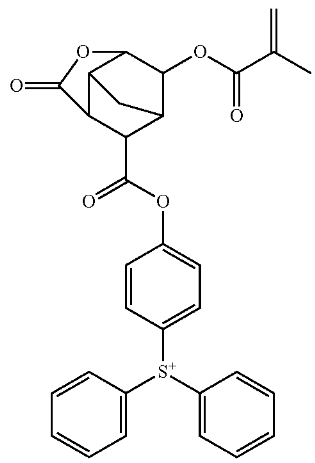
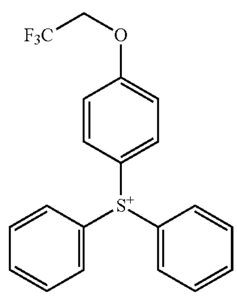
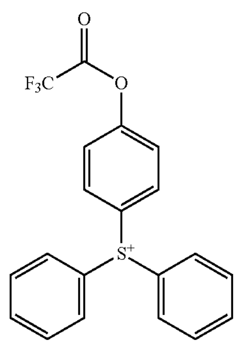
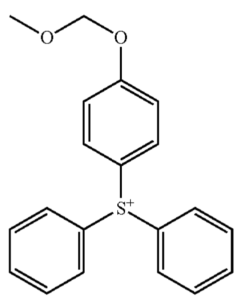
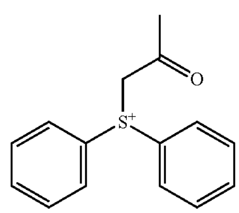
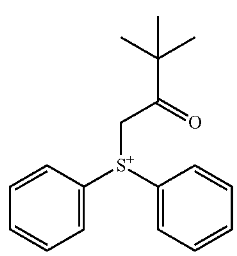
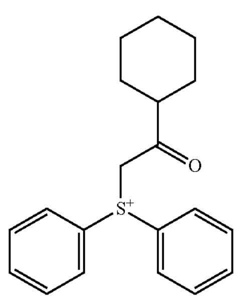
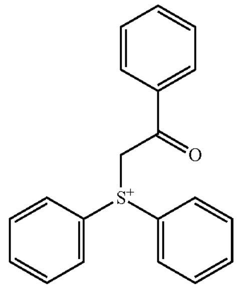
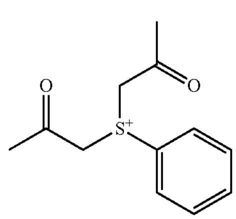
-continued
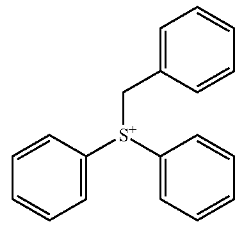
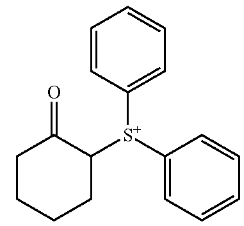
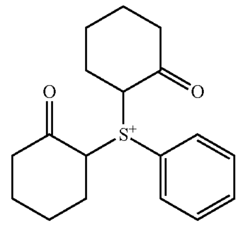
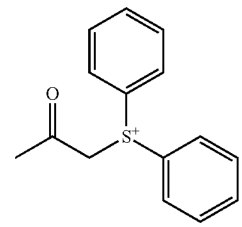
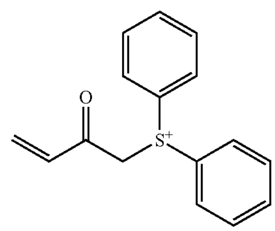
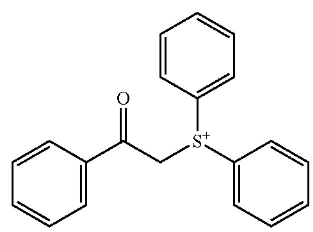
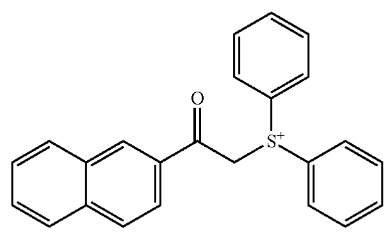
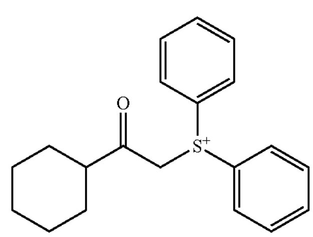
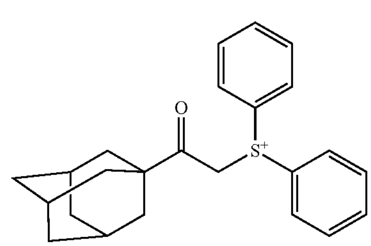

-continued
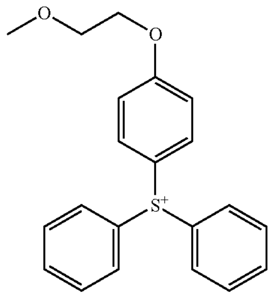
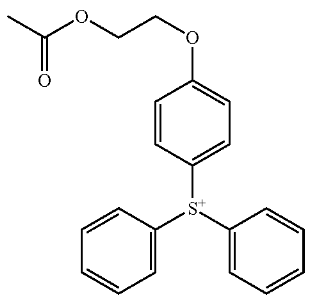
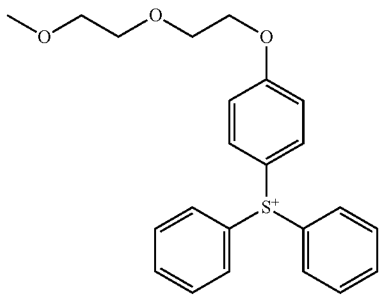
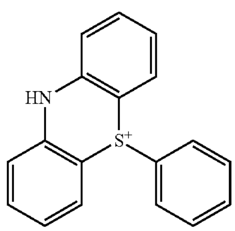
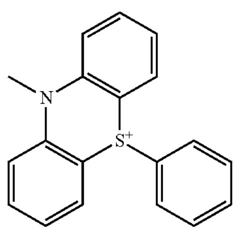
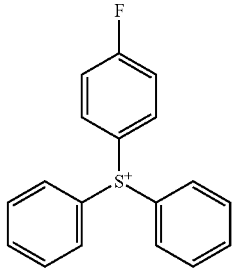
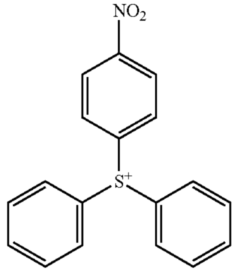
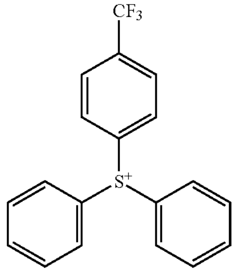
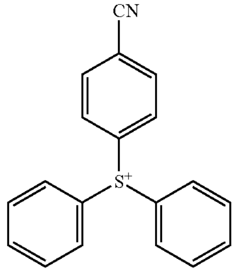
-continued
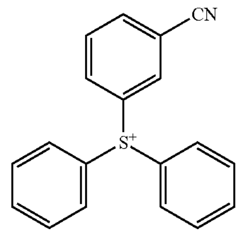
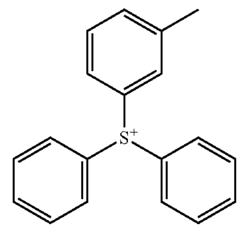
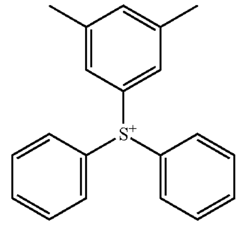
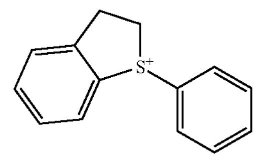
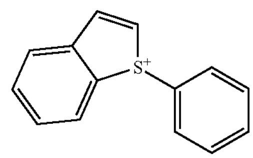
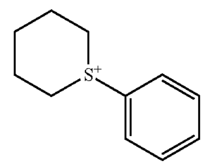
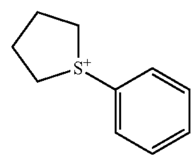
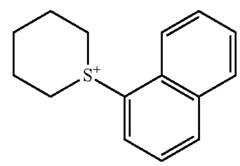
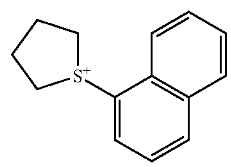
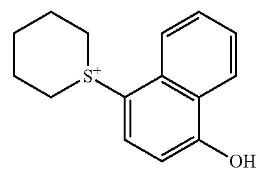
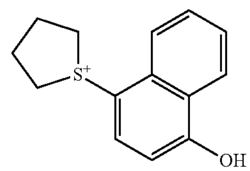
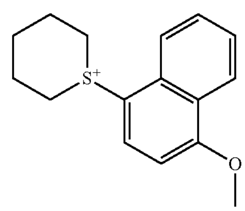
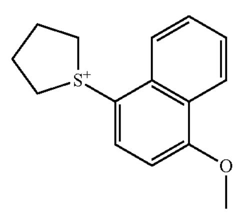
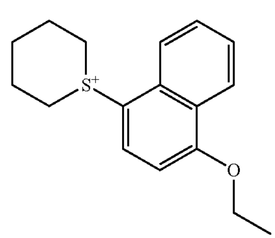

-continued
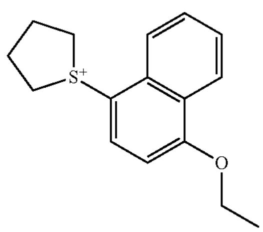
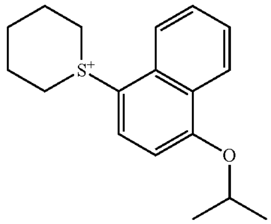
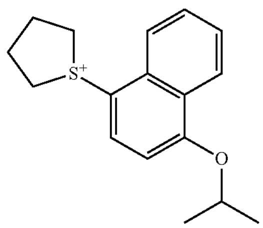
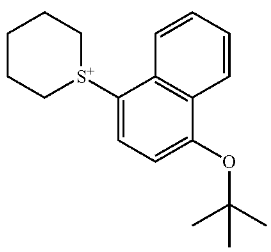
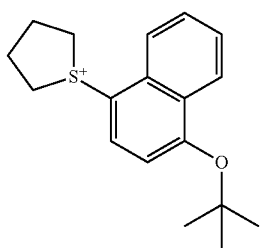
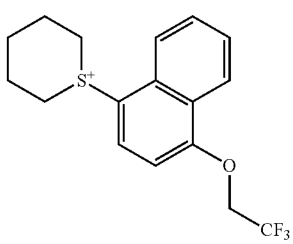
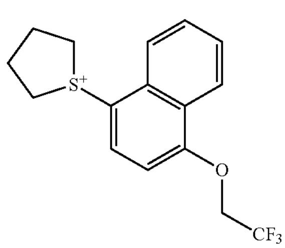
-continued
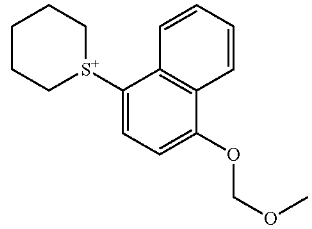
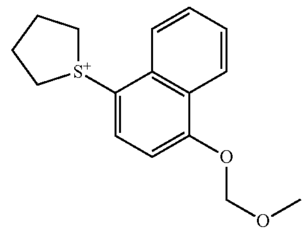
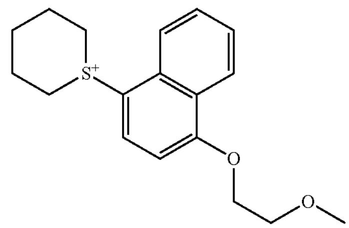
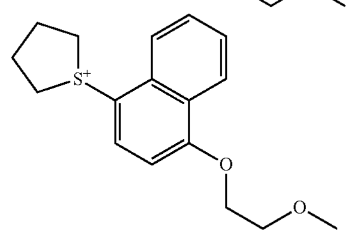
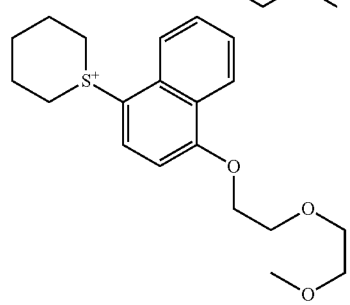
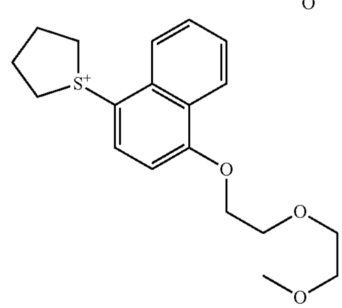
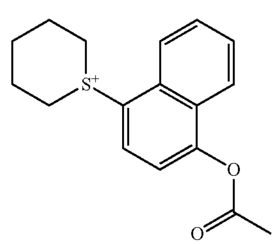
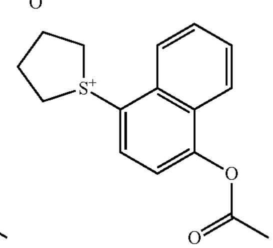

-continued
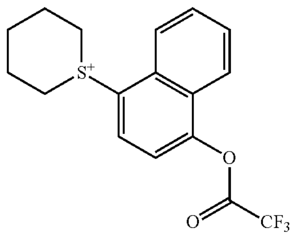
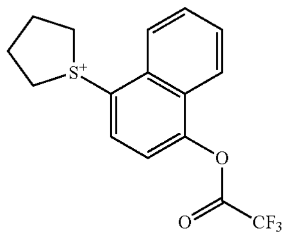
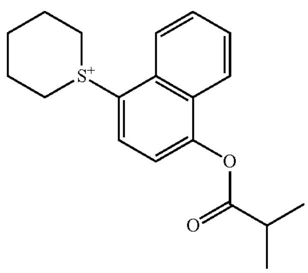
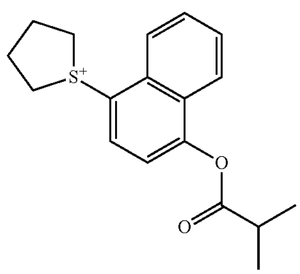
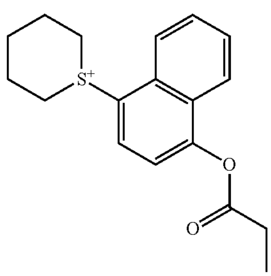
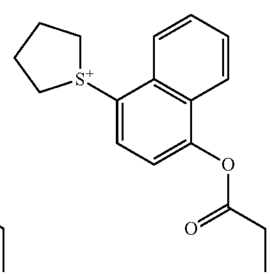
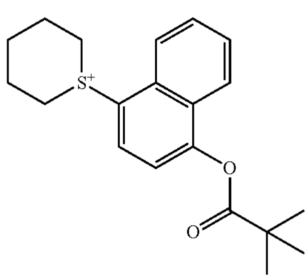
-continued
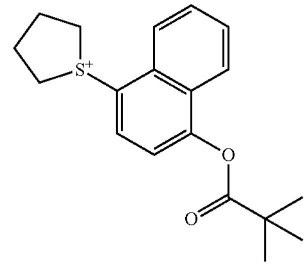
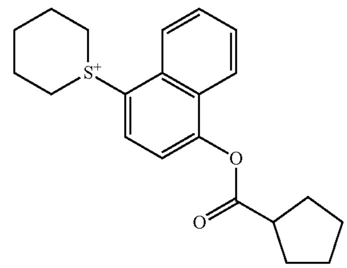
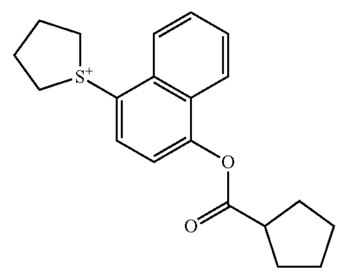
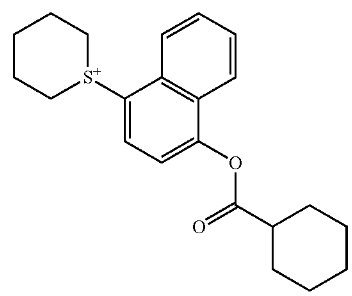
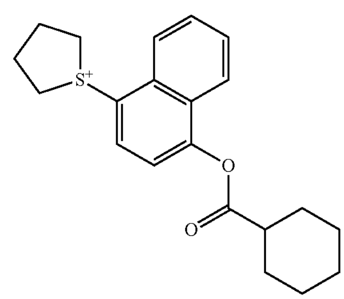
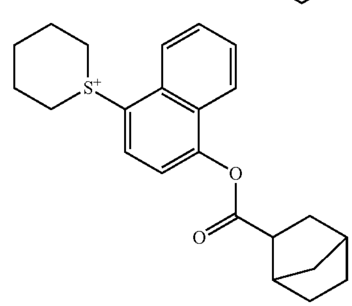

-continued
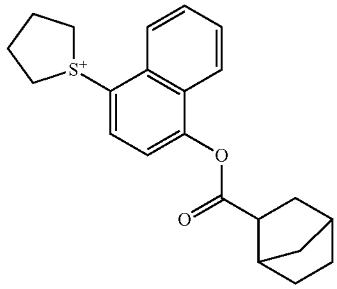
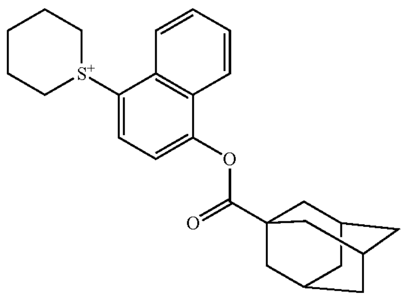
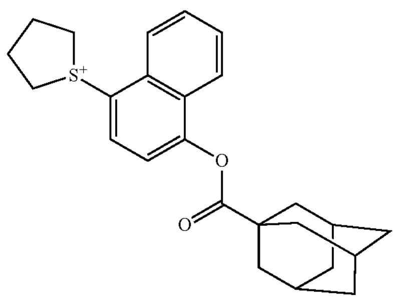
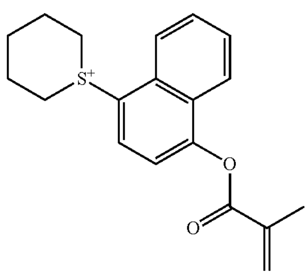
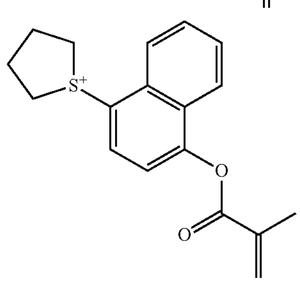
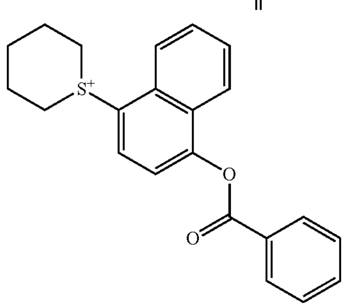
-continued
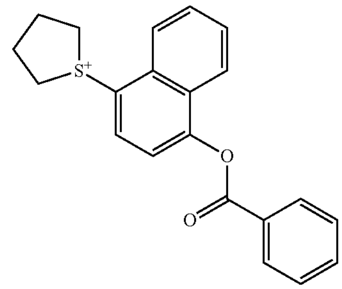
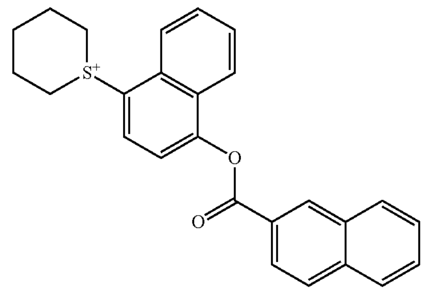
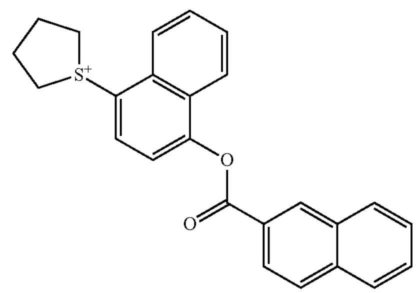
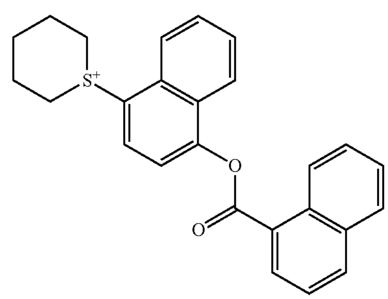
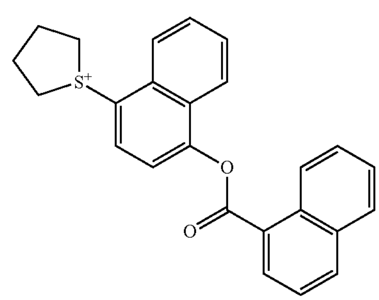

-continued
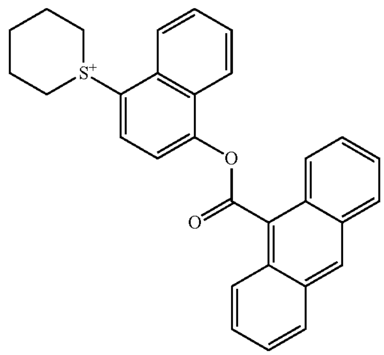
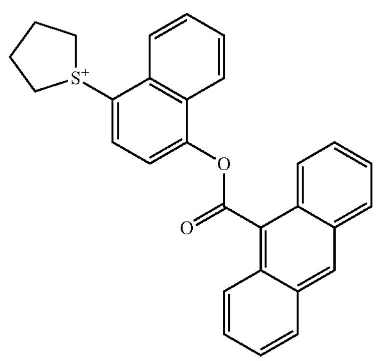
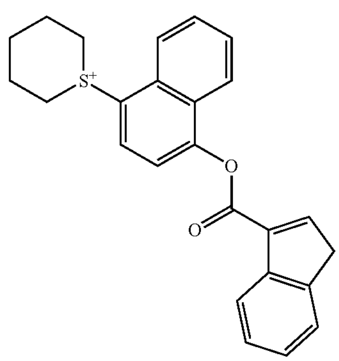
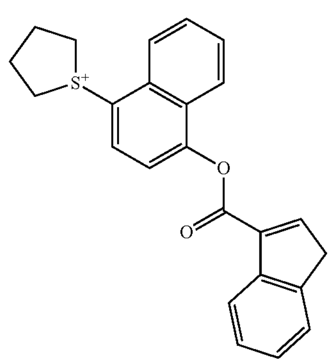
-continued
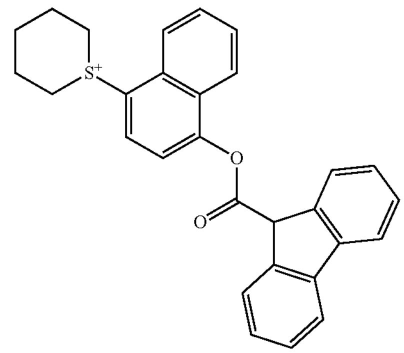
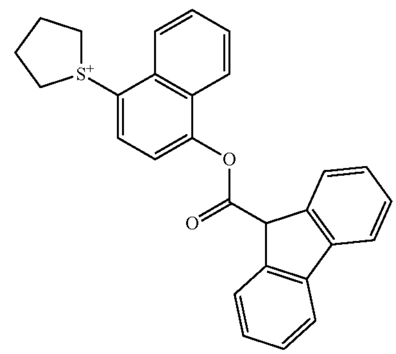
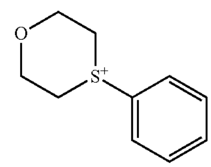
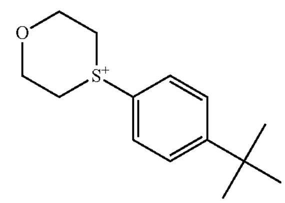
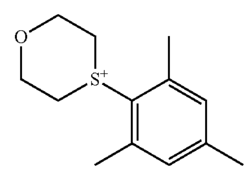
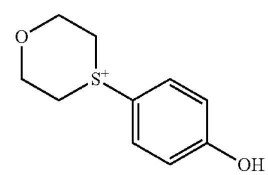
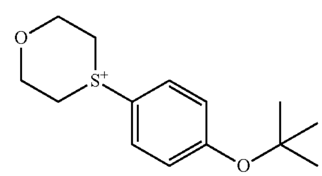
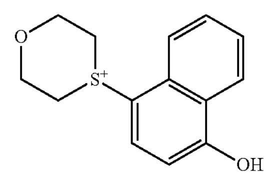
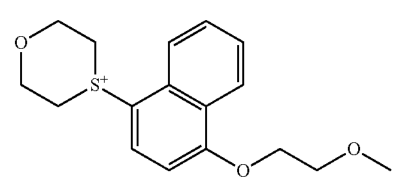

-continued
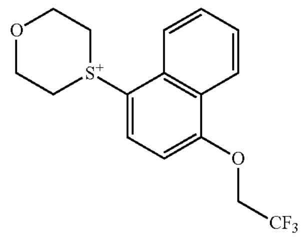
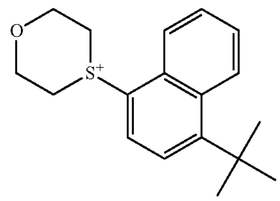
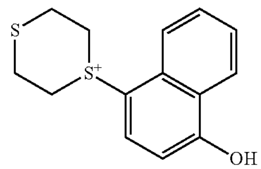
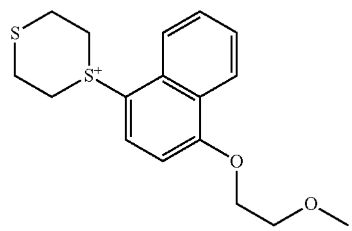
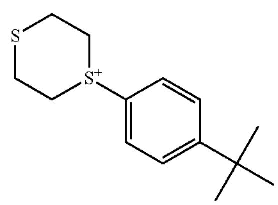
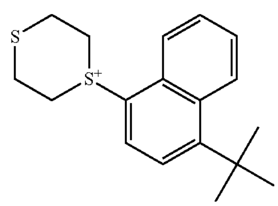
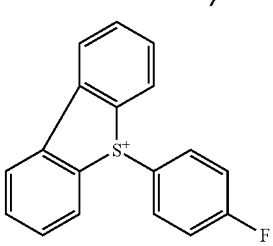
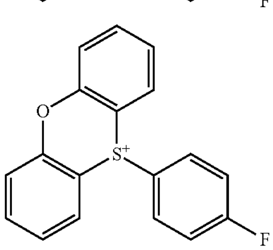
-continued
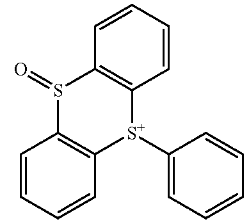
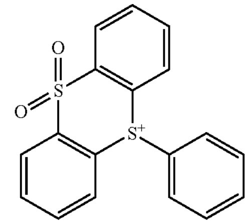
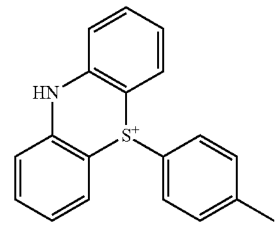
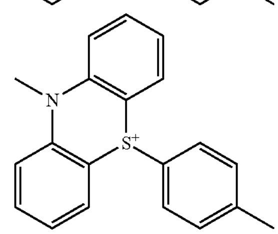
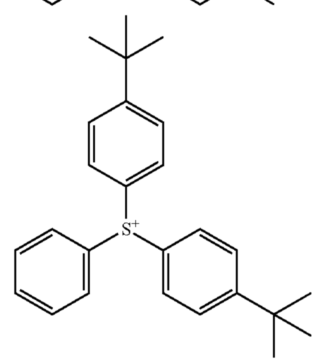
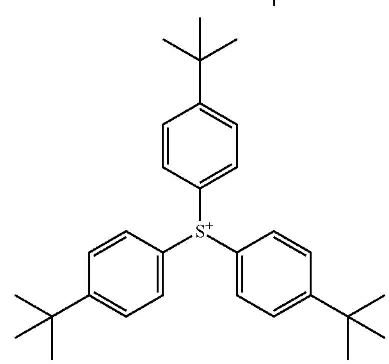
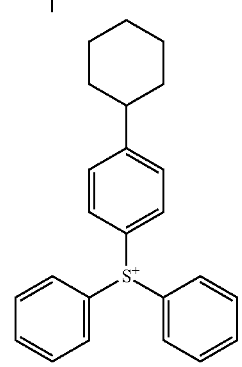

-continued
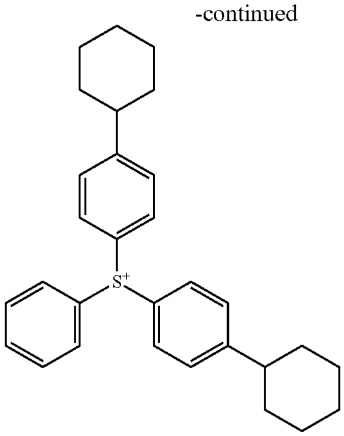
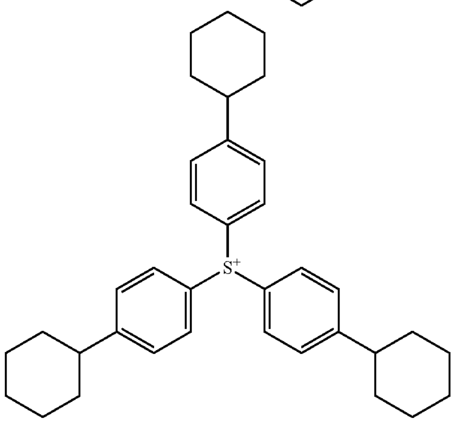
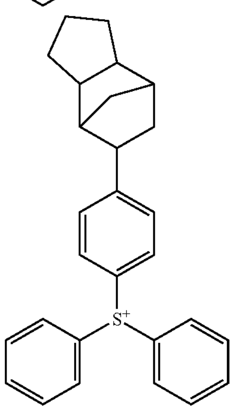
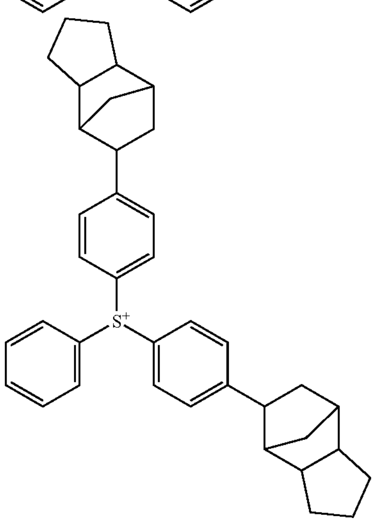
-continued
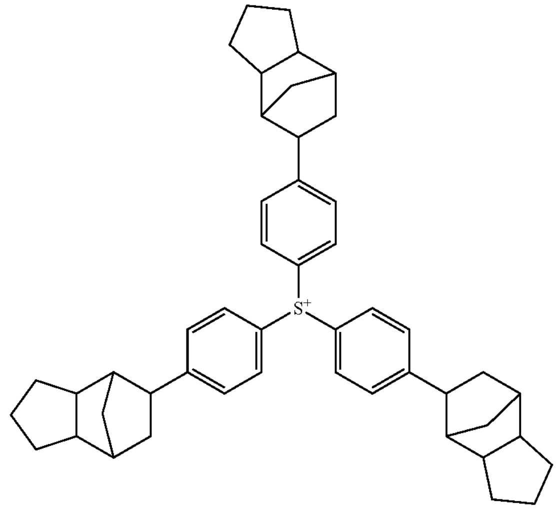
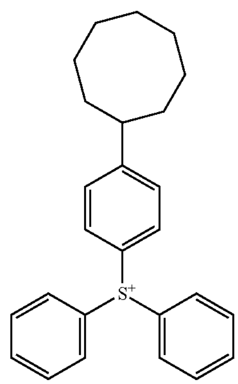
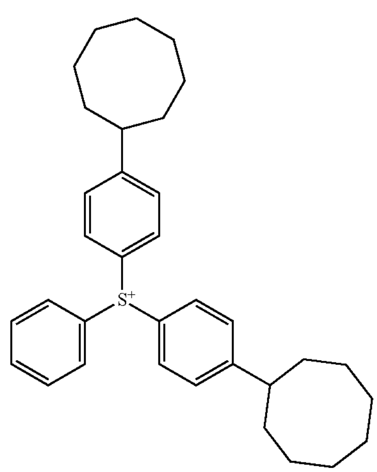

-continued
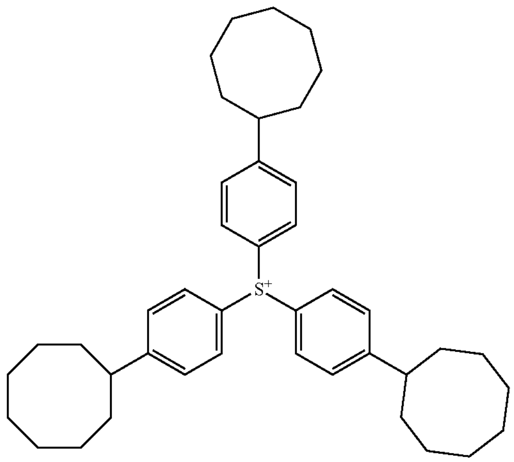
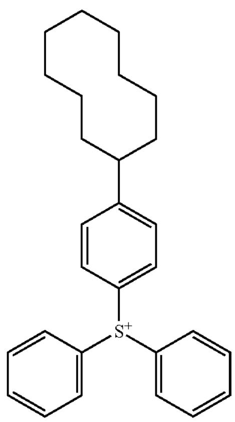
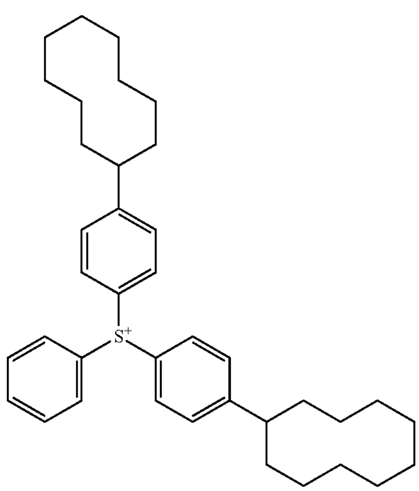
-continued
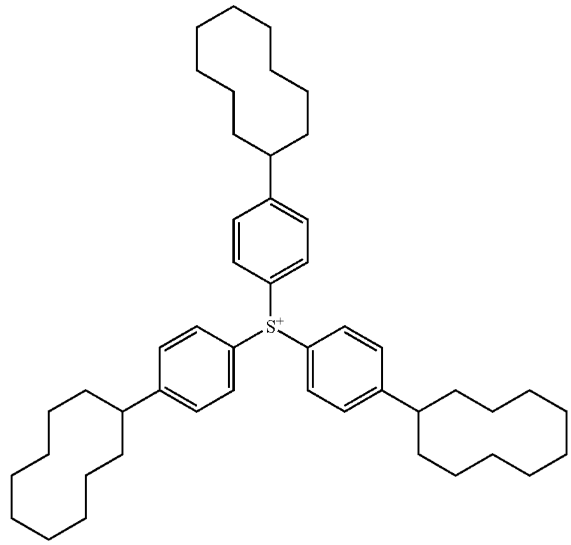
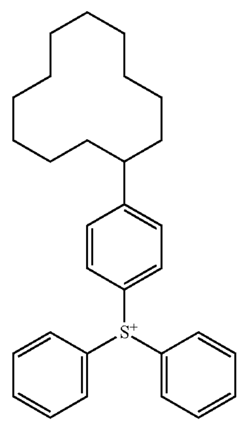
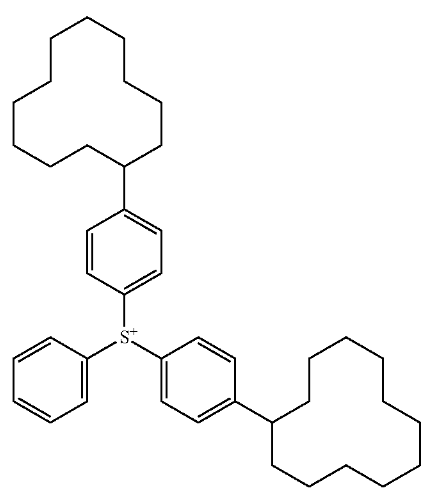
S+

-continued
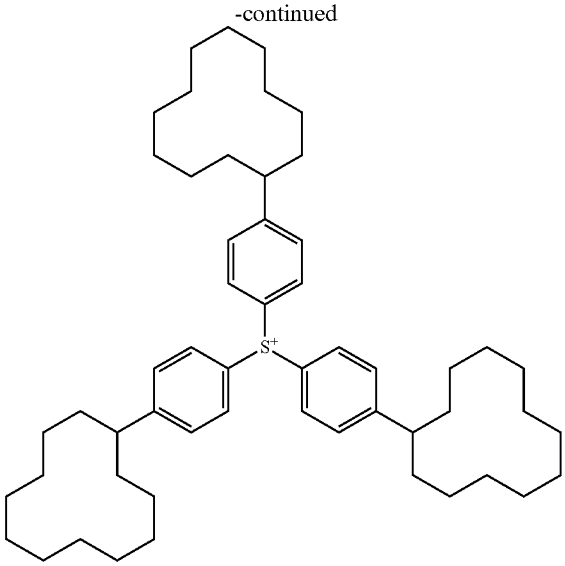
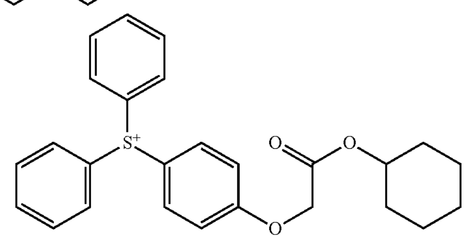
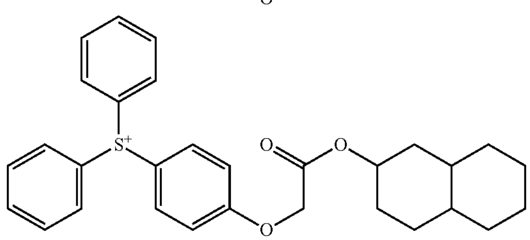
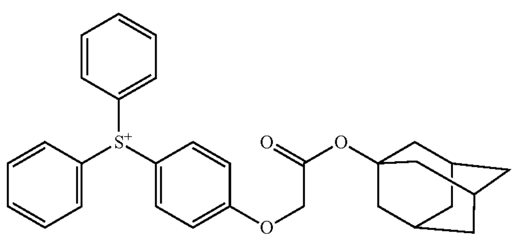
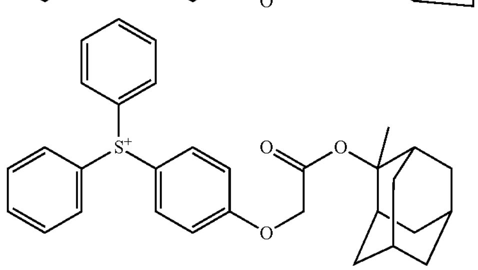
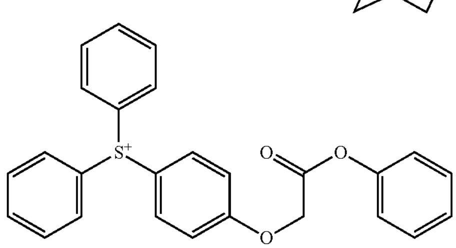
-continued
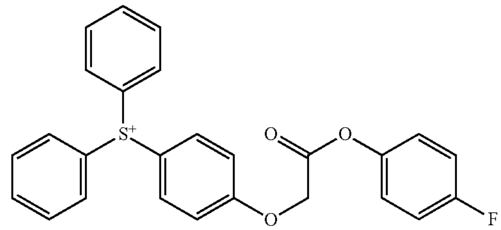
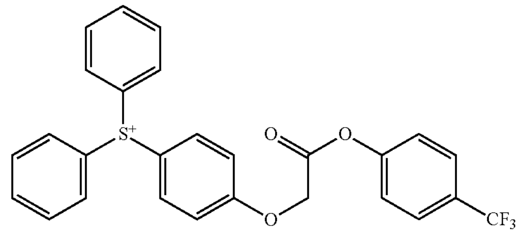
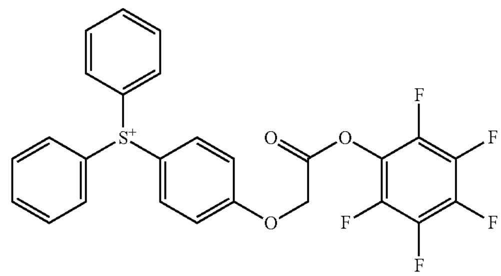
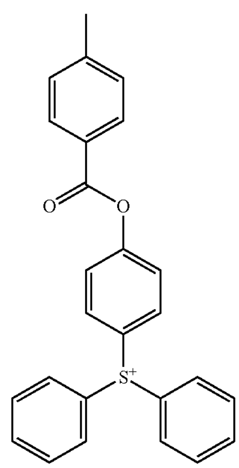
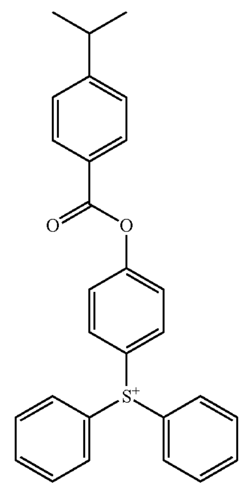
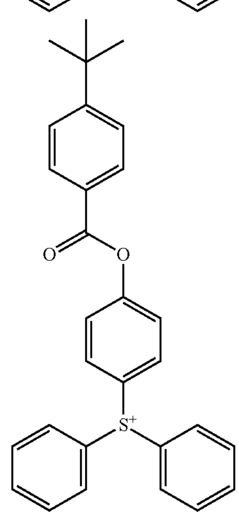
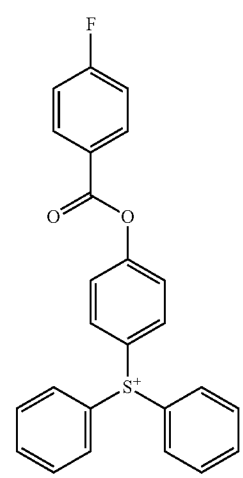

-continued
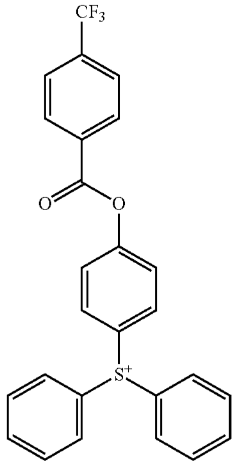
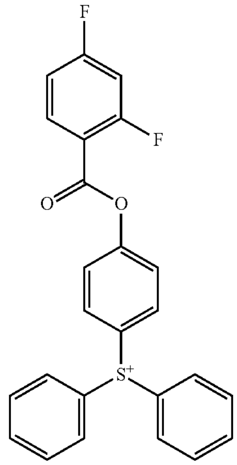
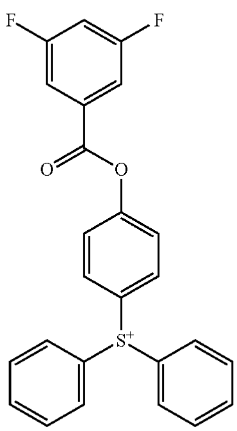
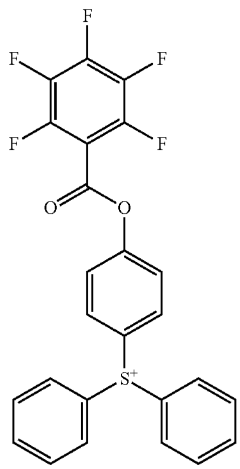
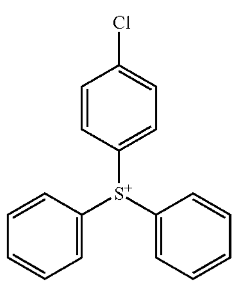
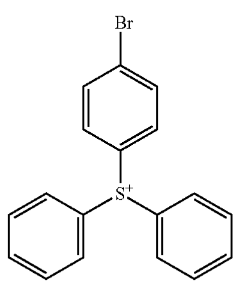
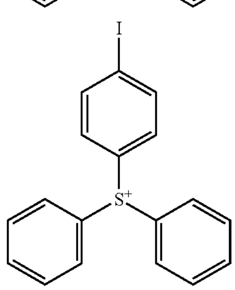
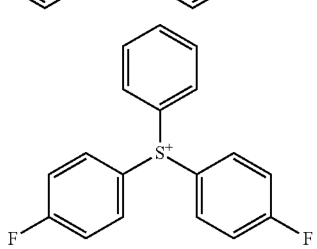
-continued
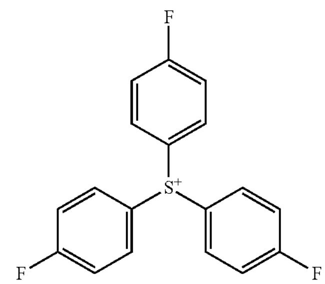
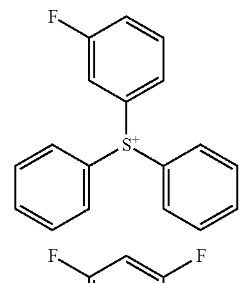
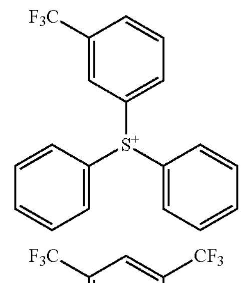
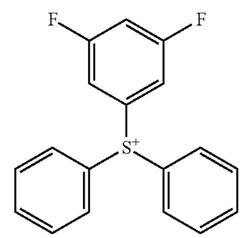
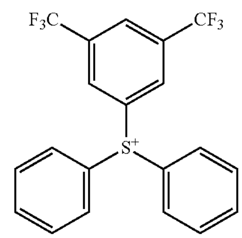
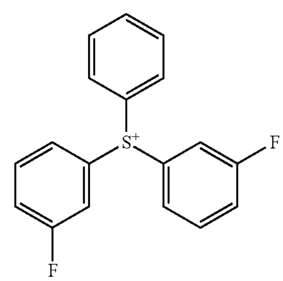
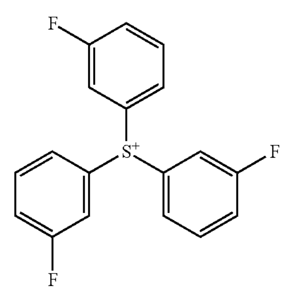
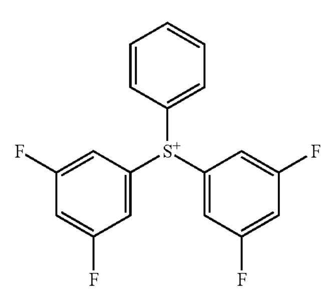

-continued
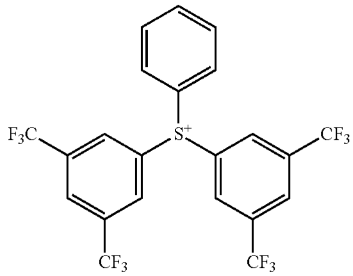
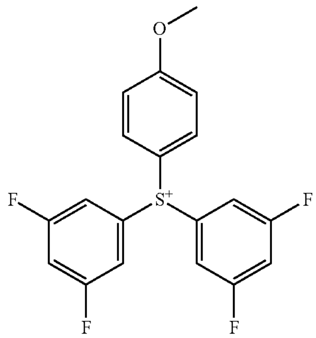
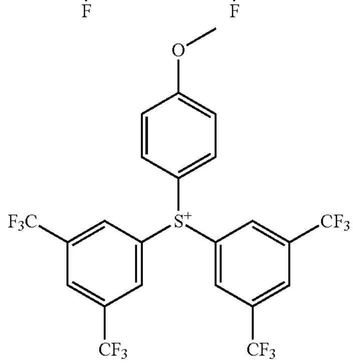
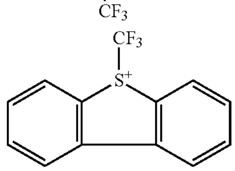
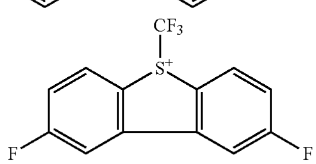
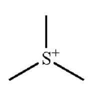
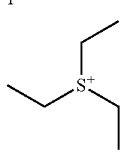
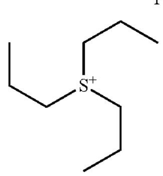
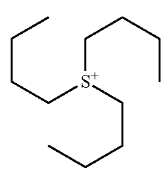
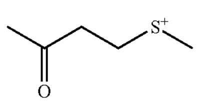
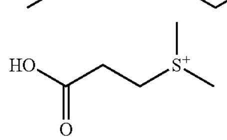
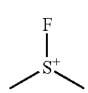
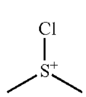
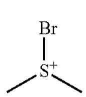
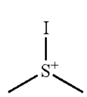
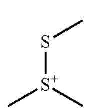
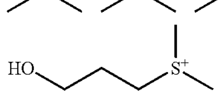
-continued
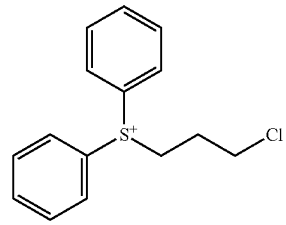
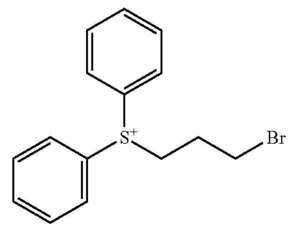
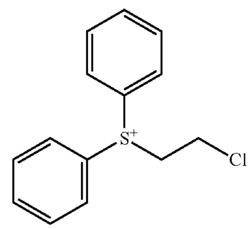
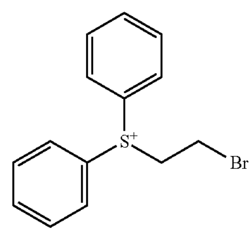
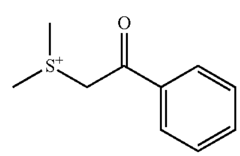
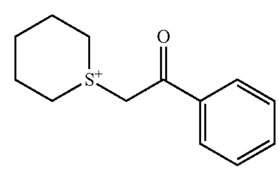
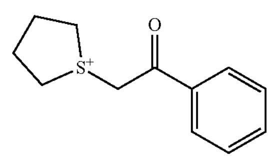
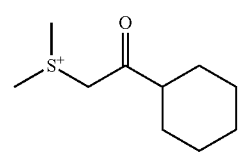
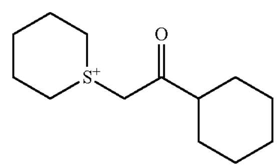
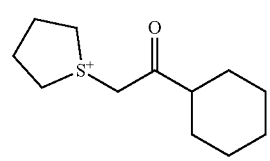
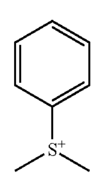
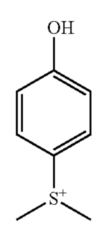

-continued
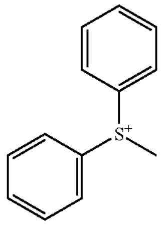
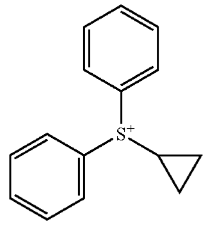
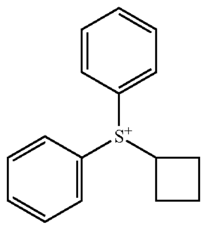
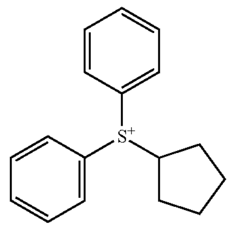
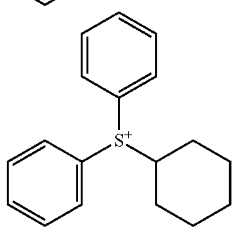
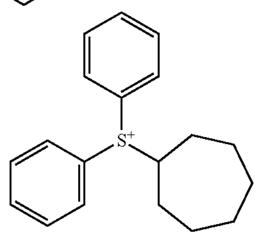
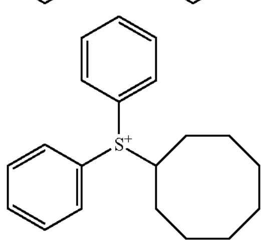
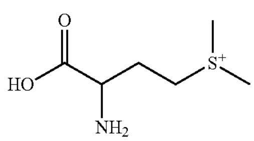
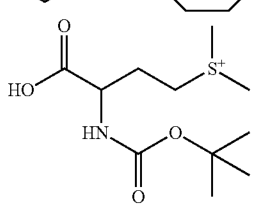
Examples of the cation in the iodonium salt having formula (1-2) are shown below, but not limited thereto.
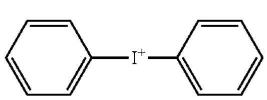
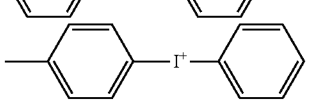
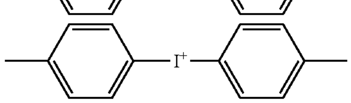
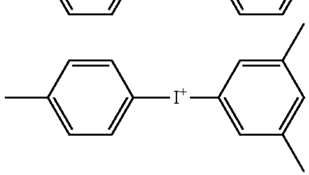
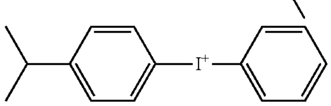
-continued
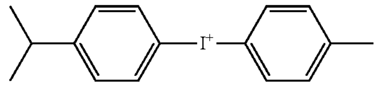
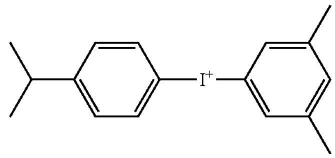
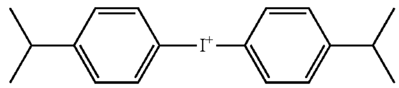
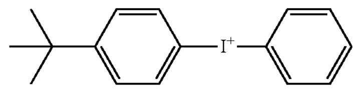
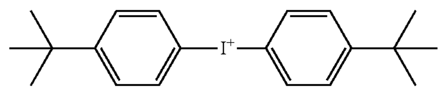
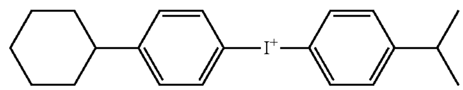
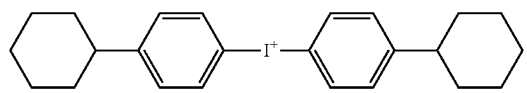
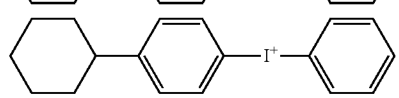
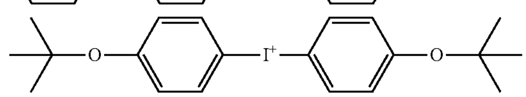
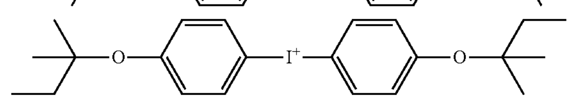
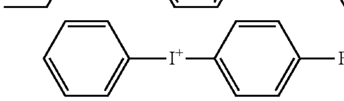
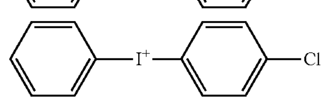
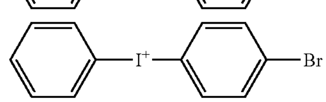
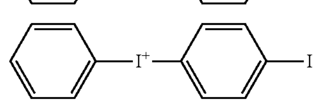
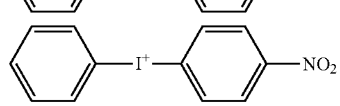
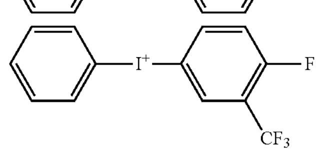
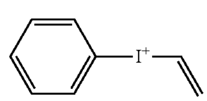
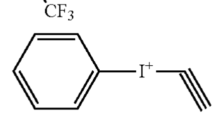
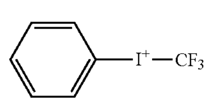

-continued

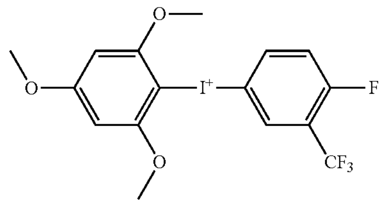

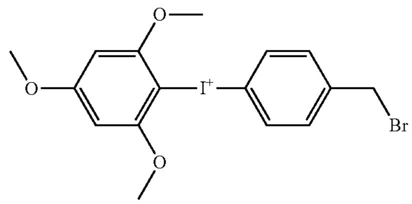

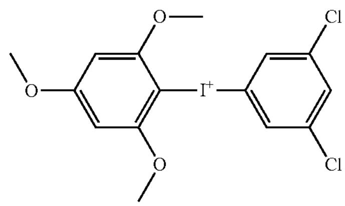

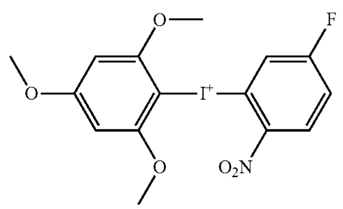

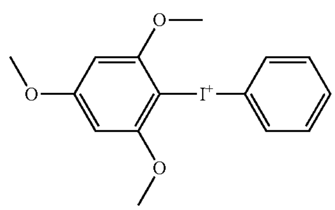

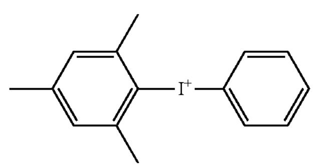

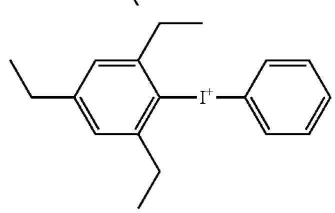

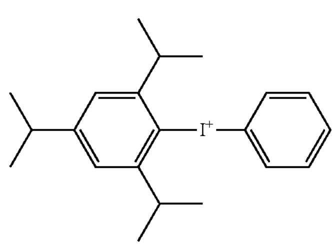

-continued

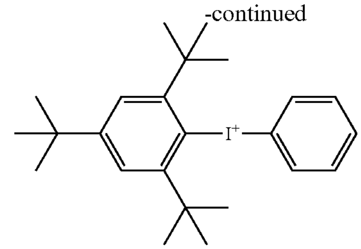

In formulae (1-1) and (1-2), $Xa^-$ is an anion selected from the following formulae (1A) to (1D).

(1A)

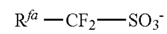

(1B)

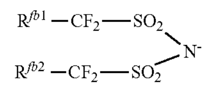

(1C)

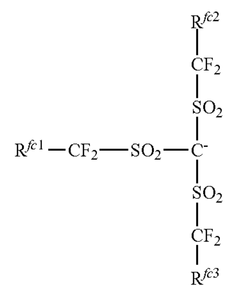

(1D)

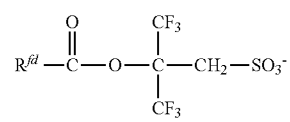

In formula (1A), $R^{fa}$ is fluorine or a $C_1$-$C_{40}$ hydrocarbyl group which may contain a heteroatom. The hydrocarbyl group may be saturated or unsaturated and straight, branched or cyclic, and examples thereof are as will be exemplified for the hydrocarbyl group $R^{111}$ in formula (1A).

Of the anions of formula (1A), a structure having the following formula (1A') is preferred.

(IA')

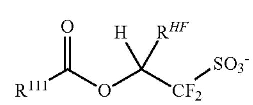

In formula (1A'), $R^{HF}$ is hydrogen or trifluoromethyl, preferably trifluoromethyl.

$R^{111}$ is a $C_1$-$C_{38}$ hydrocarbyl group which may contain a heteroatom. Suitable heteroatoms include oxygen, nitrogen, sulfur and halogen, with oxygen being preferred. Of the hydrocarbyl groups, those of 6 to 30 carbon atoms are preferred because a high resolution is available in fine pattern formation. The hydrocarbyl group may be saturated or unsaturated and straight, branched or cyclic. Suitable hydrocarbyl groups include $C_1$-$C_{38}$ alkyl groups such as methyl, ethyl, propyl, isopropyl, butyl, isobutyl, sec-butyl, tert-butyl, pentyl, neopentyl, hexyl, heptyl, 2-ethylhexyl, nonyl, undecyl, tridecyl, pentadecyl, heptadecyl, icosanyl;

$C_3$-$C_{38}$ cyclic saturated hydrocarbyl groups such as cyclopentyl, cyclohexyl, 1-adamantyl, 2-adamantyl, 1-adamantylmethyl, norbornyl, norbornylmethyl, tricyclodecanyl, tetracyclododecanyl, tetracyclododecanylmethyl, dicyclohexylmethyl; $C_2$-$C_{39}$ unsaturated aliphatic hydrocarbyl groups such as allyl and 3-cyclohexenyl; $C_6$-$C_{38}$ aryl groups such as phenyl, 1-naphthyl, 2-naphthyl; $C_7$-$C_{38}$ aralkyl groups such as benzyl and diphenylmethyl; and combinations thereof.

In these groups, some or all of the hydrogen atoms may be substituted by a moiety containing a heteroatom such as oxygen, sulfur, nitrogen or halogen, or some carbon may be replaced by a moiety containing a heteroatom such as oxygen, sulfur or nitrogen, so that the group may contain a hydroxy, cyano, carbonyl, ether bond, ester bond, sulfonic acid ester bond, carbonate bond, lactone ring, sultone ring, carboxyic anhydride or haloalkyl moiety. Examples of the heteroatom-containing hydrocarbyl group include tetrahydrofuryl, methoxymethyl, ethoxymethyl, methylthiomethyl, acetamidomethyl, trifluoroethyl, (2-methoxyethoxy)methyl, acetoxymethyl, 2-carboxy-1-cyclohexyl, 2-oxopropyl, 4-oxo-1-adamantyl, and 3-oxocyclohexyl.

With respect to the synthesis of the sulfonium salt having an anion of formula (1A'), reference is made to JP-A 2007-145797, JP-A 2008-106045, JP-A 2009-007327, and JP-A 2009-258695. Also useful are the sulfonium salts described in JP-A 2010-215608, JP-A 2012-041320, JP-A 2012-106986, and JP-A 2012-153644.

Examples of the anion having formula (1A) are as exemplified for the anion having formula (1A) in JP-A 2018-197853 (US 20180335696).

In formula (1B), $R^{fb1}$ and $R^{fb2}$ are each independently fluorine or a $C_1$-$C_{40}$ hydrocarbyl group which may contain a heteroatom. The hydrocarbyl group may be saturated or unsaturated and straight, branched or cyclic. Suitable hydrocarbyl groups are as exemplified above for $R^{111}$ in formula (1A'). Preferably $R^{fb1}$ and $R^{fb2}$ each are fluorine or a straight $C_1$-$C_4$ fluorinated alkyl group. A pair of $R^{fb1}$ and $R^{fb2}$ may bond together to form a ring with the linkage ($—CF_2—SO_2—N—SO_2—CF_2—$) to which they are attached, and the ring-forming pair is preferably a fluorinated ethylene or fluorinated propylene group.

In formula (1C), $R^{fc1}$, $R^{fc2}$ and $R^{fc3}$ are each independently fluorine or a $C_1$-$C_{40}$ hydrocarbyl group which may contain a heteroatom. The hydrocarbyl group may be saturated or unsaturated and straight, branched or cyclic. Suitable hydrocarbyl groups are as exemplified above for $R^{111}$ in formula (1A'). Preferably $R^{fc1}$, $R^{fc2}$ and $R^{fc3}$ each are fluorine or a straight $C_1$-$C_4$ fluorinated alkyl group. A pair of $R^{fc1}$ and $R^{fc2}$ may bond together to form a ring with the linkage ($—CF_2—SO_2—C—SO_2—CF_2—$) to which they are attached, and the ring-forming pair is preferably a fluorinated ethylene or fluorinated propylene group.

In formula (1D), $R^{fd}$ is a $C_1$-$C_{40}$ hydrocarbyl group which may contain a heteroatom. The hydrocarbyl group may be saturated or unsaturated and straight, branched or cyclic. Suitable hydrocarbyl groups are as exemplified above for $R^{111}$.

With respect to the synthesis of the sulfonium salt having an anion of formula (1D), reference is made to JP-A 2010-215608 and JP-A 2014-133723.

Examples of the anion having formula (1D) are as exemplified for the anion having formula (1D) in JP-A 2018-197853 (US 20180335696).

The compound having the anion of formula (1D) has a sufficient acid strength to cleave acid labile groups in the base polymer because it is free of fluorine at α-position of sulfo group, but has two trifluoromethyl groups at β-position. Thus the compound is a useful PAG.

Also compounds having the formula (2) are useful as the PAG.

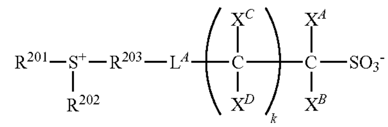

(2)

In formula (2), $R^{201}$ and $R^{202}$ are each independently halogen or a $C_1$-$C_{30}$ hydrocarbyl group which may contain a heteroatom. $R^{203}$ is a $C_1$-$C_{30}$ hydrocarbylene group which may contain a heteroatom. Any two of $R^{201}$, $R^{202}$ and $R^{203}$ may bond together to form a ring with the sulfur atom to which they are attached. Exemplary rings are the same as described above for the ring that $R^{101}$ and $R^{102}$ in formula (1-1), taken together, form with the sulfur atom to which they are attached.

The hydrocarbyl groups $R^{201}$ and $R^{202}$ may be saturated or unsaturated and straight, branched or cyclic. Examples thereof include $C_1$-$C_{30}$ alkyl groups such as methyl, ethyl, propyl, isopropyl, n-butyl, sec-butyl, tert-butyl, n-pentyl, tert-pentyl, n-hexyl, n-octyl, 2-ethylhexyl, n-nonyl, and n-decyl; $C_3$-$C_{30}$ cyclic saturated hydrocarbyl groups such as cyclopentyl, cyclohexyl, cyclopentylmethyl, cyclopentylethyl, cyclopentylbutyl, cyclohexylmethyl, cyclohexylethyl, cyclohexylbutyl, norbornyl, oxanorbornyl, tricyclo[5.2.1.0$^{2,6}$]decanyl, and adamantyl; $C_6$-$C_{30}$ aryl groups such as phenyl, methylphenyl, ethylphenyl, n-propylphenyl, isopropylphenyl, n-butylphenyl, isobutylphenyl, sec-butylphenyl, tert-butylphenyl, naphthyl, methylnaphthyl, ethylnaphthyl, n-propylnaphthyl, isopropylnaphthyl, n-butylnaphthyl, isobutylnaphthyl, sec-butylnaphthyl, tert-butylnaphthyl, and anthracenyl; and combinations thereof. In these groups, some or all of the hydrogen atoms may be substituted by a moiety containing a heteroatom such as oxygen, sulfur, nitrogen or halogen, or some carbon may be replaced by a moiety containing a heteroatom such as oxygen, sulfur or nitrogen, so that the group may contain a hydroxy, cyano, carbonyl, ether bond, ester bond, sulfonic acid ester bond, carbonate bond, lactone ring, sultone ring, carboxyic anhydride or haloalkyl moiety.

The hydrocarbylene group $R^{203}$ may be saturated or unsaturated and straight, branched or cyclic. Examples thereof include $C_1$-$C_{30}$ alkanediyl groups such as methanediyl, ethane-1,1-diyl, ethane-1,2-diyl, propane-1,3-diyl, butane-1,4-diyl, pentane-1,5-diyl, hexane-1,6-diyl, heptane-1,7-diyl, octane-1,8-diyl, nonane-1,9-diyl, decane-1,10-diyl, undecane-1,11-diyl, dodecane-1,12-diyl, tridecane-1,13-diyl, tetradecane-1,14-diyl, pentadecane-1,15-diyl, hexadecane-1,16-diyl, and heptadecane-1,17-diyl; $C_3$-$C_{30}$ cyclic saturated hydrocarbylene groups such as cyclopentanediyl, cyclohexanediyl, norbornanediyl and adamantanediyl; $C_6$-$C_{30}$ arylene groups such as phenylene, methylphenylene, ethylphenylene, n-propylphenylene, isopropylphenylene, n-butylphenylene, isobutylphenylene, sec-butylphenylene, tert-butylphenylene, naphthylene, methylnaphthylene, ethylnaphthylene, n-propylnaphthylene, isopropylnaphthylene, n-butylnaphthylene, isobutylnaphthylene, sec-butylnaphthylene, and tert-butylnaphthylene; and combinations thereof. In these groups, some or all of the hydrogen atoms may be substituted by a moiety containing a heteroatom such as oxygen, sulfur, nitrogen or halogen, or some carbon may be replaced by a moiety containing a heteroatom such as oxygen, sulfur or nitrogen, so that the group may contain a hydroxy, cyano, carbonyl, ether bond, ester bond, sulfonic acid ester bond, carbonate bond, lactone ring, sultone ring, carboxyic anhydride or haloalkyl moiety. Of the heteroatoms, oxygen is preferred.

In formula (2), $L^A$ is a single bond, ether bond or a $C_1$-$C_{20}$ hydrocarbylene group which may contain a heteroatom. The hydrocarbylene group may be saturated or unsaturated and straight, branched or cyclic. Examples thereof are as exemplified above for $R^{203}$.

In formula (2), $X^A$, $X^B$, $X^C$ and $X^D$ are each independently hydrogen, fluorine or trifluoromethyl, with the proviso that at least one of $X^A$, $X^B$, $X^C$ and $X^D$ is fluorine or trifluoromethyl.

In formula (2), k is an integer of 0 to 3.

Of the PAGs having formula (2), those having formula (2') are preferred.

(2')

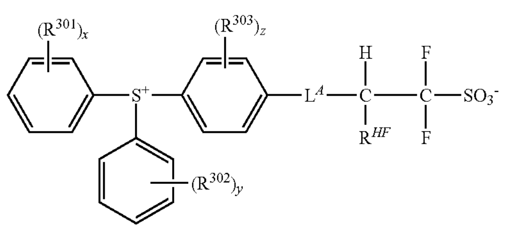

In formula (2'), $L^A$ is as defined above. $R^{HF}$ is hydrogen or trifluoromethyl, preferably trifluoromethyl. $R^{301}$, $R^{302}$ and $R^{303}$ are each independently hydrogen or a $C_1$-$C_{20}$ hydrocarbyl group which may contain a heteroatom. The hydrocarbyl group may be saturated or unsaturated and straight, branched or cyclic. Examples thereof are as exemplified above for $R^{111}$ in formula (1A'). The subscripts x and y are each independently an integer of 0 to 5, and z is an integer of 0 to 4.

Examples of the PAG having formula (2) are as exemplified for the PAG having formula (2) in JP-A 2017-026980.

Of the foregoing PAGs, those having an anion of formula (1A') or (1D) are especially preferred because of reduced acid diffusion and high solubility in the solvent. Also those having formula (2') are especially preferred because of extremely reduced acid diffusion.

Also, a sulfonium or iodonium salt having an anion containing an iodized or brominated aromatic ring may be used as the PAG. Suitable are sulfonium and iodonium salts having the formulae (3-1) and (3-2).

(3-1)

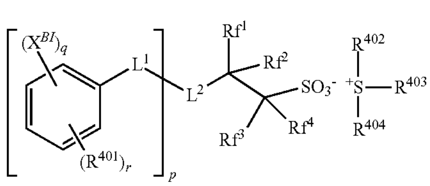

-continued (3-2)

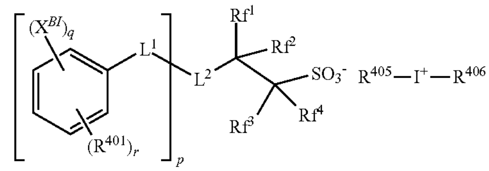

In formulae (3-1) and (3-2), p is an integer of 1 to 3, q is an integer of 1 to 5, and r is an integer of 0 to 3, meeting $1 \leq q+r \leq 5$. Preferably, q is 1, 2 or 3, more preferably 2 or 3, and r is 0, 1 or 2.

In formulae (3-1) and (3-2), $X^{BI}$ is iodine or bromine, and may be the same or different when p and/or q is 2 or more.

$L^1$ is a single bond, ether bond, ester bond, or a $C_1$-$C_6$ saturated hydrocarbylene group which may contain an ether bond or ester bond. The saturated hydrocarbylene group may be straight, branched or cyclic.

$L^2$ is a single bond or a $C_1$-$C_{20}$ divalent linking group when p is 1, and a $C_1$-$C_{20}$ tri- or tetravalent linking group which may contain oxygen, sulfur or nitrogen when p is 2 or 3.

$R^{401}$ is a hydroxy group, carboxy group, fluorine, chlorine, bromine, amino group, or a $C_1$-$C_{20}$ saturated hydrocarbyl, $C_1$-$C_{20}$ saturated hydrocarbyloxy, $C_2$-$C_{20}$ saturated hydrocarbylcarbonyl, $C_2$-$C_{20}$ saturated hydrocarbyloxycarbonyl, $C_2$-$C_{20}$ saturated hydrocarbylcarbonyloxy or $C_1$-$C_{20}$ saturated hydrocarbylsulfonyloxy group, which may contain fluorine, chlorine, bromine, hydroxy, amino or ether bond, or —N($R^{401A}$)($R^{401B}$), —N($R^{401C}$)—C(=O)—$R^{401D}$ or —N($R^{401C}$)—C(=O)—O—$R^{401D}$. $R^{401A}$ and $R^{401B}$ are each independently hydrogen or a $C_1$-$C_6$ saturated hydrocarbyl group. $R^{401C}$ is hydrogen or a $C_1$-$C_6$ saturated hydrocarbyl group which may contain halogen, hydroxy, $C_1$-$C_6$ saturated hydrocarbyloxy, $C_2$-$C_6$ saturated hydrocarbylcarbonyl or $C_2$-$C_6$ saturated hydrocarbylcarbonyloxy moiety. $R^{401D}$ is a $C_1$-$C_{16}$ aliphatic hydrocarbyl group, $C_6$-$C_{14}$ aryl group or $C_7$-$C_{15}$ aralkyl group, which may contain halogen, hydroxy, $C_1$-$C_6$ saturated hydrocarbyloxy, $C_2$-$C_6$ saturated hydrocarbylcarbonyl or $C_2$-$C_6$ saturated hydrocarbylcarbonyloxy moiety. The aliphatic hydrocarbyl group may be saturated or unsaturated and straight, branched or cyclic. The saturated hydrocarbyl, saturated hydrocarbyloxy, saturated hydrocarbyloxycarbonyl, saturated hydrocarbylcarbonyl, and saturated hydrocarbylcarbonyloxy groups may be straight, branched or cyclic. Groups $R^{401}$ may be the same or different when p and/or r is 2 or more. Of these, $R^{401}$ is preferably hydroxy, —N($R^{401C}$)—C(=O)—$R^{401D}$, —N($R^{401C}$)—C(=O)—O—$R^{401D}$, fluorine, chlorine, bromine, methyl or methoxy.

In formulae (3-1) and (3-2), $Rf^1$ to $Rf^4$ are each independently hydrogen, fluorine or trifluoromethyl, at least one of $Rf^1$ to $Rf^4$ being fluorine or trifluoromethyl. $Rf^1$ and $Rf^2$, taken together, may form a carbonyl group. Preferably, both $Rf^5$ and $Rf^4$ are fluorine.

$R^{402}$ to $R^{406}$ are each independently halogen or a $C_1$-$C_{20}$ hydrocarbyl group which may contain a heteroatom. The hydrocarbyl group may be saturated or unsaturated and straight, branched or cyclic. Examples thereof include those exemplified above for the hydrocarbyl groups $R^{101}$ to $R^{105}$ in formulae (1-1) and (1-2). In these groups, some or all of the hydrogen atoms may be substituted by hydroxy, carboxy, halogen, cyano, nitro, mercapto, sultone, sulfone, or sulfonium salt-containing moieties, and some carbon may be replaced by an ether bond, ester bond, carbonyl moiety, amide bond, carbonate bond or sulfonic acid ester bond. $R^{402}$ and $R^{403}$ may bond together to form a ring with the sulfur atom to which they are attached. Exemplary rings are the same as described above for the ring that $R^{301}$ and $R^{102}$ in formula (1-1), taken together, form with the sulfur atom to which they are attached.

Examples of the cation in the sulfonium salt having formula (3-1) include those exemplified above as the cation in the sulfonium salt having formula (1-1). Examples of the cation in the iodonium salt having formula (3-2) include those exemplified above as the cation in the iodonium salt having formula (1-2).

Examples of the anion in the onium salts having formulae (3-1) and (3-2) are shown below, but not limited thereto. Herein $X^{BI}$ is as defined above.

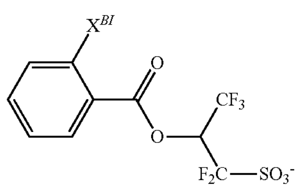

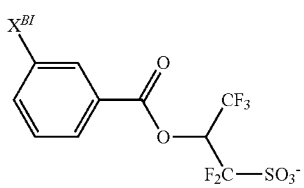

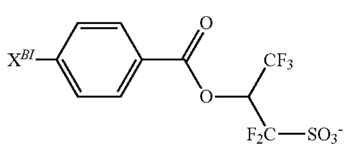

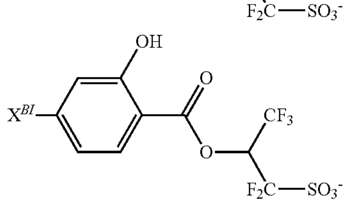

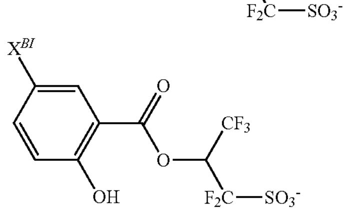

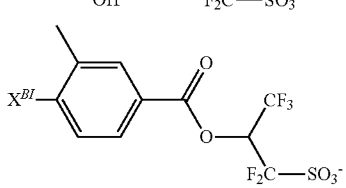

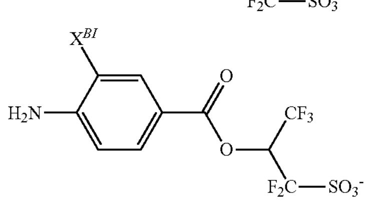

-continued

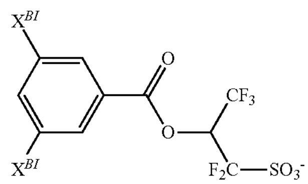

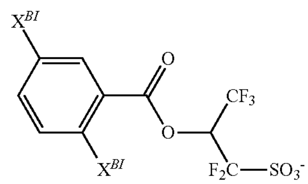

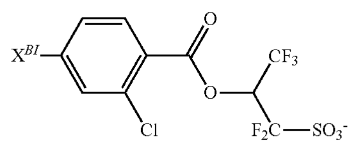

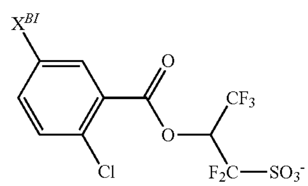

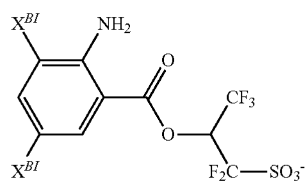

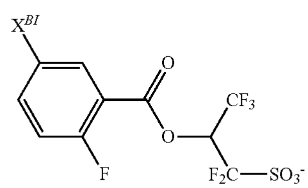

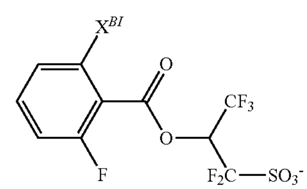

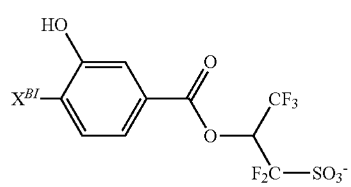

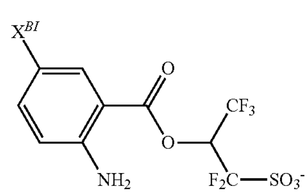

-continued
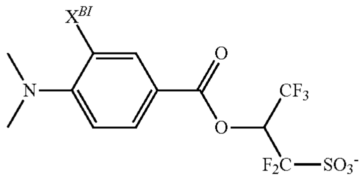
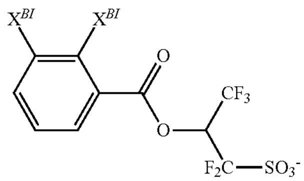
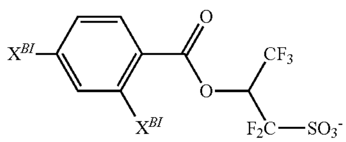
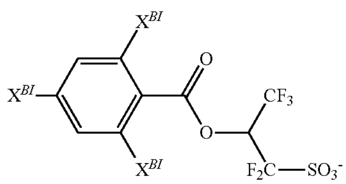
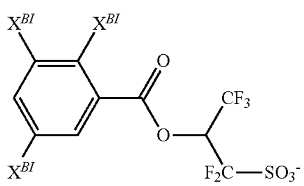
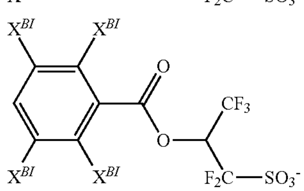
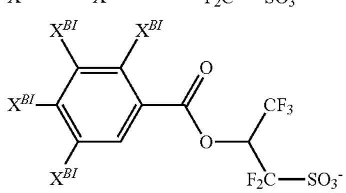
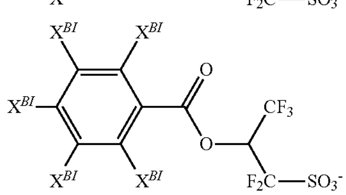
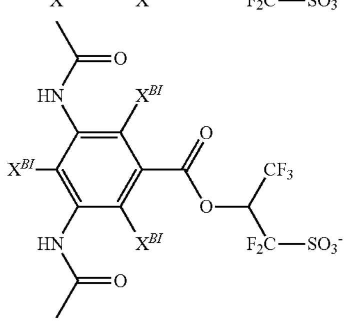
-continued
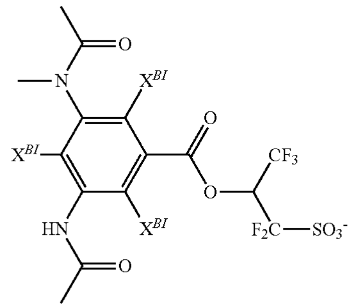
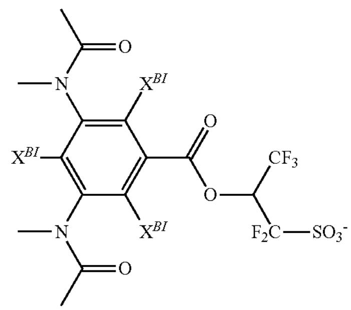
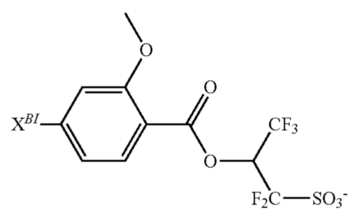
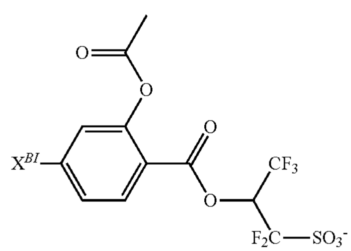
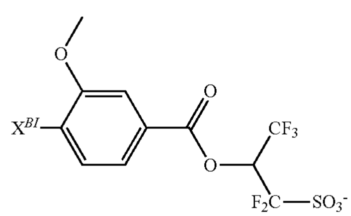
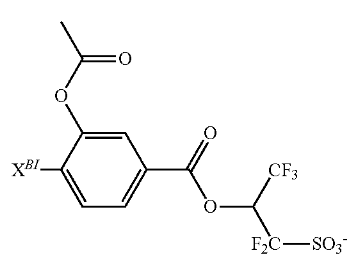

-continued
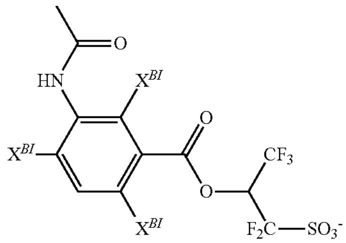
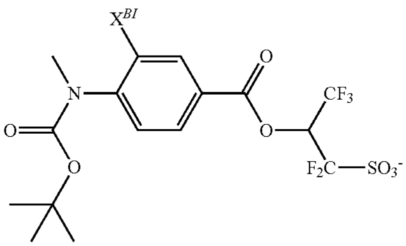
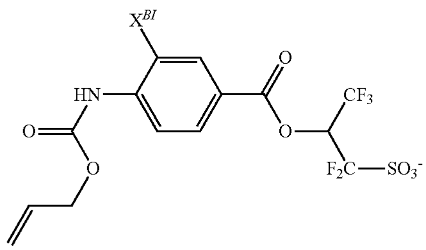
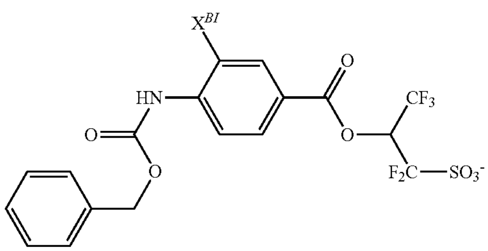
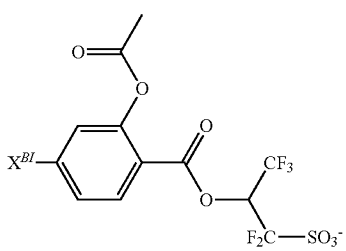
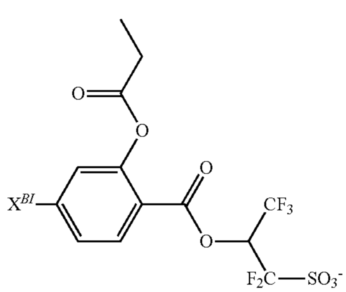
-continued
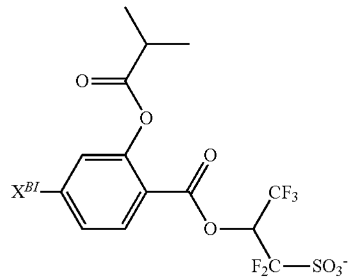
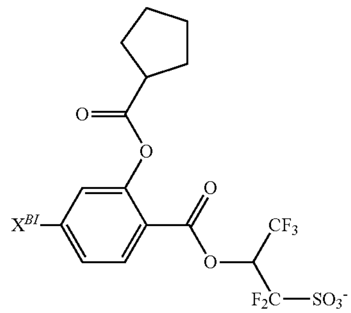
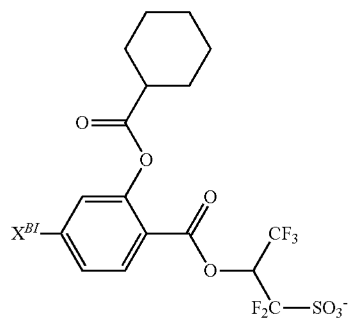
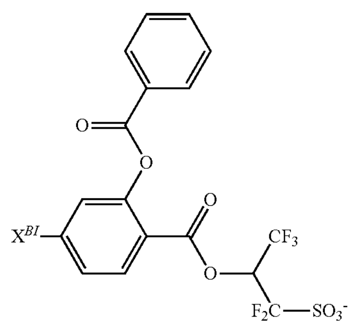
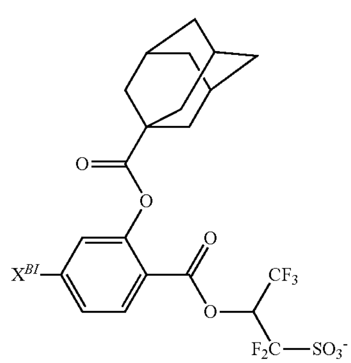

-continued
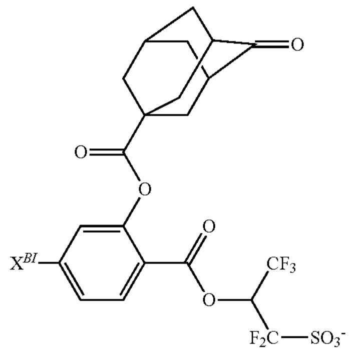
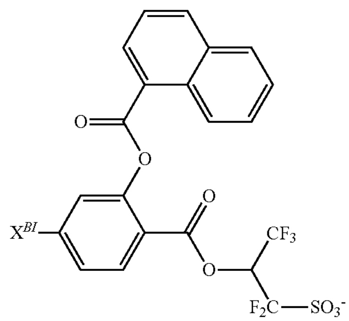
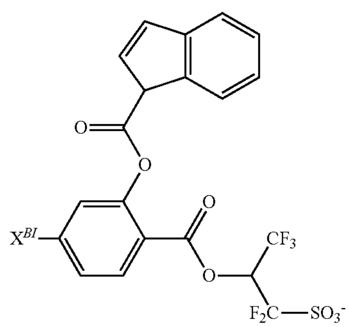
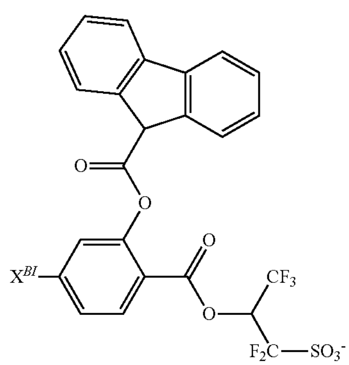
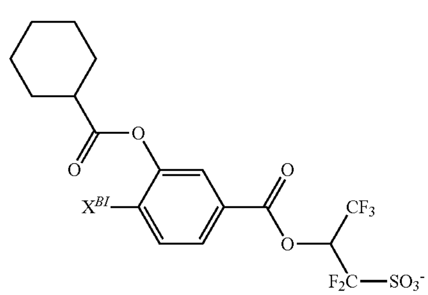
-continued
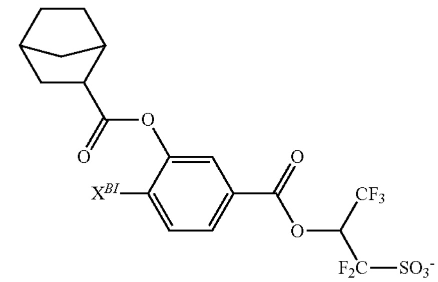
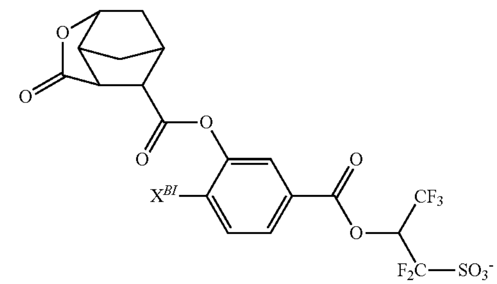
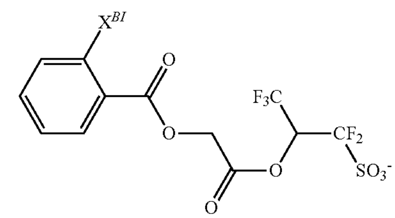
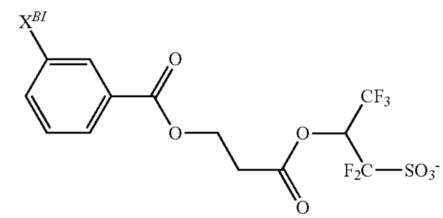
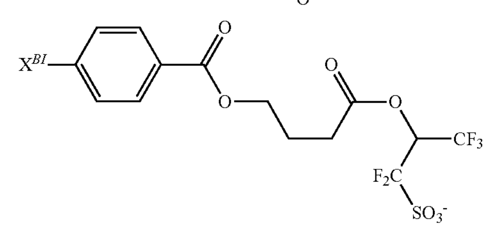
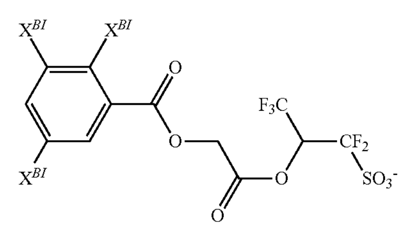
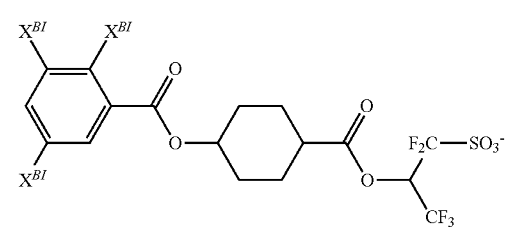

-continued
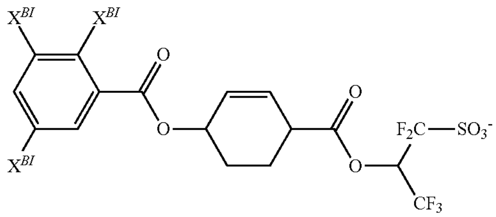
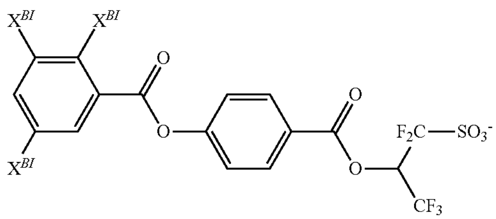
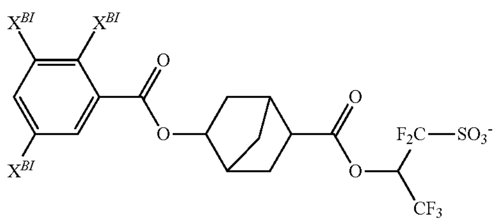
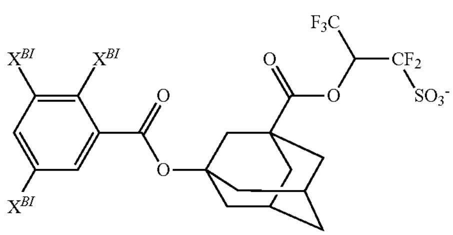
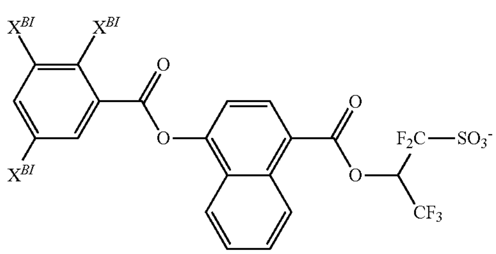
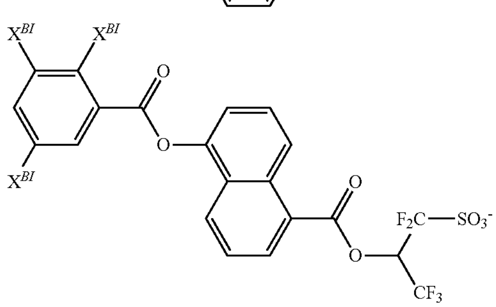
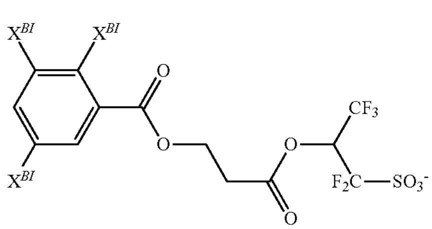
-continued
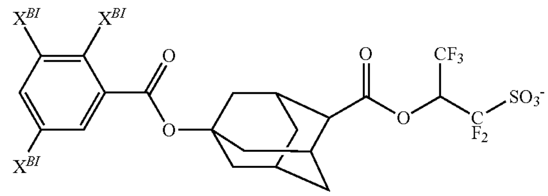
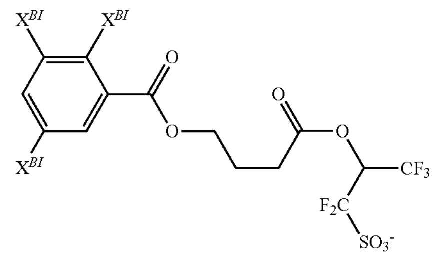
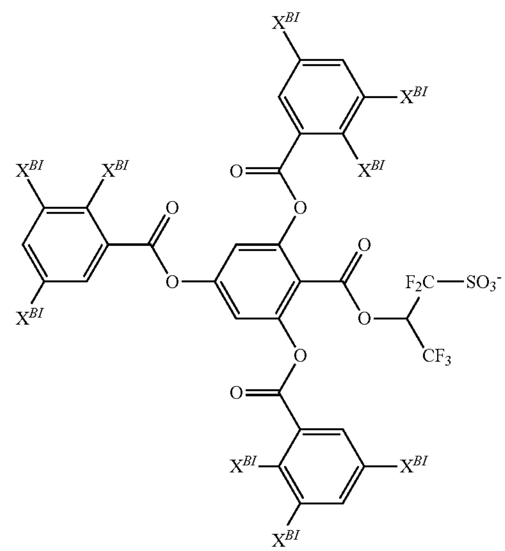
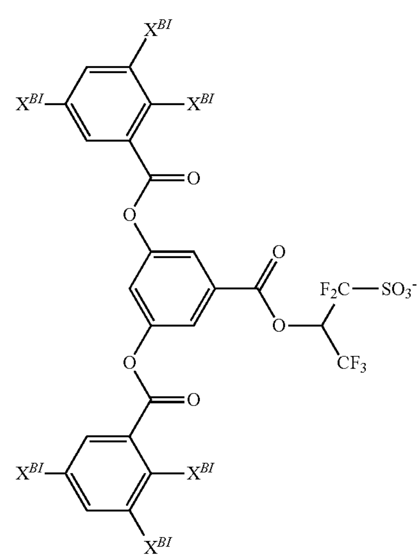

-continued
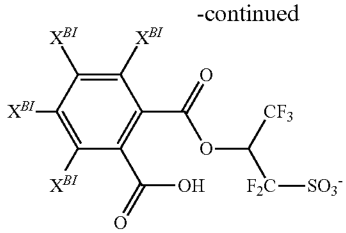
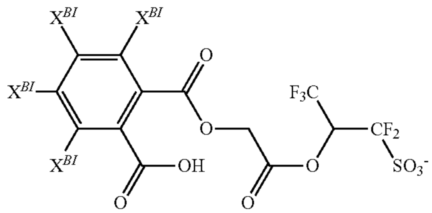
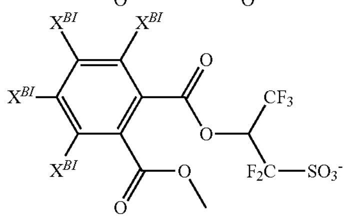
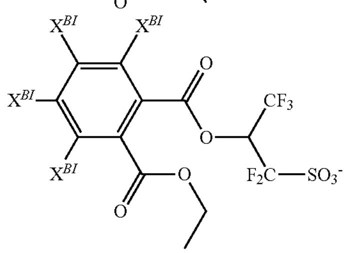
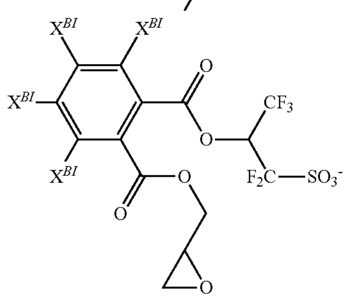
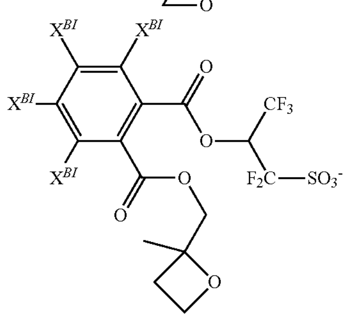
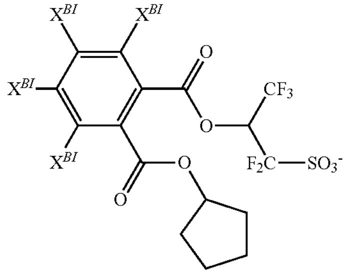
-continued
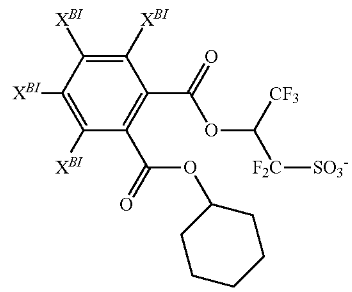
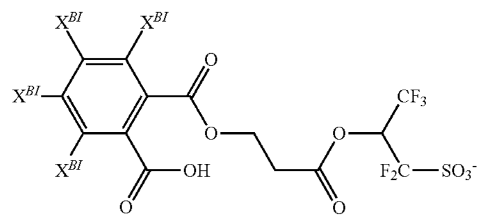
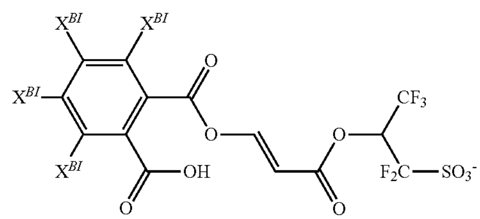
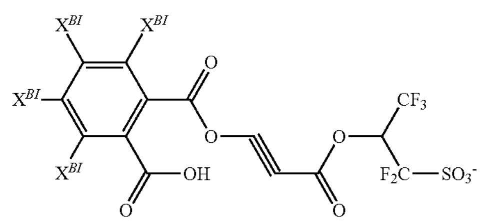
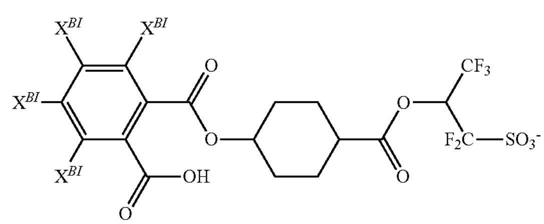
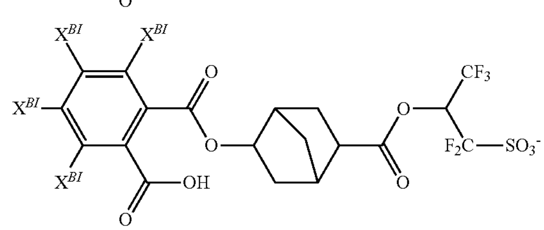
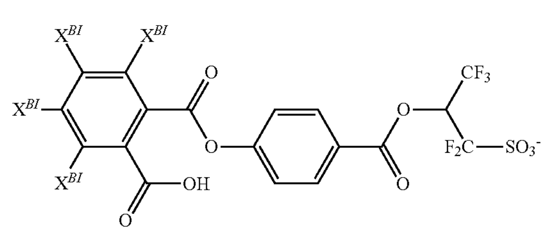

-continued
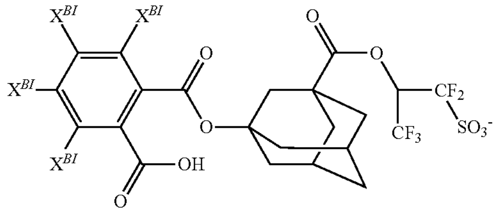
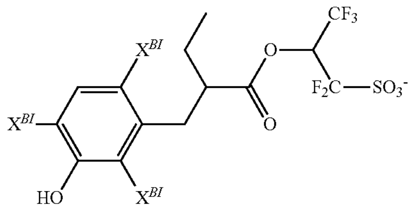
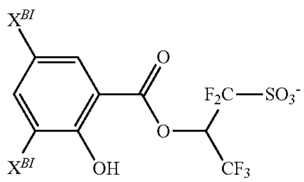
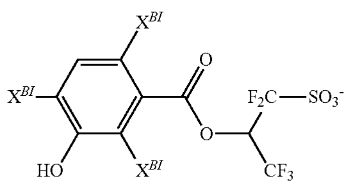
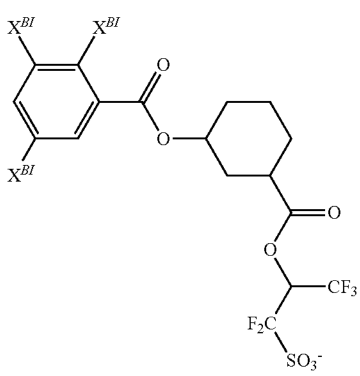
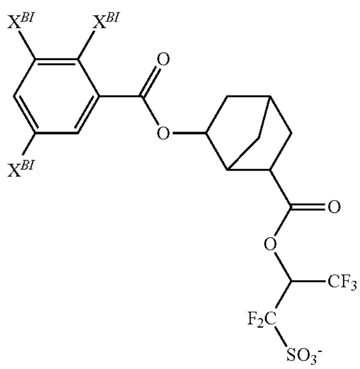
-continued
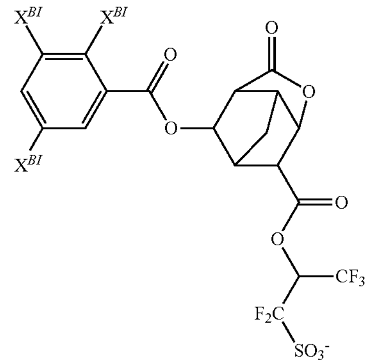
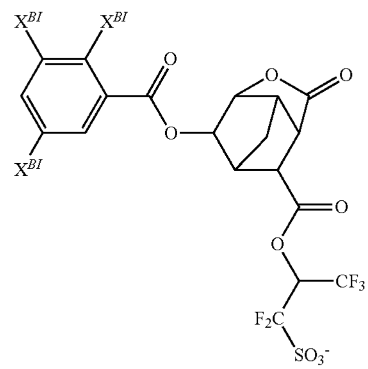
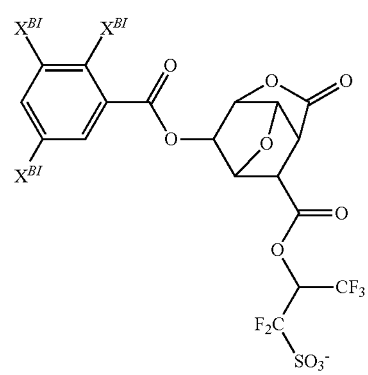
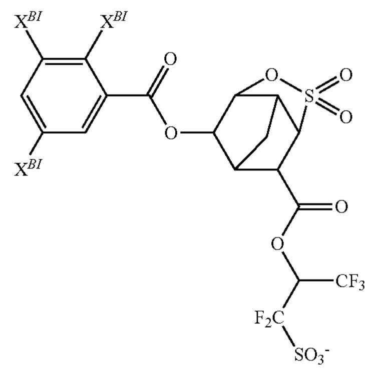

-continued
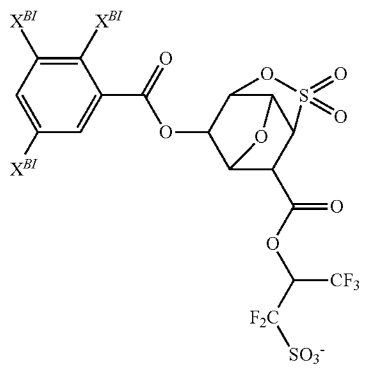
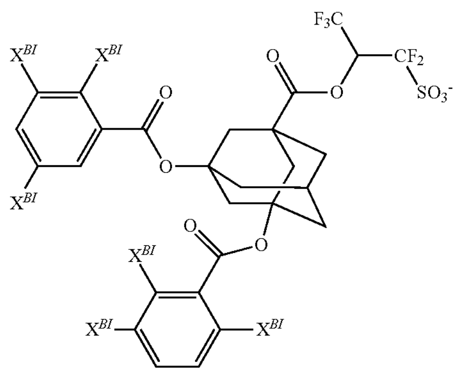
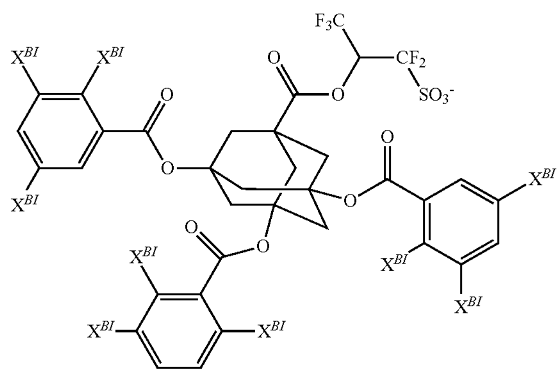
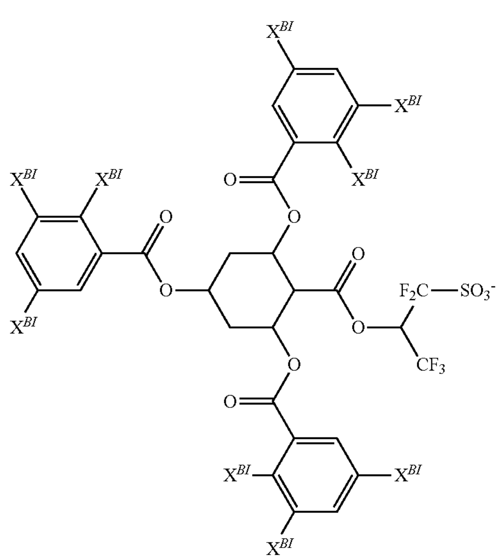
-continued
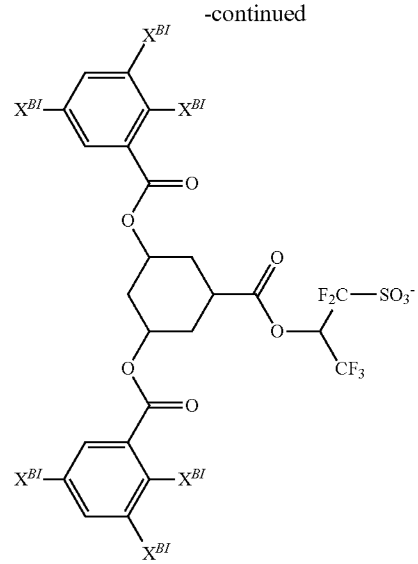
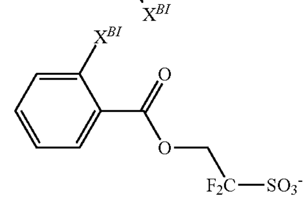
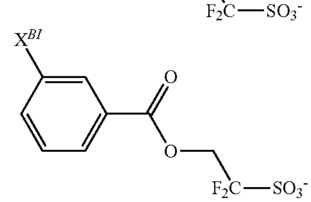
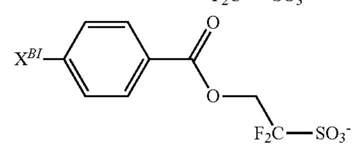
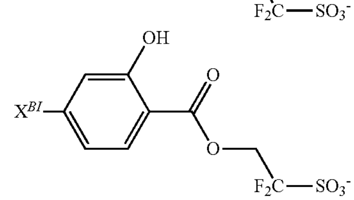
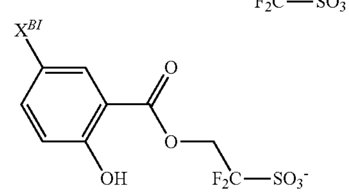
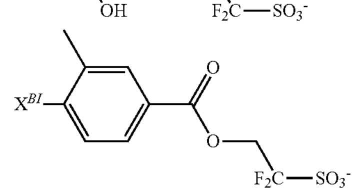
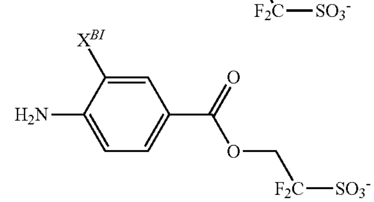

-continued
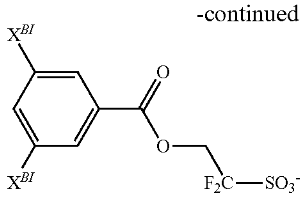
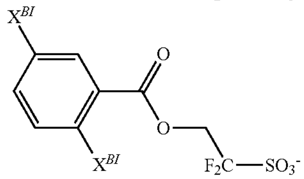
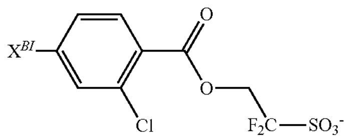
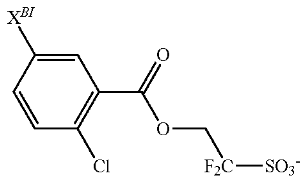
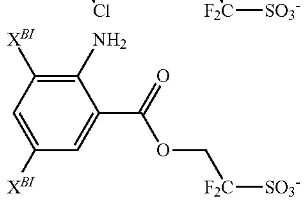
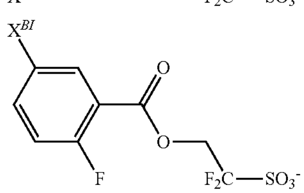
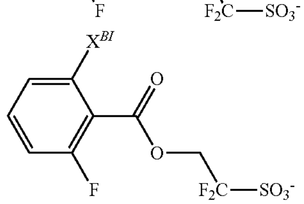
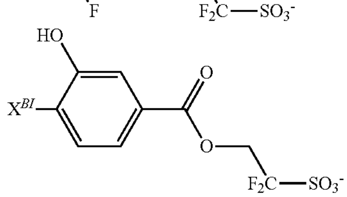
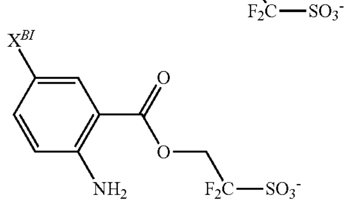
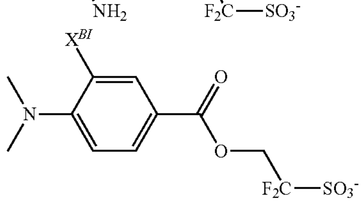
-continued
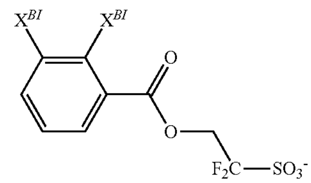
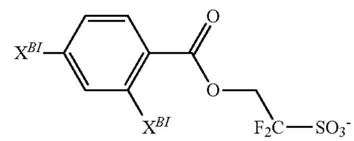
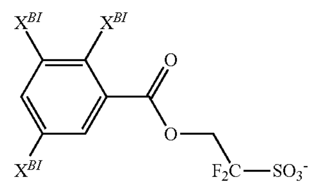
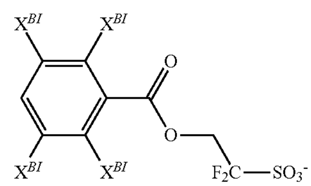
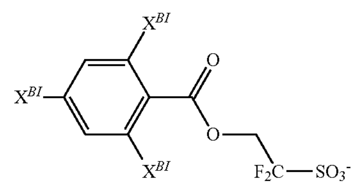
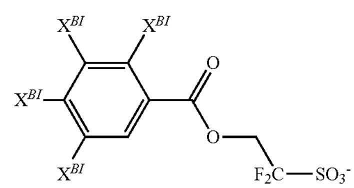
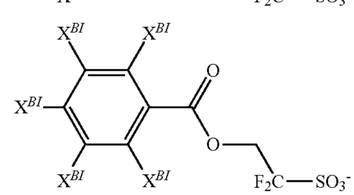
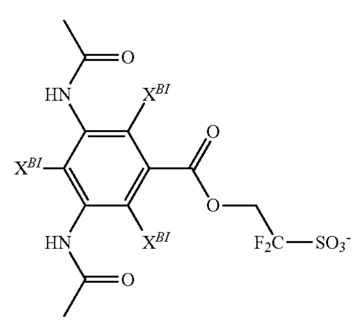

-continued
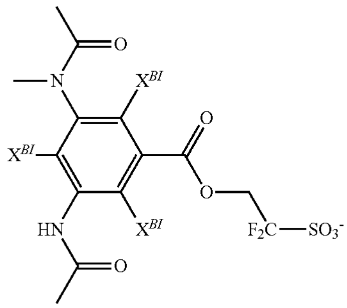
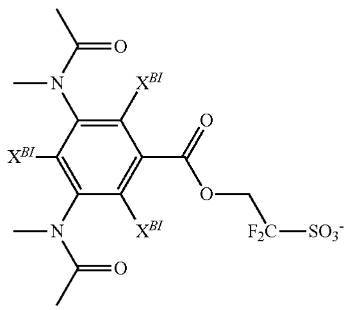
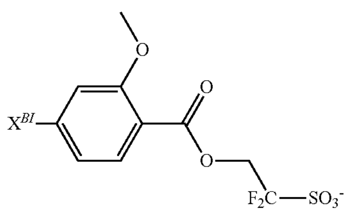
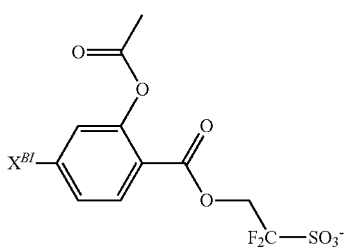
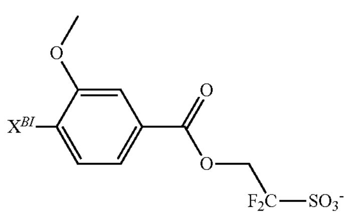
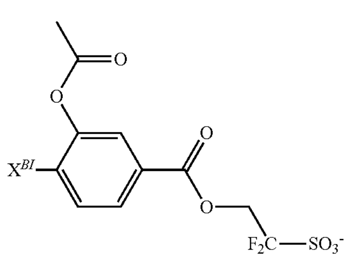
-continued
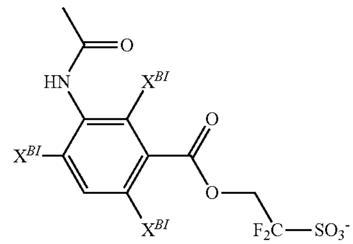
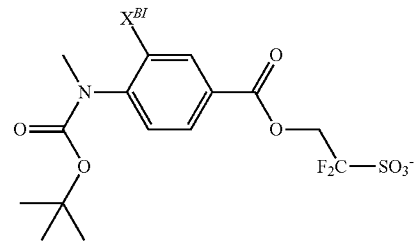
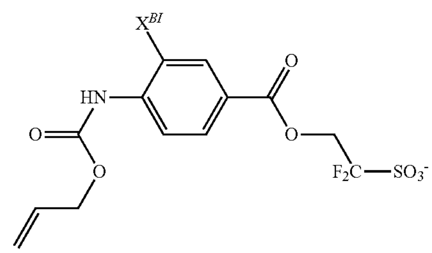
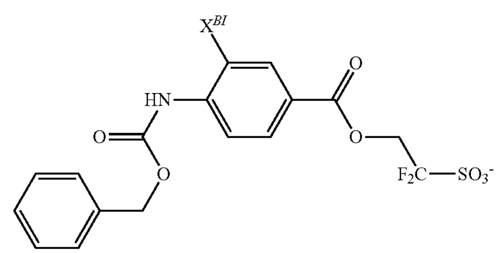
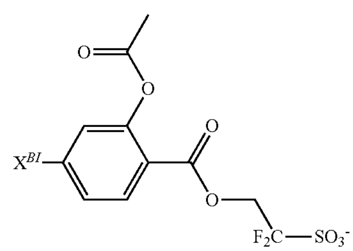
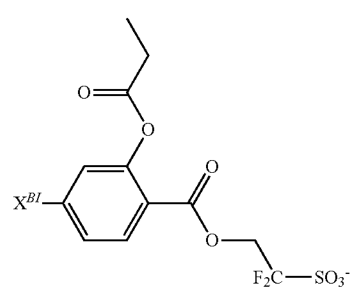

-continued
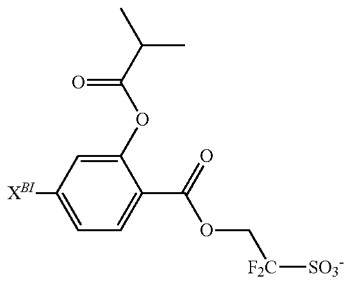
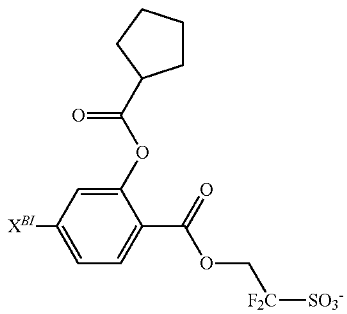
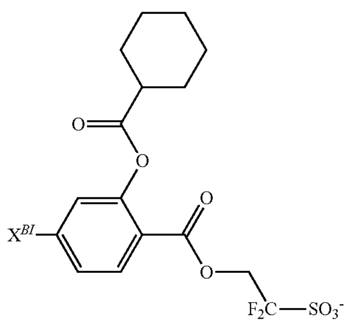
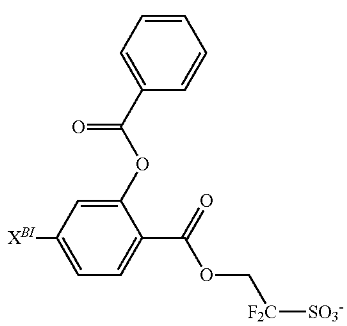
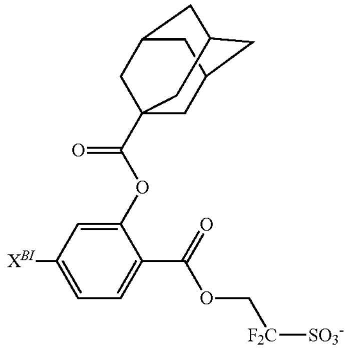
-continued
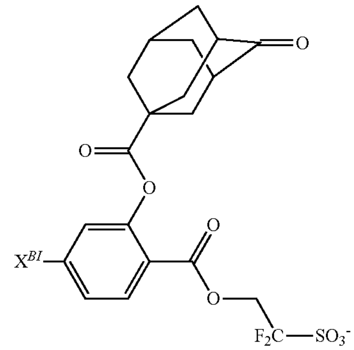
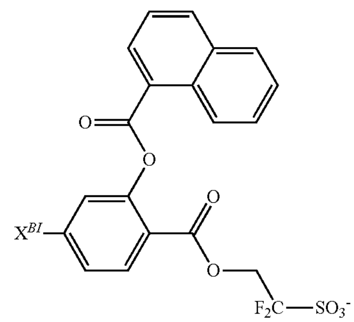
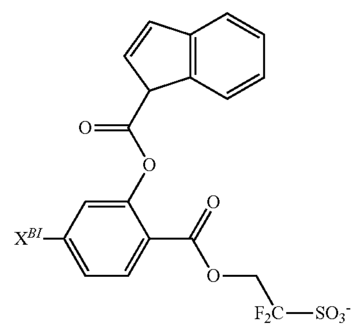
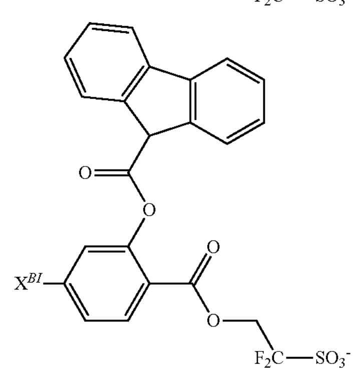
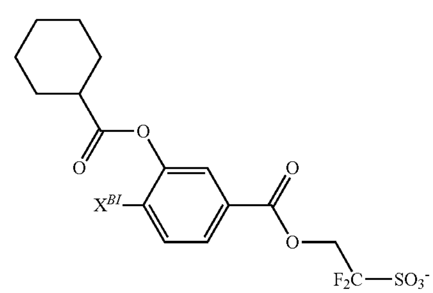

-continued
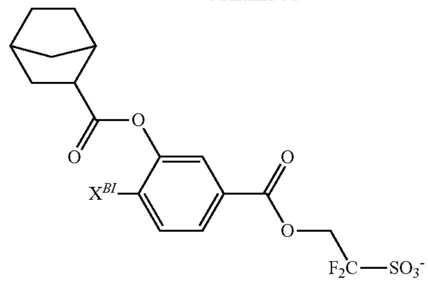
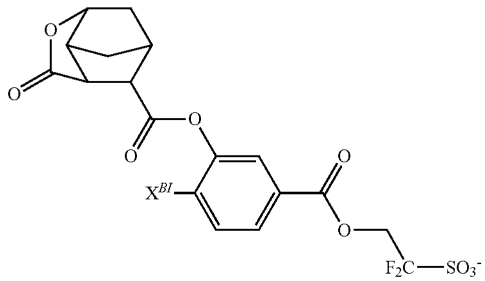
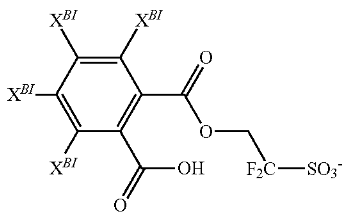
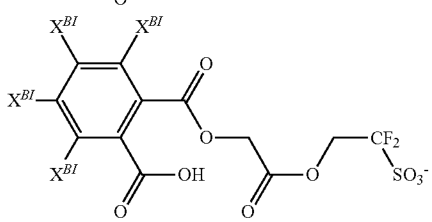
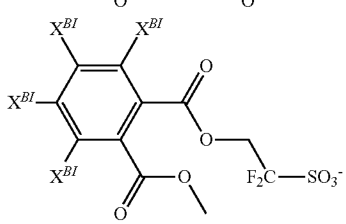
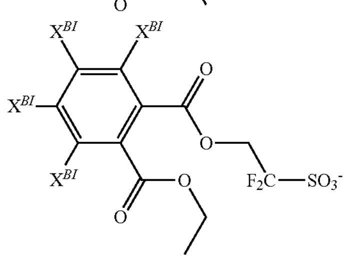
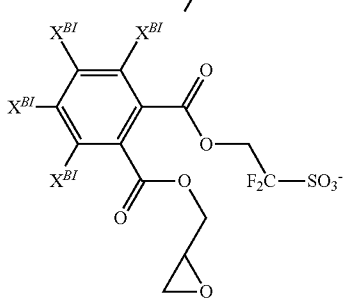
-continued
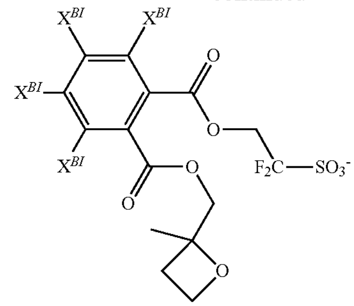
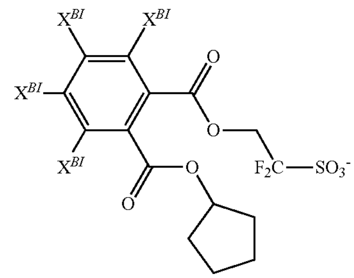
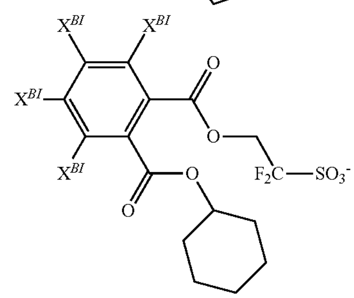
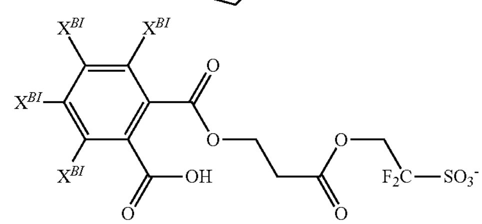
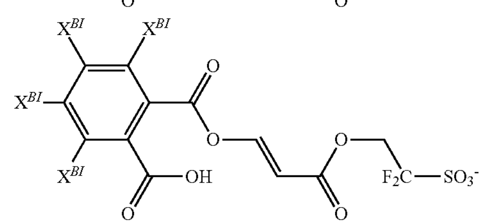
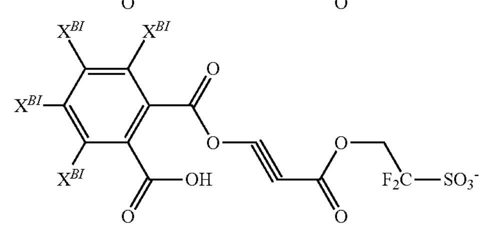
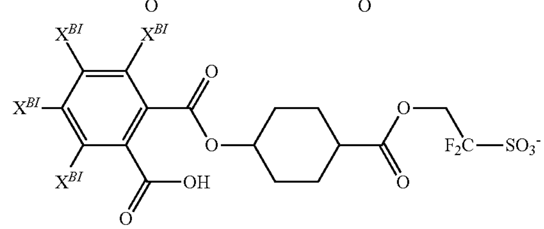

-continued
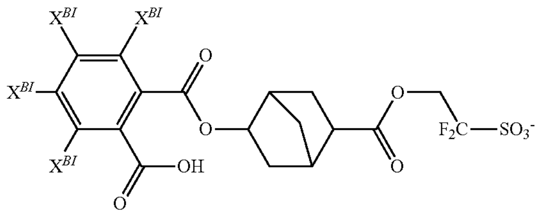
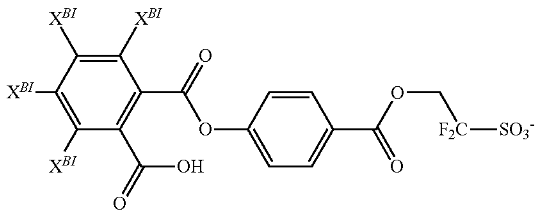
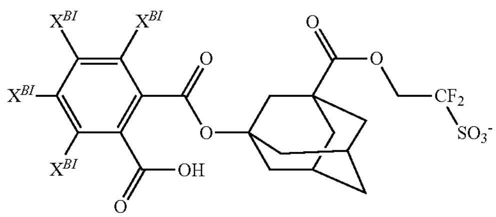
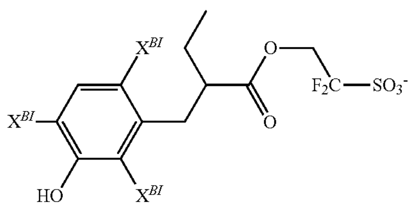
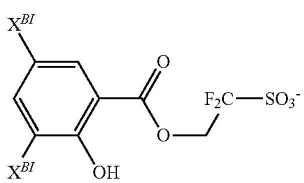
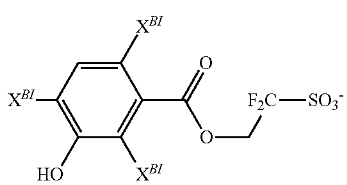
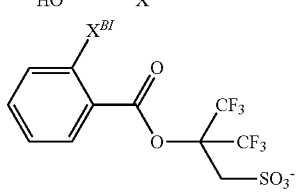
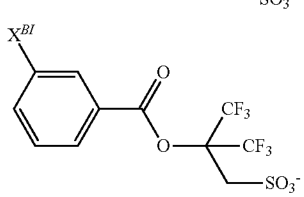
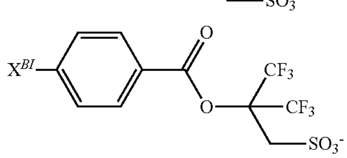
-continued
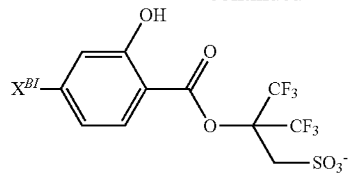
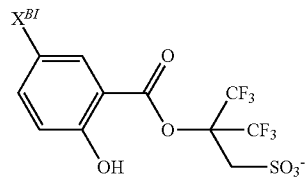
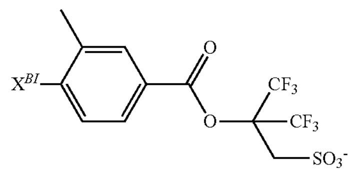
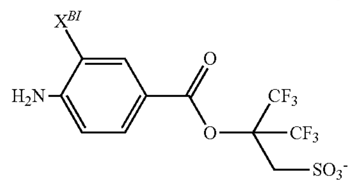
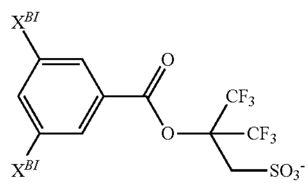
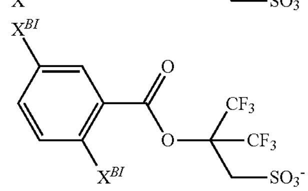
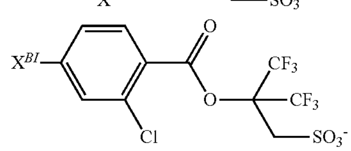
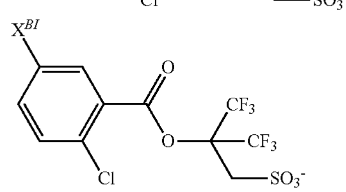
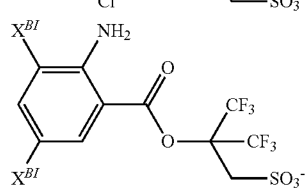
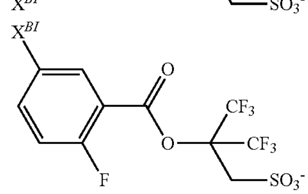

-continued
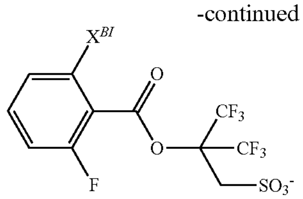
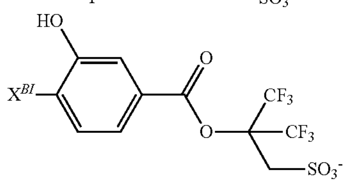
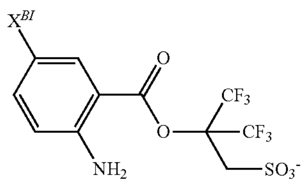
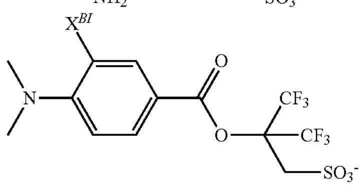
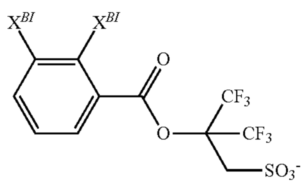
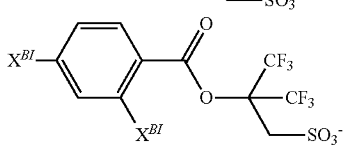
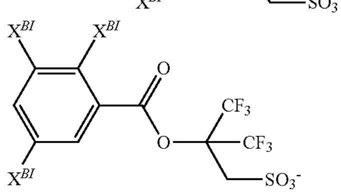
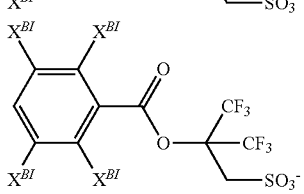
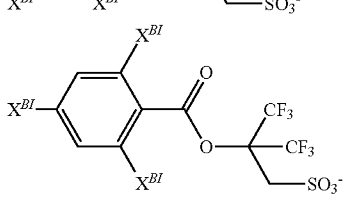
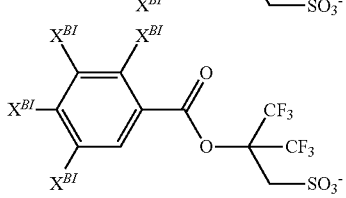
-continued
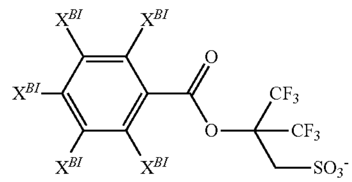
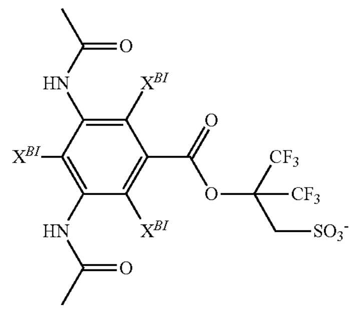
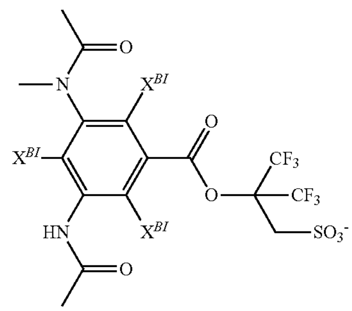
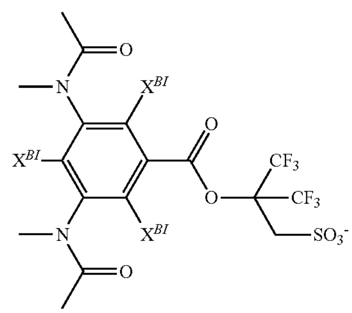
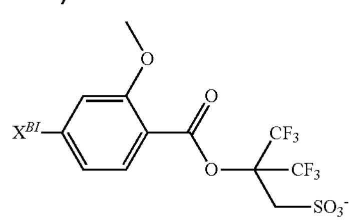
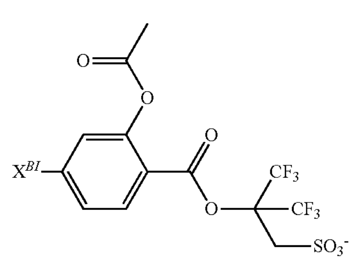

-continued
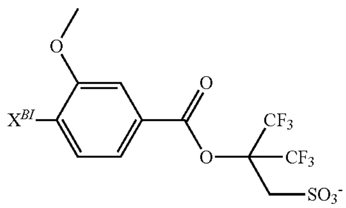
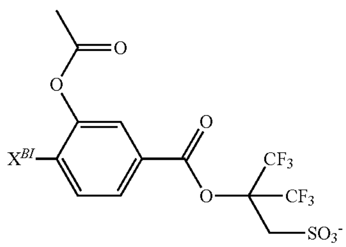
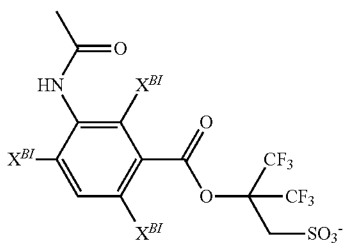
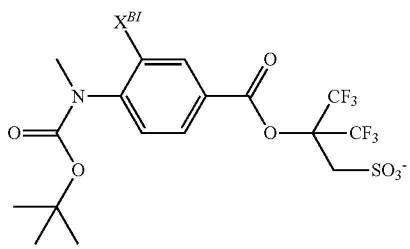
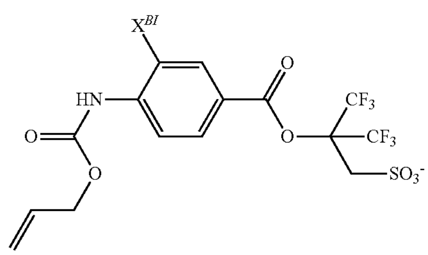
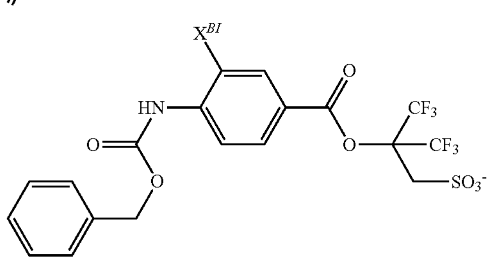
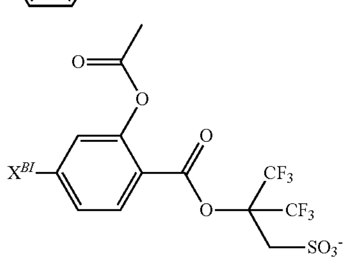
-continued
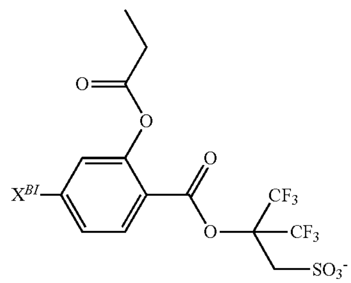
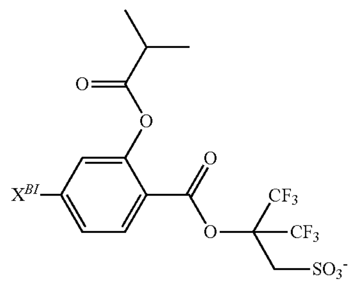
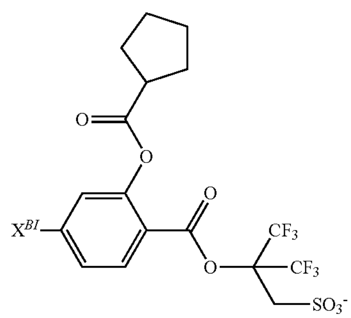
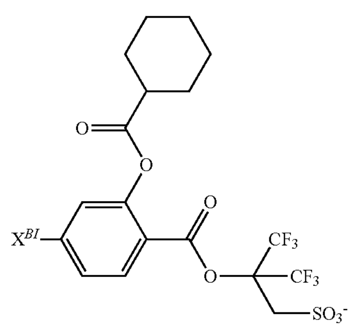
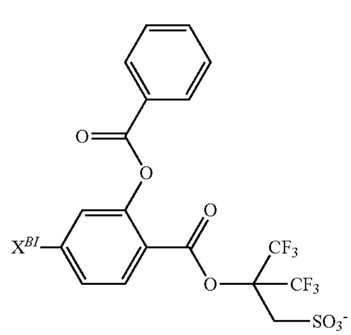

-continued
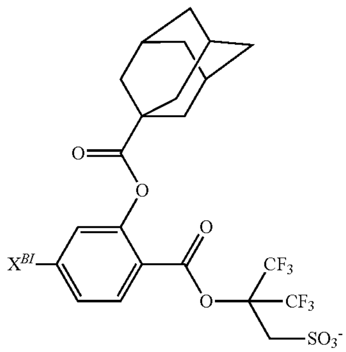
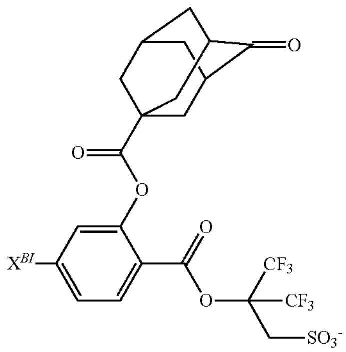
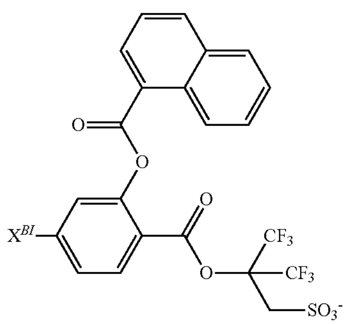
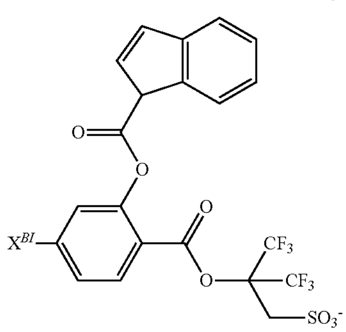
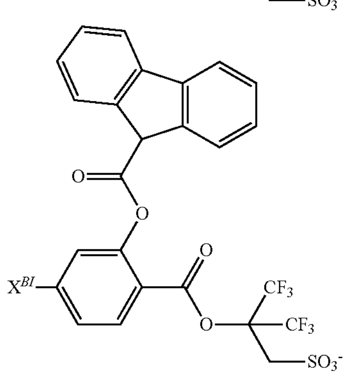
-continued
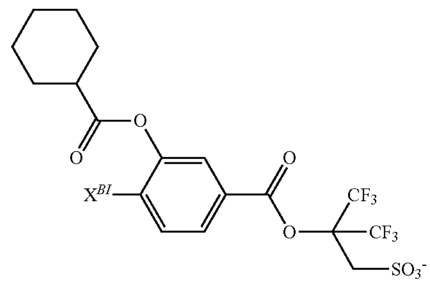
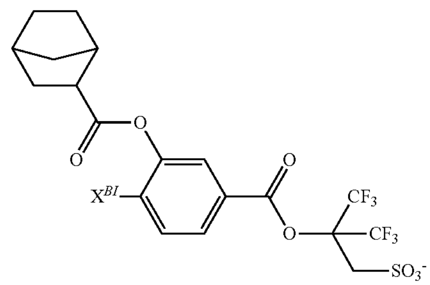
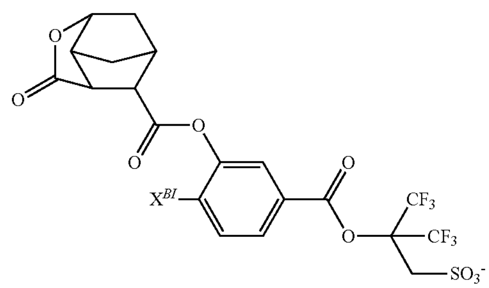
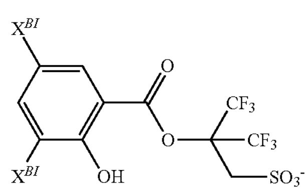
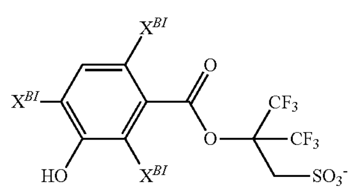
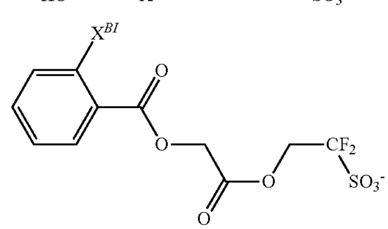
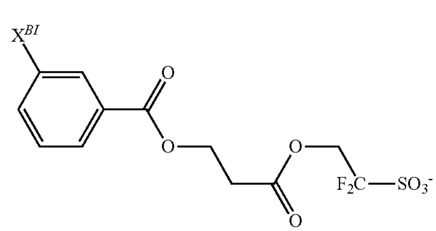

-continued
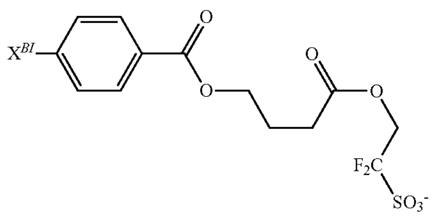
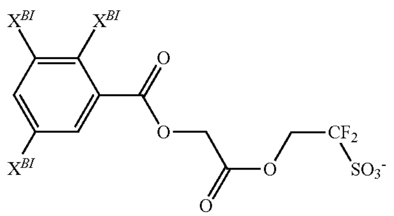
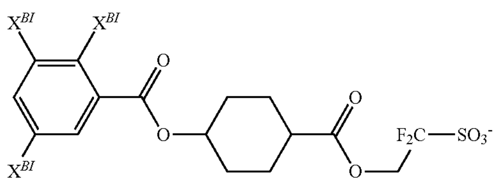
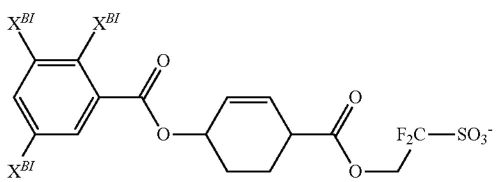
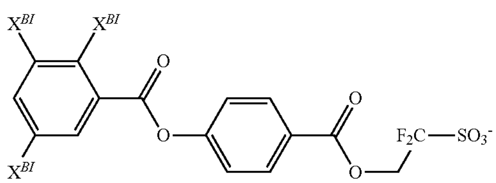
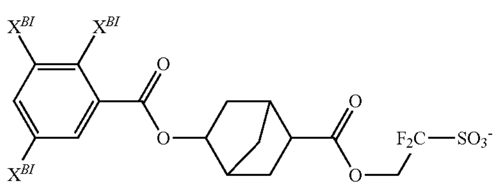
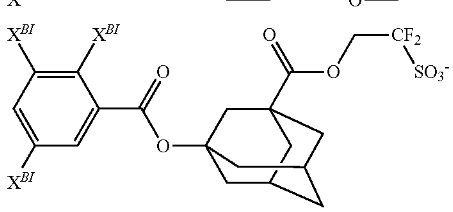
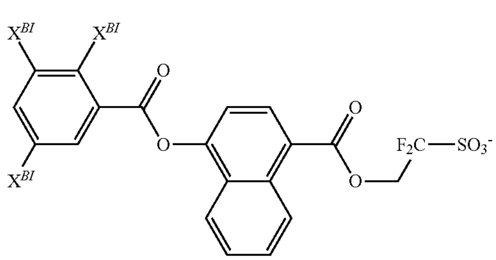
-continued
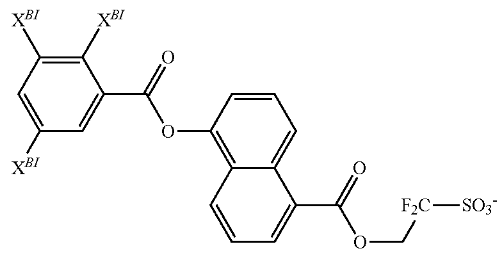
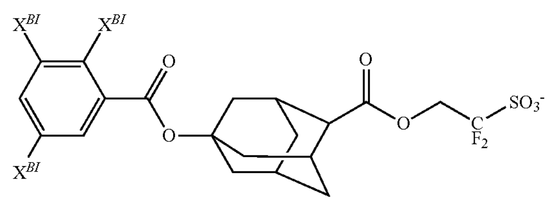
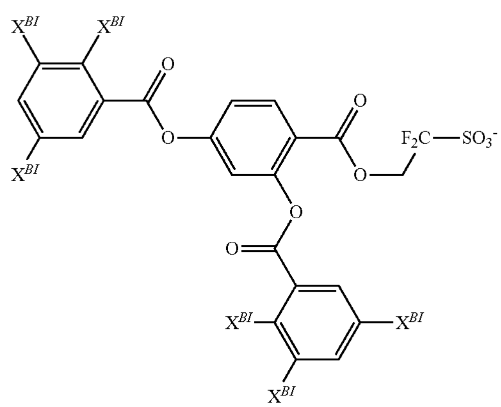
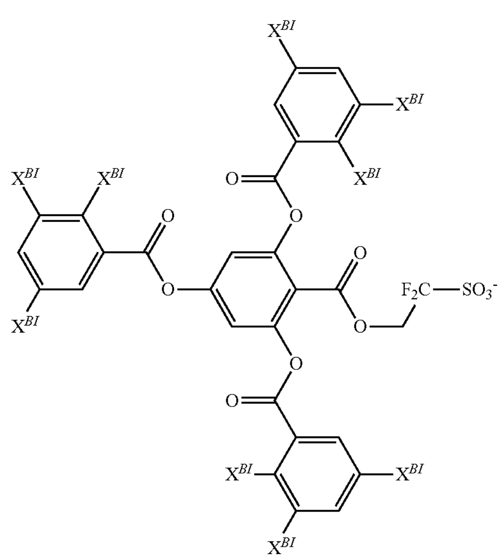

-continued
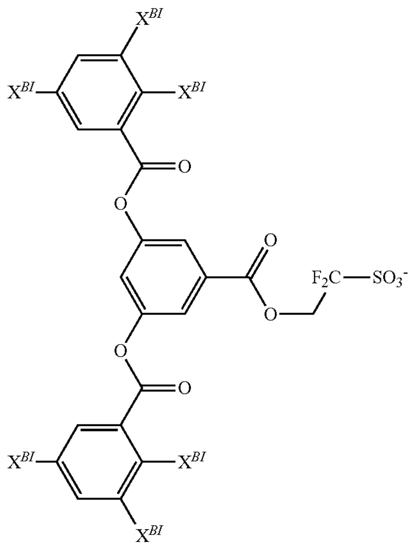
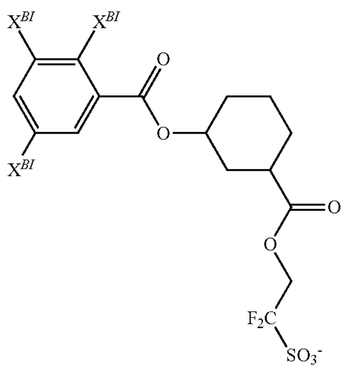
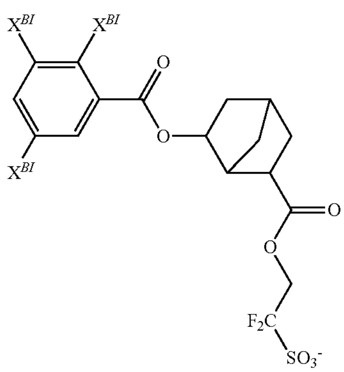
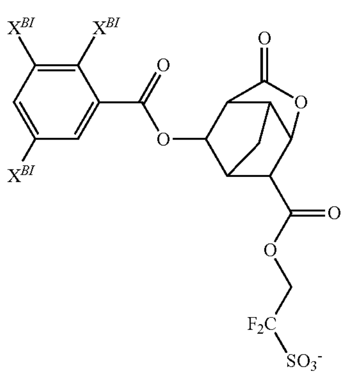
-continued
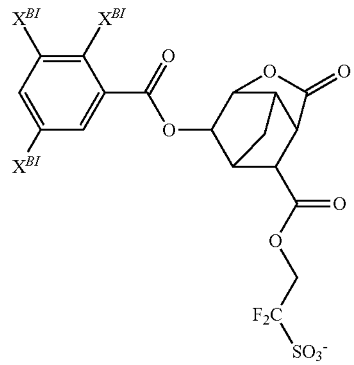
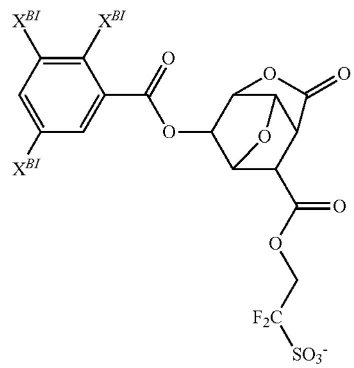
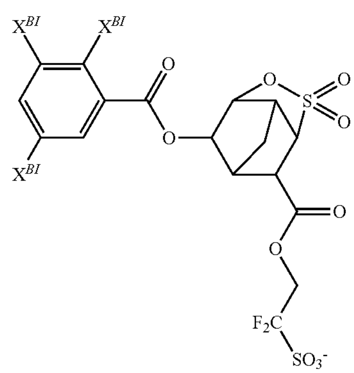
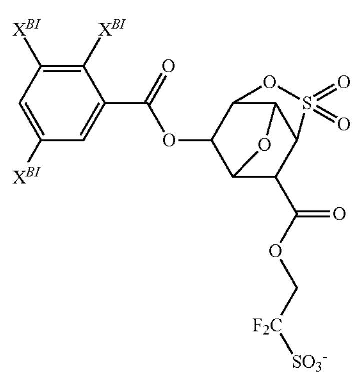

-continued
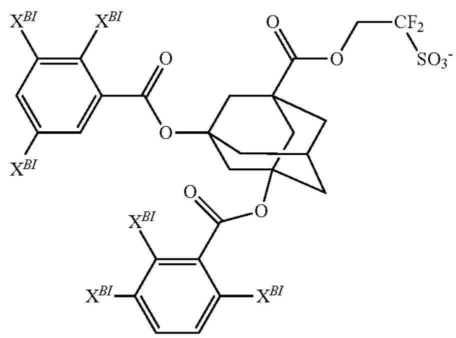
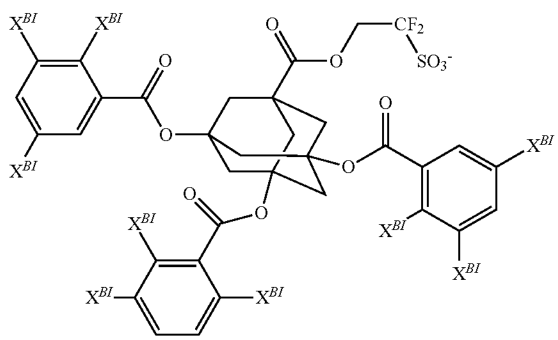
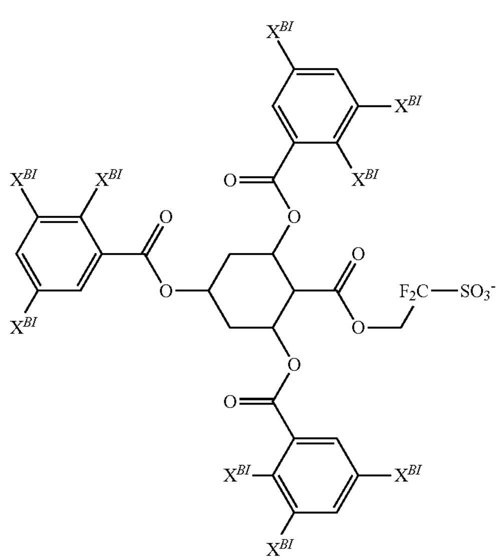
-continued
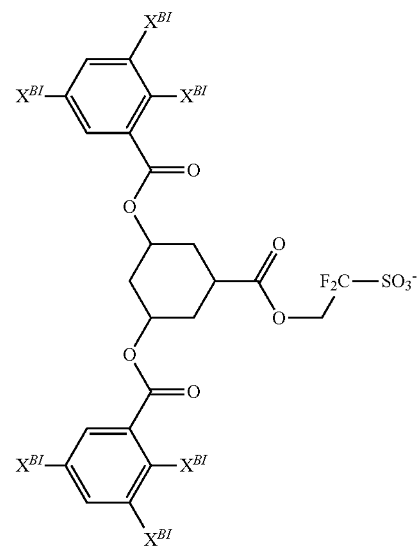
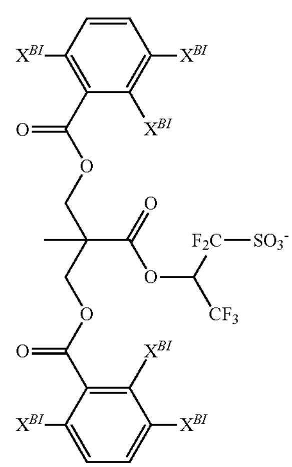
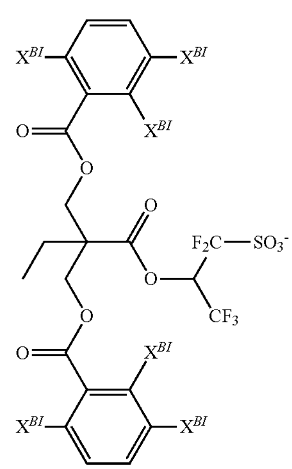

-continued
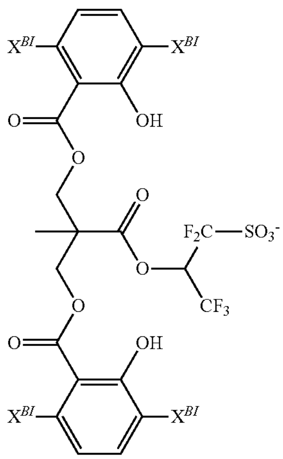
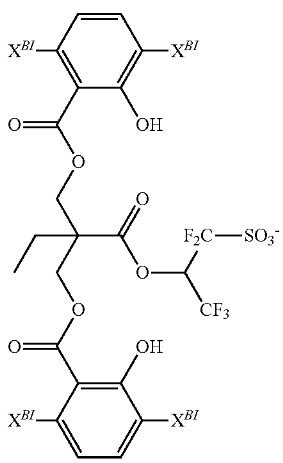
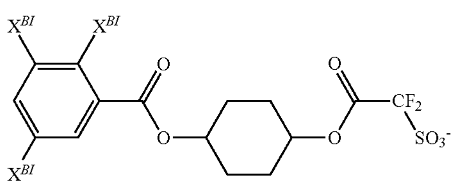
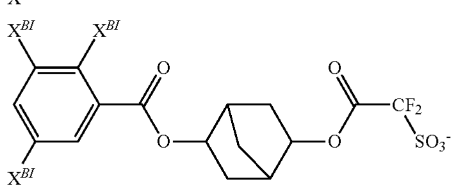
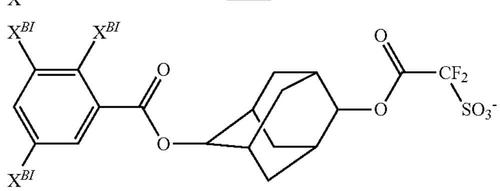
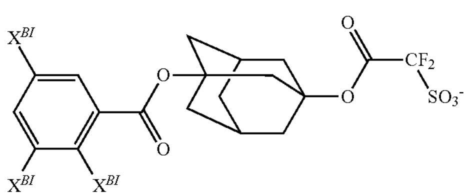
-continued
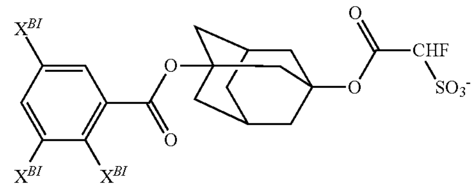
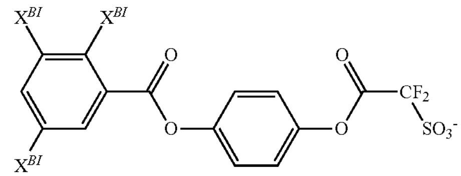
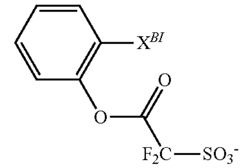
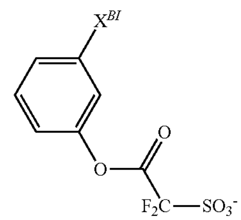
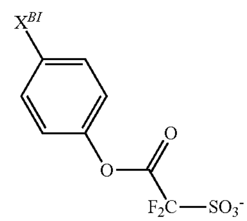
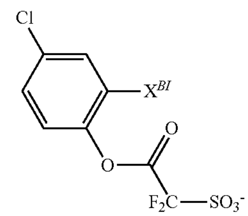
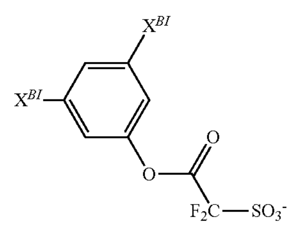
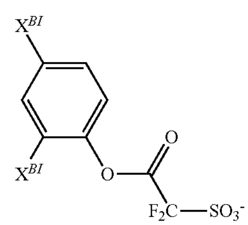
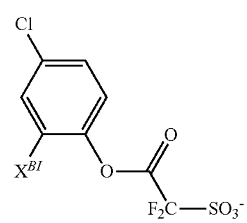
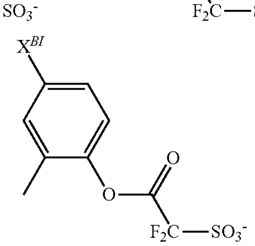
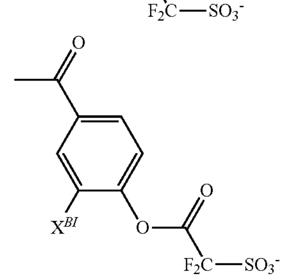
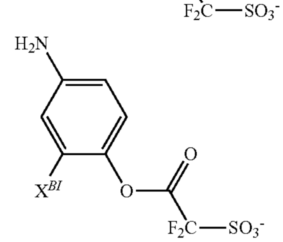

-continued
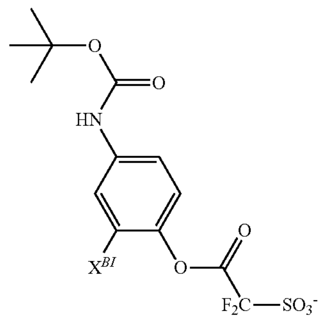
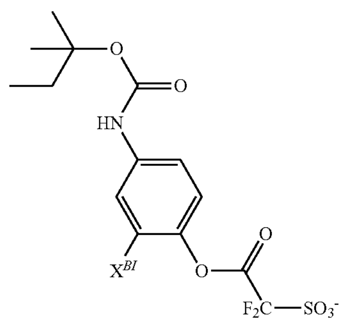
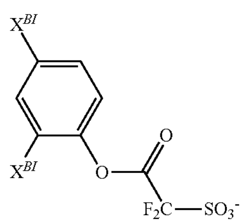
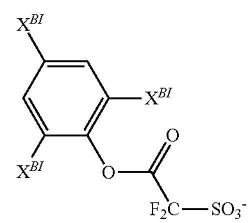
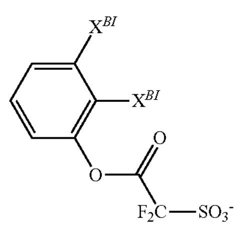
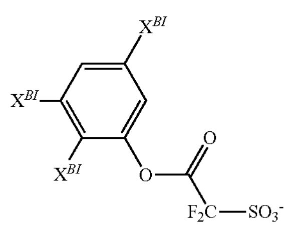
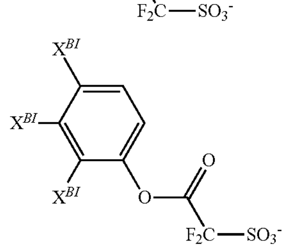
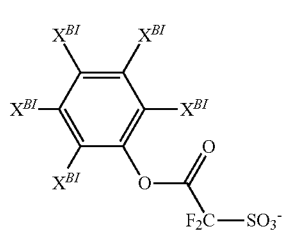
-continued
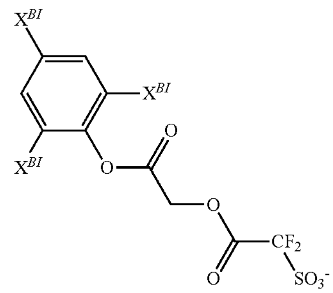
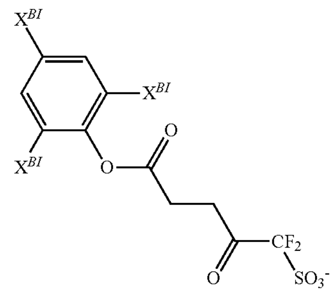
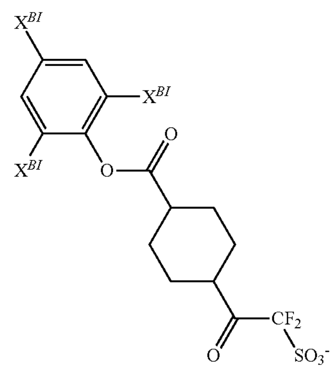
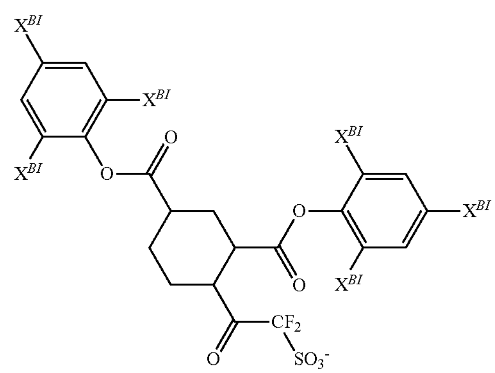
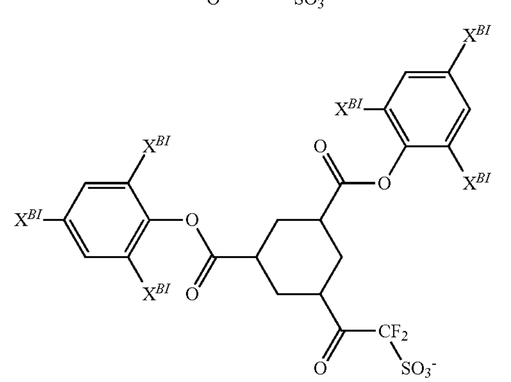

-continued
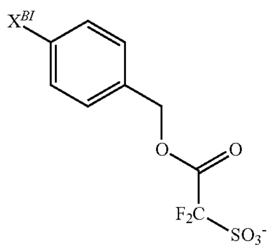
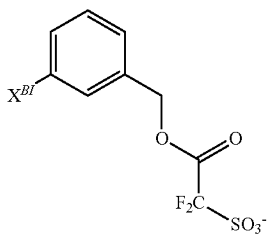
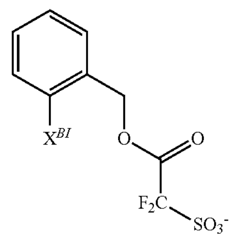
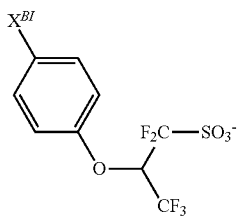
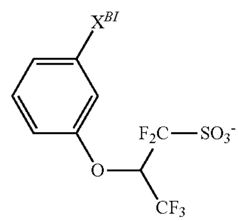
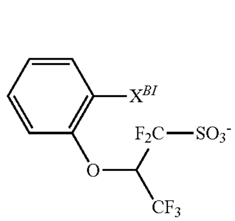
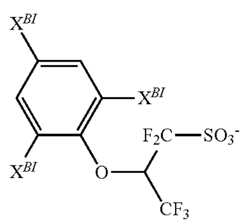
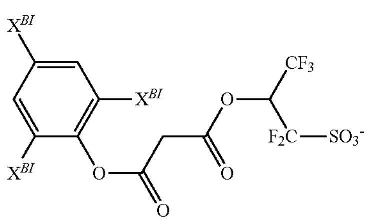
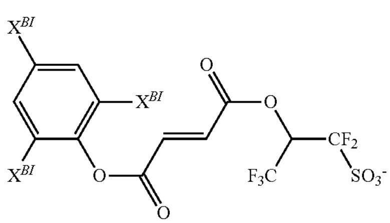
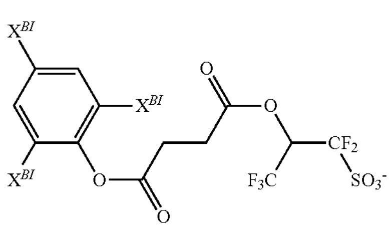
-continued
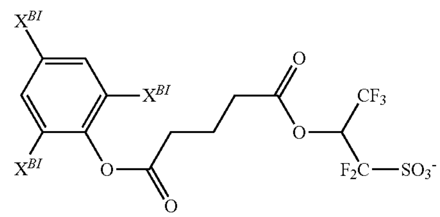
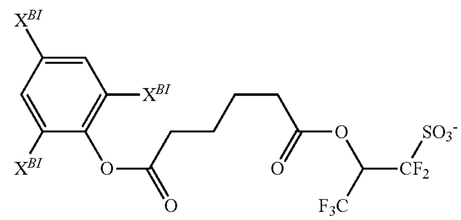
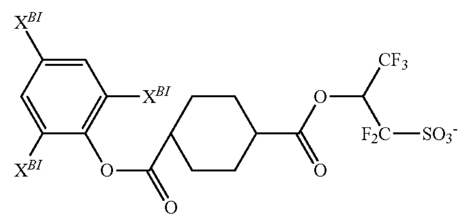
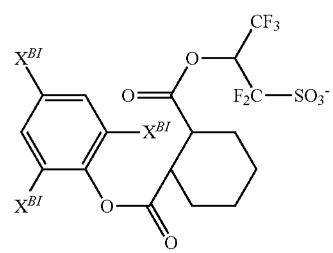
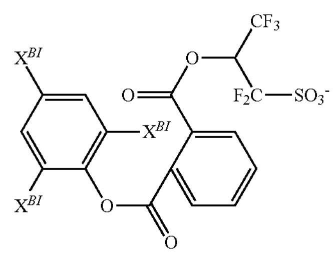
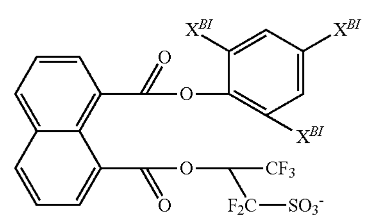
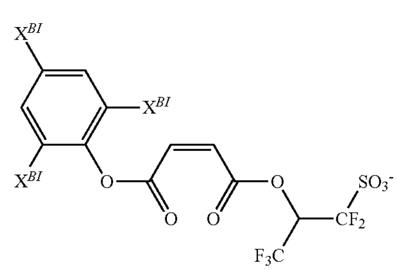

-continued
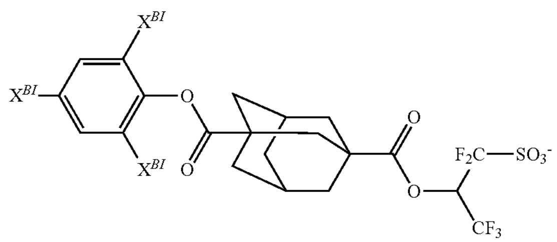
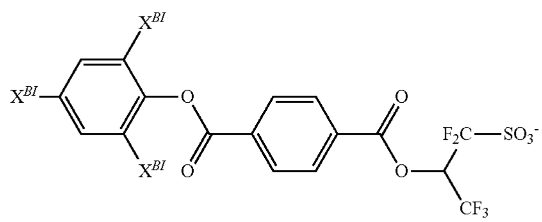
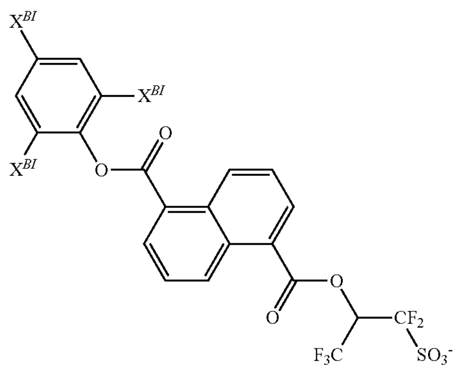
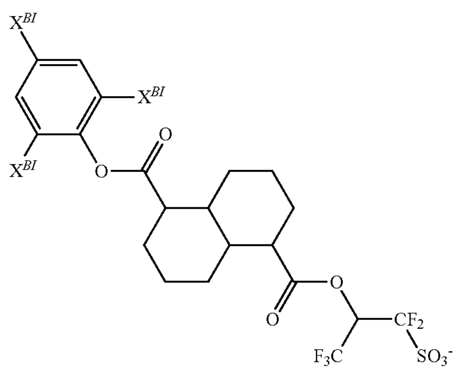
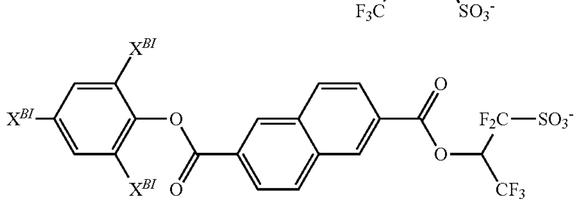
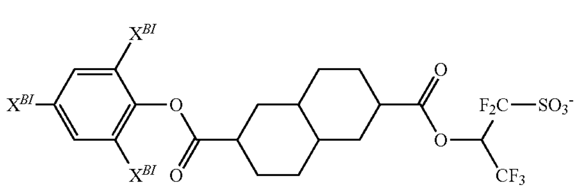
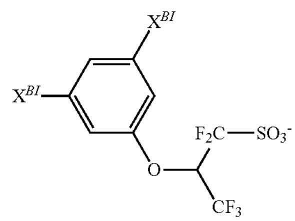
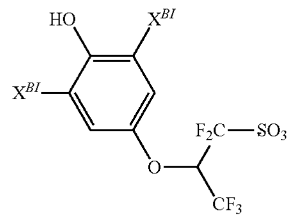
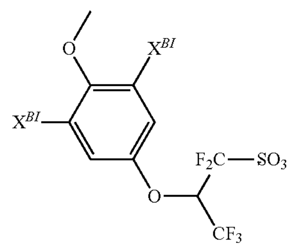
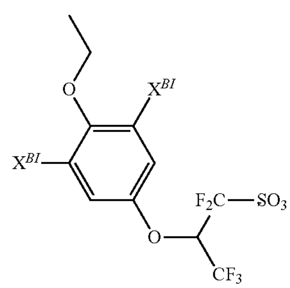
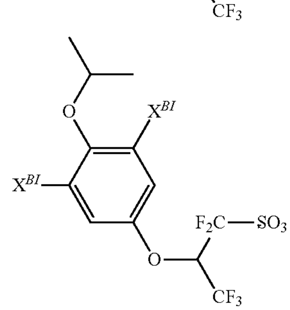
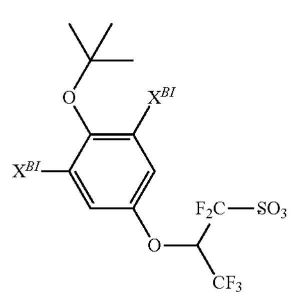

-continued
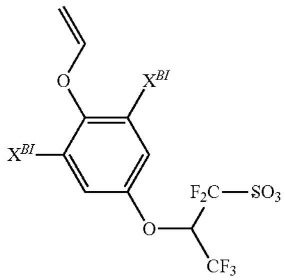
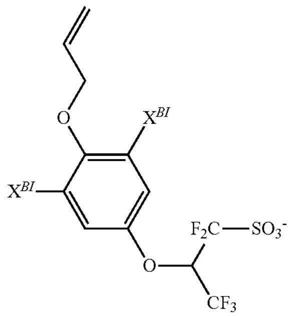
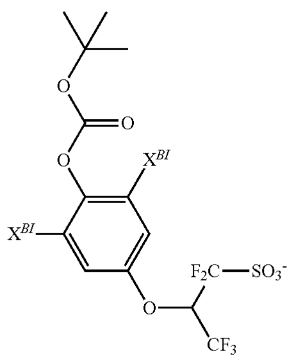
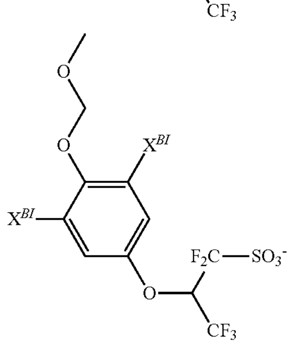
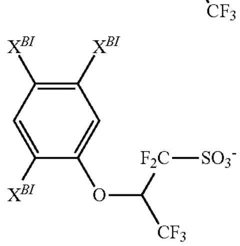
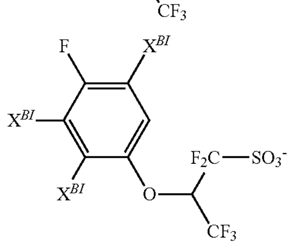
-continued
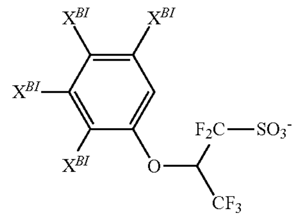
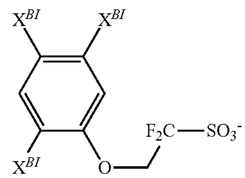
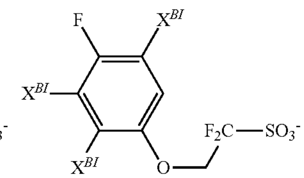
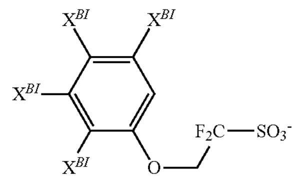
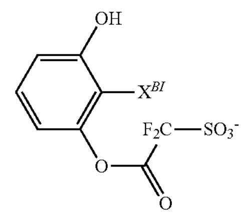
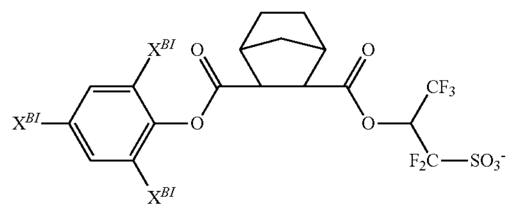
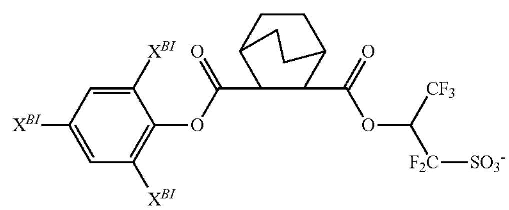
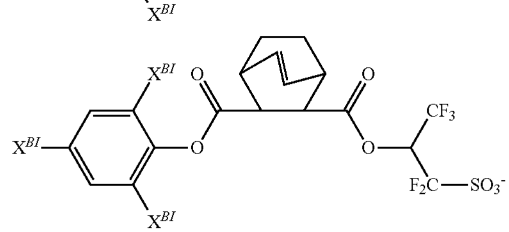
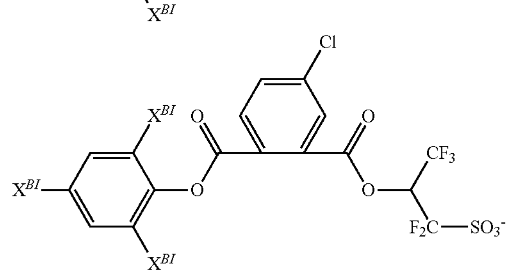
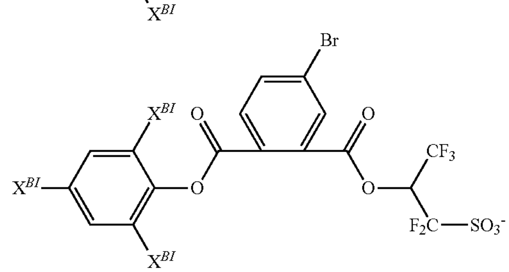

-continued
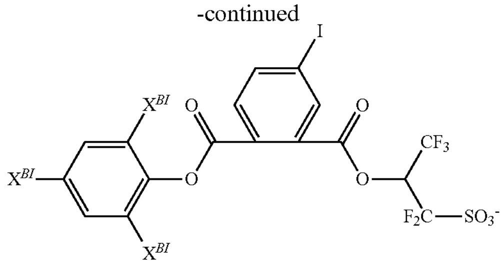
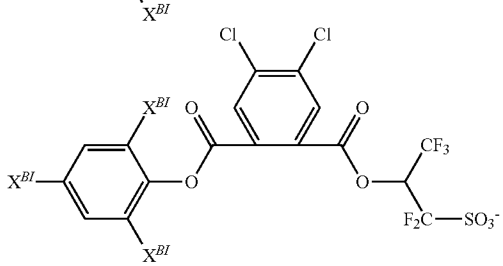
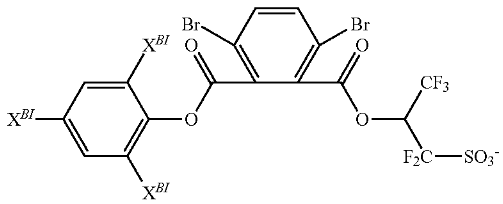
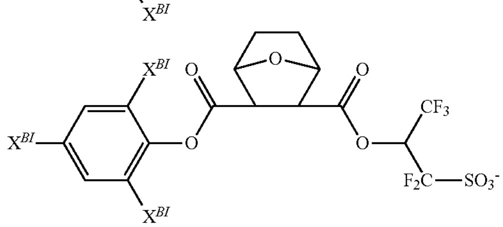
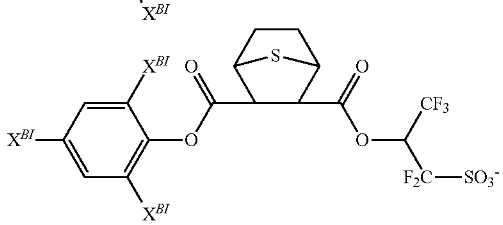
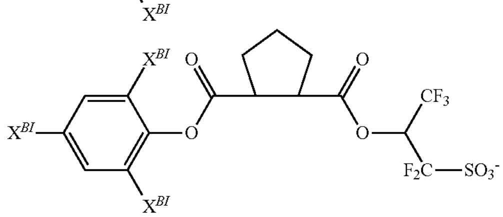
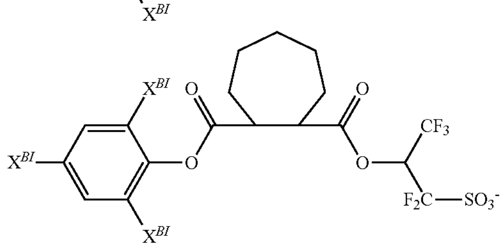
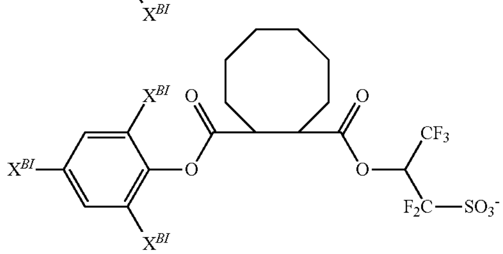
-continued
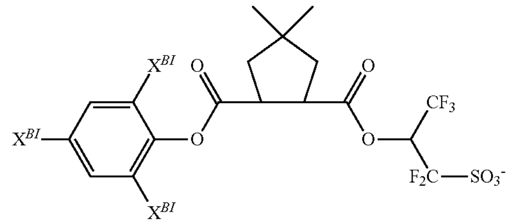
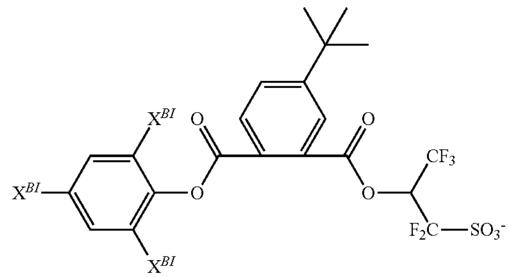
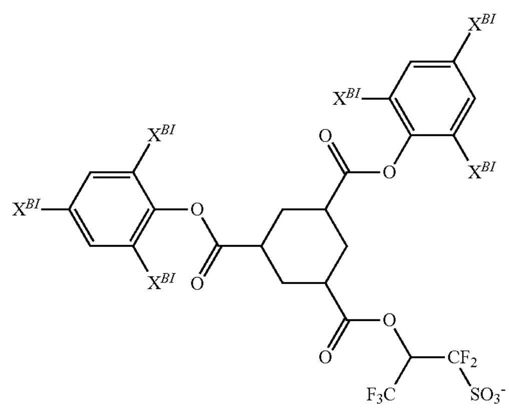
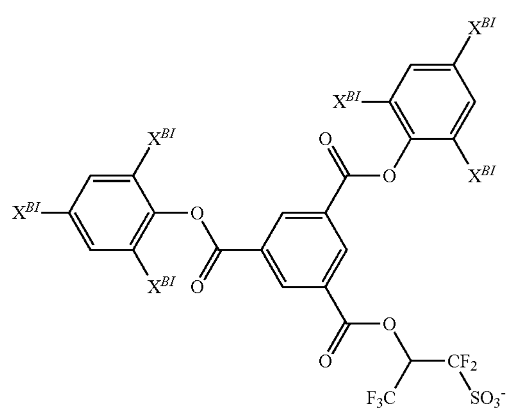

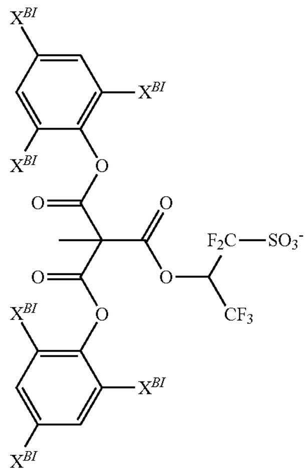
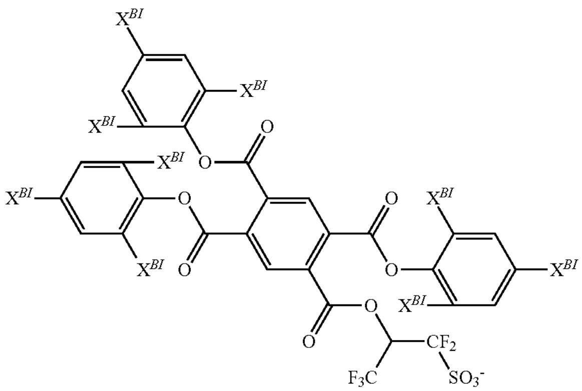
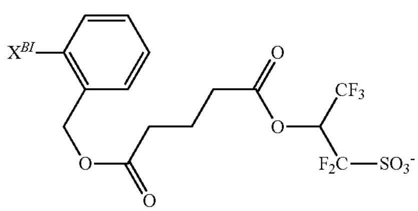
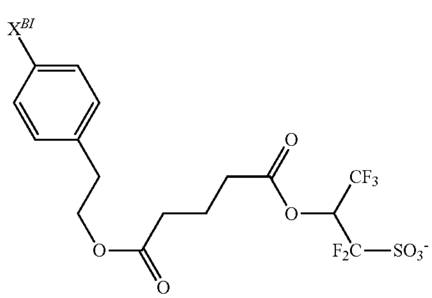
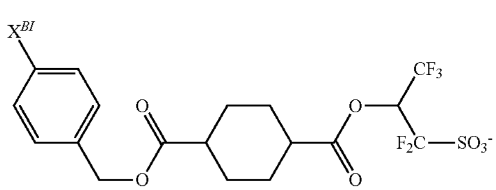
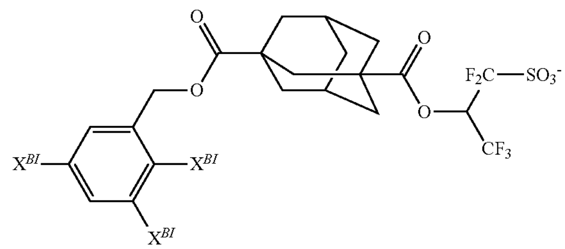
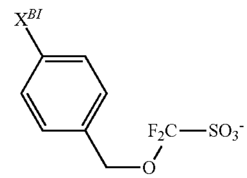
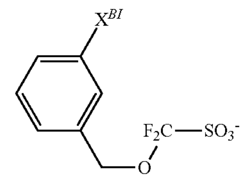
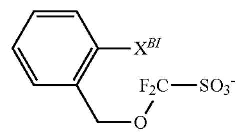
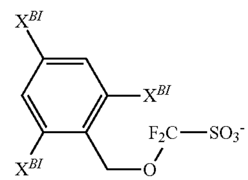
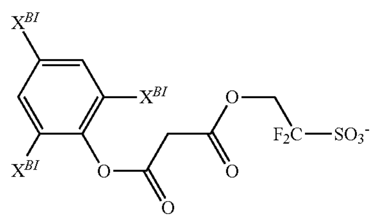
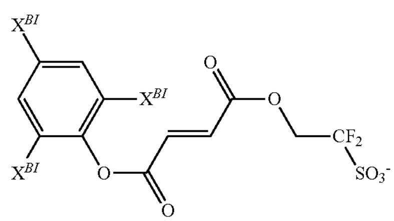
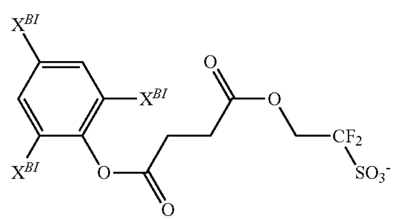
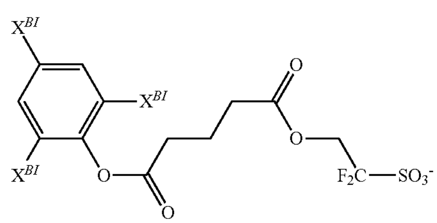
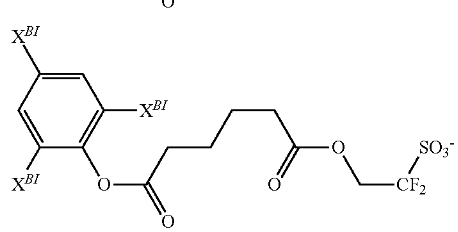

-continued
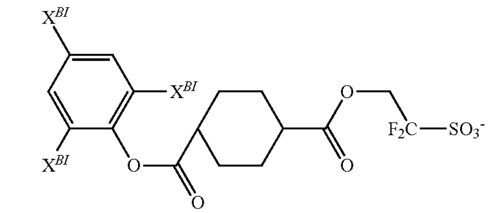
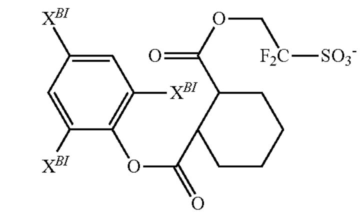
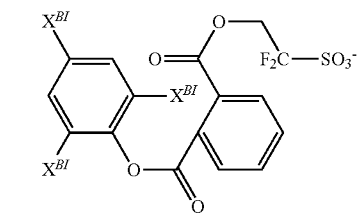
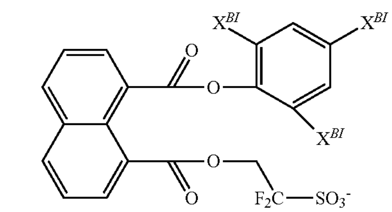
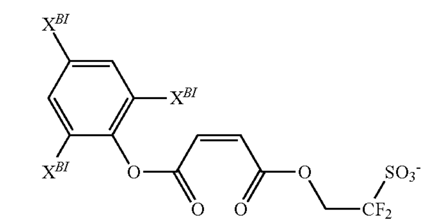
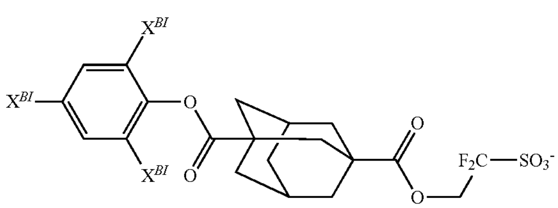
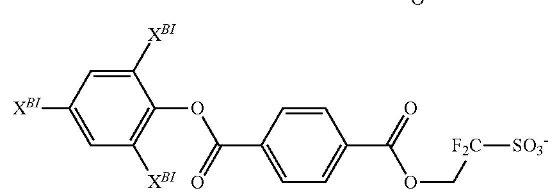
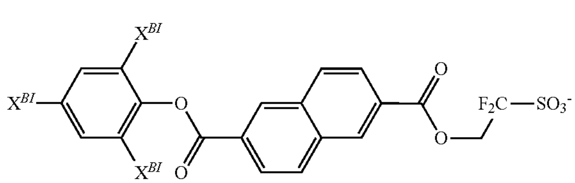
-continued
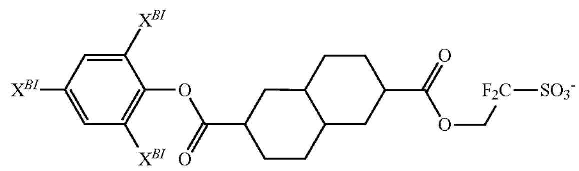
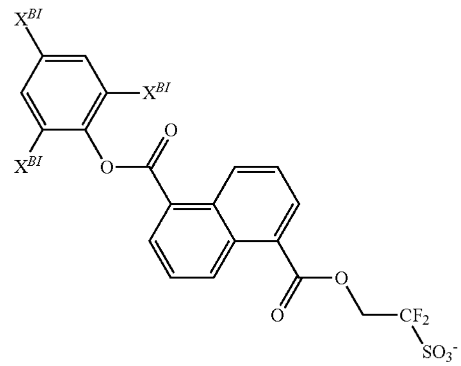
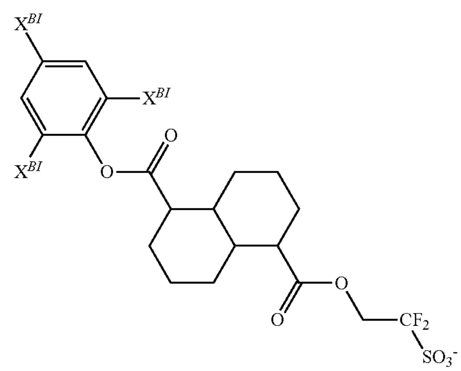
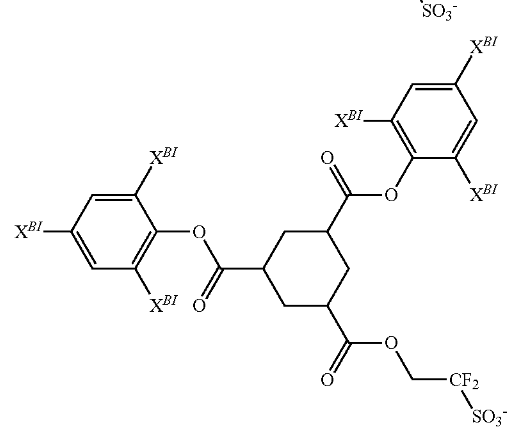
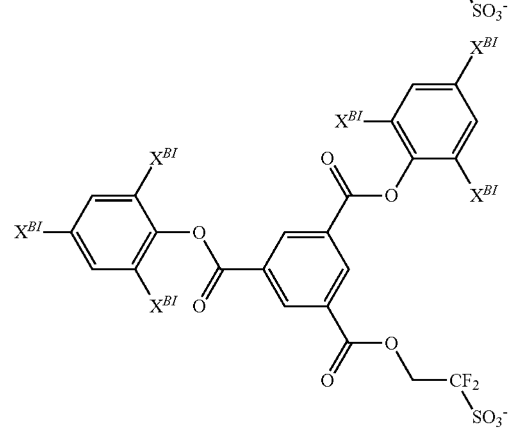

-continued
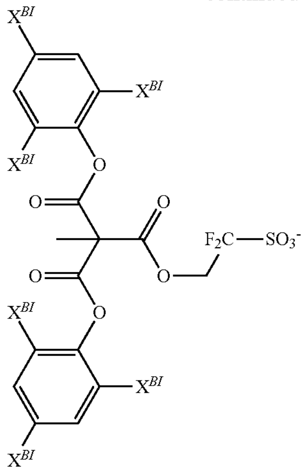
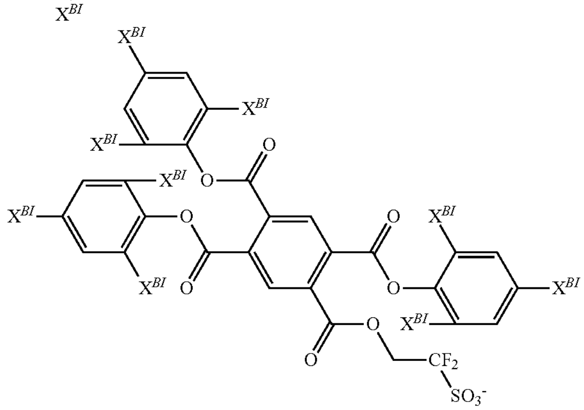
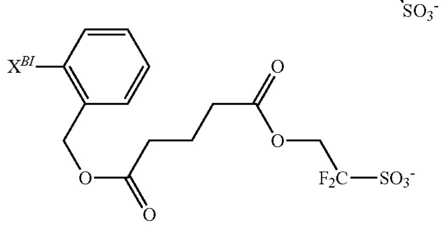
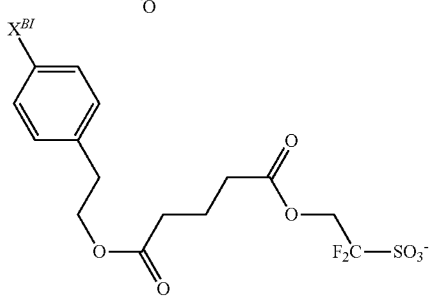
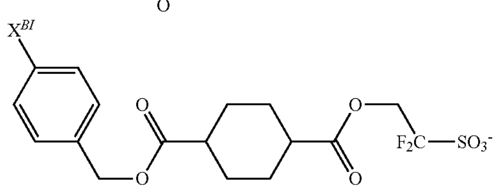
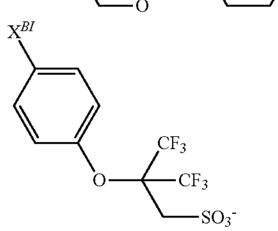
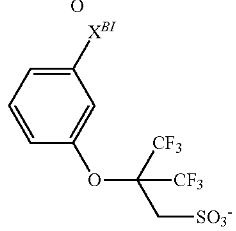
-continued
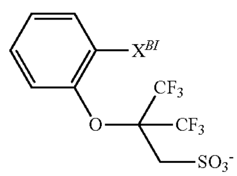
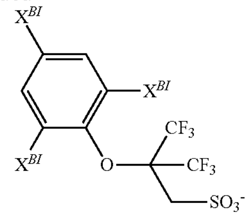
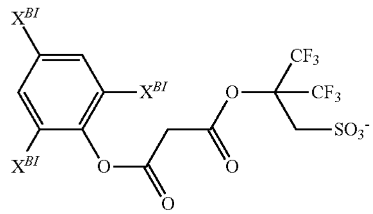
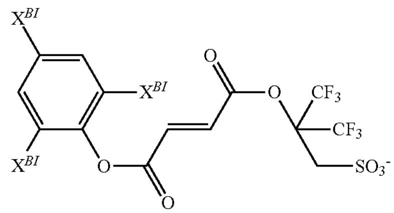
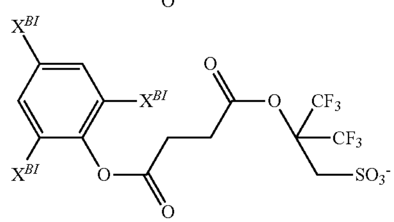
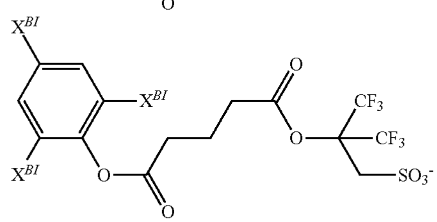
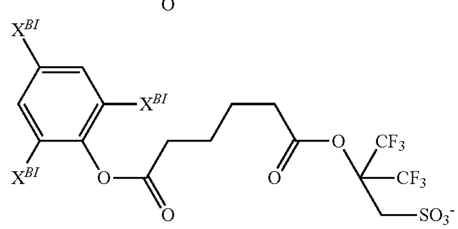
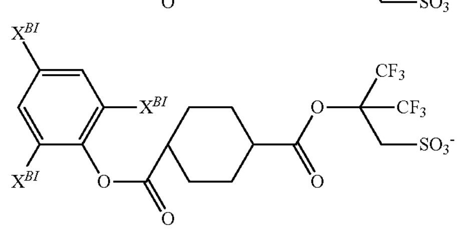
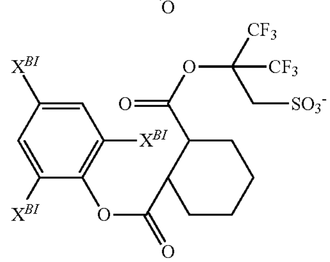

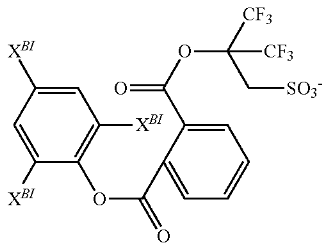
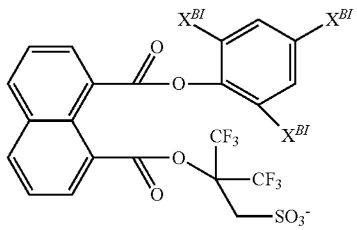
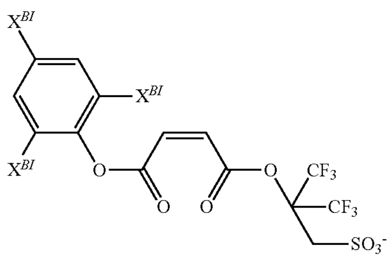
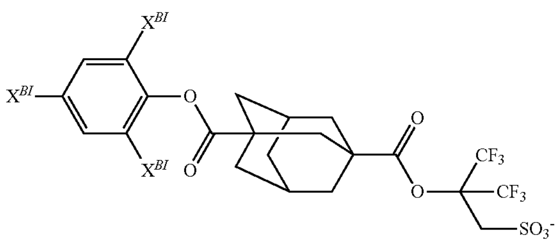
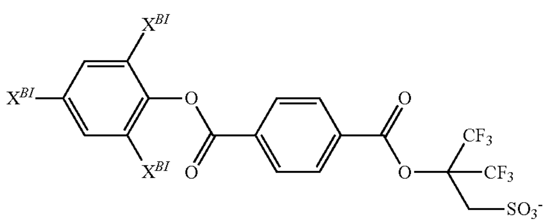
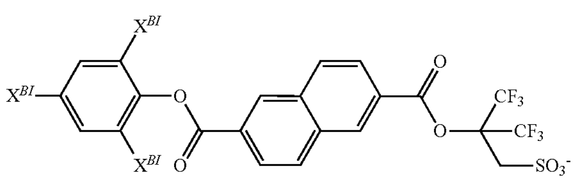
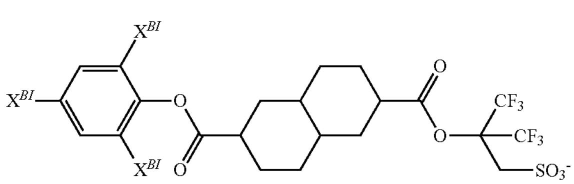
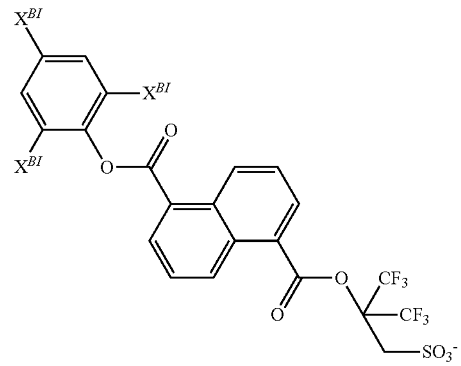
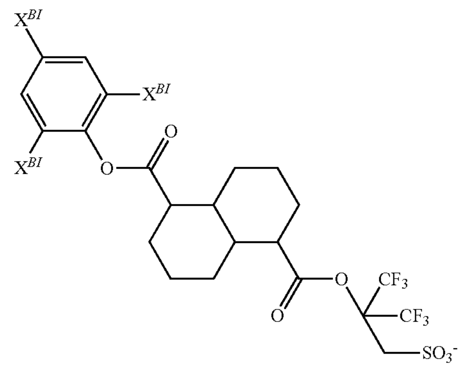
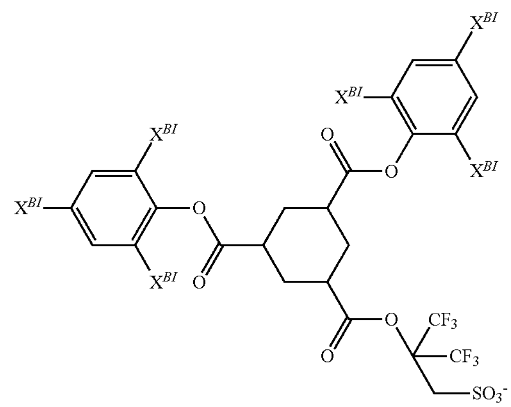
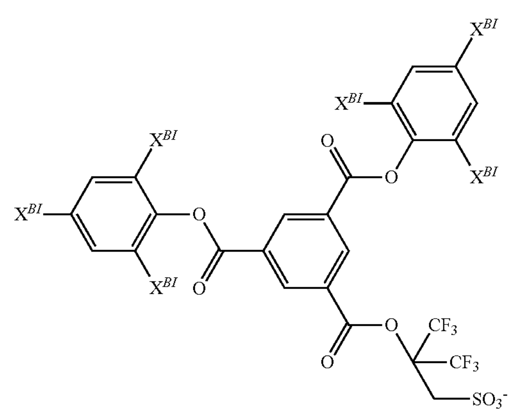

-continued

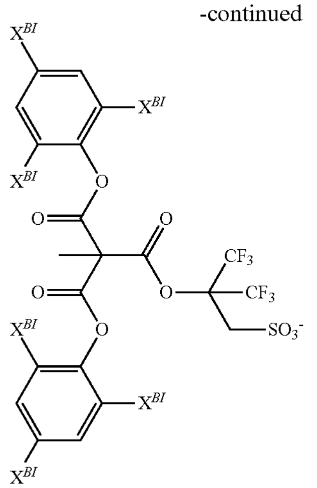

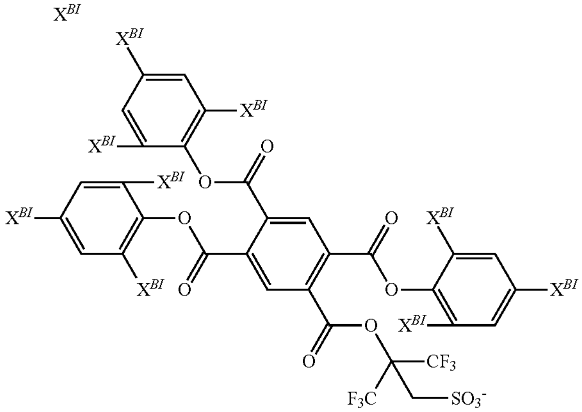

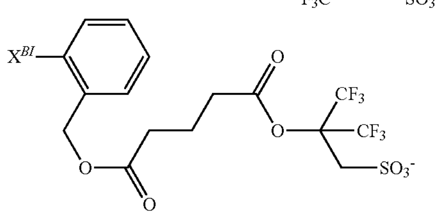

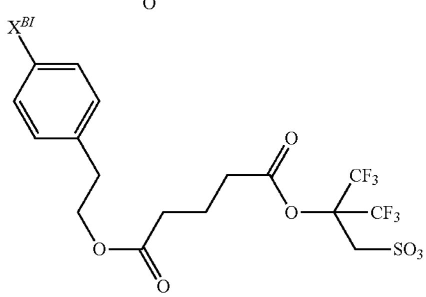

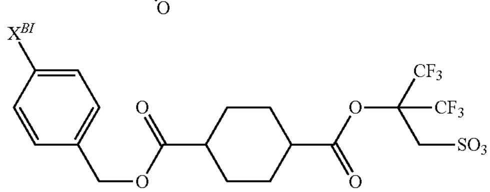

When used, the acid generator of addition type is preferably added in an amount of 0.1 to 50 parts, and more preferably 1 to 40 parts by weight per 100 parts by weight of the base polymer. The resist composition functions as a chemically amplified resist composition when the base polymer includes repeat units (f) and/or the acid generator of addition type is contained.

Organic Solvent

An organic solvent may be added to the resist composition. The organic solvent used herein is not particularly limited as long as the foregoing and other components are soluble therein. Examples of the organic solvent are described in JP-A 2008-111103, paragraphs [0144]-[0145] (U.S. Pat. No. 7,537,880). Exemplary solvents include ketones such as cyclohexanone, cyclopentanone, methyl-2-n-pentyl ketone and 2-heptanone; alcohols such as 3-methoxybutanol, 3-methyl-3-methoxybutanol, 1-methoxy-2-propanol, 1-ethoxy-2-propanol, and diacetone alcohol (DAA); ethers such as propylene glycol monomethyl ether (PGME), ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate (PGMEA), propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate; and lactones such as γ-butyrolactone, which may be used alone or in admixture.

The organic solvent is preferably added in an amount of 100 to 10,000 parts, and more preferably 200 to 8,000 parts by weight per 100 parts by weight of the base polymer.

Other Components

With the foregoing components, other components such as a quencher other than the ammonium salt and fluorine-containing polymer (referred to as other quencher, hereinafter), surfactant, dissolution inhibitor, and crosslinker may be blended in any desired combination to formulate a positive or negative resist composition. This positive or negative resist composition has a very high sensitivity in that the dissolution rate in developer of the base polymer in exposed areas is accelerated by catalytic reaction. In addition, the resist film has a high dissolution contrast, resolution, exposure latitude, and process adaptability, and provides a good pattern profile after exposure, and minimal proximity bias because of restrained acid diffusion. By virtue of these advantages, the composition is fully useful in commercial application and suited as a pattern-forming material for the fabrication of VLSIs.

The other quencher is typically selected from conventional basic compounds. Conventional basic compounds include primary, secondary, and tertiary aliphatic amines, mixed amines, aromatic amines, heterocyclic amines, nitrogen-containing compounds with carboxy group, nitrogen-containing compounds with sulfonyl group, nitrogen-containing compounds with hydroxy group, nitrogen-containing compounds with hydroxyphenyl group, alcoholic nitrogen-containing compounds, amide derivatives, imide derivatives, and carbamate derivatives. Also included are primary, secondary, and tertiary amine compounds, specifically amine compounds having a hydroxy group, ether bond, ester bond, lactone ring, cyano group, or sulfonic acid ester bond as described in JP-A 2008-111103, paragraphs [0146]-[0164], and compounds having a carbamate group as described in JP 3790649. Addition of a basic compound may be effective for further suppressing the diffusion rate of acid in the resist film or correcting the pattern profile.

Amine compounds having an iodized aromatic group as described in JP-A 2020-027297 are also useful quenchers. These compounds exert a sensitizing effect due to remarkable absorption of EUV and an acid diffusion controlling effect due to a high molecular weight.

Onium salts such as sulfonium salts, iodonium salts and ammonium salts of sulfonic acids which are not fluorinated at α-position as described in U.S. Pat. No. 8,795,942 (JP-A 2008-158339) and similar onium salts of carboxyic acid may also be used as the other quencher. While an α-fluorinated sulfonic acid, imide acid, and methide acid are necessary to deprotect the acid labile group of carboxyic acid ester, an α-non-fluorinated sulfonic acid and a carboxyic acid are released by salt exchange with an α-non-fluorinated onium salt. An α-non-fluorinated sulfonic acid and a carboxyic acid function as a quencher because they do not induce deprotection reaction.

Examples of the quencher include a compound (onium salt of α-non-fluorinated sulfonic acid) having the formula (4) and a compound (onium salt of carboxyic acid) having the formula (5).

$$R^{501}—SO_3^-Mq^+ \quad (4)$$

$$R^{502}—CO_2^-Mq^+ \quad (5)$$

In formula (4), $R^{501}$ is hydrogen or a $C_1$-$C_{40}$ hydrocarbyl group which may contain a heteroatom, exclusive of the hydrocarbyl group in which the hydrogen bonded to the carbon atom at α-position of the sulfo group is substituted by fluorine or fluoroalkyl moiety.

The hydrocarbyl group may be saturated or unsaturated and straight, branched or cyclic. Examples thereof include alkyl groups such as methyl, ethyl, propyl, isopropyl, n-butyl, sec-butyl, tert-butyl, tert-pentyl, n-pentyl, n-hexyl, n-octyl, 2-ethylhexyl, n-nonyl, n-decyl; cyclic saturated hydrocarbyl groups such as cyclopentyl, cyclohexyl, cyclopentylmethyl, cyclopentylethyl, cyclopentylbutyl, cyclohexyhnethyl, cyclohexylethyl, cyclohexylbutyl, norbornyl, tricyclo[5.2.1.$0^{2,6}$]decanyl, adamantyl, and adamantylmethyl; alkenyl groups such as vinyl, allyl, propenyl, butenyl and hexenyl; cyclic unsaturated aliphatic hydrocarbyl groups such as cyclohexenyl; aryl groups such as phenyl, naphthyl, alkylphenyl groups (e.g., 2-methylphenyl, 3-methylphenyl, 4-methylphenyl, 4-ethylphenyl, 4-tert-butylphenyl, 4-n-butylphenyl), dialkylphenyl groups (e.g., 2,4-dimethylphenyl and 2,4,6-triisopropylphenyl), alkylnaphthyl groups (e.g., methylnaphthyl and ethylnaphthyl), dialkylnaphthyl groups (e.g., dimethylnaphthyl and diethylnaphthyl); heteroaryl groups such as thienyl; and aralkyl groups such as benzyl, 1-phenylethyl and 2-phenylethyl.

In these groups, some hydrogen may be substituted by a moiety containing a heteroatom such as oxygen, sulfur, nitrogen or halogen, and some carbon may be replaced by a moiety containing a heteroatom such as oxygen, sulfur or nitrogen, so that the group may contain a hydroxy moiety, cyano moiety, carbonyl moiety, ether bond, ester bond, sulfonic acid ester bond, carbonate bond, lactone ring, sultone ring, carboxyic anhydride, or haloalkyl moiety. Suitable heteroatom-containing hydrocarbyl groups include 4-hydroxyphenyl, alkoxyphenyl groups such as 4-methoxyphenyl, 3-methoxyphenyl, 2-methoxyphenyl, 4-ethoxyphenyl, 4-tert-butoxyphenyl, 3-tert-butoxyphenyl; alkoxynaphthyl groups such as methoxynaphthyl, ethoxynaphthyl, n-propoxynaphthyl and n-butoxynaphthyl; dialkoxynaphthyl groups such as dimethoxynaphthyl and diethoxynaphthyl; and aryloxoalkyl groups, typically 2-aryl-2-oxoethyl groups such as 2-phenyl-2-oxoethyl, 2-(1-naphthyl)-2-oxoethyl and 2-(2-naphthyl)-2-oxoethyl.

In formula (5), $R^{502}$ is a $C_1$-$C_{40}$ hydrocarbyl group which may contain a heteroatom. Examples of the hydrocarbyl group $R^{502}$ are as exemplified above for the hydrocarbyl group $R^{501}$. Also included are fluorinated alkyl groups such as trifluoromethyl, trifluoroethyl, 2,2,2-trifluoro-1-methyl-1-hydroxyethyl, 2,2,2-trifluoro-1-(trifluoromethyl)-1-hydroxyethyl, and fluorinated aryl groups such as pentafluorophenyl and 4-trifluoromethylphenyl.

In formulae (4) and (5), $Mq^+$ is an onium cation. The onium cation is preferably selected from sulfonium, iodonium and ammonium cations, more preferably sulfonium and iodonium cations. Exemplary sulfonium cations are as exemplified above for the cation in the sulfonium salt having formula (1-1). Exemplary iodonium cations are as exemplified above for the cation in the iodonium salt having formula (1-2).

A sulfonium salt of iodized benzene ring-containing carboxyic acid having the formula (6) is also useful as the other quencher.

(6)

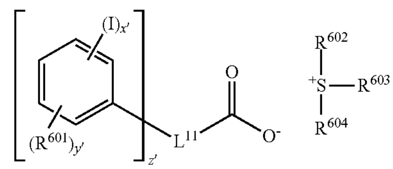

In formula (6), x' is an integer of 1 to 5, y' is an integer of 0 to 3, an z' is an integer of 1 to 3.

In formula (6), $R^{601}$ is hydroxy, fluorine, chlorine, bromine, amino, nitro, cyano, or a $C_1$-$C_6$ saturated hydrocarbyl, $C_1$-$C_6$ saturated hydrocarbyloxy, $C_2$-$C_6$ saturated hydrocarbylcarbonyloxy or $C_1$-$C_4$ saturated hydrocarbylsulfonyloxy group, in which some or all hydrogen may be substituted by halogen, or —N($R^{61A}$)—C(═O)—$R^{601B}$, or —N($R^{601A}$)—C(═O)—O—$R^{601B}$. $R^{601A}$ is hydrogen or a $C_1$-$C_6$ saturated hydrocarbyl group. $R^{601B}$ is a $C_1$-$C_6$ saturated hydrocarbyl or $C_2$-$C_8$ unsaturated aliphatic hydrocarbyl group.

In formula (6), $L^{11}$ is a single bond, or a $C_1$-$C_{20}$ (z'+1)-valent linking group which may contain at least one moiety selected from ether bond, carbonyl moiety, ester bond, amide bond, sultone ring, lactam ring, carbonate bond, halogen, hydroxy moiety, and carboxy moiety. The saturated hydrocarbyl, saturated hydrocarbyloxy, saturated hydrocarbylcarbonyloxy, and saturated hydrocarbylsulfonyloxy groups may be straight, branched or cyclic. Groups $R^{601}$ may be the same or different when y' and/or z' is 2 or 3.

In formula (6), $R^{602}$, $R^{603}$ and $R^{604}$ are each independently halogen, or a $C_1$-$C_{20}$ hydrocarbyl group which may contain a heteroatom. The hydrocarbyl group may be saturated or unsaturated and straight, branched or cyclic. Examples thereof are as exemplified above for the hydrocarbyl groups $R^{101}$ to $R^{105}$ in formulae (1-1) and (1-2).

In these groups, some or all hydrogen may be substituted by hydroxy, carboxy, halogen, oxo, cyano, nitro, sultone, sulfone, or sulfonium salt-containing moiety, or some carbon may be replaced by an ether bond, ester bond, carbonyl moiety, amide bond, carbonate bond or sulfonic acid ester bond. Also $R^{602}$ and $R^{603}$ may bond together to form a ring with the sulfur atom to which they are attached.

Examples of the compound having formula (6) include those described in U.S. Pat. No. 10,295,904 (JP-A 2017-219836). These compounds exert a sensitizing effect due to remarkable absorption and an acid diffusion controlling effect.

Also useful are quenchers of polymer type as described in U.S. Pat. No. 7,598,016 (JP-A 2008-239918). The polymeric quencher segregates at the resist film surface and consequently enhances the rectangularity of resist patterns. When a protective film is applied as is often the case in the immersion lithography, the polymeric quencher is also effective for preventing a film thickness loss of resist pattern or rounding of pattern top.

When used, the other quencher is preferably added in an amount of 0 to 5 parts, more preferably 0 to 4 parts by weight per 100 parts by weight of the base polymer. The other quencher may be used alone or in admixture.

Exemplary surfactants are described in JP-A 2008-111103, paragraphs [0165]-[0166]. Inclusion of a surfactant may improve or control the coating characteristics of the resist composition. When used, the surfactant is preferably added in an amount of 0.0001 to 10 parts by weight per 100 parts by weight of the base polymer. The surfactant may be used alone or in admixture.

When the resist composition is of positive tone, the inclusion of a dissolution inhibitor may lead to an increased difference in dissolution rate between exposed and unexposed areas and a further improvement in resolution. The dissolution inhibitor which can be used herein is a compound having at least two phenolic hydroxy groups on the molecule, in which an average of from 0 to 100 mol % of all the hydrogen atoms on the phenolic hydroxy groups are replaced by acid labile groups or a compound having at least one carboxy group on the molecule, in which an average of 50 to 100 mol % of all the hydrogen atoms on the carboxy groups are replaced by acid labile groups, both the compounds having a molecular weight of 100 to 1,000, and preferably 150 to 800. Typical are bisphenol A, trisphenol, phenolphthalein, cresol novolac, naphthalenecarboxyic acid, adamantanecarboxyic acid, and cholic acid derivatives in which the hydrogen atom on the hydroxy or carboxy group is replaced by an acid labile group, as described in U.S. Pat. No. 7,771,914 (JP-A 2008-122932, paragraphs [0155]-[0178]).

When the resist composition is of positive tone and contains a dissolution inhibitor, the dissolution inhibitor is preferably added in an amount of 0 to 50 parts, more preferably 5 to 40 parts by weight per 100 parts by weight of the base polymer. The dissolution inhibitor may be used alone or in admixture.

When the resist composition is of negative tone, a negative pattern may be formed by adding a crosslinker to reduce the dissolution rate of a resist film in exposed area. Suitable crosslinkers include epoxy compounds, melamine compounds, guanamine compounds, glycoluril compounds and urea compounds having substituted thereon at least one group selected from among methylol, alkoxymethyl and acyloxymethyl groups, isocyanate compounds, azide compounds, and compounds having a double bond such as an alkenyloxy group. These compounds may be used as an additive or introduced into a polymer side chain as a pendant. Hydroxy-containing compounds may also be used as the crosslinker.

Examples of the epoxy compound include tris(2,3-epoxypropyl) isocyanurate, trimethylolmethane triglycidyl ether, trimethylolpropane triglycidyl ether, and triethylolethane triglycidyl ether. Examples of the melamine compound include hexamethylol melamine, hexamethoxymethyl melamine, hexamethylol melamine compounds having 1 to 6 methylol groups methoxymethylated and mixtures thereof, hexamethoxyethyl melamine, hexaacyloxymethyl melamine, hexamethylol melamine compounds having 1 to 6 methylol groups acyloxymethylated and mixtures thereof. Examples of the guanamine compound include tetramethylol guanamine, tetramethoxymethyl guanamine, tetramethylol guanamine compounds having 1 to 4 methylol groups methoxymethylated and mixtures thereof, tetramethoxyethyl guanamine, tetraacyloxyguanamine, tetramethylol guanamine compounds having 1 to 4 methylol groups acyloxymethylated and mixtures thereof. Examples of the glycoluril compound include tetramethylol glycoluril, tetramethoxyglycoluril, tetramethoxymethyl glycoluril, tetramethylol glycoluril compounds having 1 to 4 methylol groups methoxymethylated and mixtures thereof, tetramethylol glycoluril compounds having 1 to 4 methylol groups acyloxymethylated and mixtures thereof. Examples of the urea compound include tetramethylol urea, tetramethoxymethyl urea, tetramethylol urea compounds having 1 to 4 methylol groups methoxymethylated and mixtures thereof, and tetramethoxyethyl urea.

Suitable isocyanate compounds include tolylene diisocyanate, diphenylnethane diisocyanate, hexamethylene diisocyanate and cyclohexane diisocyanate. Suitable azide compounds include 1,1'-biphenyl-4,4'-bisazide, 4,4'-methylidenebisazide, and 4,4'-oxybisazide. Examples of the alkenyloxy group-containing compound include ethylene glycol divinyl ether, triethylene glycol divinyl ether, 1,2-propanediol divinyl ether, 1,4-butanediol divinyl ether, tetramethylene glycol divinyl ether, neopentyl glycol divinyl ether, trimethylol propane trivinyl ether, hexanediol divinyl ether, 1,4-cyclohexanediol divinyl ether, pentaerythritol trivinyl ether, pentaerythritol tetravinyl ether, sorbitol tetravinyl ether, sorbitol pentavinyl ether, and trimethylol propane trivinyl ether.

When the resist composition is of negative tone and contains a crosslinker, the crosslinker is preferably added in an amount of 0.1 to 50 parts, more preferably 1 to 40 parts by weight per 100 parts by weight of the base polymer. The crosslinker may be used alone or in admixture.

Also, an acetylene alcohol may be blended in the resist composition. Suitable acetylene alcohols are described in JP-A 2008-122932, paragraphs [0179]-[0182]. An appropriate amount of the acetylene alcohol blended is 0 to 5 parts by weight per 100 parts by weight of the base polymer. The acetylene alcohols may be used alone or in admixture.

Pattern Forming Process

The resist composition is used in the fabrication of various integrated circuits. Pattern formation using the resist composition may be performed by well-known lithography processes. The process generally involves the steps of applying the resist composition onto a substrate to form a resist film thereon, exposing the resist film to high-energy radiation, and developing the exposed resist film in a developer. If necessary, any additional steps may be added.

The resist composition is first applied onto a substrate on which an integrated circuit is to be formed (e.g., Si, $SiO_2$, SiN, SiON, TiN, WSi, BPSG, SOG, or organic antireflective coating) or a substrate on which a mask circuit is to be formed (e.g., Cr, CrO, CrON, $MoSi_2$, or $SiO_2$) by a suitable coating technique such as spin coating, roll coating, flow coating, dipping, spraying or doctor coating. The coating is prebaked on a hot plate at a temperature of 60 to 150° C. for 10 seconds to 30 minutes, preferably at 80 to 120° C. for 30 seconds to 20 minutes. The resulting resist film is generally 0.01 to 2 μm thick.

The resist film is then exposed to a desired pattern of high-energy radiation such as UV, deep-UV, EB, EUV of wavelength 3-15 nm, x-ray, soft x-ray, excimer laser light, γ-ray or synchrotron radiation. When UV, deep-UV, EUV, x-ray, soft x-ray, excimer laser light, γ-ray or synchrotron radiation is used as the high-energy radiation, the resist film is exposed thereto directly or through a mask having a desired pattern in a dose of preferably about 1 to 200 $mJ/cm^2$, more preferably about 10 to 100 $mJ/cm^2$. When EB is used as the high-energy radiation, the resist film is exposed thereto directly or through a mask having a desired pattern in a dose of preferably about 0.1 to 100 $\mu C/cm^2$, more preferably about 0.5 to 50 $\mu C/cm^2$. It is appreciated that the inventive resist composition is suited in micropatterning using KrF excimer laser, ArF excimer laser, EB, EUV, x-ray, soft x-ray, γ-ray or synchrotron radiation, especially in micropatterning using EB or EUV.

After the exposure, the resist film may be baked (PEB) on a hotplate or in an oven at 60 to 150° C. for 10 seconds to 30 minutes, preferably at 80 to 120° C. for 30 seconds to 20 minutes.

After the exposure or PEB, the resist film is developed in a developer in the form of an aqueous base solution for 3 seconds to 3 minutes, preferably 5 seconds to 2 minutes by conventional techniques such as dip, puddle and spray techniques. A typical developer is a 0.1 to 10 wt %, preferably 2 to 5 wt % aqueous solution of tetramethylammonium hydroxide (TMAH), tetraethylammonium hydroxide (TEAH), tetrapropylammonium hydroxide (TPAH), or tetrabutylammonium hydroxide (TBAH). In the case of positive resist, the resist film in the exposed area is dissolved in the developer whereas the resist film in the unexposed area is not dissolved. In this way, the desired positive pattern is formed on the substrate. Inversely in the case of negative resist, the exposed area of resist film is insolubilized and the unexposed area is dissolved in the developer.

In an alternative embodiment, a negative pattern may be formed via organic solvent development using a positive resist composition comprising a base polymer having an acid labile group. The developer used herein is preferably selected from among 2-octanone, 2-nonanone, 2-heptanone, 3-heptanone, 4-heptanone, 2-hexanone, 3-hexanone, diisobutyl ketone, methylcyclohexanone, acetophenone, methylacetophenone, propyl acetate, butyl acetate, isobutyl acetate, pentyl acetate, butenyl acetate, isopentyl acetate, propyl formate, butyl formate, isobutyl formate, pentyl formate, isopentyl formate, methyl valerate, methyl pentenoate, methyl crotonate, ethyl crotonate, methyl propionate, ethyl propionate, ethyl 3-ethoxypropionate, methyl lactate, ethyl lactate, propyl lactate, butyl lactate, isobutyl lactate, pentyl lactate, isopentyl lactate, methyl 2-hydroxyisobutyrate, ethyl 2-hydroxyisobutyrate, methyl benzoate, ethyl benzoate, phenyl acetate, benzyl acetate, methyl phenylacetate, benzyl formate, phenylethyl formate, methyl 3-phenylpropionate, benzyl propionate, ethyl phenylacetate, and 2-phenylethyl acetate, and mixtures thereof.

At the end of development, the resist film is rinsed. As the rinsing liquid, a solvent which is miscible with the developer and does not dissolve the resist film is preferred. Suitable solvents include alcohols of 3 to 10 carbon atoms, ether compounds of 8 to 12 carbon atoms, alkanes, alkenes, and alkynes of 6 to 12 carbon atoms, and aromatic solvents. Specifically, suitable alcohols of 3 to 10 carbon atoms include n-propyl alcohol, isopropyl alcohol, 1-butyl alcohol, 2-butyl alcohol, isobutyl alcohol, t-butyl alcohol, 1-pentanol, 2-pentanol, 3-pentanol, t-pentyl alcohol, neopentyl alcohol, 2-methyl-1-butanol, 3-methyl-1-butanol, 3-methyl-3-pentanol, cyclopentanol, 1-hexanol, 2-hexanol, 3-hexanol, 2,3-dimethyl-2-butanol, 3,3-dimethyl-1-butanol, 3,3-dimethyl-2-butanol, 2-ethyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 4-methyl-3-pentanol, cyclohexanol, and 1-octanol. Suitable ether compounds of 8 to 12 carbon atoms include di-n-butyl ether, diisobutyl ether, di-s-butyl ether, di-n-pentyl ether, diisopentyl ether, di-s-pentyl ether, di-t-pentyl ether, and di-n-hexyl ether. Suitable alkanes of 6 to 12 carbon atoms include hexane, heptane, octane, nonane, decane, undecane, dodecane, methylcyclopentane, dimethylcyclopentane, cyclohexane, methylcyclohexane, dimethylcyclohexane, cycloheptane, cyclooctane, and cyclononane. Suitable alkenes of 6 to 12 carbon atoms include hexene, heptene, octene, cyclohexene, methylcyclohexene, dimethylcyclohexene, cycloheptene, and cyclooctene. Suitable alkynes of 6 to 12 carbon atoms include hexyne, heptyne, and octyne. Suitable aromatic solvents include toluene, xylene, ethylbenzene, isopropylbenzene, t-butylbenzene and mesitylene. The solvents may be used alone or in admixture.

Rinsing is effective for minimizing the risks of resist pattern collapse and defect formation. However, rinsing is not essential. If rinsing is omitted, the amount of solvent used may be reduced.

A hole or trench pattern after development may be shrunk by the thermal flow, RELACS® or DSA process. A hole pattern is shrunk by coating a shrink agent thereto, and baking such that the shrink agent may undergo crosslinking at the resist surface as a result of the acid catalyst diffusing from the resist layer during bake, and the shrink agent may attach to the sidewall of the hole pattern. The bake is preferably at a temperature of 70 to 180° C., more preferably 80 to 170° C., for a time of 10 to 300 seconds. The extra shrink agent is stripped and the hole pattern is shrunk.

EXAMPLES

Examples of the invention are given below by way of illustration and not by way of limitation. The abbreviation "pbw" is parts by weight.

[1] Synthesis of Monomers

Synthesis Examples 1-1 to 1-17 and Comparative Synthesis Example 1-1

Monomer M-1 was prepared by mixing 2-(dimethylamino)ethyl methacrylate with pentafluorobenzoic acid in a molar ratio of 1:1. Similarly, Monomers M-2 to M-17 and cM-1 were prepared by mixing a nitrogen-containing monomer with a fluorinated carboxylic acid, fluorinated sulfonamide compound, fluorinated phenol compound, fluorinated β-diketone compound, or unsubstituted benzoic acid (for comparison).

M-1

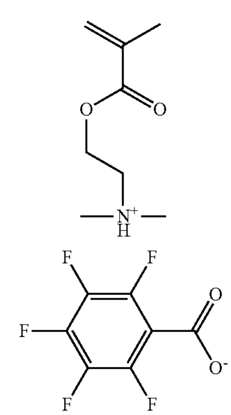

-continued
M-2
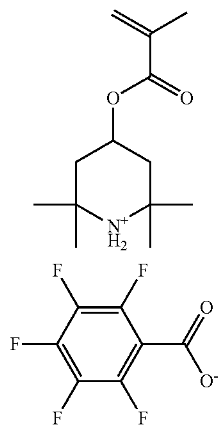
M-3
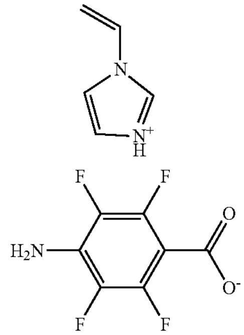
M-4
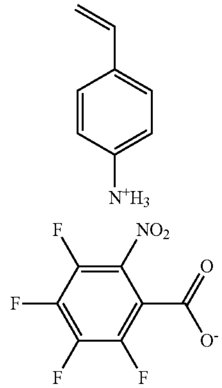
M-5
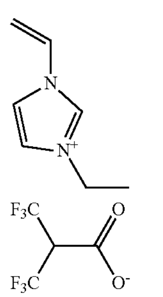
-continued
M-6
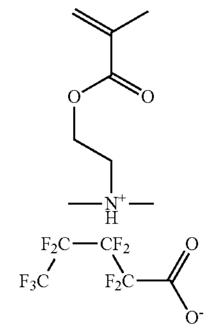
M-7
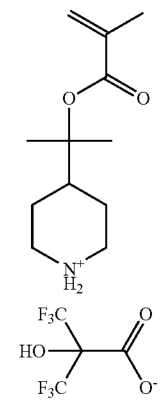
M-8
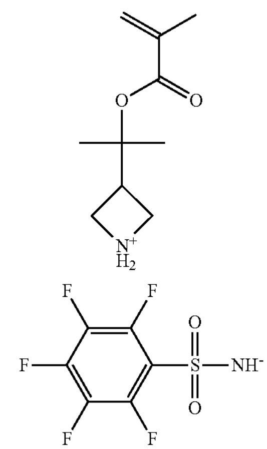
M-9
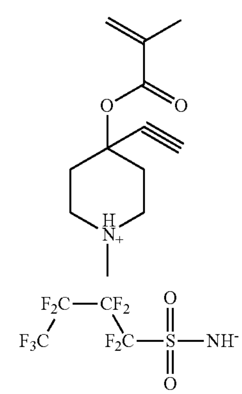

-continued
M-10
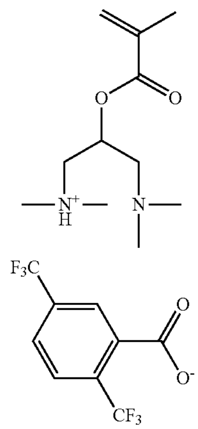
M-11
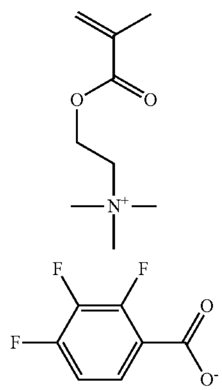
M-12
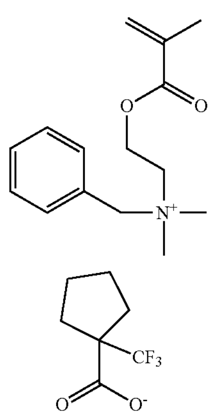
M-13
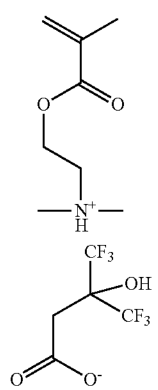
-continued
M-14
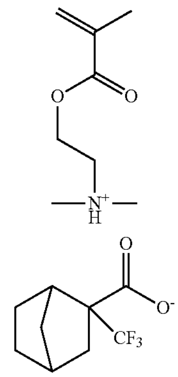
M-15
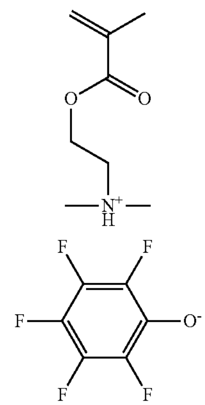
M-16
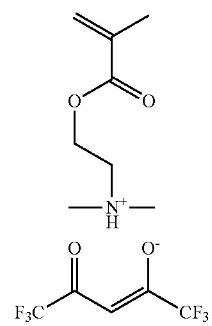
M-17
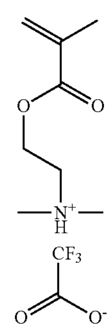

-continued
cM-1
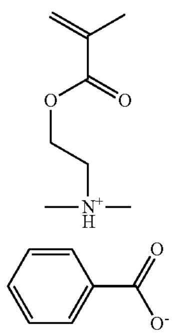
[2] Synthesis of Polymers
Fluorine-containing monomers FM-1 to FM-11 and PAG monomer PM-1 used in the synthesis of polymers have the structure shown below.
FM-1
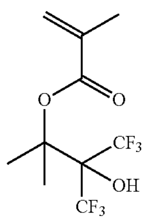
FM-2
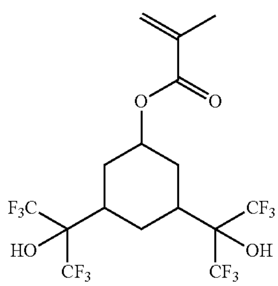
FM-3
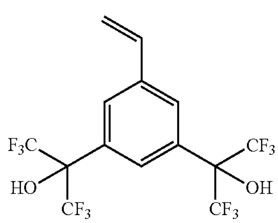
FM-4
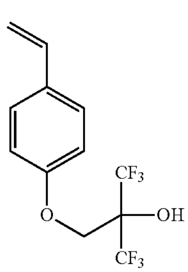
-continued
FM-5
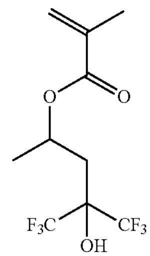
FM-6
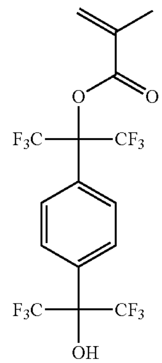
FM-7
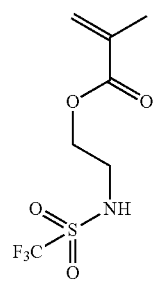
FM-8
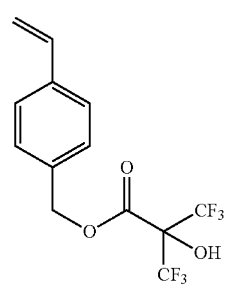
FM-9
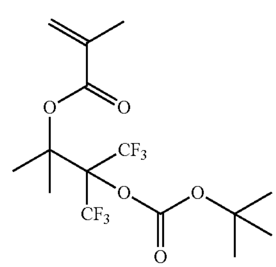

-continued

FM-10

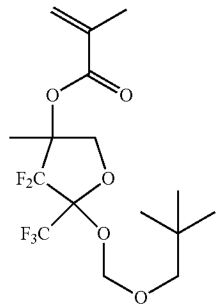

FM-11

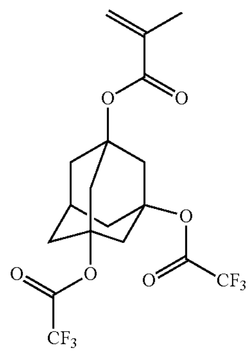

PM-1

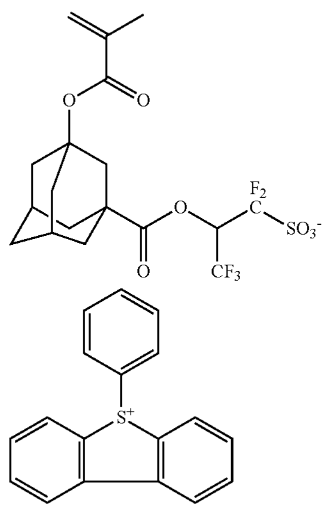

Synthesis Example 2-1

Synthesis of Polymer AP-1

A 2-L flask was charged with 3.7 g of M-1, 26.5 g of FM-1, and 60 g of tetrahydrofuran (THF) solvent. The reactor was cooled at −70° C. in a nitrogen atmosphere, after which vacuum pumping and nitrogen blow were repeated three times. The reactor was warmed up to room temperature, whereupon 1.2 g of azobisisobutyronitrile (AIBN) as polymerization initiator was added. The reactor was heated at 60° C. and held at the temperature for 15 hours for reaction. The reaction solution was poured into 1 L of isopropyl alcohol (IPA) for precipitation. The resulting white solid was collected by filtration and dried in vacuum at 60° C., obtaining Polymer AP-1. The polymer was analyzed for composition by $^{13}$C- and $^{1}$H-NMR spectroscopy and for Mw and Mw/Mn by GPC.

AP-1

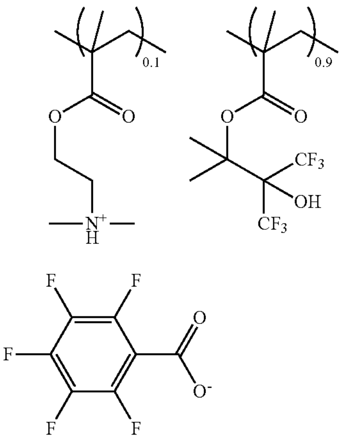

Mw = 7.800
Mw/Mn = 1.64

Synthesis Example 2-2

Synthesis of Polymer AP-2

A 2-L flask was charged with 3.3 g of M-1, 20.8 g of FM-1, 6.6 g of 3,3,4,4,5,5,6,6,6-nonafluorohexyl methacrylate, and 60 g of THF solvent. The reactor was cooled at −70° C. in a nitrogen atmosphere, after which vacuum pumping and nitrogen blow were repeated three times. The reactor was warmed up to room temperature, whereupon 1.2 g of AIBN was added. The reactor was heated at 60° C. and held at the temperature for 15 hours for reaction. The reaction solution was poured into 1 L of IPA for precipitation. The resulting white solid was collected by filtration and dried in vacuum at 60° C., obtaining Polymer AP-2. The polymer was analyzed for composition by $^{13}$C- and $^{1}$H-NMR spectroscopy and for Mw and Mw/Mn by GPC.

AP-2

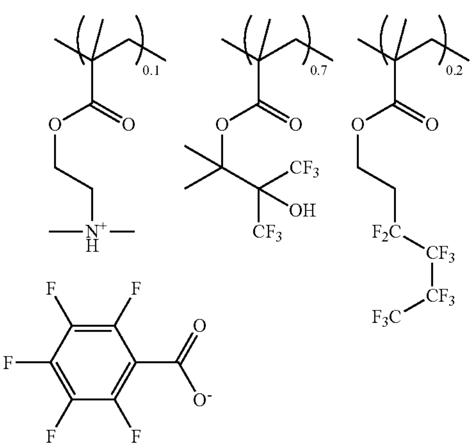

Mw = 8.700
Mw/Mn = 1.86

Synthesis Example 2-3

Synthesis of Polymer AP-3

A 2-L flask was charged with 4.4 g of M-2, 20.8 g of FM-1, 6.0 g of 1H,1H,5H-octafluoropentyl methacrylate, and 60 g of THF solvent. The reactor was cooled at −70° C. in a nitrogen atmosphere, after which vacuum pumping and nitrogen blow were repeated three times. The reactor was warmed up to room temperature, whereupon 1.2 g of AIBN was added. The reactor was heated at 60° C. and held at the temperature for 15 hours for reaction. The reaction solution was poured into 1 L of IPA for precipitation. The resulting white solid was collected by filtration and dried in vacuum at 60° C., obtaining Polymer AP-3. The polymer was analyzed for composition by $^{13}C$- and $^{1}H$-NMR spectroscopy and for Mw and Mw/Mn by GPC.

AP-3

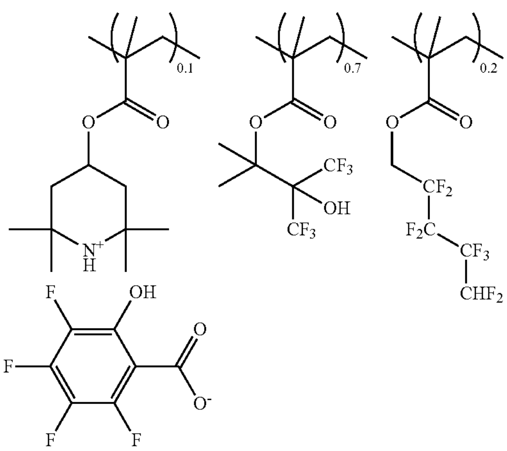

Mw = 9.000
Mw/Mn = 1.83

Synthesis Example 2-4

Synthesis of Polymer AP-4

A 2-L flask was charged with 3.0 g of M-3, 34.0 g of FM-2, 6.0 g of 1H,1H,5H-octafluoropentyl methacrylate, and 60 g of THF solvent. The reactor was cooled at −70° C. in a nitrogen atmosphere, after which vacuum pumping and nitrogen blow were repeated three times. The reactor was warmed up to room temperature, whereupon 1.2 g of AIBN was added. The reactor was heated at 60° C. and held at the temperature for 15 hours for reaction. The reaction solution was poured into 1 L of IPA for precipitation. The resulting white solid was collected by filtration and dried in vacuum at 60° C., obtaining Polymer AP-4. The polymer was analyzed for composition by $^{13}C$- and $^{1}H$-NMR spectroscopy and for Mw and Mw/Mn by GPC.

AP-4

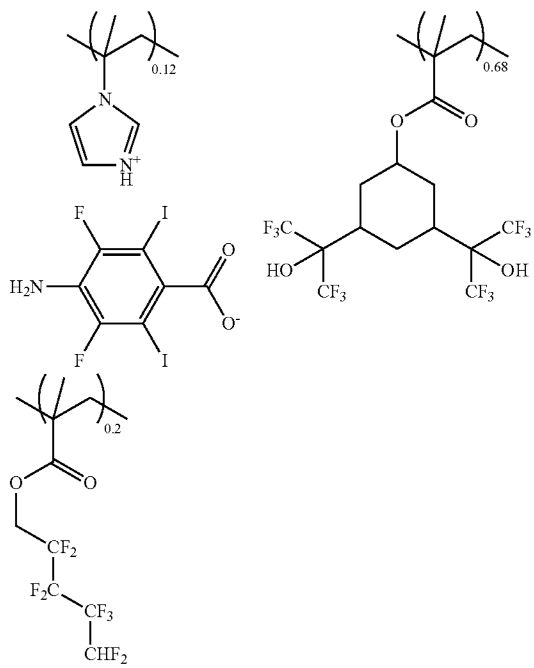

Mw = 9.300
Mw/Mn = 1.86

Synthesis Example 2-5

Synthesis of Polymer AP-5

A 2-L flask was charged with 3.6 g of M-4, 24.0 g of FM-3, 7.1 g of 1,1,1,3,3,3-hexafluoroisopropyl methacrylate, and 60 g of THE solvent. The reactor was cooled at −70° C. in a nitrogen atmosphere, after which vacuum pumping and nitrogen blow were repeated three times. The reactor was warmed up to room temperature, whereupon 1.2 g of AIBN was added. The reactor was heated at 60° C. and held at the temperature for 15 hours for reaction. The reaction solution was poured into 1 L of IPA for precipitation. The resulting white solid was collected by filtration and dried in vacuum at 60° C., obtaining Polymer AP-5. The polymer was analyzed for composition by $^{13}C$- and $^{1}H$-NMR spectroscopy and for Mw and Mw/Mn by GPC.

AP-5

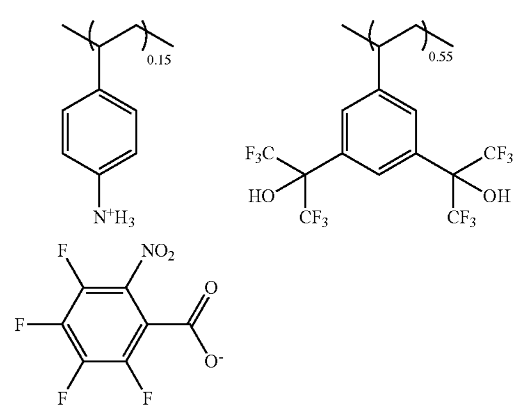

-continued

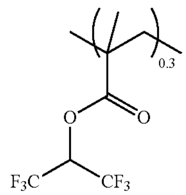

Mw = 8.300
Mw/Mn = 1.79

Synthesis Example 2-6

Synthesis of Polymer AP-6

A 2-L flask was charged with 3.2 g of M-5, 18.0 g of FM-4, 7.1 g of 1,1,1,3,3,3-hexafluoroisopropyl methacrylate, and 60 g of THF solvent. The reactor was cooled at −70° C. in a nitrogen atmosphere, after which vacuum pumping and nitrogen blow were repeated three times. The reactor was warmed up to room temperature, whereupon 1.2 g of AIBN was added. The reactor was heated at 60° C. and held at the temperature for 15 hours for reaction. The reaction solution was poured into 1 L of IPA for precipitation. The resulting white solid was collected by filtration and dried in vacuum at 60° C., obtaining Polymer AP-6. The polymer was analyzed for composition by $^{13}C$- and $^{1}H$-NMR spectroscopy and for Mw and Mw/Mn by GPC.

AP-6

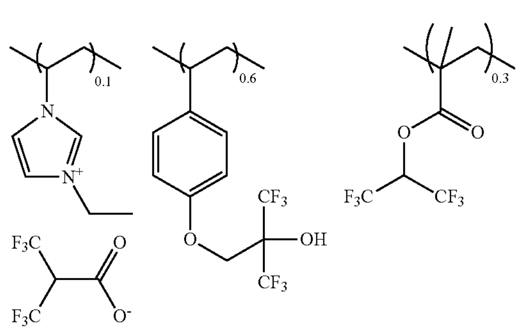

Mw = 8.300
Mw/Mn = 1.76

Synthesis Example 2-7

Synthesis of Polymer AP-7

A 2-L flask was charged with 4.2 g of M-6, 26.5 g of FM-5, and 60 g of THF solvent. The reactor was cooled at −70° C. in a nitrogen atmosphere, after which vacuum pumping and nitrogen blow were repeated three times. The reactor was warmed up to room temperature, whereupon 1.2 g of AIBN was added. The reactor was heated at 60° C. and held at the temperature for 15 hours for reaction. The reaction solution was poured into 1 L of IPA for precipitation. The resulting white solid was collected by filtration and dried in vacuum at 60° C., obtaining Polymer AP-7. The polymer was analyzed for composition by $^{13}C$- and $^{1}H$-NMR spectroscopy and for Mw and Mw/Mn by GPC.

AP-7

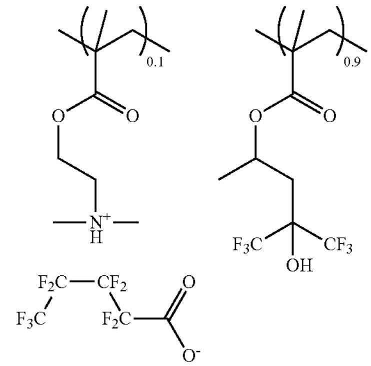

Mw = 8.900
Mw/Mn = 1.76

Synthesis Example 2-8

Synthesis of Polymer AP-8

A 2-L flask was charged with 4.2 g of M-7, 43.0 g of FM-6, and 60 g of THE solvent. The reactor was cooled at −70° C. in a nitrogen atmosphere, after which vacuum pumping and nitrogen blow were repeated three times. The reactor was warmed up to room temperature, whereupon 1.2 g of AIBN was added. The reactor was heated at 60° C. and held at the temperature for 15 hours for reaction. The reaction solution was poured to into 1 L of IPA for precipitation. The resulting white solid was collected by filtration and dried in vacuum at 60° C., obtaining Polymer AP-8. The polymer was analyzed for composition by $^{13}C$- and $^{1}H$-NMR spectroscopy and for Mw and Mw/Mn by GPC.

AP-8

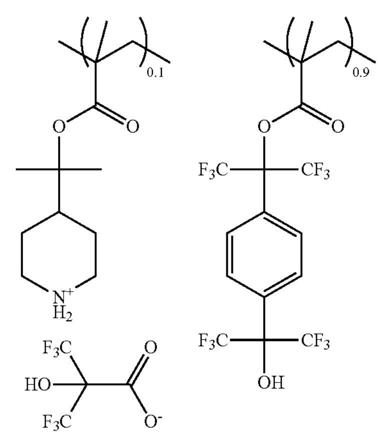

Mw = 8.700
Mw/Mn = 1.78

Synthesis Example 2-9

Synthesis of Polymer AP-9

A 2-L flask was charged with 4.3 g of M-8, 15.7 g of FM-7, 9.0 g of 1H,1H,5H-octafluoropentyl methacrylate, and 60 g of TIF solvent. The reactor was cooled at −70° C. in a nitrogen atmosphere, after which vacuum pumping and nitrogen blow were repeated three times. The reactor was warmed up to room temperature, whereupon 1.2 g of AIBN was added. The reactor was heated at 60° C. and held at the temperature for 15 hours for reaction. The reaction solution was poured into 1 L of IPA for precipitation. The resulting white solid was collected by filtration and dried in vacuum at 60° C., obtaining Polymer AP-9. The polymer was analyzed for composition by $^{13}C$- and $^{1}H$-NMR spectroscopy and for Mw and Mw/Mn by GPC.

AP-9

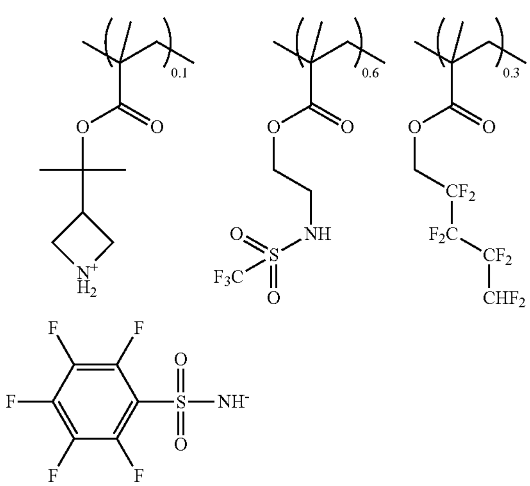

Mw = 9.000
Mw/Mn = 1.88

Synthesis Example 2-10

Synthesis of Polymer AP-10

A 2-L flask was charged with 5.1 g of M-9, 19.7 g of FM-8, 9.0 g of 1H,1H,5H-octafluoropentyl methacrylate, and 60 g of THF solvent. The reactor was cooled at −70° C. in a nitrogen atmosphere, after which vacuum pumping and nitrogen blow were repeated three times. The reactor was warmed up to room temperature, whereupon 1.2 g of AIBN was added. The reactor was heated at 60° C. and held at the temperature for 15 hours for reaction. The reaction solution was poured into 1 L of IPA for precipitation. The resulting white solid was collected by filtration and dried in vacuum at 60° C., obtaining Polymer AP-10. The polymer was analyzed for composition by $^{13}C$- and $^{1}H$-NMR spectroscopy and for Mw and Mw/Mn by GPC.

AP-10

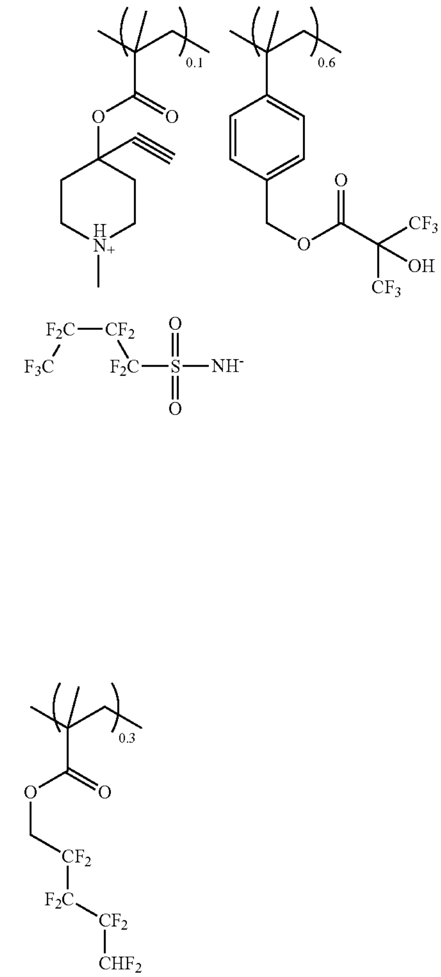

Mw = 9.000
Mw/Mn = 1.86

Synthesis Example 2-11

Synthesis of Polymer AP-11

A 2-L flask was charged with 3.3 g of M-10, 20.7 g of FM-8, 9.0 g of 1H,1H,5H-octafluoropentyl methacrylate, and 60 g of THF solvent. The reactor was cooled at −70° C. in a nitrogen atmosphere, after which vacuum pumping and nitrogen blow were repeated three times. The reactor was warmed up to room temperature, whereupon 1.2 g of AIBN was added. The reactor was heated at 60° C. and held at the temperature for 15 hours for reaction. The reaction solution was poured into 1 L of IPA for precipitation. The resulting white solid was collected by filtration and dried in vacuum at 60° C., obtaining Polymer AP-11. The polymer was analyzed for composition by $^{13}C$- and $^{1}H$-NMR spectroscopy and for Mw and Mw/Mn by GPC.

AP-11

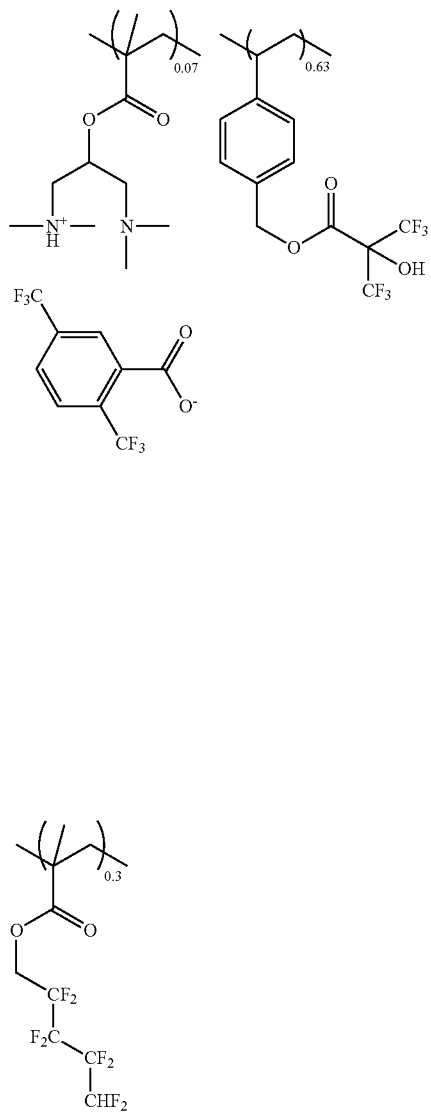

Mw = 8.500
Mw/Mn = 1.86

Synthesis Example 2-12

Synthesis of Polymer AP-12

A 2-L flask was charged with 3.5 g of M-11, 19.7 g of FM-8, 9.0 g of 1H,1H,5H-octafluoropentyl methacrylate, and 60 g of THF solvent. The reactor was cooled at −70° C. in a nitrogen atmosphere, after which vacuum pumping and nitrogen blow were repeated three times. The reactor was warmed up to room temperature, whereupon 1.2 g of AIBN was added. The reactor was heated at 60° C. and held at the temperature for 15 hours for reaction. The reaction solution was poured into 1 L of IPA for precipitation. The resulting white solid was collected by filtration and dried in vacuum at 60° C., obtaining Polymer AP-12. The polymer was analyzed for composition by $^{13}C$- and $^{1}H$-NMR spectroscopy and for Mw and Mw/Mn by GPC.

AP-12

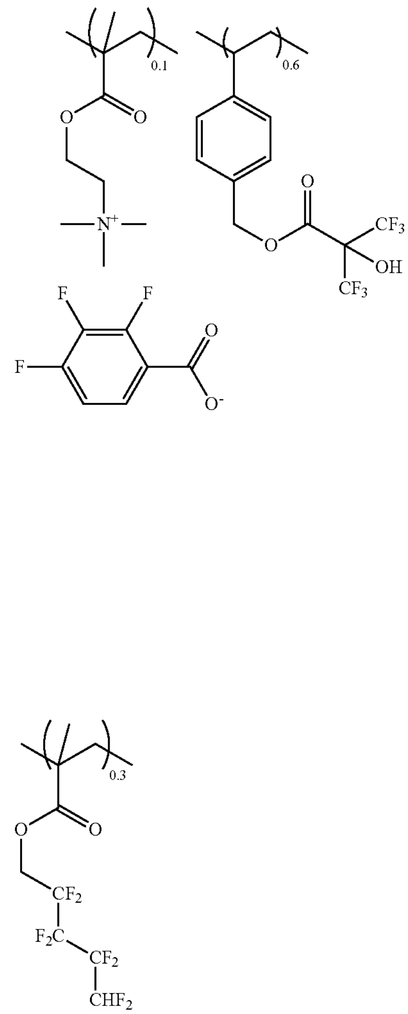

Mw = 8.600
Mw/Mn = 1.83

Synthesis Example 2-13

Synthesis of Polymer AP-13

A 2-L flask was charged with 4.3 g of M-12, 19.7 g of FM-8, 9.0 g of 1H,1H,5H-octafluoropentyl methacrylate, and 60 g of THF solvent. The reactor was cooled at −70° C. in a nitrogen atmosphere, after which vacuum pumping and nitrogen blow were repeated three times. The reactor was warmed up to room temperature, whereupon 1.2 g of AIBN was added. The reactor was heated at 60° C. and held at the temperature for 15 hours for reaction. The reaction solution was poured into 1 L of IPA for precipitation. The resulting white solid was collected by filtration and dried in vacuum at 60° C., obtaining Polymer AP-13. The polymer was analyzed for composition by $^{13}C$- and $^{1}H$-NMR spectroscopy and for Mw and Mw/Mn by GPC.

AP-13

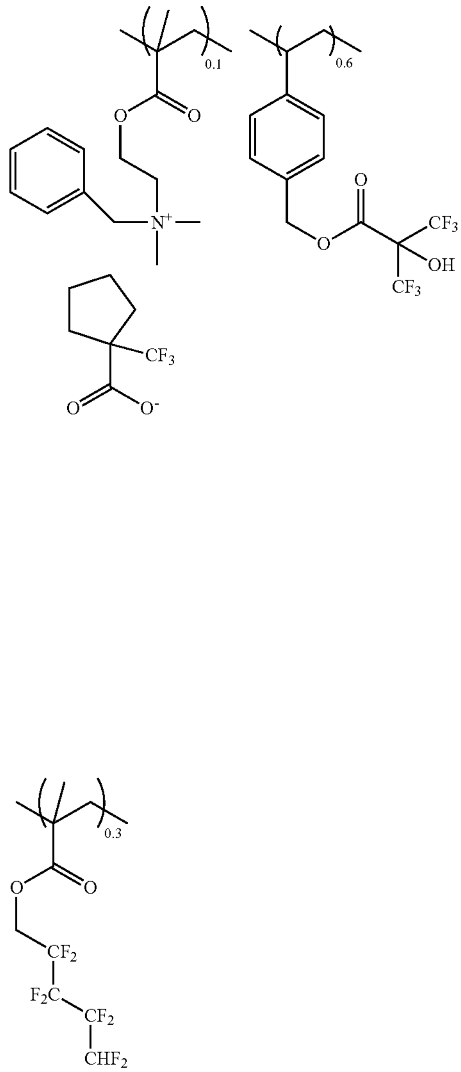

Mw = 9.500
Mw/Mn = 1.85

Synthesis Example 2-14

Synthesis of Polymer AP-14

A 2-L flask was charged with 3.8 g of M-13, 19.7 g of FM-8, 9.0 g of 1H,1H,5H-octafluoropentyl methacrylate, and 60 g of THF solvent. The reactor was cooled at −70° C. in a nitrogen atmosphere, after which vacuum pumping and nitrogen blow were repeated three times. The reactor was warmed up to room temperature, whereupon 1.2 g of AIBN was added. The reactor was heated at 60° C. and held at the temperature for 15 hours for reaction. The reaction solution was poured into 1 L of IPA for precipitation. The resulting white solid was collected by filtration and dried in vacuum at 60° C., obtaining Polymer AP-14. The polymer was analyzed for composition by $^{13}C$- and $^{1}H$-NMR spectroscopy and for Mw and Mw/Mn by GPC.

AP-14

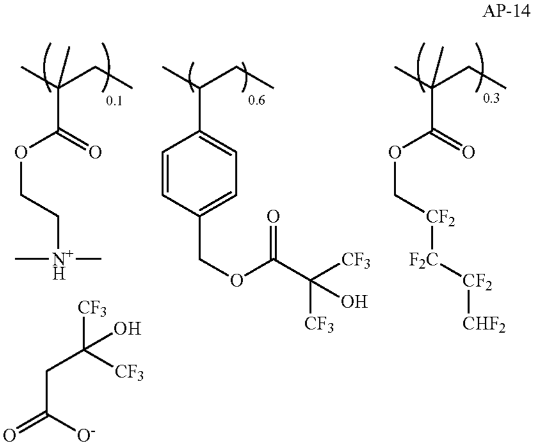

Mw = 8.900
Mw/Mn = 1.91

Synthesis Example 2-15

Synthesis of Polymer AP-15

A 2-L flask was charged with 3.7 g of M-14, 19.7 g of FM-8, 9.0 g of 1H,1H,5H-octafluoropentyl methacrylate, and 60 g of THF solvent. The reactor was cooled at −70° C. in a nitrogen atmosphere, after which vacuum pumping and nitrogen blow were repeated three times. The reactor was warmed up to room temperature, whereupon 1.2 g of AIBN was added. The reactor was heated at 60° C. and held at the temperature for 15 hours for reaction. The reaction solution was poured into 1 L of IPA for precipitation. The resulting white solid was collected by filtration and dried in vacuum at 60° C., obtaining Polymer AP-15. The polymer was analyzed for composition by $^{13}C$- and $^{1}H$-NMR spectroscopy and for Mw and Mw/Mn by GPC.

AP-15

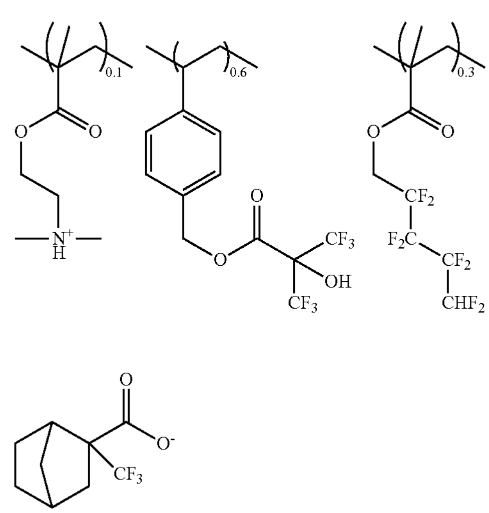

Mw = 8,600
Mw/Mn = 1.91

Synthesis Example 2-16

Synthesis of Polymer AP-16

A 2-L flask was charged with 3.8 g of M-13, 11.9 g of FM-9, 9.8 g of FM-8, 9.0 g of 1H,1H,5H-octafluoropentyl methacrylate, and 60 g of THF solvent. The reactor was cooled at −70° C. in a nitrogen atmosphere, after which vacuum pumping and nitrogen blow were repeated three times. The reactor was warmed up to room temperature, whereupon 1.2 g of AIBN was added. The reactor was heated at 60° C. and held at the temperature for 15 hours for reaction. The reaction solution was poured into 1 L of IPA for precipitation. The resulting white solid was collected by filtration and dried in vacuum at 60° C., obtaining Polymer AP-16. The polymer was analyzed for composition by $^{13}C$- and $^{1}H$-NMR spectroscopy and for Mw and Mw/Mn by GPC.

AP-16

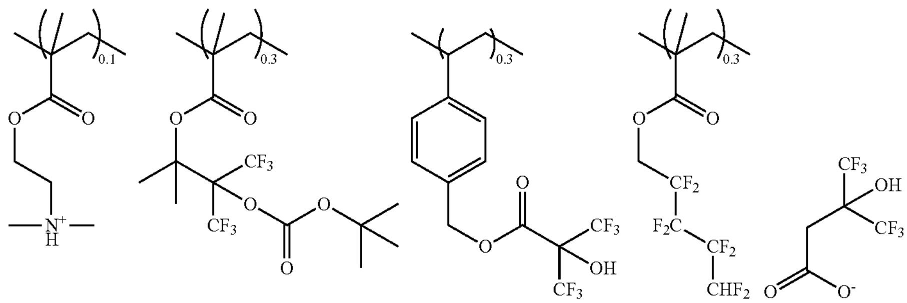

Mw = 8,500
Mw/Mn = 1.77

Synthesis Example 2-17

Synthesis of Polymer AP-17

A 2-L flask was charged with 3.4 g of M-15, 11.7 g of FM-10, 9.8 g of FM-8, 9.0 g of 1H,1H,5H-octafluoropentyl methacrylate, and 60 g of THF solvent. The reactor was cooled at −70° C. in a nitrogen atmosphere, after which vacuum pumping and nitrogen blow were repeated three times. The reactor was warmed up to room temperature, whereupon 1.2 g of AIBN was added. The reactor was heated at 60° C. and held at the temperature for 15 hours for reaction. The reaction solution was poured into 1 L of IPA for precipitation. The resulting white solid was collected by filtration and dried in vacuum at 60° C., obtaining Polymer AP-17. The polymer was analyzed for composition by $^{13}C$- and $^{1}H$-NMR spectroscopy and for Mw and Mw/Mn by GPC.

AP-17

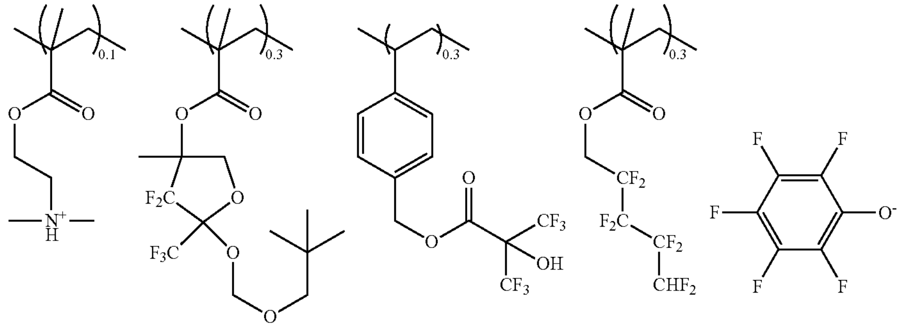

Mw = 8,200
Mw/Mn = 1.78

Synthesis Example 2-18

Synthesis of Polymer AP-18

A 2-L flask was charged with 3.7 g of M-14, 19.7 g of FM-8, 13.3 g of FM-11, and 60 g of THF solvent. The reactor was cooled at −70° C. in a nitrogen atmosphere, after which vacuum pumping and nitrogen blow were repeated three times. The reactor was warmed up to room temperature, whereupon 1.2 g of AIBN was added. The reactor was heated at 60° C. and held at the temperature for 15 hours for reaction. The reaction solution was poured into 1 L of IPA for precipitation. The resulting white solid was collected by filtration and dried in vacuum at 60° C., obtaining Polymer AP-18. The polymer was analyzed for composition by $^{13}C$- and $^{1}H$-NMR spectroscopy and for Mw and Mw/Mn by GPC.

AP-18

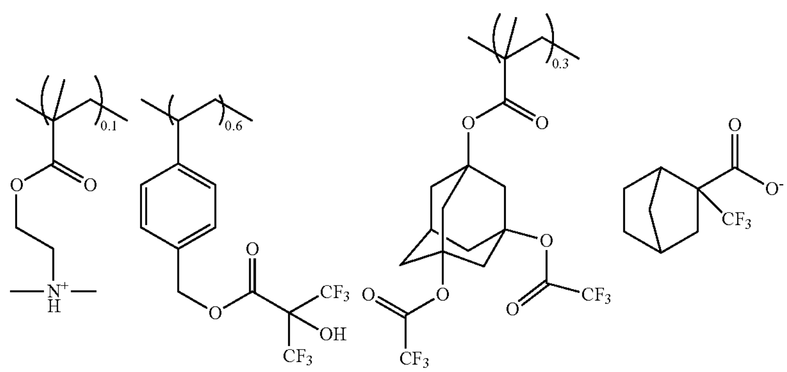

Mw = 9,300
Mw/Mn = 1.98

Synthesis Example 2-19

Synthesis of Polymer AP-19

A 2-L flask was charged with 3.7 g of M-16, 26.2 g of FM-8, 7.4 g of PM-1, and 60 g of THE solvent. The reactor was cooled at −70° C. in a nitrogen atmosphere, after which vacuum pumping and nitrogen blow were repeated three times. The reactor was warmed up to room temperature, whereupon 1.2 g of AIBN was added. The reactor was heated at 60° C. and held at the temperature for 15 hours for reaction. The reaction solution was poured into 1 L of IPA for precipitation. The resulting white solid was collected by filtration and dried in vacuum at 60° C., obtaining Polymer AP-19. The polymer was analyzed for composition by $^{13}C$- and $^{1}H$-NMR spectroscopy and for Mw and Mw/Mn by GPC.

Ap-19

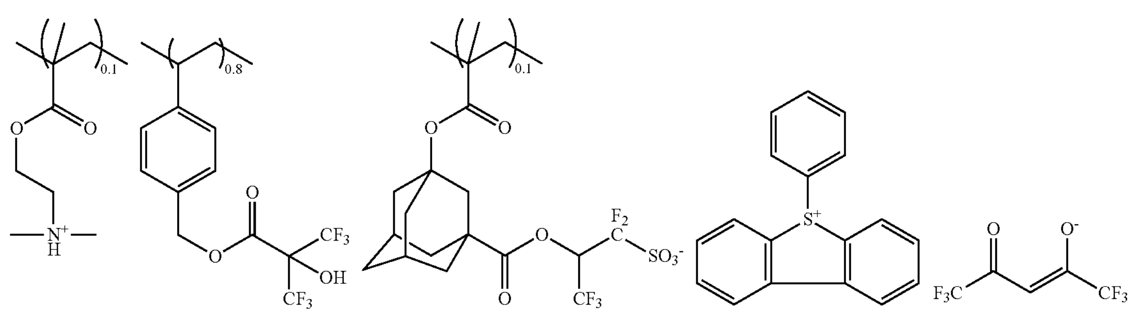

Mw = 8,100
Mw/Mn = 1.61

Synthesis Example 2-20

Synthesis of Polymer AP-20

A 2-L flask was charged with 2.7 g of M-17, 19.7 g of FM-8, 9.0 g of 1H,1H,5H-octafluoropentyl methacrylate, and 60 g of THF solvent. The reactor was cooled at −70° C. in a nitrogen atmosphere, after which vacuum pumping and nitrogen blow were repeated three times. The reactor was warmed up to room temperature, whereupon 1.2 g of AIBN was added. The reactor was heated at 60° C. and held at the temperature for 15 hours for reaction. The reaction solution was poured into 1 L of IPA for precipitation. The resulting white solid was collected by filtration and dried in vacuum at 60° C., obtaining Polymer AP-20. The polymer was analyzed for composition by $^{13}$C- and $^{1}$H-NMR spectroscopy and for Mw and Mw/Mn by GPC.

AP-20

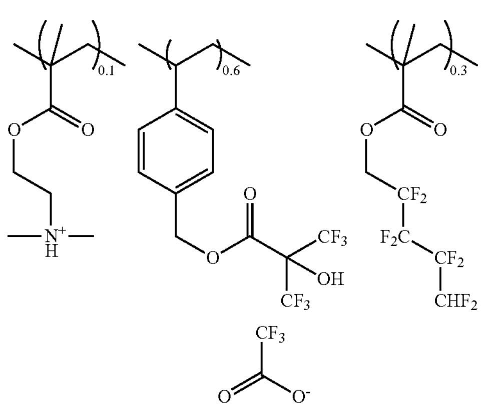

Mw = 8,100
Mw/Mn = 1.61

Comparative Synthesis Example 2-1

Synthesis of Comparative Polymer cP-1

A 2-L flask was charged with 40.0 g of FM-2, 6.0 g of 1H,1H,5H-octafluoropentyl methacrylate, and 60 g of THE solvent. The reactor was cooled at −70° C. in a nitrogen atmosphere, after which vacuum pumping and nitrogen blow were repeated three times. The reactor was warmed up to room temperature, whereupon 1.2 g of AIBN was added. The reactor was heated at 60° C. and held at the temperature for 15 hours for reaction. The reaction solution was poured into 1 L of IPA for precipitation. The resulting white solid was collected by filtration and dried in vacuum at 60° C., obtaining Comparative Polymer cP-1. The polymer was analyzed for composition by $^{13}$C- and $^{1}$H-NMR spectroscopy and for Mw and Mw/Mn by GPC.

cP-1

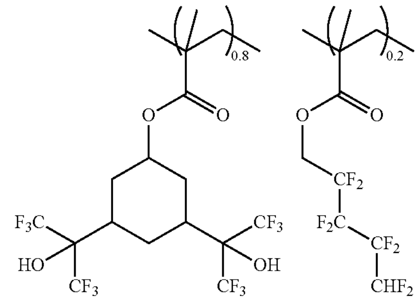

Mw = 9,600
Mw/Mn = 1.86

Comparative Synthesis Example 2-2

Synthesis of Comparative Polymer cP-2

A 2-L flask was charged with 1.6 g of 2-(dimethylamino) ethyl methacrylate, 35.0 g of FM-2, 6.0 g of 1H,1H,5H-octafluoropentyl methacrylate, and 60 g of THF solvent. The reactor was cooled at −70° C. in a nitrogen atmosphere, after which vacuum pumping and nitrogen blow were repeated three times. The reactor was warmed up to room temperature, whereupon 1.2 g of AIBN was added. The reactor was heated at 60° C. and held at the temperature for 15 hours for reaction. The reaction solution was poured into 1 L of IPA for precipitation. The resulting white solid was collected by filtration and dried in vacuum at 60° C., obtaining Comparative Polymer cP-2. The polymer was analyzed for composition by $^{13}$C- and $^{1}$H-NMR spectroscopy and for Mw and Mw/Mn by GPC.

cP-2

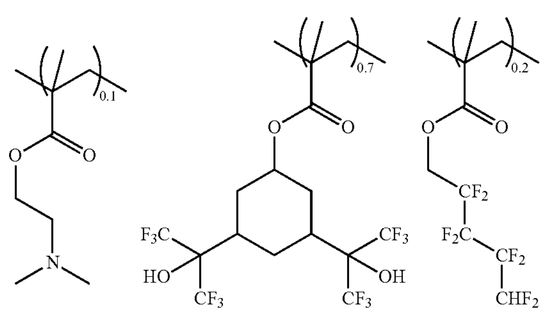

Mw = 9,200
Mw/Mn = 1.74

Comparative Synthesis Example 2-3

Synthesis of Comparative Polymer cP-3

A 2-L flask was charged with 2.8 g of cM-1, 35.0 g of FM-2, 6.0 g of 1H,1H,5H-octafluoropentyl methacrylate, and 60 g of THE solvent. The reactor was cooled at −70° C. in a nitrogen atmosphere, after which vacuum pumping and nitrogen blow were repeated three times. The reactor was warmed up to room temperature, whereupon 1.2 g of AIBN was added. The reactor was heated at 60° C. and held at the temperature for 15 hours for reaction. The reaction solution was poured into 1 L of IPA for precipitation. The resulting white solid was collected by filtration and dried in vacuum at 60° C., obtaining Comparative Polymer cP-3. The polymer was analyzed for composition by $^{13}C$- and $^{1}H$-NMR spectroscopy and for Mw and Mw/Mn by GPC.

-continued

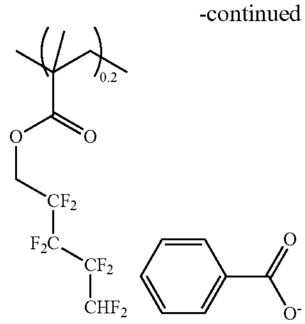

Mw = 9,400
Mw/Mn = 1.69 cP-3

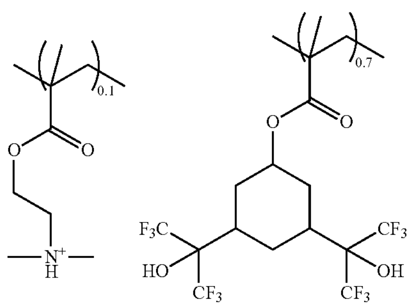

It is noted that the foregoing inventive and comparative polymers are shown under the column of "additive polymer" in Tables 1 and 2.

Synthesis Examples 3-1 and 3-2

Synthesis of base polymers BP-1 and BP-2

Base polymers (BP-1 and BP-2) were prepared by combining suitable monomers, effecting copolymerization reaction thereof in THF solvent, pouring the reaction solution into methanol for precipitation, repeatedly washing the solid precipitate with hexane, isolation, and drying. The resulting polymers were analyzed for composition by $^{1}H$-NMR spectroscopy, and for Mw and Mw/Mn by GPC versus polystyrene standards using THF solvent.

BP-1

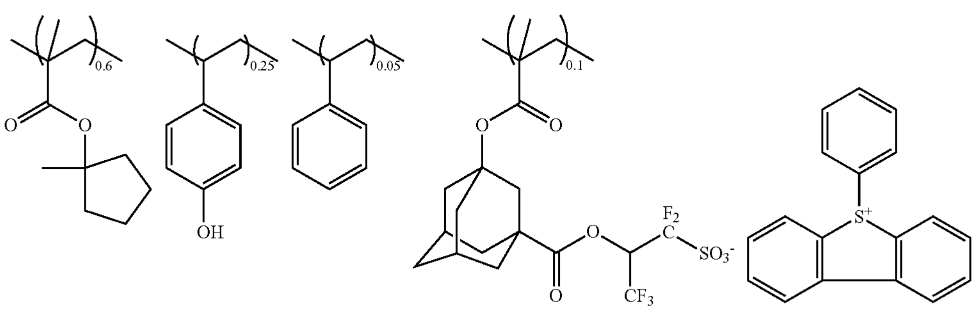

Mw = 8,700
Mw/Mn = 1.79

BP-2

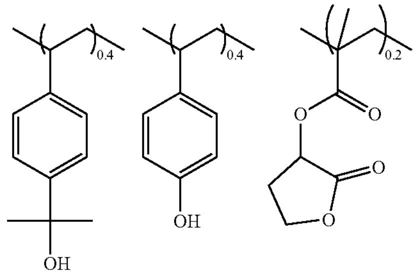

Mw = 6,900
mw/Mn = 1.62

[3] Preparation and Evaluation of Resist Compositions

Examples 1 to 25 and Comparative Examples 1 to 5

(1) Preparation of Resist Compositions

Resist compositions were prepared by dissolving the selected components in a solvent in accordance with the recipe shown in Tables 1 and 2, and filtering through a filter having a pore size of 0.2 μm. The solvent contained 100 ppm of surfactant PolyFox PF-636 (Omnova Solutions Inc.). The resist compositions of Examples 1 to 23, 25 and Comparative Examples 1 to 4 were of positive tone while the resist compositions of Example 24 and Comparative Example 5 were of negative tone. The components in Tables 1 and 2 are as identified below.

Organic Solvents:

PGMEA (propylene glycol monomethyl ether acetate)

DAA (diacetone alcohol)

Acid generators: PAG-1 to PAG-4 of the following structural formulae

PAG-1

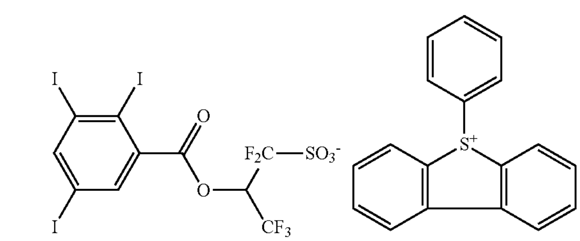

PAG-2

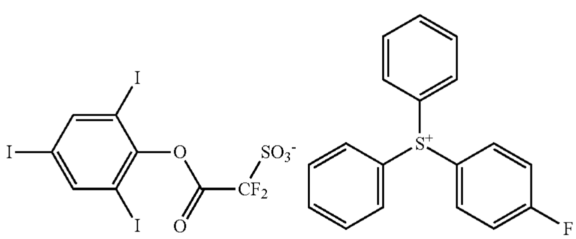

PAG-3

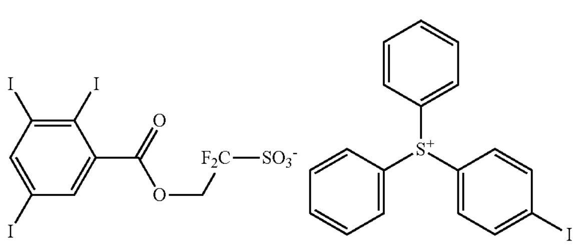

PAG-4

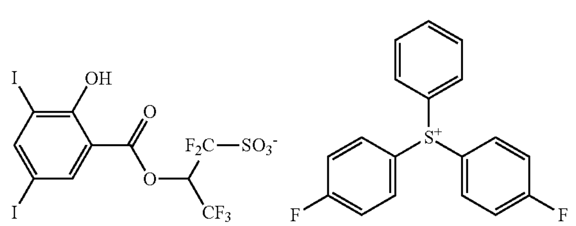

Quenchers: Q-1 to Q-4 of the following structural formulae

Q-1

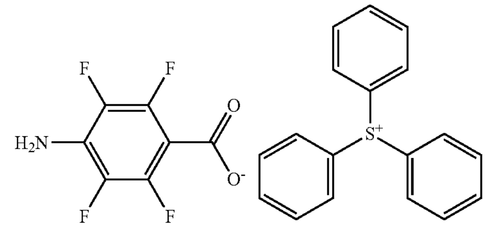

Q-2

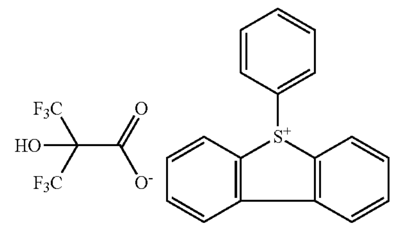

Q-3

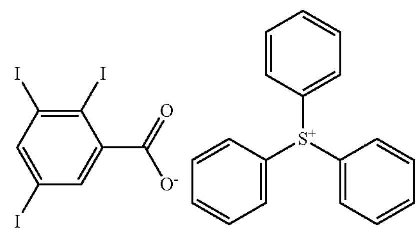

Q-4

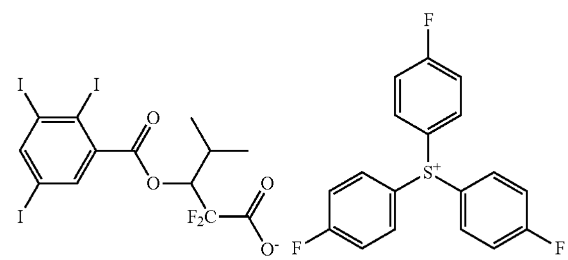

(2) EUV Lithography Test

Each of the resist compositions in Tables 1 and 2 was spin coated on a silicon substrate having a 20-nm coating of silicon-containing spin-on hard mask SHB-A940 (Shin-Etsu Chemical Co., Ltd., silicon content 43 wt %) and prebaked on a hotplate at 100° C. for 60 seconds to form a resist film of 40 nm thick. Using an EUV scanner NXE3300 (ASML, NA 0.33, σ 0.9, 90° dipole illumination), the resist film was exposed to EUV through a mask bearing a 18-nm 1:1 line-and-space (LS) pattern in the case of positive resist film or a mask bearing a 22-nm 1:1 LS pattern in the case of negative resist film. The resist film was baked (PEB) on a hotplate at the temperature shown in Tables 1 and 2 for 60 seconds and developed in a 2.38 wt % TMAH aqueous solution for 30 seconds to form a LS pattern having a size of 18 nm in Examples 1 to 23, 25 and Comparative Examples 1 to 4 or a LS pattern having a size of 22 nm in Example 24 and Comparative Example 5.

The resist pattern was observed under CD-SEM (CG-5000, Hitachi High-Technologies Corp.). The exposure dose that provides a LS pattern at 1:1 is reported as sensitivity. The LWR of the pattern at that dose was measured. Reported as a window is the size of the thickest line in the under-exposed region where no stringy bridges are formed between lines minus the size of the thinnest line in the over-exposed region where no lines collapse.

The resist composition is shown in Tables 1 and 2 together with the sensitivity, window and LWR of EUV lithography.

TABLE 1

| | | Additive polymer (pbw) | Base polymer (pbw) | Acid generator or additive (pbw) | Quencher (pbw) | Organic solvent (pbw) | PEB temp. (° C.) | Sensitivity (mJ/cm$^2$) | Window (nm) | LWR (nm) |
|---|---|---|---|---|---|---|---|---|---|---|
| Example | 1 | AP-1 (2.5) | BP-1 (100) | — | Q-1 (4.71) | PGMEA (3,500) DAA (500) | 85 | 30 | 7 | 2.3 |
| | 2 | AP-2 (2.8 | BP-1 (100) | — | Q-2 (4.79) | PGMEA (3,500) DAA (500) | 85 | 32 | 7 | 2.4 |
| | 3 | AP-3 (3) | BP-1 (100) | — | Q-3 (7.61) | PGMEA (3,500) DAA (500) | 85 | 31 | 8 | 2.3 |
| | 4 | AP-4 (2) | BP-1 (100) | — | Q-4 (9.66) | PGMEA (3,500) DAA (500) | 85 | 31 | 8 | 2.4 |
| | 5 | AP-5 (3) | BP-1 (100) | — | Q-2 (4.79) | PGMEA (3,500) DAA (500) | 85 | 32 | 8 | 2.6 |
| | 6 | AP-6 (3.1) | BP-1 (100) | — | Q-2 (4.79) | PGMEA (3,500) DAA (500) | 85 | 33 | 7 | 2.4 |
| | 7 | AP-7 (2.6) | BP-1 (100) | — | Q-2 (4.79) | PGMEA (3,500) DAA (500) | 85 | 34 | 8 | 2.3 |
| | 8 | AP-8 (2.6) | BP-1 (100) | — | Q-2 (4.79) | PGMEA (3,500) DAA (500) | 85 | 34 | 8 | 2.4 |
| | 9 | AP-9 (2.1) | BP-1 (100) | — | Q-2 (4.79) | PGMEA (3,500) DAA (500) | 85 | 33 | 7 | 2.4 |
| | 10 | AP-10 (2.8) | BP-1 (100) | — | Q-2 (4.79) | PGMEA (3,500) DAA (500) | 85 | 33 | 6 | 2.4 |
| | 11 | AP-11 (3) | BP-1 (100) | — | Q-4 (9.66) | PGMEA (3,500) DAA (500) | 85 | 33 | 7 | 2.5 |
| | 12 | AP-12 (2.5) | BP-1 (100) | — | Q-2 (4 79) | PGMEA (3,500) DAA (500) | 85 | 30 | 8 | 2.3 |
| | 13 | AP-13 (2.2) | BP-1 (100) | — | Q-2 (4.79) | PGMEA (3,500) DAA (500) | 85 | 36 | 7 | 2.3 |
| | 14 | AP-14 (2.5) | BP-1 (100) | — | Q-2 (4.79) | PGMEA (3,500) DAA (500) | 85 | 35 | 8 | 2.2 |
| | 15 | AP-15 (2.5) | BP-1 (100) | — | Q-2 (4.79) | PGMEA (3,500) DAA (500) | 85 | 36 | 6 | 2.3 |
| | 16 | AP-16 (2) | BP-1 (100) | — | Q-2 (4.79) | PGMEA (3,500) DAA (500) | 85 | 34 | 8 | 2.4 |
| | 17 | AP-17 (2) | BP-1 (100) | — | Q-2 (4.79) | PGMEA (3,500) DAA (500) | 85 | 34 | 7 | 2.4 |
| | 18 | AP-18 (2) | BP-1 (100) | — | Q-2 (4.79) | PGMEA (3,500) DAA (500) | 85 | 33 | 7 | 2.2 |
| | 19 | AP-19 (1.9) | BP-1 (100) | PAG-1 (3.00) | Q-2 (4.79) | PGMEA (3,500) DAA (500) | 85 | 31 | 7 | 2.0 |
| | 20 | cP-2 (2.5) | BP-1 (100) | 2,3,5-trifluorobenzoic acid (0.2) | Q-2 (4.79) | PGMEA (3,500) DAA (500) | 85 | 33 | 6 | 2.4 |
| | 21 | AP-12 (2.5) | BP-1 (100) | PAG-2 (3.03) | Q-2 (479) | PGMEA (3,500) DAA (500) | 80 | 27 | 8 | 2.4 |
| | 22 | AP-12 (2.5) | BP-1 (100) | PAG-3 (3.44) | Q-2 (4.79) | PGMEA (3,500) DAA (500) | 80 | 26 | 7 | 2.4 |
| | 23 | AP-13 (2.3) | BP-1 (100) | PAG-3 (3.44) | Q-2 (479) | PGMEA (3,500) DAA (500) | 80 | 28 | 8 | 2.4 |
| | 24 | AP-13 (2.3) | BP-2 (100) | PAG-4 (19) | Q-2 (4.79) | PGMEA (3,500) DAA (500) | 120 | 44 | 6 | 3.6 |
| | 25 | AP-20 (2) | BP-1 (100) | — | Q-2 (4.79) | PGMEA (3,500) DAA (500) | 85 | 34 | 6 | 2.0 |

TABLE 2

| | | Additive polymer (pbw) | Base polymer (pbw) | Acid generator or additive (pbw) | Quencher (pbw) | Organic solvent (pbw) | PEB temp. (° C.) | Sensitivity (mJ/cm$^2$) | Window (nm) | LWR (nm) |
|---|---|---|---|---|---|---|---|---|---|---|
| Comparative Example | 1 | cP-1 (4) | BP-1 (100) | — | Q-1 (4.71) | PGMEA (3,500) DAA (500) | 85 | 31 | 1 | 2.8 |
| | 2 | cP-2 (4) | BP-1 (100) | — | Q-1 (4.71) | PGMEA (3,500) DAA (500) | 85 | 39 | 1 | 2.9 |
| | 3 | cP-3 (4) | BP-1 (100) | — | Q-1 (4.71) | PGMEA (3,500) DAA (500) | 85 | 38 | 1 | 2.9 |
| | 4 | — | BP-1 (100) | — | Q-1 (4.71) | PGMEA (3,500) DAA (500) | 85 | 34 | 0 | 2.8 |
| | 5 | — | BP-2 (100) | PAG-4 (19) | Q-2 (4.79) | PGMEA (3,500) DAA (500) | 120 | 52 | 2 | 4.7 |

It is evident from Tables 1 and 2 that resist compositions having an ammonium salt and fluorine-containing polymer added thereto offer a high sensitivity, reduced LWR and broad window.

Japanese Patent Application No. 2020-123159 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A resist composition comprising an ammonium salt and fluorine-containing polymer comprising repeat units AU having an ammonium salt structure containing a sulfonamide anion containing fluorine, but not iodine and bromine, a phenoxide anion containing fluorine, but not iodine and bromine, or an enolate anion of β-diketone containing fluorine, but not iodine and bromine, and repeat units of at least one type selected from repeat units FU-1 having a trifluoromethylalcohol group which may be substituted with an acid labile group and repeat units FU-2 having a fluorinated hydrocarbyl group, and a base polymer comprising repeat units of at least one type selected from repeat units having the formulae (f1) to (f3):

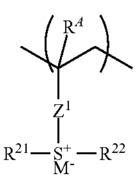

(f1)

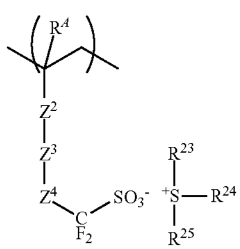

(f2)

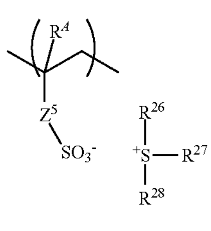

(f3)

wherein $R^A$ is each independently hydrogen or methyl, $Z^1$ is a single bond, a $C_1$-$C_6$ aliphatic hydrocarbylene group, phenylene group, naphthylene group, or $C_7$-$C_{18}$ group obtained by combining the foregoing, or —O—$Z^{11}$—, —C(═O)—O—$Z^{11}$— or —C(═O)—NH—$Z^{11}$—, $Z^{11}$ is a $C_1$-$C_6$ aliphatic hydrocarbylene group, phenylene group, naphthylene group, or $C_7$-$C_{18}$ group obtained by combining the foregoing, which may contain a carbonyl moiety, ester bond, ether bond or hydroxy moiety, $Z^2$ is a single bond or ester bond, $Z^3$ is a single bond, —$Z^{31}$—C(═O)—O—, —$Z^{31}$—O— or —$Z^{31}$—O—C(═O)—, $Z^{31}$ is a $C_1$-$C_{12}$ hydrocarbylene group, phenylene group, or $C_7$-$C_{18}$ group obtained by combining the foregoing, which may contain a carbonyl moiety, ester bond, ether bond, iodine or bromine, $Z^4$ is a methylene, 2,2,2-trifluoro-1,1-ethanediyl or carbonyl group, $Z^5$ is a single bond, methylene, ethylene, phenylene, fluorinated phenylene, trifluoromethyl-substituted phenylene group, —O—$Z^{51}$—, —C(═O)—O—$Z^{51}$—, or —C(═O)—NH—$Z^{51}$—, $Z^{51}$ is a $C_1$-$C_6$ aliphatic hydrocarbylene group, phenylene group, fluorinated phenylene group, or trifluoromethyl-substituted phenylene group, which may contain a carbonyl moiety, ester bond, ether bond or hydroxy moiety, $R_{21}$ to $R_{28}$ are each independently halogen or a $C_1$-$C_{20}$ hydrocarbyl group which may contain a heteroatom, a pair of $R_{23}$ and $R_{24}$ or $R_{26}$ and $R_{27}$ may bond together to form a ring with the sulfur atom to which they are attached, and $M^-$ is a non-nucleophilic counter ion.

2. The resist composition of claim 1 wherein the repeat unit AU has the formula (AU), the repeat unit FU-1 has the formula (FU-1), and the repeat unit FU-2 has the formula (FU-2):

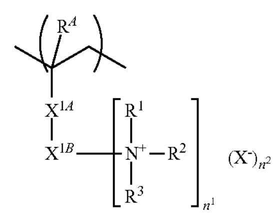

(AU)

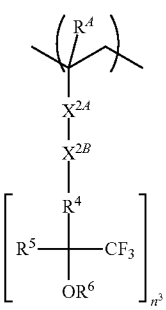

(FU-1)

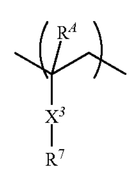

(FU-2)

wherein $n^1$ is 1 or 2, $n^2$ is a positive number in the range: $0<n^2/n^1\leq 1$, $n^3$ is 1 or 2, $R^A$ is each independently hydrogen or methyl, $X^{1A}$ is a single bond, phenylene group, ester bond or amide bond, $X^{1B}$ is a single bond or a $C_1$-$C_{20}$ $(n^1+1)$-valent hydrocarbon group which may contain an ether bond, carbonyl moiety, ester bond, amide bond, sultone ring, lactam ring, carbonate bond, halogen, hydroxy moiety or carboxy moiety, $X^{2A}$ is a single bond, phenylene, —O—, —C(═O)—O— or —C(═O)—NH—, $X^{2B}$ is a $C_1$-$C_{12}$ ($n^3$+1)-valent saturated hydrocarbon group or ($n^3$+1)-valent aromatic hydrocarbon group, which may contain fluorine, hydroxy moiety, ester bond or ether bond, $X^3$ is a single bond, phenylene, —O—, —C(═O)—O—$X^{31}$—$X^{32}$— or —C(═O)—NH—$X^{31}$—$X^{32}$—, $X^{31}$ is a single bond or $C_1$-$C_4$ alkanediyl group, $X^{32}$ is a single bond, ester bond, ether bond or sulfonamide bond, $R^1$, $R^2$ and $R^3$ are each independently hydrogen, a $C_1$-$C_{12}$ alkyl group, $C_2$-$C_{12}$ alkenyl group, $C_6$-$C_{12}$ aryl group or $C_7$-$C_{12}$ aralkyl group, a pair of $R^1$ and $R^2$ or $R^1$ and $X^{1B}$ may bond together to form a ring with the nitrogen atom to which they are attached, the ring may contain oxygen, sulfur, nitrogen or a double bond, $R^4$ is a single bond, ester bond, or a $C_1$-$C_{12}$ saturated hydrocarbylene group in which some or all of the hydrogen atoms may be substituted by fluorine and some carbon may be replaced by an ester bond or ether bond, $R^5$ is hydrogen, fluorine, methyl, trifluoromethyl or difluoromethyl, a pair of $R^5$ and $R^6$ may bond together to form a ring with the carbon atom to which they are attached, the ring may contain an ether bond, fluorine or trifluoromethyl, $R^6$ is hydrogen or an acid labile group, $R^7$ is a $C_1$-$C_{20}$ hydrocarbyl group which is substituted with at least one fluorine, and in which some carbon may be replaced by an ester bond or ether bond, and $X^-$ is a sulfonamide anion containing fluorine, but not iodine and bromine, a phenoxide anion containing fluorine, but not iodine and bromine, or an enolate anion of β-diketone containing fluorine, but not iodine and bromine.

3. The resist composition of claim 1 wherein 0.001 to 20 parts by weight of the ammonium salt and fluorine-containing polymer is present per 100 parts by weight of the base polymer.

4. A resist composition comprising an ammonium salt and fluorine-containing polymer comprising repeat units AU having an ammonium salt structure containing a sulfonamide anion containing fluorine, but not iodine and bromine, a phenoxide anion containing fluorine, but not iodine and bromine, or an enolate anion of β-diketone containing fluorine, but not iodine and bromine, and repeat units of at least one type selected from repeat units FU-1 having a trifluoromethylalcohol group which may be substituted with an acid labile group and repeat units FU-2 having a fluorinated hydrocarbyl group, a base polymer, and an acid generator capable of generating a sulfonic acid, imide acid or methide acid.

5. The resist composition of claim 1, further comprising an organic solvent.

6. The resist composition of claim 1 wherein the base polymer comprises repeat units having the formula (a1) or repeat units having the formula (a2):

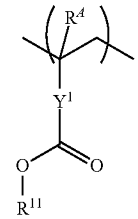

(a1)

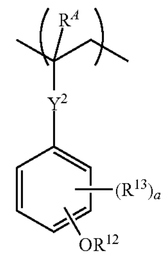

(a2)

wherein $R^A$ is each independently hydrogen or methyl, $R^{11}$ and $R^{12}$ each are an acid labile group, $R^{13}$ is fluorine, trifluoromethyl, a $C_1$-$C_5$ saturated hydrocarbyl group or $C_1$-$C_5$ saturated hydrocarbyloxy group, $Y^1$ is a single bond, phenylene group, naphthylene group, or $C_1$-$C_{12}$ divalent linking group containing at least one moiety selected from ester bond and lactone ring, $Y^2$ is a single bond or ester bond, and a is an integer of 0 to 4.

7. The resist composition of claim 6 which is a chemically amplified positive resist composition.

8. The resist composition of claim 1 wherein the base polymer is free of an acid labile group.

9. The resist composition of claim 8 which is a chemically amplified negative resist composition.

10. The resist composition of claim 1, further comprising a surfactant.

11. A process for forming a pattern comprising the steps of applying the resist composition of claim 1 onto a substrate to form a resist film thereon, exposing the resist film to high-energy radiation, and developing the exposed resist film in a developer.

12. The process of claim 11 wherein the high-energy radiation is ArF excimer laser radiation of wavelength 193 nm or KrF excimer laser radiation of wavelength 248 nm.

13. The process of claim 11 wherein the high-energy radiation is EB or EUV of wavelength 3 to 15 nm.

* * * * *